US010711082B2

(12) United States Patent
Arayama et al.

(10) Patent No.: US 10,711,082 B2
(45) Date of Patent: Jul. 14, 2020

(54) NEAR INFRARED ABSORBING COLORANT POLYMER, COMPOSITION, FILM, OPTICAL FILTER, PATTERN FORMING METHOD, AND DEVICE

(71) Applicant: FUJIFILM Corporation, Tokyo (JP)

(72) Inventors: Kyohei Arayama, Haibara-gun (JP); Kazuya Oota, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 105 days.

(21) Appl. No.: 15/803,099

(22) Filed: Nov. 3, 2017

(65) Prior Publication Data

US 2018/0118865 A1 May 3, 2018

Related U.S. Application Data

(63) Continuation of application No. PCT/JP2016/063233, filed on Apr. 27, 2016.

(30) Foreign Application Priority Data

May 29, 2015 (JP) ................................ 2015-109887
Feb. 24, 2016 (JP) ................................ 2016-033094

(51) Int. Cl.
*G02B 5/20* (2006.01)
*G03F 7/038* (2006.01)
(Continued)

(52) U.S. Cl.
CPC ............ *C08F 220/06* (2013.01); *C08F 20/34* (2013.01); *C08F 20/38* (2013.01); *C08F 220/34* (2013.01);
(Continued)

(58) Field of Classification Search
CPC ..... C09B 69/10; C09B 69/103; C09B 69/105; C09B 69/107; C09B 69/108;
(Continued)

(56) References Cited

U.S. PATENT DOCUMENTS 5,547,819 A 8/1996 Ohno et al.
2003/0091932 A1 5/2003 Loccufier et al.
(Continued)

FOREIGN PATENT DOCUMENTS

CN 101983200 A 3/2011
CN 102169290 A 8/2011
(Continued)

OTHER PUBLICATIONS

Computer-generated translation of WO 2007-018065 (Feb. 2007) (Year: 2007).*

(Continued)

*Primary Examiner* — John A McPherson
(74) *Attorney, Agent, or Firm* — Birch, Stewart, Kolasch & Birch, LLP

(57) ABSTRACT

A near infrared absorbing colorant polymer has a maximal absorption in a wavelength range of 700 to 1200 nm. It is preferable that the near infrared absorbing colorant polymer includes at least one near infrared absorbing colorant structure selected from the group consisting of a pyrrolopyrrole colorant, a cyanine colorant, a squarylium colorant, a diimonium colorant, a phthalocyanine colorant, a naphthalocyanine colorant, a rylene colorant, a dithiol complex colorant, a croconium colorant, an oxonol colorant, a triarylmethane colorant, a pyrromethene colorant, an azomethine colorant, an anthraquinone colorant, and a dibenzofuranone colorant.

16 Claims, 2 Drawing Sheets

(51) Int. Cl.

| | |
|---|---|
| ***C08F 220/06*** | (2006.01) |
| ***C08F 20/34*** | (2006.01) |
| ***C08F 20/38*** | (2006.01) |
| ***G02B 5/22*** | (2006.01) |
| ***G03F 7/075*** | (2006.01) |
| ***G03F 7/00*** | (2006.01) |
| ***G03F 7/027*** | (2006.01) |
| ***G03F 7/105*** | (2006.01) |
| ***C08F 226/06*** | (2006.01) |
| ***C08F 220/34*** | (2006.01) |
| ***C08F 220/36*** | (2006.01) |
| ***C08F 220/38*** | (2006.01) |
| ***C09B 69/10*** | (2006.01) |
| ***G03F 7/20*** | (2006.01) |
| ***G03F 7/32*** | (2006.01) |
| *C08F 2/50* | (2006.01) |

(52) U.S. Cl.

CPC .......... *C08F 220/36* (2013.01); *C08F 220/38* (2013.01); *C08F 226/06* (2013.01); *C09B 69/105* (2013.01); *C09B 69/108* (2013.01); *C09B 69/109* (2013.01); *G02B 5/208* (2013.01); *G02B 5/223* (2013.01); *G03F 7/0007* (2013.01); *G03F 7/027* (2013.01); *G03F 7/0388* (2013.01); *G03F 7/0758* (2013.01); *G03F 7/105* (2013.01); *G03F 7/2004* (2013.01); *G03F 7/322* (2013.01); *C08F 2/50* (2013.01); *C08F 220/365* (2020.02); *C08F 220/387* (2020.02)

(58) Field of Classification Search

CPC ..... C09B 69/109; G03F 7/0007; G03F 7/027; G03F 7/028; G03F 7/0388; G02B 5/223; G02B 5/208

USPC ....................................... 430/7, 281.1, 287.1

See application file for complete search history.

(56) References Cited

U.S. PATENT DOCUMENTS

| | | | | |
|---|---|---|---|---|
| 2003/0232280 | A1* | 12/2003 | Goto .................... | B41C 1/1008 430/284.1 |
| 2007/0269739 | A1* | 11/2007 | Nguyen .................. | G03F 7/027 430/270.1 |
| 2009/0052017 | A1 | 2/2009 | Sasaki | |
| 2011/0012075 | A1 | 1/2011 | Nii et al. | |
| 2011/0070407 | A1 | 3/2011 | Kato et al. | |
| 2011/0217636 | A1 | 9/2011 | Kanna et al. | |
| 2012/0154596 | A1 | 6/2012 | Wajs | |
| 2014/0350183 | A1* | 11/2014 | Chiu .................... | C09B 69/105 525/54.1 |
| 2015/0287756 | A1 | 10/2015 | Ezoe et al. | |
| 2015/0331163 | A1 | 11/2015 | Iwasaki et al. | |
| 2015/0346404 | A1 | 12/2015 | Bak et al. | |
| 2016/0108161 | A1 | 4/2016 | Kaneko et al. | |
| 2017/0038507 | A1 | 2/2017 | Norizuki et al. | |

FOREIGN PATENT DOCUMENTS

| | | | |
|---|---|---|---|
| CN | 103779368 | A | 5/2014 |
| JP | 7-253639 | A | 10/1995 |
| JP | 2002-341161 | A | 11/2002 |
| JP | 2003-162053 | A1 | 6/2003 |
| JP | 2004-285296 | A | 10/2004 |
| JP | 2004-292507 | A | 10/2004 |
| JP | 2007-134439 | A | 5/2007 |
| JP | 2008-138022 | A | 6/2008 |
| JP | 2008-291072 | A | 12/2008 |
| JP | 2009-263614 | A | 11/2009 |
| JP | 2010-72575 | A | 4/2010 |
| JP | 2011-68731 | A | 4/2011 |
| JP | 2011-180306 | A | 9/2011 |
| JP | 2012-46708 | A | 3/2012 |
| JP | 2013-503527 | A | 1/2013 |
| JP | 2013-151675 | A | 8/2013 |
| JP | 2013-218312 | A | 10/2013 |
| JP | 2014-66987 | A | 4/2014 |
| JP | 2014-116741 | A | 6/2014 |
| JP | 2014-130343 | A | 7/2014 |
| JP | 2014-130344 | A | 7/2014 |
| JP | 2014-186342 | A | 10/2014 |
| JP | 2014-197170 | A | 10/2014 |
| JP | 2015-28144 | A | 2/2015 |
| JP | 2015-68945 | A | 4/2015 |
| WO | WO 2006/098334 | A1 | 9/2006 |
| WO | WO 2007/018065 | * | 2/2007 |
| WO | WO 2014/061188 | A1 | 1/2013 |
| WO | WO 2015/166873 | A1 | 11/2015 |

OTHER PUBLICATIONS

Japanese Decision of Refusal for Japanese Application No. 2017-521744, dated Feb. 5, 2019, with English translation.

Japanese Notification of Reasons for Refusal and English translation for Application No. 2017-521744, dated Aug. 7, 2018.

International Preliminary Report on Patentability and Written Opinion of the International Searching Authority (Forms PCT/IB/373 and PCT/ISA/237) for International Application No. PCT/JP2016/063233, dated Dec. 5, 2017.

International Search Report and Written Opinion of the International Searching Authority (Forms PCT/ISA/210 and PCT/ISA/237) for International Application No. PCT/JP2016/063233, dated Jul. 12, 2016, with English translations.

Chinese Office Action and Search Report, dated Mar. 8, 2019, for corresponding Chinese Application No. 201680028875.X., with an English translation of the Office Action.

Taiwanese Office Action and Search Report for corresponding Taiwanese Application No. 105114484, dated Aug. 27, 2019, with partial English translation of the Office Action.

Japanese Office Action, dated Feb. 25, 2020, for Japanese Application No. 2019-082585, with an English translation.

Japanese Office Action for corresponding Japanese Application No. 2017-521744, dated Mar. 17, 2020, with English translation.

Japanese Office Action dated May 26, 2020 in corresponding Japanese Patent Application No. 2019-082585, with English translation.

* cited by examiner

NEAR INFRARED ABSORBING COLORANT POLYMER, COMPOSITION, FILM, OPTICAL FILTER, PATTERN FORMING METHOD, AND DEVICE

CROSS-REFERENCE TO RELATED APPLICATIONS

This application is a Continuation of PCT International Application No. PCT/JP2016/063233 filed on Apr. 27, 2016, which claims priority under 35 U.S.C § 119(a) to Japanese Patent Application No. 2015-109887 filed on May 29, 2015 and Japanese Patent Application No. 2016-033094 filed on Feb. 24, 2016. Each of the above application(s) is hereby expressly incorporated by reference, in its entirety, into the present application.

BACKGROUND OF THE INVENTION

1. Field of the Invention

The present invention relates to a near infrared absorbing colorant polymer, a composition, a film, an optical filter, a pattern forming method, and a device.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, it is necessary to correct visibility using an infrared cut filter.

As the infrared cut filter, for example, a film including a near infrared absorbing colorant may be used. As the near infrared absorbing colorant, for example, a pyrrolopyrrole colorant is known (for example, JP2009-263614A).

On the other hand, JP2012-46708A discloses a colorant polymer having a colorant skeleton derived from a pyrromethene metal complex compound. Paragraph "0044" describes that a maximal absorption of the colorant polymer is preferably present in a range of 510 nm to 590 nm.

SUMMARY OF THE INVENTION

The pyrrolopyrrole colorant described in JP2009-263614A has an absorption in a near infrared range and has excellent invisibility.

On the other hand, recently, further improvement of solvent resistance and color transfer properties has been required for a film including a near infrared absorbing colorant.

JP2012-46708A relates to a colorant polymer for mainly manufacturing a blue color filter and neither describes nor implies a near infrared absorbing colorant.

Accordingly, an object of the present invention is to provide a near infrared absorbing colorant polymer with which a film having excellent solvent resistance and suppressed color transfer can be formed, a composition, a film, an optical filter, a pattern forming method, and a device.

As a result of various investigations, the present inventors found that the object can be achieved by forming a polymer using a near infrared absorbing colorant, thereby completing the present invention. The present invention provides the following.

<1> A near infrared absorbing colorant polymer that has a maximal absorption in a wavelength range of 700 to 1200 nm.

<2> The near infrared absorbing colorant polymer according to <1>, comprising:

at least one near infrared absorbing colorant structure selected from the group consisting of a pyrrolopyrrole colorant, a polymethine colorant, a diimonium colorant, a phthalocyanine colorant, a naphthalocyanine colorant, a rylene colorant, a dithiol complex colorant, a triarylmethane colorant, a pyrromethene colorant, an azomethine colorant, an anthraquinone colorant, and a dibenzofuranone colorant.

<3> The near infrared absorbing colorant polymer according to <1>, comprising:

at least one near infrared absorbing colorant structure selected from the group consisting of a pyrrolopyrrole colorant, a cyanine colorant, a squarylium colorant, a diimonium colorant, a phthalocyanine colorant, a naphthalocyanine colorant, and an oxonol colorant.

<4> The near infrared absorbing colorant polymer according to <2> or <3>, in which the near infrared absorbing colorant structure is a structure derived a compound represented by the following Formula (PP), (PP)

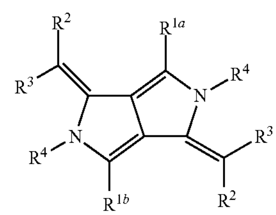

in Formula (PP), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a hydrogen atom or a substituent.

<5> The near infrared absorbing colorant polymer according to any one of <1> to <4>, in which the near infrared absorbing colorant polymer has a structure in which two or more near infrared absorbing colorant structures are bonded to a divalent or higher linking group.

<6> The near infrared absorbing colorant polymer according to any one of <1> to <4>, in which the near infrared absorbing colorant polymer comprises at least one selected from the group consisting of a repeating unit having a near infrared absorbing colorant structure at a side chain and a repeating unit having a near infrared absorbing colorant structure at a main chain.

<7> The near infrared absorbing colorant polymer according to any one of <1> to <4>, in which the near infrared absorbing colorant polymer comprises at least one selected from the group consisting of a repeating unit represented by the following Formula (A), a repeating unit represented by the following Formula (B), and a repeating unit represented by the following Formula (C), or is represented by the following Formula (D):

(A)

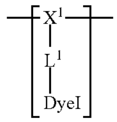

in Formula (A), $X^1$ represents a main chain of the repeating unit, $L^1$ represents a single bond or a divalent linking group, and DyeI represents a near infrared absorbing colorant structure;

(B)

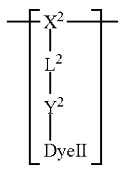

in Formula (B), $X^2$ represents a main chain of the repeating unit, $L^2$ represents a single bond or a divalent linking group, DyeII represents a near infrared absorbing colorant structure having a group capable of forming an ionic bond or a coordinate bond with $Y^2$, and $Y^2$ represents a group capable of forming an ionic bond or a coordinate bond with DyeII;

$$-\!\!\left[\mathrm{DyeIII}\!-\!(L^3)_m\right]\!\!- \quad \text{(C)}$$

in Formula (C), $L^3$ represents a single bond or a divalent linking group,

DyeIII represents a near infrared absorbing colorant structure, and m represents 0 or 1; and $$(\mathrm{DyeIV})_n\!-\!L^4\!-\!(P)_k \quad \text{(D)}$$

in Formula (D), $L^4$ represents an (n+k)-valent linking group, n represents an integer of 2 to 20, k represents an integer of 0 to 20, DyeIV represents a near infrared absorbing colorant structure, P represents a substituent, in a case where n represents 2 or more, a plurality of DyeIV's may be different from each other, in a case where k represents 2 or more, a plurality of P's may be different from each other, and n+k represents an integer of 2 to 20.

<8> The near infrared absorbing colorant polymer according to any one of <1> to <7> comprises a curable group.

<9> The near infrared absorbing colorant polymer according to <8>, in which the curable group is a radically polymerizable group.

<10> The near infrared absorbing colorant polymer according to any one of <1> to <9> comprises an acid group.

<11> A composition comprising:

the near infrared absorbing colorant polymer according to any one of <1> to <10>; and a solvent.

<12> The composition according to <11>, further comprising:

a curable compound and;

an alkali-soluble resin.

<13> The composition according to <12>, further comprising:

a photopolymerization initiator, in which the curable compound is a radically polymerizable compound.

<14> The composition according to any one of <11> to <13>, further comprising:

a coloring material that shields visible light.

<15> A film which is formed using the composition according to any one of <11> to <14>.

<16> An optical filter comprising:

the film according to <15>.

<17> The optical filter according to <16>, which is an infrared cut filter or an infrared transmitting filter.

<18> The optical filter according to <16> or <17> comprising:

a pixel of the film according to <15>; and at least one pixel selected from the group consisting of a red pixel, a green pixel, a blue pixel, a magenta pixel, a yellow pixel, a cyan pixel, a black pixel, and an achromatic pixel.

<19> A pattern forming method comprising:

forming a composition layer on a support using the composition according to any one of <11> to <14>; and forming a pattern on the composition layer using a photolithography method or a dry etching method.

<20> A device comprising:

the film according to <15>, in which the device is a solid image pickup element, an infrared sensor, or an image display device.

According to the present invention, a near infrared absorbing colorant polymer with which a film having excellent solvent resistance and suppressed color transfer can be formed, a composition, a film, an optical filter, a pattern forming method, and a device can be provided.

DESCRIPTION OF THE PREFERRED EMBODIMENTS

Figure 1:
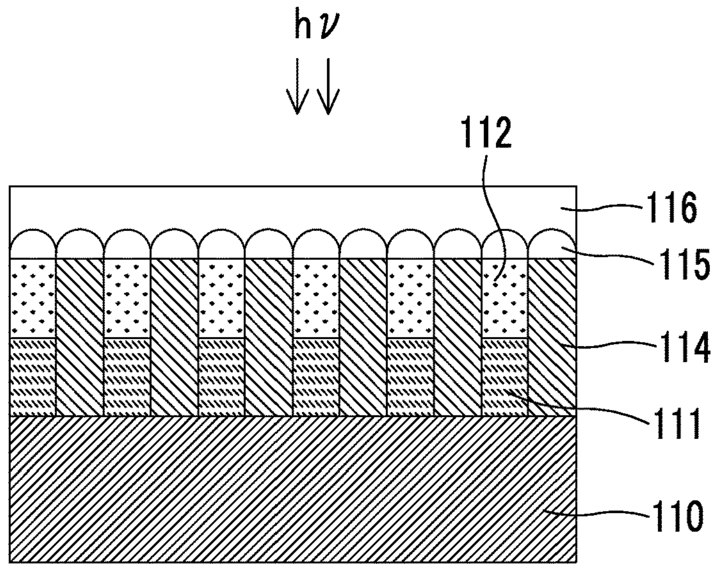
FIG. 1 is a schematic diagram showing an embodiment of an infrared sensor.

In this specification, "total solid content" denotes the total mass of all the components of a composition excluding a solvent. In addition, "solid content" denotes a solid content at 25° C.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light generally used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes either or both of acrylate or methacrylate, "(meth)acryl" denotes either or both of acryl and methacryl, and "(meth)acryloyl" denotes either or both of acryloyl and methacryloyl.

In this specification, in a chemical formula, Me represents a methyl group, Et represents an ethyl group, Pr represents a propyl group, Bu represents a butyl group, Ac represents an acetyl group, Bn represents a benzyl group, and Ph represents a phenyl group.

In this specification, the term "step" denotes not only an individual step but also a step which is not clearly distinguishable from another step as long as an effect expected from the step can be achieved.

In this specification, a weight-average molecular weight and a number-average molecular weight are defined as values in terms of polystyrene obtained by gel permeation chromatography (GPC).

<Near Infrared Absorbing Colorant Polymer>

A near infrared absorbing colorant polymer according to the present invention has a maximal absorption in a wavelength range of 700 to 1200 nm. The maximal absorption of the near infrared absorbing colorant polymer is preferably present in a wavelength range of 750 to 1200 nm and more preferably in a wavelength range of 750 to 1000 nm.

Even in a case where the near infrared absorbing colorant polymer according to the present invention is used in a molecular dispersion state (used as a dye) in which it is dissolved in a solvent, solvent resistance of a film can be improved. Further, the movement of the near infrared absorbing colorant polymer in the film can be suppressed, and color transfer can be effectively suppressed. In addition, an acid group or a polymerizable group may be introduced into a structure of the near infrared absorbing colorant polymer. For example, in a case where the near infrared absorbing colorant polymer includes an acid group, developability of a composition can be improved, and a film having a small residue and excellent pattern formability can be formed. In addition, in a case where the near infrared absorbing colorant polymer includes a polymerizable group, solvent resistance of a film can be further improved.

In the present invention, examples of the structure of the near infrared absorbing colorant polymer include structures such as a dimer, a trimer, and a polymer.

The near infrared absorbing colorant polymer according to the present invention may be a pigment or a dye and is preferably a dye. Even in a case where the near infrared absorbing colorant polymer according to the present invention is used as a dye, solvent resistance of a film can be improved, and color transfer can be suppressed. Therefore, the effects of the present invention are particularly significant.

In addition, it is preferable that the near infrared absorbing colorant polymer according to the present invention is a dye that is used after dissolved in a solvent. In this case, the near infrared absorbing colorant polymer may form particles, and these particles are typically used after dispersed in a solvent. The near infrared absorbing colorant polymer in the form of particles can be obtained by, for example, emulsion polymerization, and specific examples of a compound and a manufacturing method thereof are described in JP2015-214682A.

The near infrared absorbing colorant polymer according to the present invention has two or more near infrared absorbing colorant structures in one molecules and preferably has three or more near infrared absorbing colorant structures in one molecule. The upper limit is not particularly limited and may be 100 or less. The near infrared absorbing colorant structures in one molecule may be the same as or different from each other. In the present invention, different colorant structures denote not only colorant structures having different colorant skeletons but also colorant structures having the same colorant skeleton and different substituents bonded to the colorant skeleton.

<<Near Infrared Absorbing Colorant Structure (Colorant Structure)>>

The near infrared absorbing colorant polymer according to the present invention includes a near infrared absorbing colorant structure (hereinafter, also referred to as "colorant structure").

In the present invention, the near infrared absorbing colorant structure denotes a structure derived from a near infrared absorbing colorant. For example, a structure in which one or more arbitrary hydrogen atoms are removed from a near infrared absorbing colorant may be used. The maximal absorption of the near infrared absorbing colorant is present preferably in a wavelength range of 700 to 1200 nm, more preferably in a wavelength range of 750 to 1200 nm, and still more preferably in a wavelength range of 750 to 1000 nm.

It is preferable that the colorant structure is derived from at least one near infrared absorbing colorant (colorant compound) selected from the group consisting of a pyrrolopyrrole colorant, a polymethine colorant, a diimonium colorant, a phthalocyanine colorant, a naphthalocyanine colorant, a rylene colorant, a dithiol complex colorant, a triarylmethane colorant, a pyrromethene colorant, an azomethine colorant, an anthraquinone colorant, and a dibenzofuranone colorant. Examples of the polymethine colorant depending on the kind of an atomic group to be bonded include a cyanine colorant, a merocyanine colorant, a squarylium colorant, a croconium colorant, and an oxonol colorant. Among these, a cyanine colorant, a squarylium colorant, or an oxonol colorant is preferable, and a cyanine colorant or a squarylium colorant is more preferable.

In the present invention, it is preferable that the colorant structure is derived from at least one near infrared absorbing colorant (colorant compound) selected from the group consisting of a pyrrolopyrrole pigment, a cyanine colorant, a squarylium colorant, a diimonium colorant, a phthalocyanine colorant, a naphthalocyanine colorant, and an oxonol colorant, and it is more preferable that the colorant structure is derived from a pyrrolopyrrole colorant.

Hereinafter, the colorant structure which is preferably used in the present invention will be described in detail.

(Pyrrolopyrrole Colorant Structure)

In one aspect of the colorant structure used in the present invention, a structure (pyrrolopyrrole colorant structure) derived from a pyrrolopyrrole colorant is used. As the pyrrolopyrrole colorant structure, a structure derived from a compound represented by the following Formula (PP) is preferable.

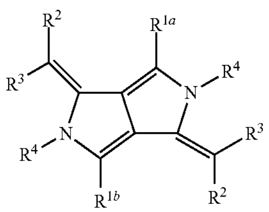

(PP)

In Formula (PP), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a hydrogen atom or a substituent.

The number of carbon atoms in the alkyl group represented by $R^{1a}$ and $R^{1b}$ is preferably 1 to 40, more preferably 1 to 30, and still more preferably 1 to 25. The alkyl group may be linear, branched, or cyclic and is preferably linear or branched and more preferably branched.

The number of carbon atoms in the aryl group represented by $R^{1a}$ and $R^{1b}$ is preferably 6 to 30, more preferably 6 to 20, and still more preferably 6 to 12. It is preferable that the aryl group is phenyl.

The heteroaryl group represented by $R^{1a}$ and $R^{1b}$ is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. The number of carbon atoms constituting the heteroaryl group is preferably 3 to 30, more preferably 3 to 18, still more preferably 3 to 12 and even still more preferably 3 to 10. It is preferable that the heteroaryl group is a 5- or 6-membered ring. Specific examples of the heteroaryl group include imidazolyl, pyridyl, quinolyl, furyl, thienyl, benzoxazolyl, benzimidazolyl, benzothiazolyl, naphthothiazolyl, m-carbazolyl, and azepinyl.

The alkyl group, the aryl group, and the heteroaryl group may have a substituent or may be unsubstituted. Examples of the substituent include a substituent group T described below, a group represented by Formula A, an anionic group, and a cationic group. Examples of the anionic group and the cationic group include groups described below regarding $Y^2$ of a colorant polymer (B).

It is preferable that the group represented by R1a and R1b is an aryl group having an alkoxy group (preferably a branched alkoxy group). The number of carbon atoms in the alkoxy group is preferably 3 to 30 and more preferably 3 to 20.

In Formula (PP), $R^{1a}$ and $R^{1b}$ may be the same as or different from each other.

$R^2$ and $R^3$ each independently represent a hydrogen atom or a substituent. $R^2$ and $R^3$ may be bonded to each other to form a ring. It is preferable that at least one of $R^2$ or $R^3$ represents an electron-withdrawing group. It is preferable that $R^2$ and $R^3$ each independently represent a cyano group or a heteroaryl group.

Examples of the substituent include the following substituent group T.

(Substituent Group T)

The substituent group T includes:

a halogen atom (for example, a fluorine atom, a chlorine atom, a bromine atom, or an iodine atom);

a linear or branched alkyl group (a linear or branched substituted or unsubstituted alkyl group, preferably an alkyl group having 1 to 30 carbon atoms; for example, methyl, ethyl, n-propyl, isopropyl, t-butyl, n-octyl, 2-chloroethyl, 2-cyanoethyl, or 2-ethylhexyl);

a cycloalkyl group (preferably, a substituted or unsubstituted cycloalkyl group having 3 to 30 carbon atoms (for example, cyclohexyl or cyclopentyl) or a polycycloalkyl group, for example, a bicycloalkyl group (preferably a substituted or unsubstituted bicycloalkyl group having 5 to 30 carbon atoms; for example, bicyclo[1,2,2]heptane-2-yl or bicyclo[2,2,2]octan-3-yl) or a tricycloalkyl group; as the cycloalkyl group, a monocycloalkyl group or a bicycloalkyl group is preferable, and a monocycloalkyl group is more preferable);

a linear or branched alkenyl group (a linear or branched substituted or unsubstituted alkenyl group, preferably, an alkenyl group having 2 to 30 carbon atoms; for example, vinyl, allyl, prenyl, geranyl, or oleyl);

a cycloalkenyl group (preferably, a substituted or unsubstituted cyclic cycloalkyl group having 3 to 30 carbon atoms (for example, 2-cyclopenten-1-yl or 2-cyclohexen-1-yl) or a polycycloalkenyl group, for example, a bicycloalkenyl group (preferably a substituted or unsubstituted bicycloalkenyl group having 5 to 30 carbon atoms; for example, bicyclo[2,2,1]hept-2-en-1-yl or bicyclo[2,2,2]oct-2-en-4-yl) or a tricycloalkenyl group; as the cycloalkenyl group, a monocycloalkenyl group is preferable), and an alkynyl group (preferably a substituted or unsubstituted alkynyl group having 2 to 30 carbon atoms; for example, ethynyl, propargyl, or trimethylsilylethynyl group);

an aryl group (preferably a substituted or unsubstituted aryl group having 6 to 30 carbon atoms; for example, phenyl, p-tolyl, naphthyl, m-chlorophenyl, or o-hexadecanoylaminophenyl);

a heteroaryl group (preferably a substituted or unsubstituted and monocyclic or fused heteroaryl group having 5 to 7 carbon atoms, more preferably a heteroaryl group having a ring-constituting atom selected from a carbon atom, a nitrogen atom, and a sulfur atom and having at least one heteroatom selected from a nitrogen atom, an oxygen atom, and a sulfur atom, and still more preferably a 5-membered or 6-membered heteroaryl group having 3 to 30 carbon atoms);

a cyano group;

a hydroxyl group;

a nitro group;

a carboxyl group (in which a hydrogen atom may be dissociable (that is, a carbonate group), or may be in the form of a salt);

an alkoxy group (preferably a substituted or unsubstituted alkoxy group alkoxy group having 1 to 30 carbon atoms; for example, methoxy, ethoxy, isopropoxy, t-butoxy, n-octyloxy, or 2-methoxyethoxy);

an aryloxy group (preferably a substituted or unsubstituted aryloxy group having 6 to carbon atoms; for example, phenoxy, 2-methylphenoxy, 2,4-di-t-amylphenoxy, 4-t-butylphenoxy, 3-nitrophenoxy, or 2-tetradecanoylaminophenoxy);

a silyloxy group (preferably a silyloxy group having 3 to 20 carbon atoms; for example, trimethylsilyloxy or t-butyldimethylsilyloxy);

a heteroaryloxy group (preferably a substituted or unsubstituted heteroaryloxy group having 2 to 30 carbon atoms in which a heteroaryl portion is preferably configured as described above regarding the heteroaryl group; for example, 1-phenyltetrazole-5-oxy or 2-tetrahydropyranyloxy);

an acyloxy group (preferably a substituted or unsubstituted alkylcarbonyloxy group having 2 to 30 carbon atoms, or a substituted or unsubstituted arylcarbonyloxy group having 6 to 30 carbon atoms; for example, formyloxy, acetyloxy, pivaloyloxy, stearoyloxy, benzoyloxy, or p-methoxyphenylcarbonyloxy);

a carbamoyloxy group (preferably a substituted or unsubstituted carbamoyloxy group having 1 to 30 carbon atoms; for example, N,N-dimethylcarbamoyloxy, N,N-diethylcarbamoyloxy, morpholinocarbonyloxy, N,N-di-n-octylaminocarbonyloxy, or N-n-octylcarbamoyloxy);

an alkoxycarbonyloxy group (preferably a substituted or unsubstituted alkoxycarbonyloxy group having 2 to 30 carbon atoms; for example, methoxycarbonyloxy, ethoxycarbonyloxy, t-butoxycarbonyloxy, or n-octylcarbonyloxy);

an aryloxycarbonyloxy group (preferably a substituted or unsubstituted aryloxycarbonyloxy group having 7 to 30 carbon atoms; for example, phenoxycarbonyloxy, p-methoxyphenoxycarbonyloxy, or p-n-hexadecyloxyphenoxycarbonyloxy);

an amino group (preferably an amino group, a substituted or unsubstituted alkylamino group having 1 to 30 carbon atoms, a substituted or unsubstituted arylamino group having 6 to 30 carbon atoms, or a heteroarylamino group having 0 to 30 carbon atoms; for example, amino, methylamino, dimethylamino, anilino, N-methyl-anilino, diphenylamino, or N-1,3,5-triazin-2-yl-amino);

an acylamino group (preferably a substituted or unsubstituted alkylcarbonylamino group having 1 to 30 carbon atoms, or a substituted or unsubstituted arylcarbonylamino group having 6 to 30 carbon atoms; for example, formylamino, acetylamino, pivaloylamino, lauroylamino, benzoylamino, or 3,4,5-tri-n-octyloxyphenylcarbonylamino);

an aminocarbonylamino group (preferably a substituted or unsubstituted aminocarbonylamino group having 1 to 30 carbon atoms; for example, carbamoylamino, N,N-dimethylaminocarbonylamino, N,N-diethylaminocarbonylamino, or morpholinocarbonylamino);

an alkoxycarbonylamino group (preferably a substituted or unsubstituted alkoxycarbonylamino group having 2 to 30 carbon atoms; for example, methoxycarbonylamino, ethoxycarbonylamino, t-butoxycarbonylamino, n-octadecyloxycarbonylamino, or N-methyl-methoxycarbonylamino);

an aryloxycarbonylamino group (preferably a substituted or unsubstituted aryloxycarbonylamino group having 7 to 30 carbon atoms; for example, phenoxycarbonylamino, p-chlorophenoxycarbonylamino, or m-n-octyloxyphenoxy carbonylamino);

a sulfamoylamino group (preferably a substituted or unsubstituted sulfamoylamino group having 0 to 30 carbon atoms; for example, sulfamoylamino, N,N-dimethylaminosulfonylamino, or N-n-octylaminosulfonylamino);

an alkyl- or aryl-sulfonylamino group (preferably a substituted or unsubstituted alkylsulfonylamino group having 1 to 30 carbon atoms or a substituted or unsubstituted arylsulfonylamino group having 6 to 30 carbon atoms; for example, methylsulfonylamino, butylsulfonylamino, phenylsulfonylamino, 2,3,5-trichlorophenylsulfonylamino, or p-methylphenylsulfonylamino);

a mercapto group;

an alkylthio group (preferably a substituted or unsubstituted alkylthio group having 1 to 30 carbon atoms; for example, methylthio, ethylthio, or n-hexadecylthio);

an arylthio group (preferably a substituted or unsubstituted arylthio group having 6 to 30 carbon atoms; for example, phenylthio, p-chlorophenylthio, or m-methoxyphenylthio);

a heteroarylthio group (preferably a substituted or unsubstituted heteroarylthio group having 2 to 30 carbon atoms in which a heteroaryl portion is preferably configured as described above regarding the heteroaryl group; for example, 2-benzothiazolylthio or 1-phenyltetrazole-5-ylthio), a sulfamoyl group (preferably a substituted or unsubstituted sulfamoyl group having 0 to 30 carbon atoms; for example, N-ethylsulfamoyl, N-(3-dodecyloxypropyl)sulfamoyl, N,N-dimethylsulfamoyl, N-acetylsulfamoyl, N-benzoylsulfamoyl, or N—(N'-phenylcarbamoyl)sulfamoyl);

a sulfo group (in which a hydrogen atom may be dissociable (that is, a sulfonate group), or may be in the form of a salt);

an alkyl- or aryl-sulfinyl group (preferably a substituted or unsubstituted alkylsulfinyl group having 1 to 30 carbon atoms or a substituted or unsubstituted arylsulfinyl group having 6 to 30 carbon atoms; for example, methylsulfinyl, ethylsulfinyl, phenylsulfinyl, or p-methylphenylsulfinyl);

an alkyl- or aryl-sulfonyl group (preferably a substituted or unsubstituted alkylsulfonyl group having 1 to 30 carbon atoms or a substituted or unsubstituted arylsulfonyl group having 6 to 30 carbon atoms; for example, methylsulfonyl, ethylsulfonyl, phenylsulfonyl, or p-methylphenylsulfonyl);

an acyl group (preferably a formyl group, a substituted or unsubstituted alkylcarbonyl group having 2 to 30 carbon atoms, or a substituted or unsubstituted arylcarbonyl group having 7 to 30 carbon atoms; for example, acetyl, pivaloyl, 2-chloroacetyl, stearoyl, benzoyl, or p-n-octyloxyphenylcarbonyl);

an aryloxycarbonyl group (preferably a substituted or unsubstituted aryloxycarbonyl group having 7 to 30 carbon atoms; for example, phenoxycarbonyl, o-chlorophenoxycarbonyl, m-nitrophenoxycarbonyl, or p-t-butylphenoxycarbonyl);

an alkoxycarbonyl group (preferably a substituted or unsubstituted alkoxycarbonyl group having 2 to 30 carbon atoms; for example, methoxycarbonyl, ethoxycarbonyl, t-butoxycarbonyl, or n-octadecyloxycarbonyl);

a carbamoyl group (preferably a substituted or unsubstituted carbamoyl group having 1 to 30 carbon atoms; for example, carbamoyl, N-methylcarbamoyl, N,N-dimethylcarbamoyl, N,N-di-n-octylcarbamoyl, or N-(methylsulfonyl)carbamoyl);

an aryl- or heteroaryl-azo group (preferably a substituted or unsubstituted aryl azo group having 6 to 30 carbon atoms or a substituted or unsubstituted heteroarylazo group having 3 to 30 carbon atoms (in which a heteroaryl portion is preferably configured as described above regarding the heteroaryl group); for example, phenylazo, p-chlorophenylazo, or 5-ethylthio-1,3,4-thiadiazol-2-ylazo);

an imido group (preferably a substituted or unsubstituted imido group having 2 to 30 carbon atoms; for example, N-succinimido or N-phthalimido);

a phosphino group (preferably a substituted or unsubstituted phosphino group having 2 to 30 carbon atoms; for example, dimethylphosphino, diphenylphosphino, or methylphenoxyphosphino);

a phosphinyl group (preferably a substituted or unsubstituted phosphinyl group having 2 to 30 carbon atoms; for example, dioctyloxyphosphinyl, or diethoxyphosphinyl);

a phosphinyloxy group (preferably a substituted or unsubstituted phosphinyloxy group having 2 to 30 carbon atoms; for example, diphenoxyphosphinyloxy or dioctyloxyphosphinyloxy);

a phosphinylamino group (preferably a substituted or unsubstituted phosphinylamino group having 2 to 30 carbon atoms; for example, dimethoxyphosphinylamino or dimethylaminophosphinylamino); and a silyl group (preferably a substituted or unsubstituted silyl group having 3 to 30 carbon atoms; for example, trimethylsilyl, t-butyldimethylsilyl, or phenyldimethylsilyl).

In a case where the above-described groups can be further substituted, the groups may further have a substituent. Examples of the substituent include the groups described above regarding the substituent group T, a group represented by the following Formula A, an anionic group, and a cationic group.

$$-L^1-X^1 \qquad A:$$

In Formula A, $L^1$ represents a single bond or a divalent linking group, and $X^1$ represents a (meth)acryloyl group, an epoxy group, an oxetanyl group, an isocyanate group, a hydroxyl group, an amino group, a carboxyl group, a thiol group, an alkoxysilyl group, a methylol group, a vinyl group, a (meth)acrylamide group, a sulfo group, a styryl group, or a maleimide group.

In a case where $L^1$ represents a divalent linking group, it is preferable that $L^1$ represents an alkylene group having 1 to 20 carbon atoms, an arylene group having 6 to 18 carbon atoms, a heteroarylene group having 3 to 18 carbon atoms, —O—, —S—, —C(═O)—, or a group of a combination of the above-described groups.

It is more preferable that $X^1$ represents one or more groups selected from the group consisting of a (meth) acryloyl group, a vinyl group, an epoxy group, and an oxetanyl group, and it is still more preferable that $X^1$ represents a (meth)acryloyl group.

It is preferable that at least one of $R^2$ or $R^3$ represents an electron-withdrawing group. A substituent having a positive Hammett sigma para value (σp value) functions as an electron-withdrawing group.

In the present invention, a substituent having a Hammett σp value of 0.2 or higher can be used as an example of the electron-withdrawing group. The σp value is preferably 0.25 or higher, more preferably 0.3 or higher, and still more preferably 0.35 or higher. The upper limit is not particularly limited and is preferably 0.8 or lower.

Specific examples of the substituent having a Hammett σp value of 0.2 or higher include a cyano group (0.66), a carboxyl group (—COOH: 0.45), an alkoxycarbonyl group (—COOMe: 0.45), an aryloxycarbonyl group (—COOPh: 0.44), a carbamoyl group ($—CONH_2$: 0.36), an alkylcarbonyl group (—COMe: 0.50), an arylcarbonyl group (—COPh: 0.43), an alkylsulfonyl group ($—SO_2Me$: 0.72), and an arylsulfonyl group (for example, $—SO_2Ph$: 0.68).

In particular, a cyano group is preferable. Here, Me represents a methyl group, and Ph represents a phenyl group.

The details of the Hammett substituent constant σ value can be found in paragraphs "0017" and "0018" of JP2011-68731A, the content of which is incorporated herein by reference.

In a case where $R^2$ and $R^3$ are bonded to each other to form a ring, it is preferable that the formed ring is a 5- to 7-membered (preferably 5- or 6-membered) ring which is typically used as an acid nucleus in a merocyanine colorant. Specific examples include a structure described in paragraph "0026" of JP2009-263614A, and the content of which is incorporated herein by reference.

The σp values of $R^2$ and $R^3$ which form the ring cannot be defined. However, in this present invention, assuming that each of $R^2$ and $R^3$ is substituted with a partial ring structure, the σp values of $R^2$ and $R^3$ which form the ring are defined. For example, in a case where $R^2$ and $R^3$ form a 1,3-indanedione ring, each of $R^2$ and $R^3$ is substituted with a benzoyl group.

It is preferable that the ring which is formed by $R^2$ and $R^3$ being bonded to each other is a 1,3-dicarbonyl nucleus, a pyrazolinone nucleus, a 2,4,6-triketohexahydropyrimidine nucleus (including a thioketone form), a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus, a 2-imidazolin-5-one nucleus, a 3,5-pyrazolidinedione nucleus, a benzothiophen-3-one nucleus, or an indanone nucleus. It is more preferable that the ring which is formed by $R^2$ and $R^3$ being bonded to each other is a 1,3-dicarbonyl nucleus, a 2,4,6-triketohexahydropyrimidine nucleus (including a thioketone form), a 3,5-pyrazolidinedione nucleus, a benzothiophen-3-one nucleus, or an indanone nucleus.

It is more preferable that $R^3$ represents a heteroaryl group. It is preferable that the heteroaryl group is a 5- or 6-membered ring. In addition, the heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3 and more preferably 1 or 2. Examples of a heteroatom include a nitrogen atom, an oxygen atom, and a sulfur atom. The heteroaryl group is preferably a quinoline group, a benzothiazole group, or a naphthothiazol group, and is more preferably a benzothiazole group. The heteroaryl group may have a substituent or may be unsubstituted. Examples of the substituent include the above-described substituent group T.

In Formula (PP), two $R^2$'s may be the same as or different from each other, and two $R^3$'s may be the same as or different from each other.

In a case where $R^4$ represents an alkyl group, an aryl group, or a heteroaryl group, the alkyl group, the aryl group, and the heteroaryl group represented by $R^4$ have the same definitions and the same preferable ranges as those described regarding $R^{1a}$ and $R^{1b}$.

In a case where $R^4$ represents $—BR^{4A}R^{4B}$, $R^{4A}$ and $R^{4B}$ each independently represent a hydrogen atom or a substituent and may be bonded to each other to form a ring. Examples of the substituent represented by $R^{4A}$ and $R^{4B}$ include the above-described substituent group T. In particular, a halogen atom, an alkyl group, an alkoxy group, an aryl group, or a heteroaryl group is preferable, an alkyl group, an aryl group, or a heteroaryl group is more preferable, and an aryl group is still more preferable. Specific examples of the group represented by $—BR^{4A}R^{4B}$ include difluoroboron, diphenylboron, dibutylboron, dinaphthylboron, and catecholboron. In particular, diphenylboron is preferable.

In a case where $R^4$ represents a metal atom, examples of the metal atom include magnesium, aluminum, calcium, barium, zinc, tin, vanadium, iron, cobalt, nickel, copper, palladium, iridium, platinum. In particular, aluminum, zinc, vanadium, iron, copper, palladium, iridium, or platinum is preferable.

$R^4$ may form a covalent bond or a coordinate bond with at least one selected from the group consisting of $R^{1a}$, $R^{1b}$, and $R^3$. In particular, it is preferable that $R^4$ and $R^3$ form a coordinate bond.

It is preferable that $R^4$ represents a hydrogen atom or a group (in particular, diphenylboron) represented by —$BR^{4A}R^{4B}$.

In Formula (PP), two $R^4$'s may be the same as or different from each other.

It is preferable that the compound represented by Formula (PP) is bonded to another site of the near infrared absorbing colorant polymer through any site of $R^{1a}$, $R^{1b}$, $R^2$, $R^3$, and $R^4$.

Specific examples of the compound represented by Formula (PP) include a compound described in paragraphs "0049" to "0058" of JP2009-263614A and a compound derived from a colorant structure included in specific examples of the near infrared absorbing colorant polymer described below.

(Squarylium Colorant Structure)

In one aspect of the colorant structure used in the present invention, a structure (squarylium colorant structure) derived from a squarylium colorant is used. As the squarylium colorant structure, a structure derived from a compound represented by the following Formula (SQ) is preferable.

(SQ)

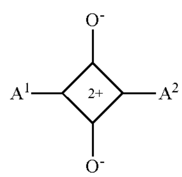

In Formula (SQ), $A^1$ and $A^2$ each independently represent an aryl group, a heterocyclic group, or a group represented by the following Formula (Ax).

(Ax)

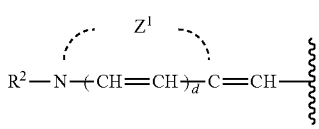

In Formula (Ax), $Z^1$ represents a non-metal atomic group which forms a nitrogen-containing heterocycle, $R^2$ represents an alkyl group, an alkenyl group, or an aralkyl group, d represents 0 or 1, and a wave line represents a direct bond to Formula (SQ).

In Formula (SQ), $A^1$ and $A^2$ each independently represent an aryl group, a heterocyclic group, or a group represented by the following Formula (Ax), and preferably a group represented by Formula (Ax).

The number of carbon atoms in the aryl group represented by $A^1$ and $A^2$ is preferably 6 to 48, more preferably 6 to 24, and still more preferably 6 to 12. Specific examples include a phenyl group and a naphthyl group. In a case where the aryl group has a substituent, the number of carbon atoms in the aryl group denotes the number of carbon atoms excluding the number of carbon atoms in the substituent.

It is preferable that the heterocyclic group represented by $A^1$ and $A^2$ is a 5- or 6-membered ring. In addition, the heterocyclic group is preferably a monocycle or a fused ring, more preferably a monocycle or a fused ring composed of 2 to 8 rings, still more preferably a monocycle or a fused ring composed of 2 to 4 rings, and even still more preferably a monocycle or a fused ring composed of 2 or 3 rings. Examples of a heteroatom included in the heterocyclic group include a nitrogen atom, an oxygen atom, and a sulfur atom. Among these, a nitrogen atom or a sulfur atom is preferable.

The number of heteroatoms is preferably 1 to 3 and more preferably 1 or 2. Specific examples include a heterocyclic group derived from a monocycle or a polycyclic aromatic ring such as a 5- or 6-membered ring containing at least one of a nitrogen atom, an oxygen atom, or a sulfur atom.

The aryl group and the heterocyclic group may have a substituent. Examples of the substituent include the groups described above regarding the substituent group T, the group represented by Formula A, an anionic group, and a cationic group.

A substituent which may be included in the aryl group and the heterocyclic group is preferably a halogen atom, an alkyl group, a hydroxy group, an amino group, or an acylamino group.

The halogen atom is preferably a chlorine atom.

The number of carbon atoms in the alkyl group is preferably 1 to 20, more preferably 1 to 10, still more preferably 1 to 5, and most preferably 1 to 4. The alkyl group is preferably linear or branched.

The amino group is preferably a group represented by —$NR^{100}R^{101}$. $R^{100}$ and $R^{101}$ each independently represent a hydrogen atom or an alkyl group having 1 to 30 carbon atoms. The number of carbon atoms in the alkyl group is preferably 1 to 30, more preferably 1 to 20, still more preferably 1 to 10, and most preferably 1 to 8. The alkyl group is preferably linear or branched and more preferably linear.

The acylamino group is preferably a group represented by —$NR^{102}$—C(═O)—$R^{103}$. $R^{102}$ represents a hydrogen atom or an alkyl group and preferably a hydrogen atom. $R^{103}$ represents an alkyl group. The number of carbon atoms in the alkyl group represented by $R^{102}$ and $R^{103}$ is preferably 1 to 20, more preferably 1 to 10, still more preferably 1 to 5, and even still more preferably 1 to 4.

In a case where the aryl group and the heterocyclic group have two or more substituents, the substituents may be the same as or different from each other.

Next, the group represented by Formula (Ax) which is represented by $A^1$ and $A^2$ will be described.

In Formula (Ax), $R^2$ represents an alkyl group, an alkenyl group, or an aralkyl group and preferably an alkyl group.

The number of carbon atoms in the alkyl group is preferably 1 to 30, more preferably 1 to 20, still more preferably 1 to 12, and most preferably 2 to 8.

The number of carbon atoms in the alkenyl group is preferably 2 to 30, more preferably 2 to 20, and still more preferably 2 to 12.

The alkyl group and the alkenyl group may be linear, branched, or cyclic and is preferably linear or branched.

The number of carbon atoms in the aralkyl group is preferably 7 to 30 and more preferably 7 to 20.

In Formula (Ax), the nitrogen-containing heterocycle formed by $Z^1$ is preferably a 5- or 6-membered ring. In addition, the nitrogen-containing heterocycle is preferably a monocycle or a fused ring, more preferably a monocycle or a fused ring composed of 2 to 8 rings, still more preferably a monocycle or a fused ring composed of 2 to 4 rings, and even still more preferably a fused ring composed of 2 or 3 rings. In addition to a nitrogen atom, the nitrogen-containing heterocycle may include a sulfur atom. In addition, the nitrogen-containing heterocycle may have a substituent. Examples of the substituent include the groups described above regarding the substituent group T, the group represented by Formula A, an anionic group, and a cationic group. For example, a halogen atom, an alkyl group, a hydroxy group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

It is preferable that the group represented by Formula (Ax) is a group represented by the following Formula (Ax-1) or (Ax-2).

(Ax-1)

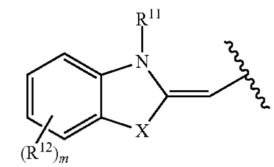

(Ax-2)

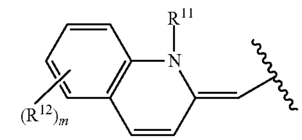

In Formulae (Ax-1) and (Ax-2), $R^1$ represents an alkyl group, an alkenyl group, or an aralkyl group, $R^{12}$ represents a substituent, in a case where m represents 2 or more, $R^{12}$'S may be linked to each other to form a ring, X represents a nitrogen atom or $CR^{13}R^{14}$, $R^{13}$ and $R^{14}$ each independently represent a hydrogen atom or a substituent, m represents an integer of 0 to 4, and a wave line represents a direct bond to Formula (SQ).

$R^1$ in Formulae (Ax-1) and (Ax-2) has the same definition and the same preferable range as $R^2$ in Formula (Ax).

$R^{12}$ in Formulae (Ax-1) and (Ax-2) represents a substituent. Examples of the substituent include the groups described above regarding the substituent group T, the group represented by Formula A, an anionic group, and a cationic group. For example, a halogen atom, an alkyl group, a hydroxy group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

In a case where m represents 2 or more, $R^{12}$'s may be linked to each other to form a ring. Examples of the ring include an alicyclic ring (a nonaromatic hydrocarbon ring), an aromatic ring, and a heterocycle. The ring may be a monocycle or a polycycle. In a case where substituents are linked to each other to form a ring through a linking group, for example, the linking group may be a divalent linking group selected from the group consisting of —CO—, —O—, —NH—, a divalent aliphatic group, a divalent aromatic group, and a combination thereof. For example, it is preferable that $R^{12}$'s may be linked to each other to form a benzene ring.

In Formula (Ax-1), X represents a nitrogen atom or $CR^{13}R^{14}$, and $R^{13}$ and $R^{14}$ each independently represent a hydrogen atom or a substituent. Examples of the substituent include the groups described above regarding the substituent group T, the group represented by Formula A, an anionic group, and a cationic group. For example, an alkyl group is preferable. The number of carbon atoms in the alkyl group is preferably 1 to 20, more preferably 1 to 10, still more preferably 1 to 5, even still more preferably 1 to 3, and most preferably 1. The alkyl group is preferably linear or branched and more preferably linear.

m represents an integer of 0 to 4 and preferably 0 to 2.

It is preferable that the compound represented by Formula (SQ) is bonded to another site of the near infrared absorbing colorant polymer through any site of $A^1$ and $A^2$.

Specific examples of the compound represented by Formula (SQ) include compounds shown below and a compound derived from a colorant structure included in specific examples of the near infrared absorbing colorant polymer described below.

Q-1

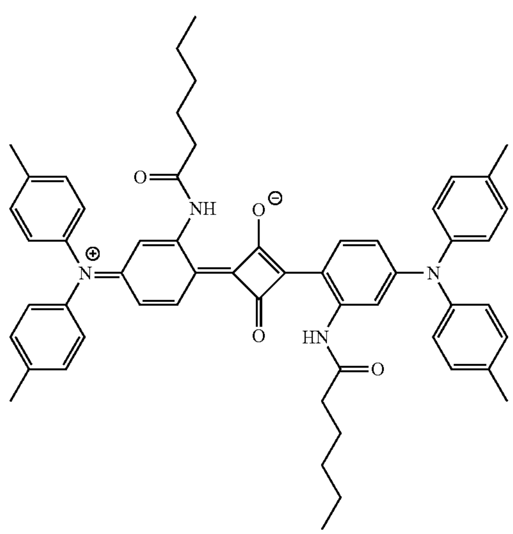

Q-2

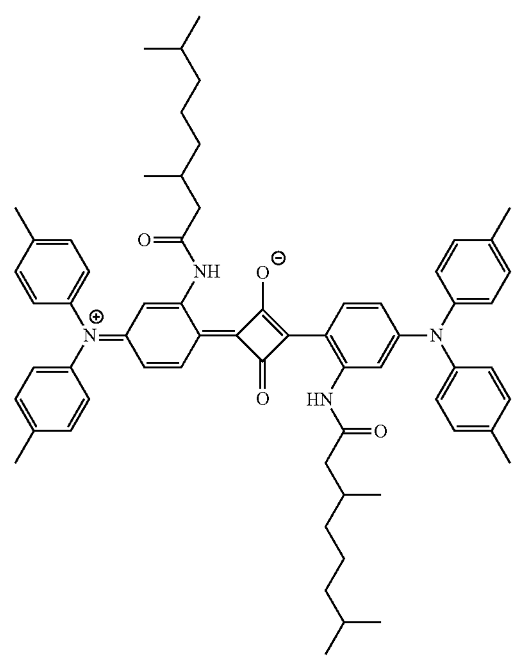

-continued
Q-3
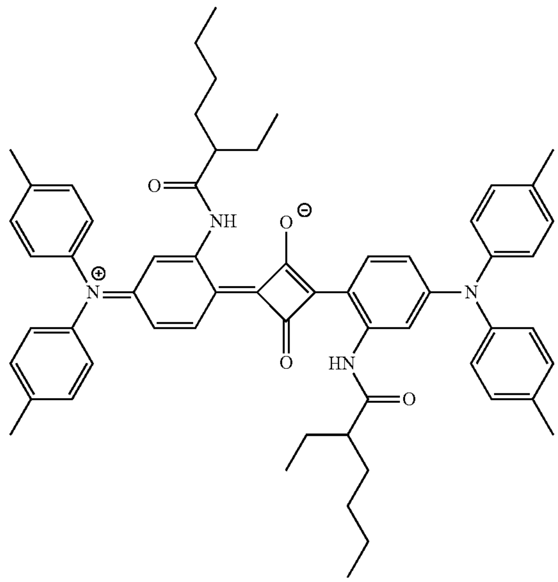
Q-4
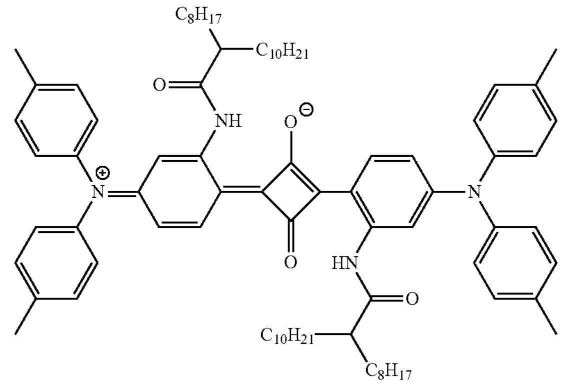
Q-5
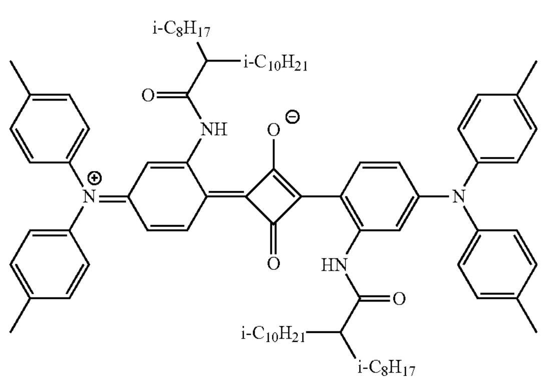
Q-6
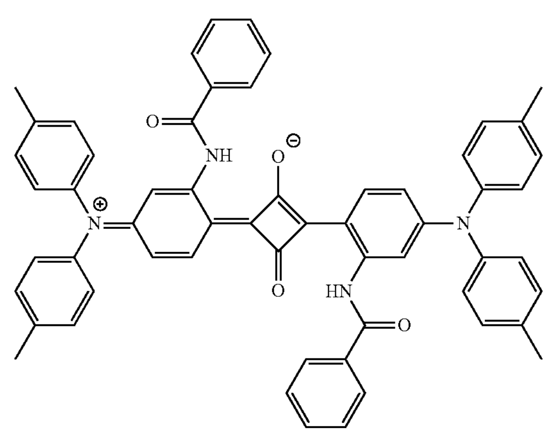

-continued
Q-7
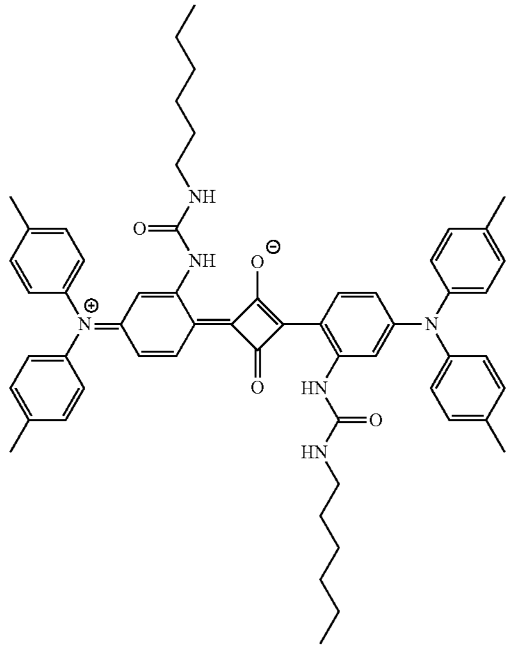
Q-8
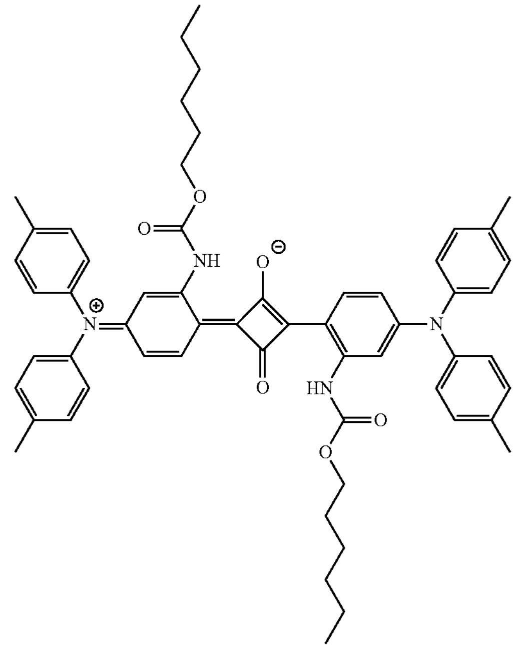
Q-9
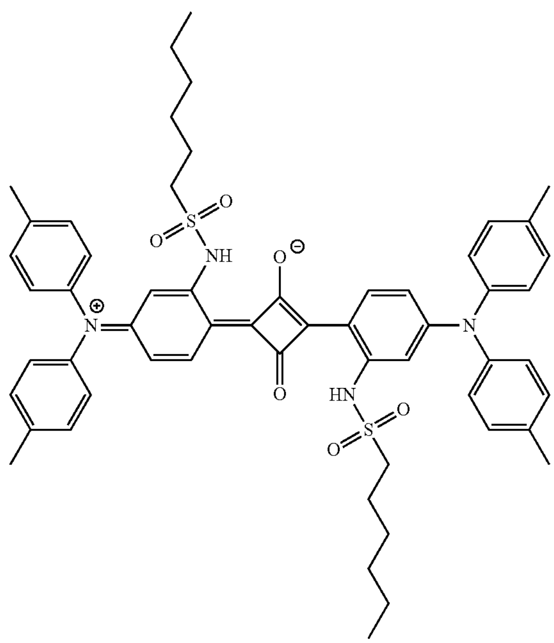
Q-10
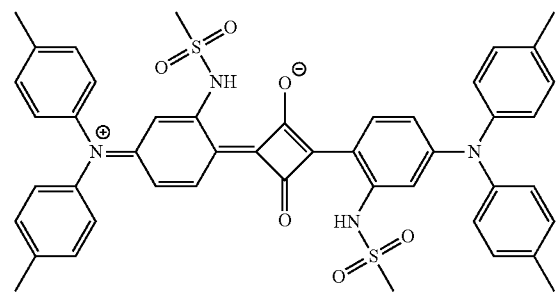
Q-11
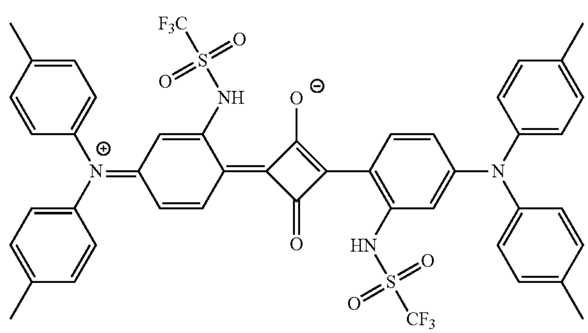

-continued
Q-12
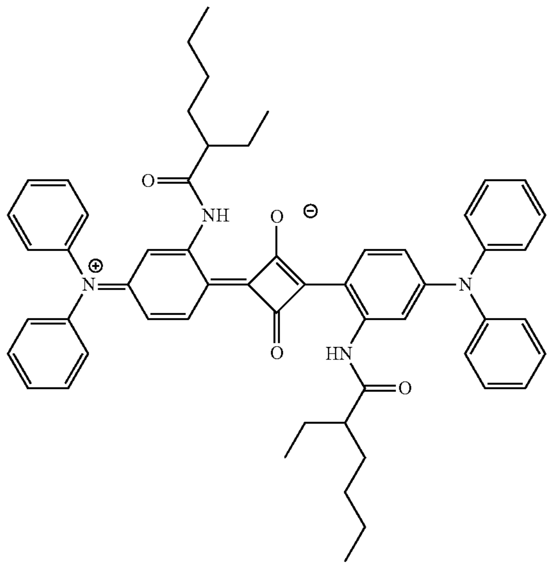
Q-13
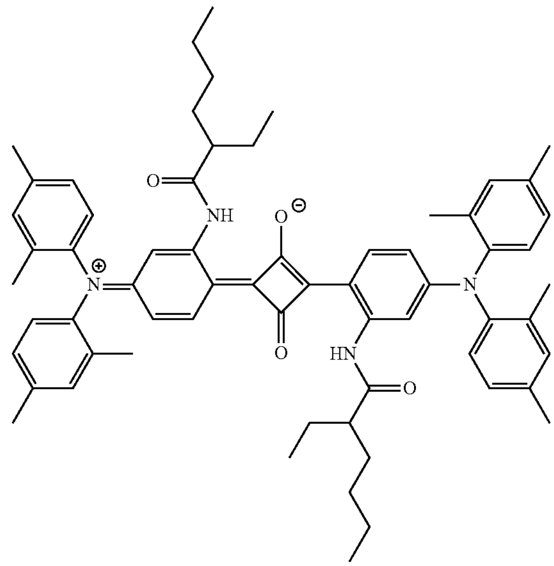
Q-14
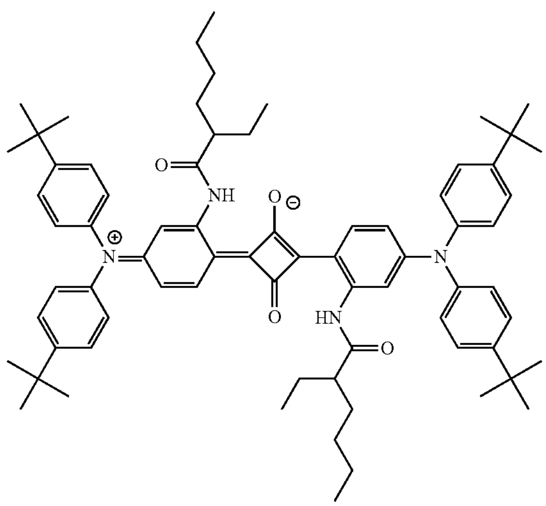
Q-15
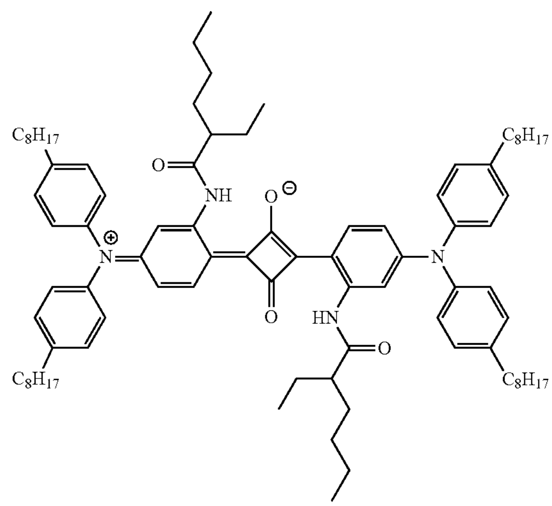
Q-16
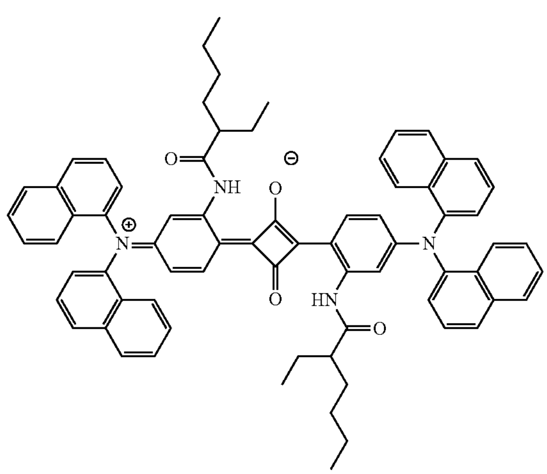
Q-17
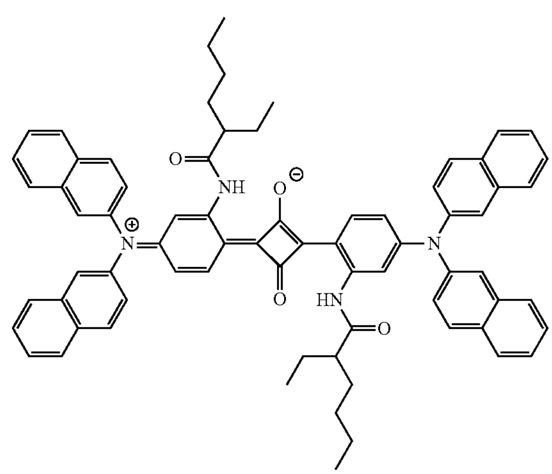

-continued
Q-18
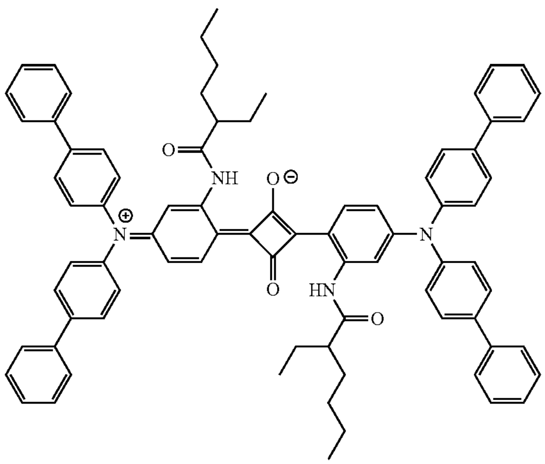
Q-19
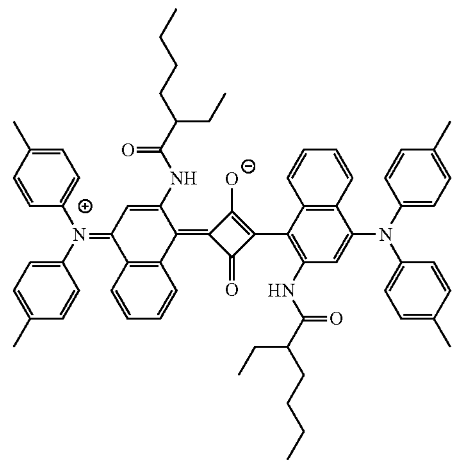
Q-20
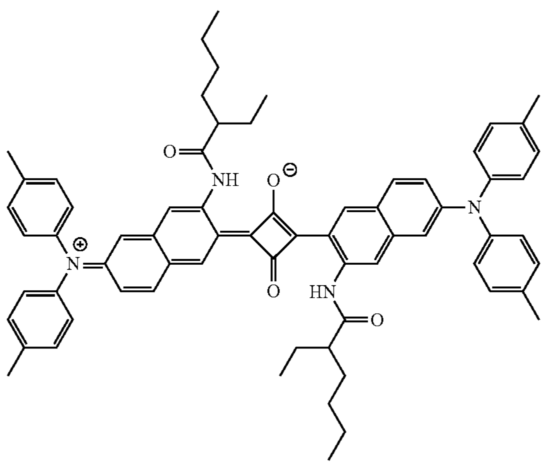
Q-21
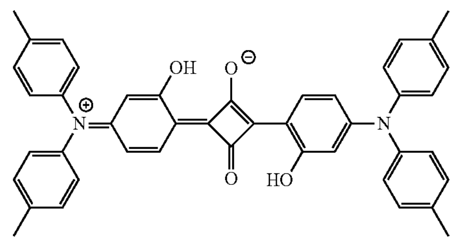
Q-22
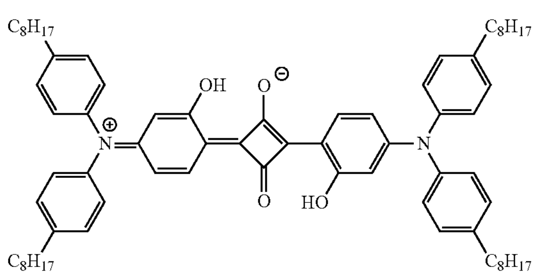
Q-23
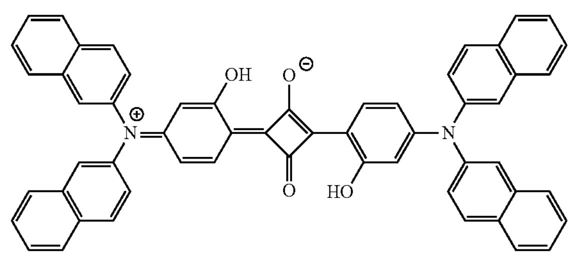
Q-24
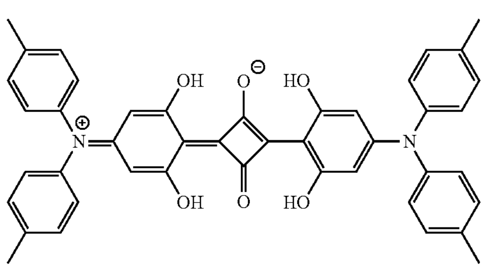
Q-25
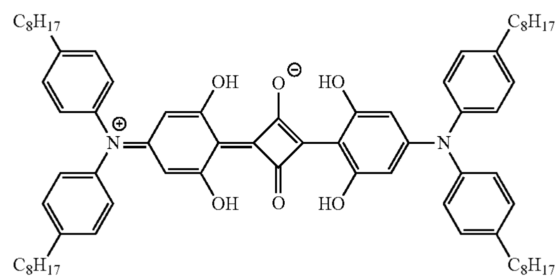

-continued
Q-26
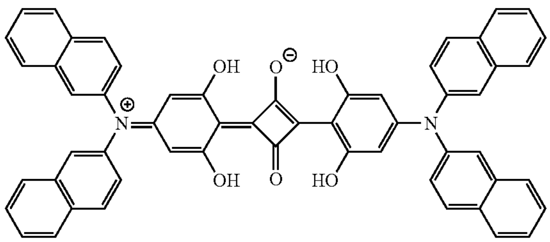
Q-27
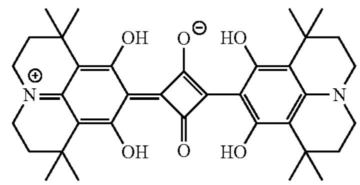
Q-28
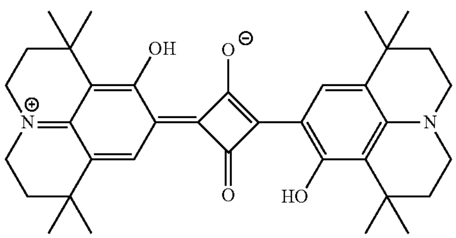
Q-29
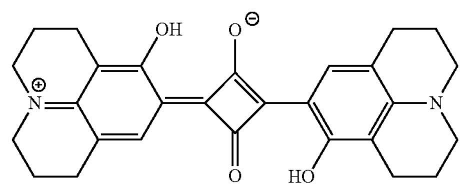
Q-30
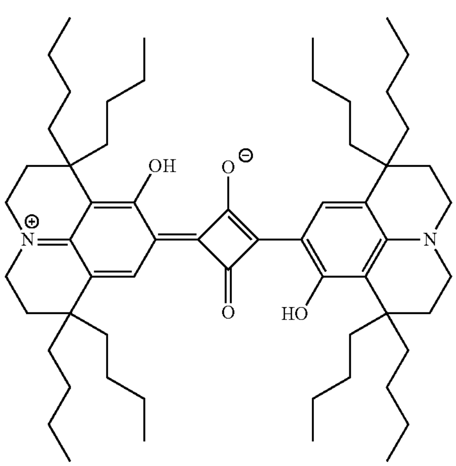
Q-31
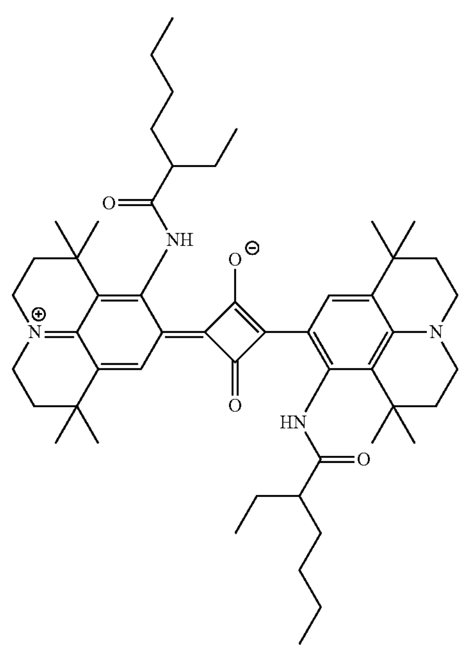

-continued
Q-32
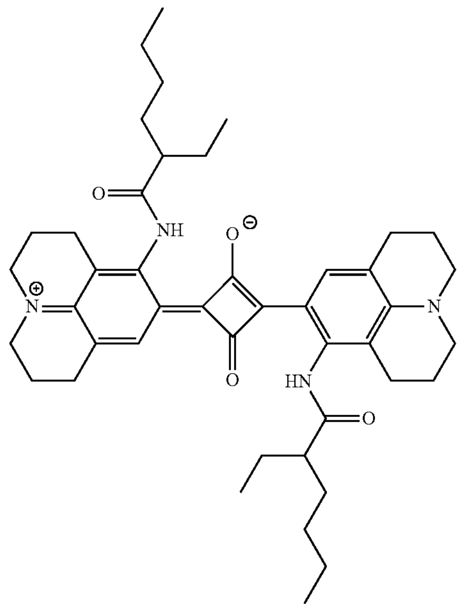
Q-33
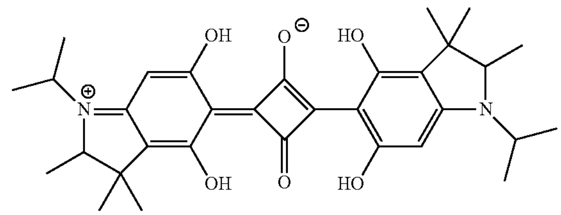
Q-34
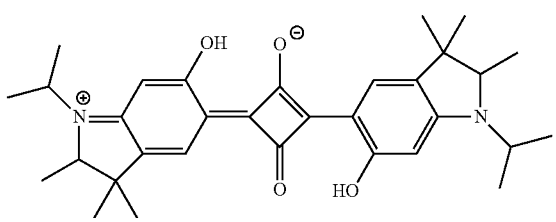
Q-35
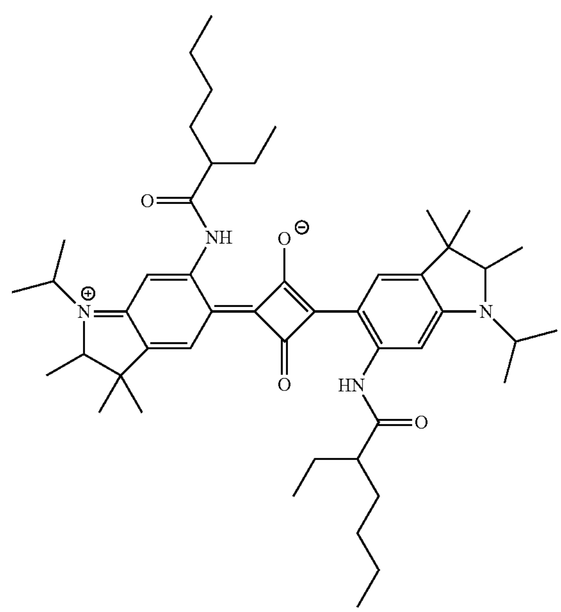

-continued
Q-36
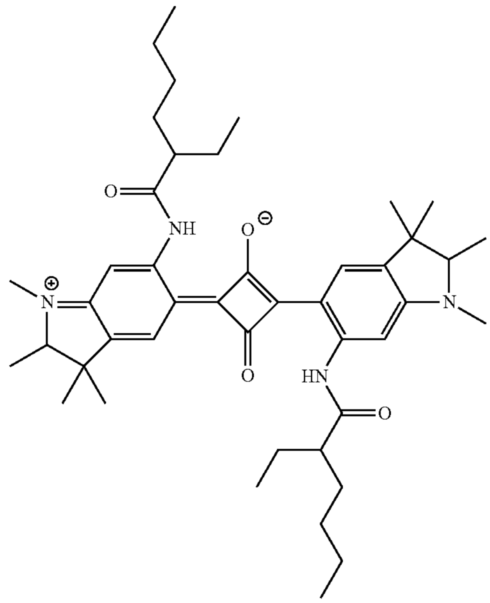
Q-37
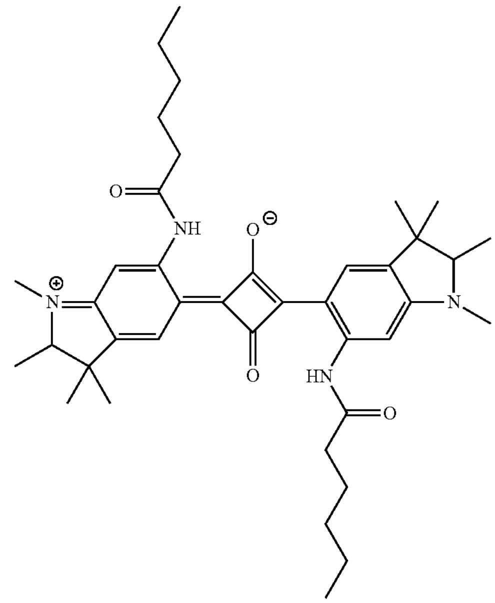
Q-38
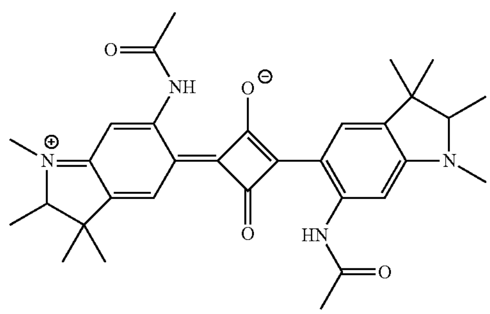
Q-39
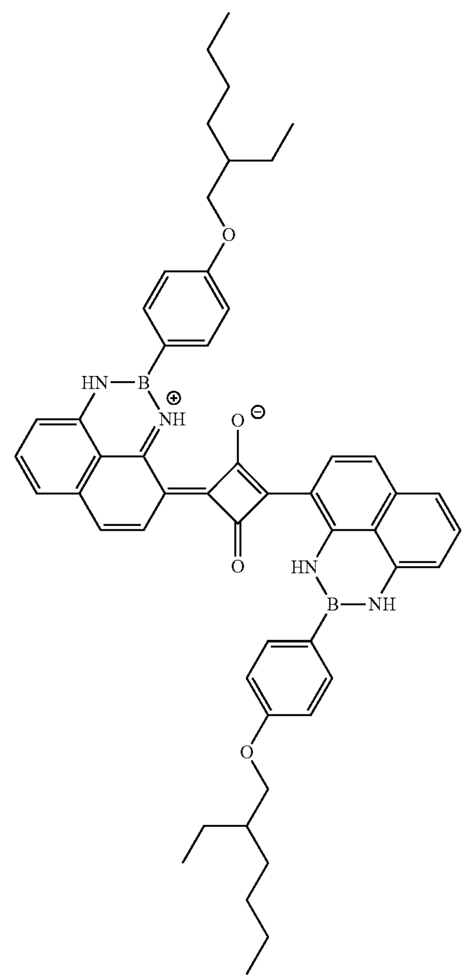

-continued
Q-40
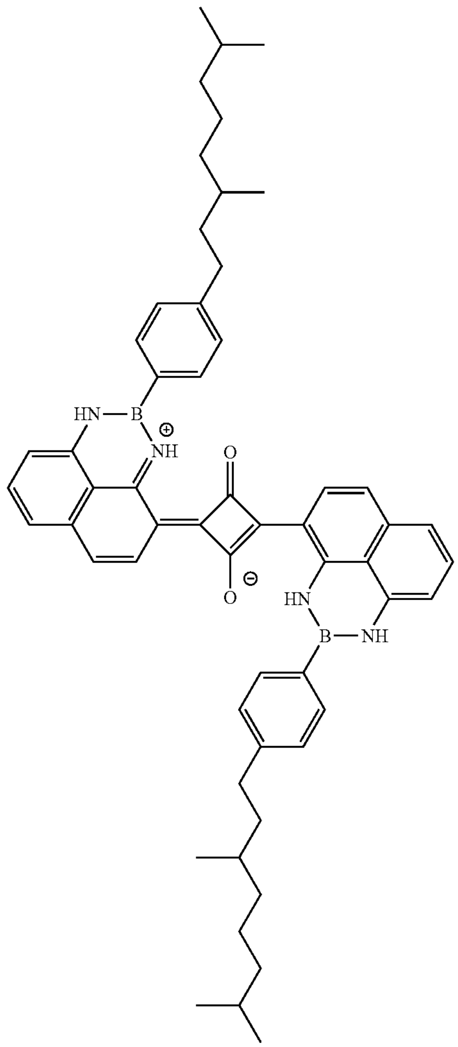
Q-41
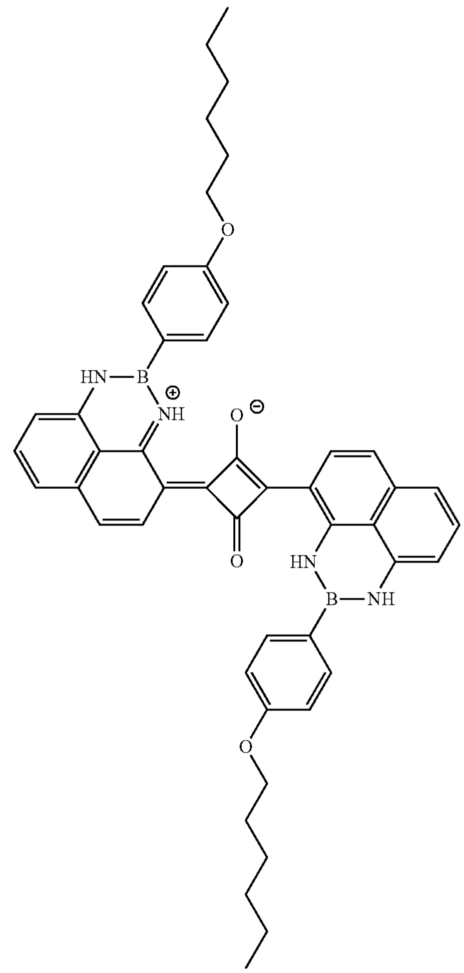
Q-42
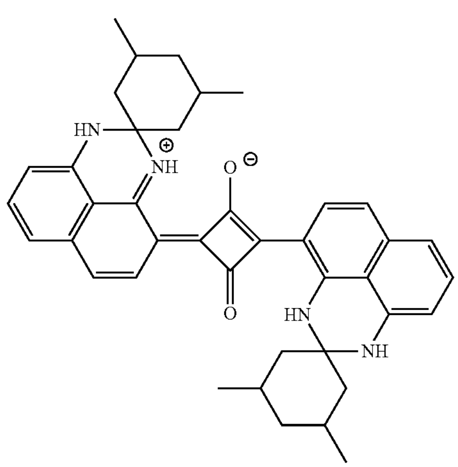
Q-43
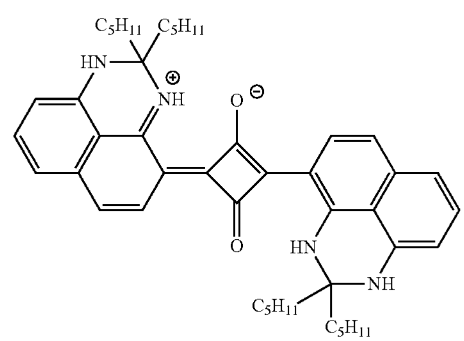

-continued
Q-44
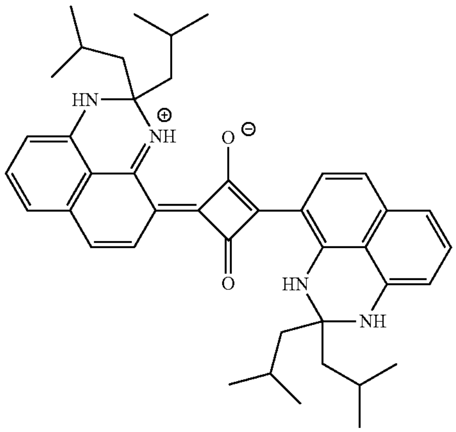
Q-45
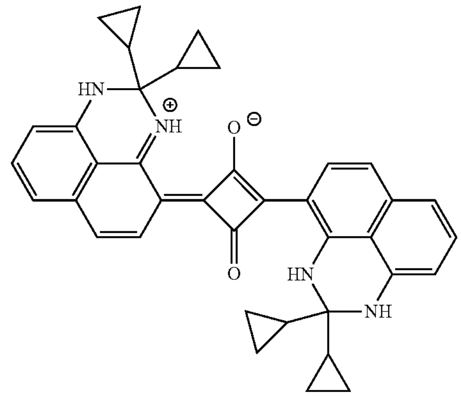
Q-46
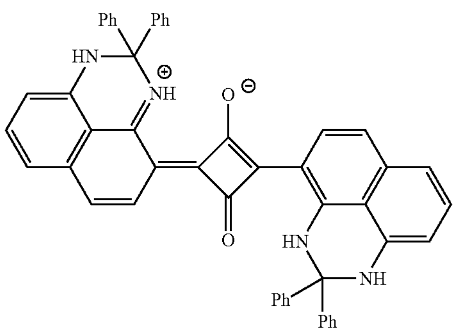
Q-47
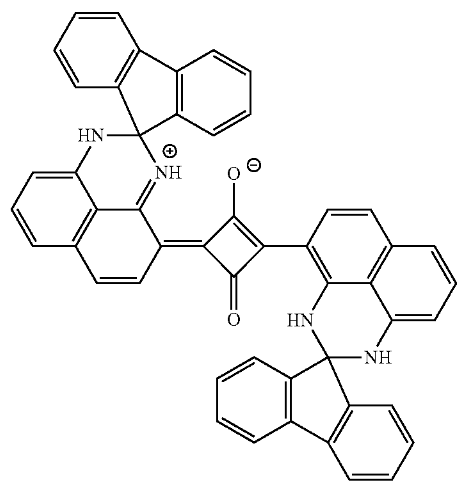
Q-48
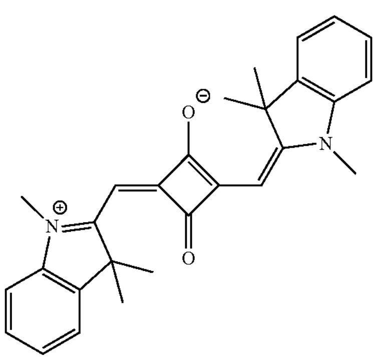
Q-49
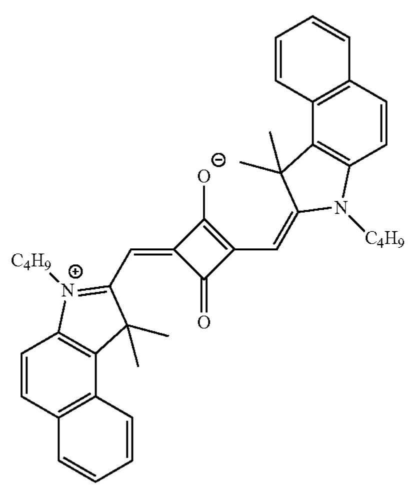

-continued
Q-50
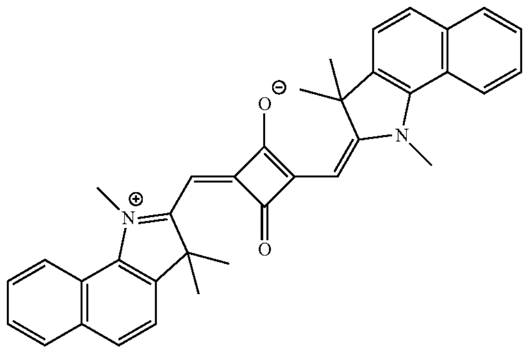
Q-51
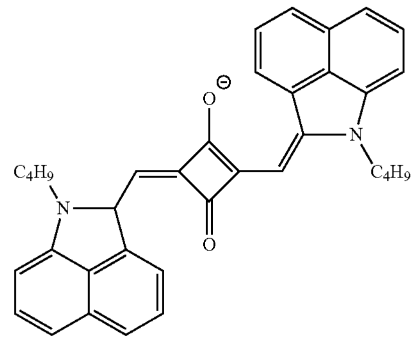
Q-52
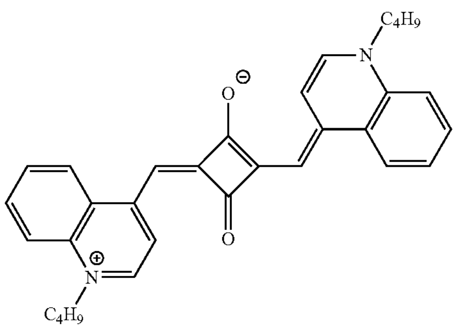
Q-53
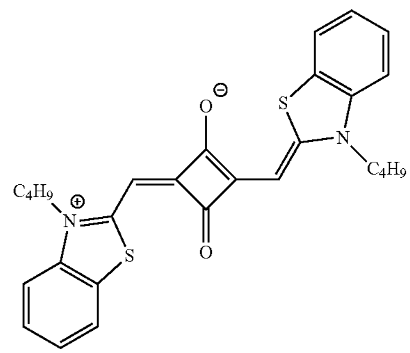
Q-54
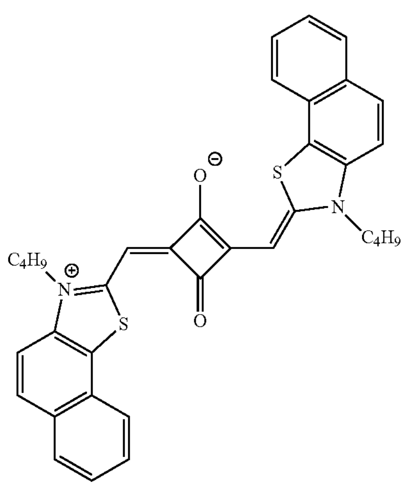
Q-55
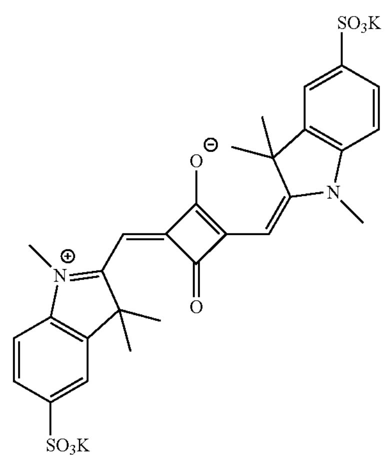
Q-56
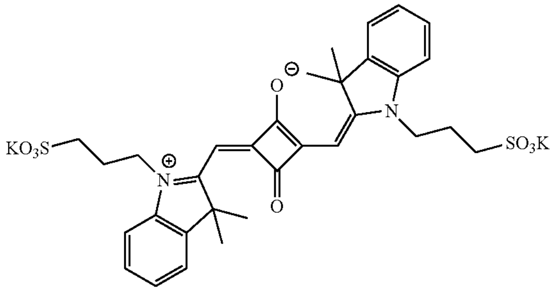
Q-57
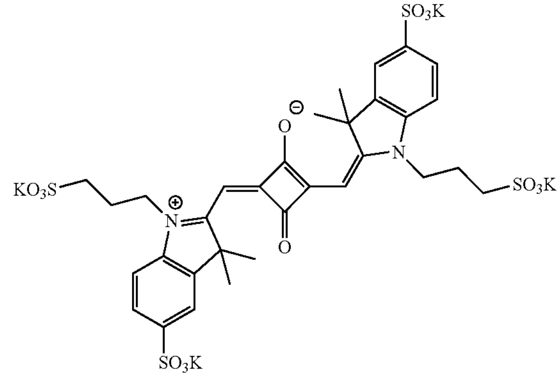

-continued
Q-58
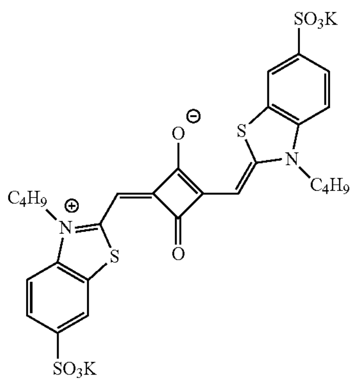
Q-59
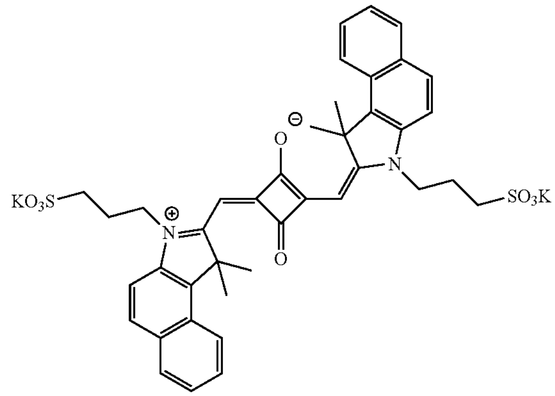
Q-60
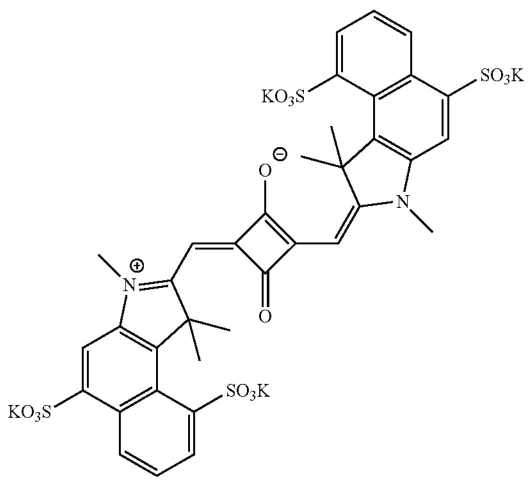
Q-61
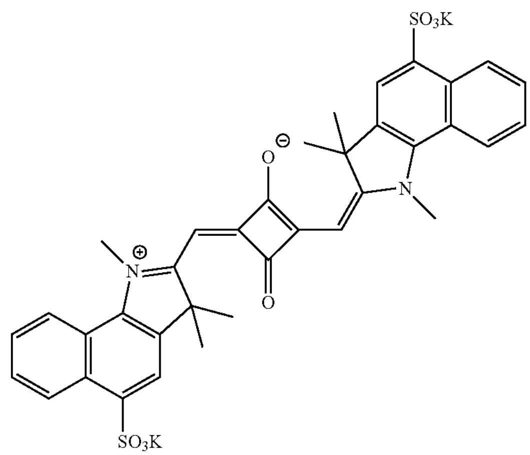
Q-62
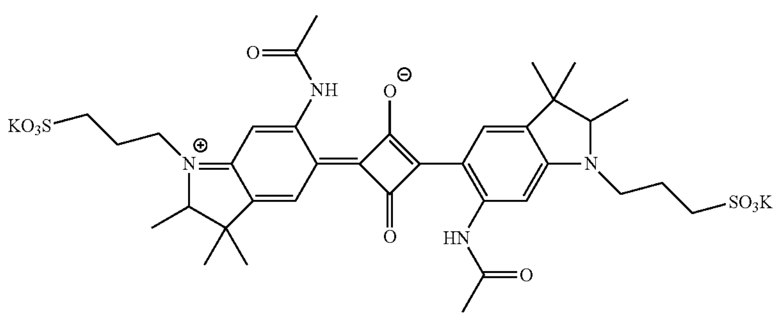
Q-63
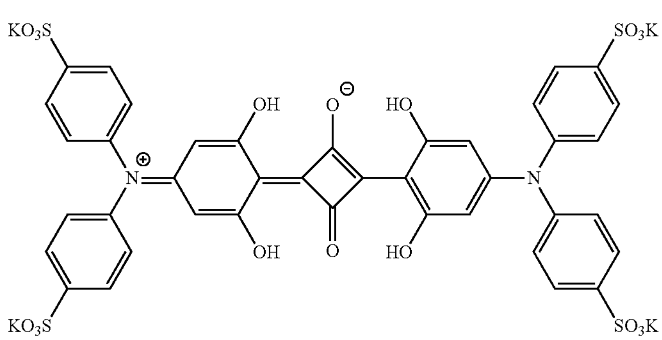

(Cyanine Colorant Structure)

In one aspect of the colorant structure used in the present invention, a structure (cyanine colorant structure) derived from a cyanine colorant is used. As the cyanine colorant structure, a structure derived from a compound represented by the following Formula (Cn) is preferable. Formula (Cn)

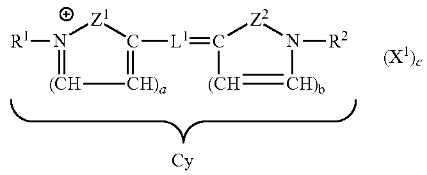

In Formula (Cn), $Z^1$ and $Z^2$ each independently represent a non-metal atomic group for forming a 5- or 6-membered nitrogen-containing heterocycle which may be fused, $R^1$ and $R^2$ each independently represent an alkyl group, an alkenyl group, an alkynyl group, an aralkyl group, or an aryl group, $L^1$ represents a methine chain including an odd number of methine groups, and a and b each independently represent 0 or 1, and In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

In Formula (Cn), $Z^1$ and $Z^2$ each independently represent a non-metal atomic group for forming a 5- or 6-membered nitrogen-containing heterocycle which may be fused.

Another heterocycle, an aromatic ring, or an aliphatic ring may be fused to the nitrogen-containing heterocycle. It is preferable that the nitrogen-containing heterocycle is a 5-membered ring. It is more preferable that a benzene ring or a naphthalene ring is fused to the 5-membered nitrogen-containing heterocycle. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazol ring, an indolenine ring, a benzoindolenine ring, an imidazole ring, a benzoimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring. Among these, a quinoline ring, an indolenine ring, a benzoindolenine ring, a benzoxazole ring, a benzothiazole ring, or a benzoimidazole ring is preferable, and an indolenine ring, a benzothiazole ring, or a benzoimidazole ring is more preferable.

The nitrogen-containing heterocycle and a ring fused thereto may have a substituent. Examples of the substituent include the groups described above regarding the substituent group T, the group represented by Formula A, an anionic group, and a cationic group. Specific examples of the substituent include a halogen atom, a cyano group, a nitro group, an alkyl group, an alkenyl group, an alkynyl group, an aryl group, a heteroaryl group, an aralkyl group, $—OR^{10}$, $—COR^{11}$, $—COOR^{12}$, $—OCOR^{13}$, $—NR^{14}R^{15}$, $—NHCOR^{16}$, $—CONR^{17}R^{18}$, $—NHCONR^{19}R^{20}$, $—NHCOOR^{21}$, $—SR^{22}$, $—SO_2R^{23}$, $—SO_2OR^{24}$, $—NHSO_2R^{25}$, and $—SO_2NR^{26}R^{27}$. $R^{10}$ to $R^{27}$ each independently represent a hydrogen atom, an alkyl group, an alkenyl group, an alkynyl group, an aryl group, a heteroaryl group, or an aralkyl group. In a case where $R^{12}$ in $—COOR^{12}$ represents a hydrogen atom (that is, a carboxyl group), the hydrogen atom may be dissociable (that is, a carbonate group) or may be in the form of a salt. In a case where $R^{24}$ in $—SO_2OR^{24}$ represents a hydrogen atom (that is, a sulfo group), the hydrogen atom may be dissociable (that is, a sulfonate group) or may be in the form of a salt. The details are the same as the ranges described above.

In Formula (Cn), $R^1$ and $R^2$ each independently represent an alkyl group, an alkenyl group, an alkynyl group, an aralkyl group, or an aryl group.

The number of carbon atoms in the alkyl group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The alkyl group, the alkenyl group, the alkynyl group, the aralkyl group, and the aryl group may have a substituent or may be unsubstituted. Examples of the substituent include the groups described above regarding the substituent group T, the group represented by Formula A, the anionic group, and the cationic group. Examples of the substituent include a halogen atom, a hydroxyl group, a carboxyl group, a sulfo group, an alkoxy group, and an amino group. Among these, a carboxyl group or a sulfo group is preferable, and a sulfo group is more preferable. In the carboxyl group and the sulfo group, a hydrogen atom may be dissociable or may be in the form of a salt.

In Formula (Cn), $L^1$ represents a methine chain including an odd number of methine groups. $L^1$ represents a methine chain including 3, 5, or 7 methine groups.

The methine group may have a substituent. It is preferable that the methine group having a substituent is a methine group positioned at the center (meso position). Specific examples of the substituent include a substituent which may be included in the nitrogen-containing heterocycle represented by $Z^1$ and $Z^2$, and a group represented by the following Formula (a). In addition, two substituents of the methine group may be bonded to each other to form a 5- or 6-membered ring.

(a)

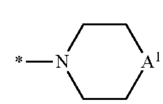

In Formula (a), * represents a linking portion to the methine chain, and $A^1$ represents an oxygen atom or a sulfur atom.

a and b each independently represent 0 or 1. In a case where a represents 0, a carbon atom and a nitrogen atom are bonded through a double bond. In a case where b represents 0, a carbon atom and a nitrogen atom are bonded through a single bond. It is preferable that both a and b represent 0. In a case where both a and b represent 0, Formula (Cn) will be shown below.

Formula (Cn)

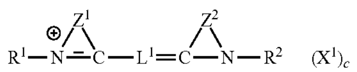

In a case where a site represented by Cy in Formula (Cn) is a cation site, $X^1$ represents an anion, and c represents the number of $X^1$'s for balancing charge. Examples of the anion include an halide ion ($Cl^-$, $Br^-$, $I^-$), a p-toluenesulfonate ion, an ethyl sulfate ion, $PF_6^-$, $B(CN)4^-$, $BF_4^-$, $B(C_6F_5)_4^-$, $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), and a tetracyano borate anion.

In a case where a site represented by Cy in Formula (Cn) is an anion site, $X^1$ represents a cation, and c represents the number of $X^1$'s for balancing charge. Examples of the cation include an alkali metal ion (for example, $Li^+$, $Na^+$, or $K^+$), an alkali earth metal ion ($Mg^{2+}$, $Ca^{2+}$, $Ba^{2+}$, or $Sr^{2+}$), a transition metal ion (for example, $Ag^+$, $Fe^{2+}$, $Co^{2+}$, $Ni^{2+}$, $Cu^{2+}$, or $Zn^{2+}$), other metal ions (for example, $Al^{3+}$), an ammonium ion, a triethylammonium ion, a tributylammonium ion, a pyridinium ion, a tetrabutylammonium ion, a guanidinium ion, a tetramethylguanidium ion, and diazabicycloundecenium. As the cation, $Na^+$, $K^+$, $Mg^{2+}$, $Ca^{2+}$, $Zn^{2+}$, or diazabicycloundecenium is preferable.

In a case where charge of a site represented by Cy in Formula (Cn) is neutralized in a molecule, $X^1$ is not present. That is, c represents 0.

It is preferable that the compound represented by Formula (Cn) is bonded to another site of the near infrared absorbing colorant polymer through any site of $Z^1$, $Z^2$, $R^1$, $R^2$, and $L^1$. Specific examples of the compound represented by Formula (Cn) include compounds shown below and a compound derived from a colorant structure included in specific examples of the near infrared absorbing colorant polymer described below. Hereinafter, Me represents a methyl group, Et represents an ethyl group, Bu represents a butyl group, Bn represents a benzyl group, Ph represents a phenyl group, PRS represents $C_3H_6SO_3^-$, and BUS represents $C_4H_9SO_3^-$. In addition, numerical values added to structural formulae in the tables represent binding sites of $V^1$ and $V^2$. In addition, in the tables, L represents a linked state in the structural formula, "*" represents linking to a single bond, and "**" represents linking to a double bond.

C-1

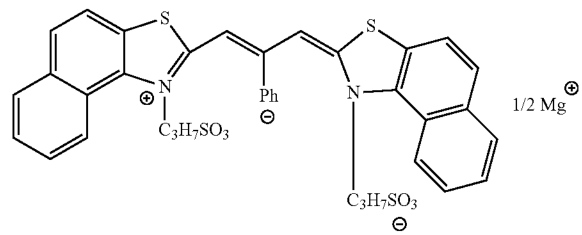

C-2

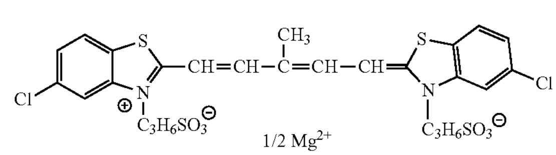

C-3

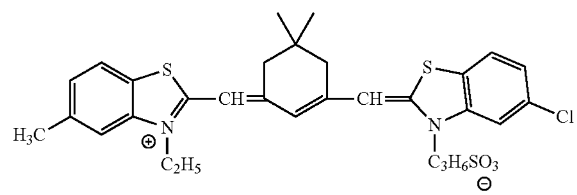

C-4

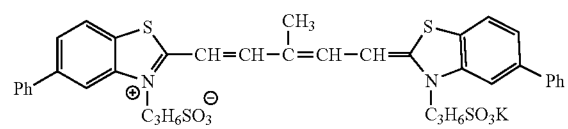

C-5

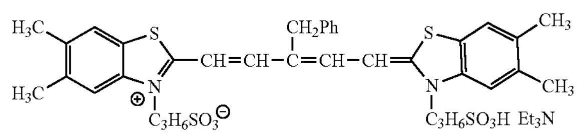

C-6

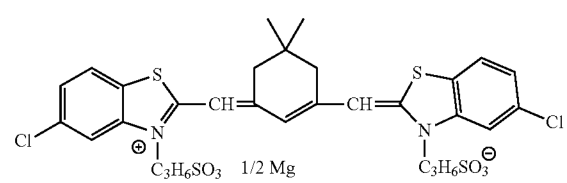

C-7

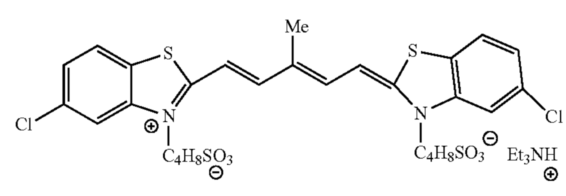

C-8

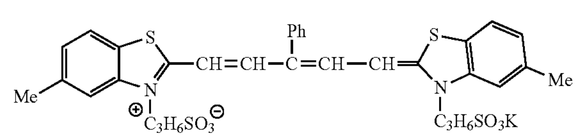

TABLE 1
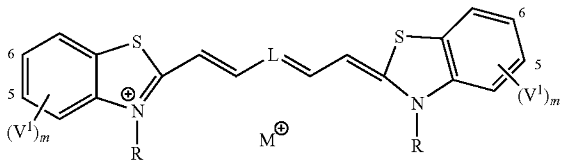
| Compound No. | R | L | $V^1$ | m | M |
|---|---|---|---|---|---|
| C-9 | PRS |  | 5: Cl | 1 | K |
| C-10 | PRS | 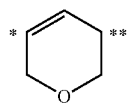 | 5: Cl | 1 | K |
| C-11 | PRS | 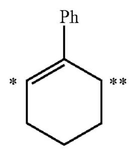 | 5: Cl | 1 | K |
TABLE 1-continued
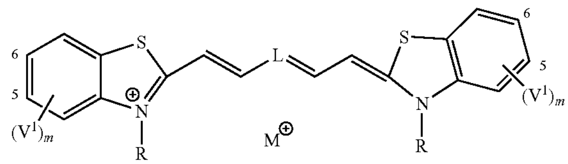
| Compound No. | R | L | $V^1$ | m | M |
|---|---|---|---|---|---|
| C-12 | BUS | 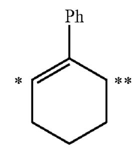 | 5: COOH | 1 | K |
| C-13 | PRS |  | 5: Cl | 1 | Na |
| C-14 | PRS |  | 5: Cl | 1 | 1/2 Mg |
TABLE 2
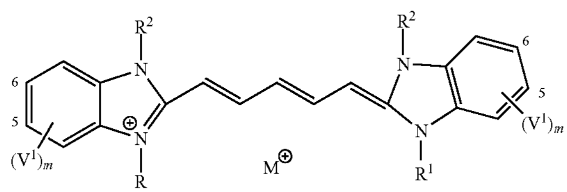
| Compound No. | $R^1$ | $R^2$ | $V^1$ | m | M |
|---|---|---|---|---|---|
| C-15 | PRS | Et | 5: Cl<br>6: Cl | 2 | Na |
| C-16 | PRS | Me | 5: Cl<br>6: Cl | 2 | K |
| C-17 | BUS | Et | 5: Cl<br>6: Cl | 2 | K |
| C-18 | BUS | $CF_3CH_2$ | 5: Cl<br>6: Cl | 2 | 1/2 Ca |
| C-19 | PRS | Et | 5: Cl<br>6: Cl | 2 | K |
| C-20 | PRS | Et | 5: Cl<br>6: Cl | 2 | 1/2 Mg |
| C-21 | BUS | Et | 5: Cl<br>6: Cl | 2 | Na |
| C-22 | PRS | Me | 5: Cl<br>6: Cl | 2 | 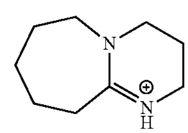 |
| C-23 | PRS | 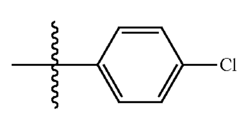 [SMILES: *c1ccc(Cl)cc1] | 5: Cl<br>6: Cl | 2 | Na |

C-24
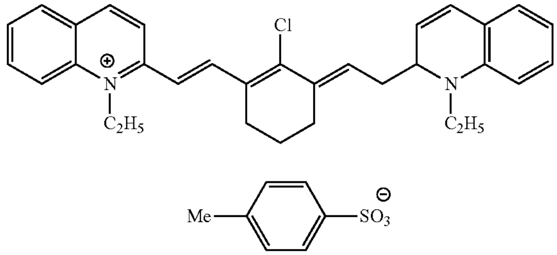
C-25
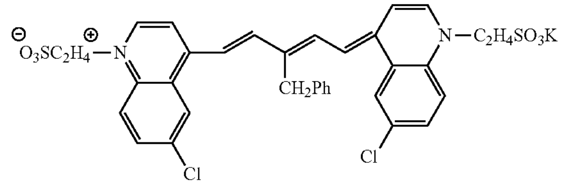
C-26
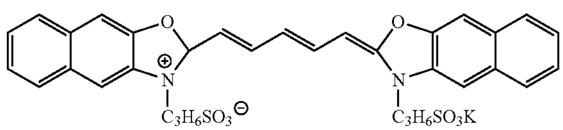
C-27
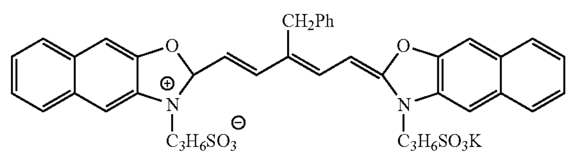
C-28
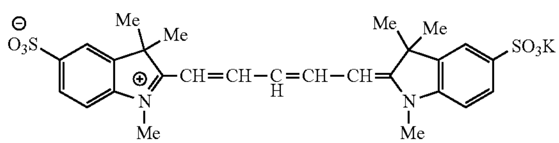
C-29
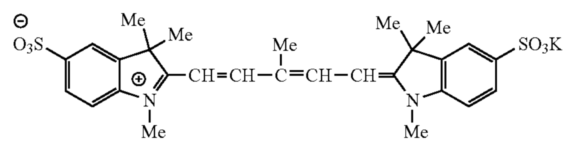
C-30
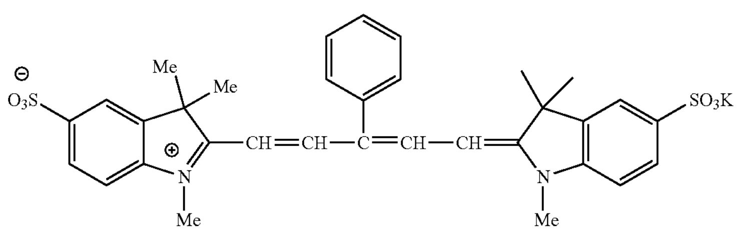
C-31
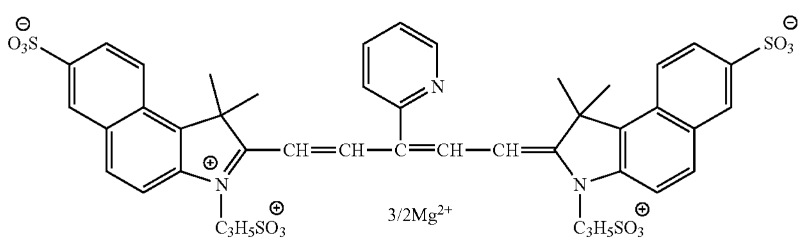
C-32
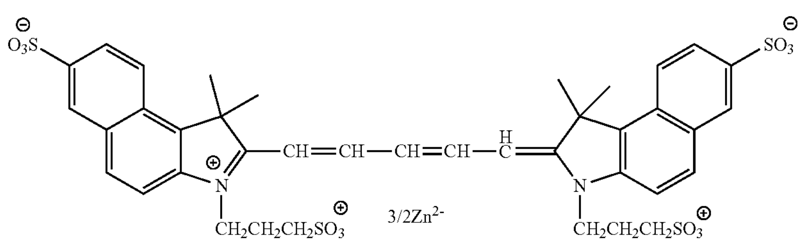

-continued
C-33
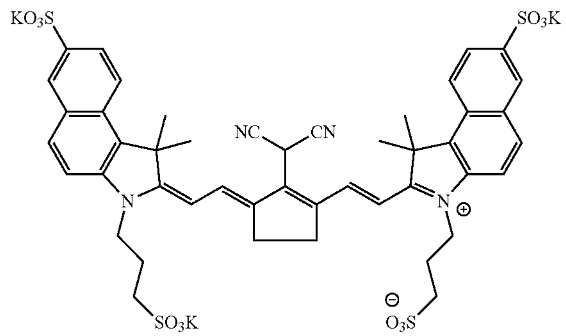
C-34
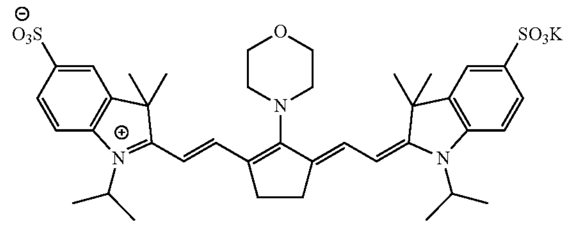
C-35
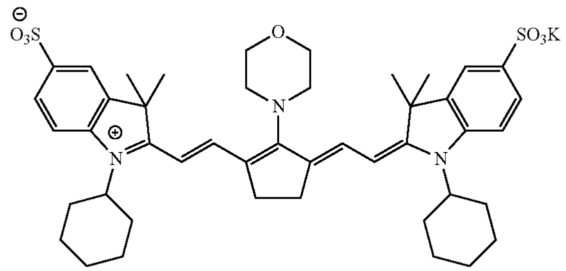
C-36
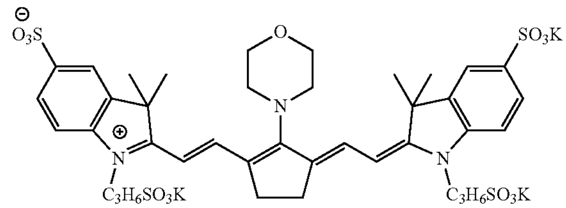
C-37
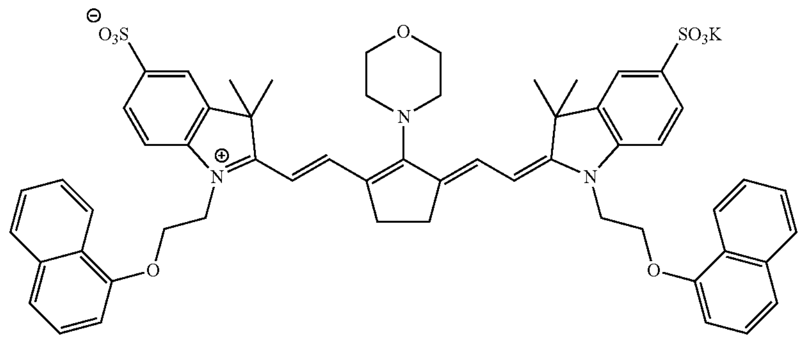
TABLE 3
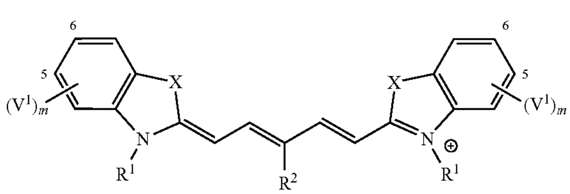
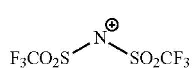
| Compound No. | X | $R^1$ | $R^2$ | $V^1$ | m |
|---|---|---|---|---|---|
| S-1 | S | Et | H | — | 0 |
| S-2 | O | Et | Me | — | 0 |
| S-3 | N—Et | Et | H | 5: Cl<br>6: Cl | 2 |
| S-4 | S | n-Bu | Bn | 5: Cl | 1 |
TABLE 4
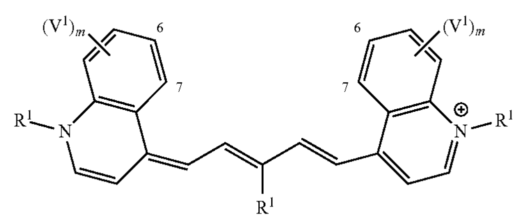
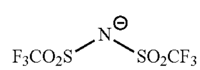
| Compound No. | $R^1$ | $R^2$ | $V^1$ | m |
|---|---|---|---|---|
| S-5 | Et | H | — | 0 |
| S-6 | Et | Me | — | 0 |
| S-7 | Et | Bn | 6: Cl<br>7: Cl | 2 |
| S-8 | n-Bu | Bn | 6: Cl | 1 |

TABLE 5
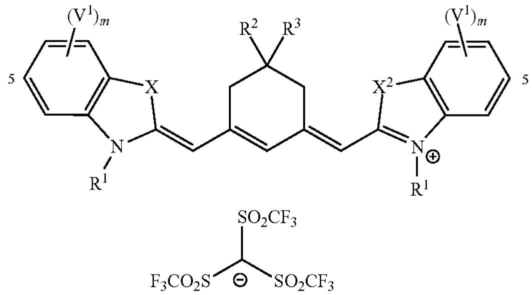
| Compound No. | X | $R^1$ | $R^2$ | $R^3$ | $V^1$ | m |
|---|---|---|---|---|---|---|
| S-9 | S | Et | H | H | — | 0 |
| S-10 | O | Et | H | Me | — | 0 |
| S-11 | S | Et | Me | Me | 5: MeO | 1 |
| S-12 | S | n-Bu | H | Ph | 5: Cl | 1 |
TABLE 6
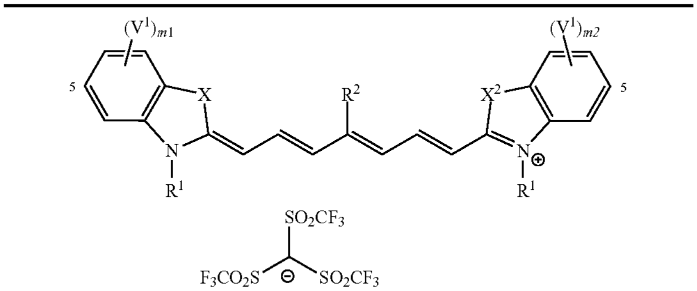
| Com - pound No. | X | $R^1$ | $R^2$ | $V^1$ | m1 | $V^2$ | m2 |
|---|---|---|---|---|---|---|---|
| S-13 | S | Et | H | — | 0 | — | 0 |
| S-14 | O | Et | H | 5: Cl | 1 | — | 0 |
| S-15 | S | Et | Me | 5: MeO | 1 | 5: MeO | 1 |
| S-16 | S | n-Bu | Bn | 5: Cl | 1 | 5: Cl | 1 |
TABLE 7
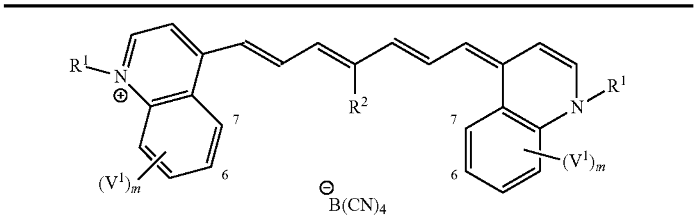
| Compound No. | $R^1$ | $R^2$ | $V^1$ | m |
|---|---|---|---|---|
| S-17 | Et | H | — | 0 |
| S-18 | Et | Me | — | 0 |
| S-19 | Et | Bn | 6: Cl<br>7: Cl | 2 |
| S-20 | n-Bu | Bn | 6: Cl | 1 |

TABLE 8
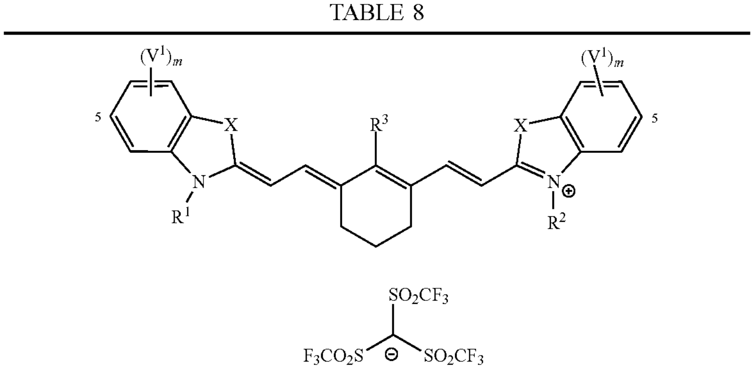
| Compound No. | X | $R^1$ | $R^2$ | $R^3$ | $V^1$ | m |
|---|---|---|---|---|---|---|
| S-21 | S | Et | Et | H | — | 0 |
| S-22 | O | Et | Et | Cl | — | 0 |
| S-23 | S | n-Bu | n-Bu | H | 5: MeO | 1 |
| S-24 | S | Et | Et | Ph | 5: Cl | 1 |
S-25
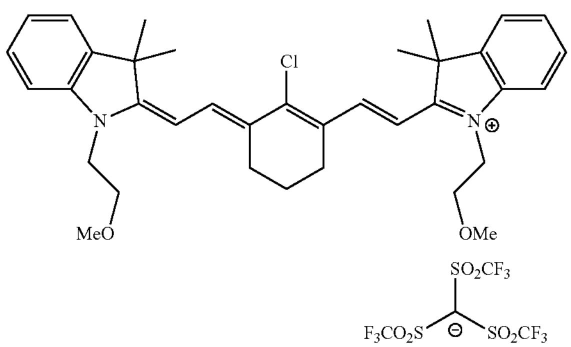
S-26
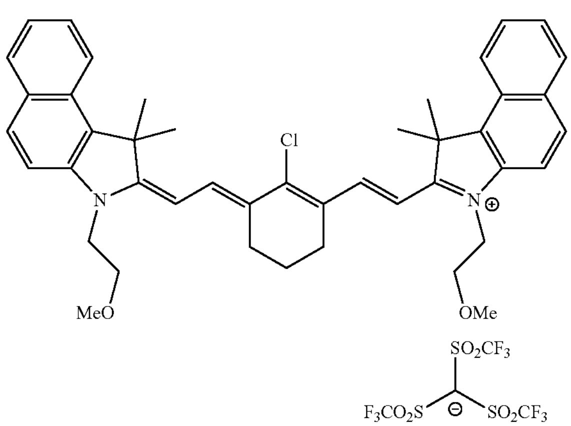
-continued
S-27
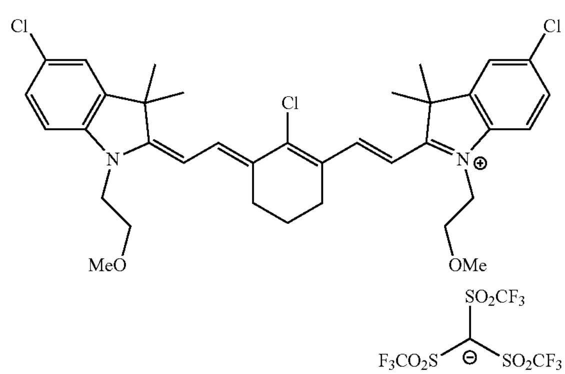
S-28
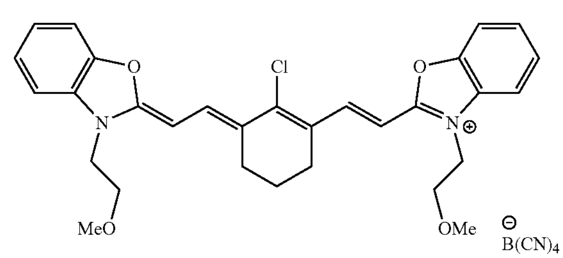

-continued
S-29
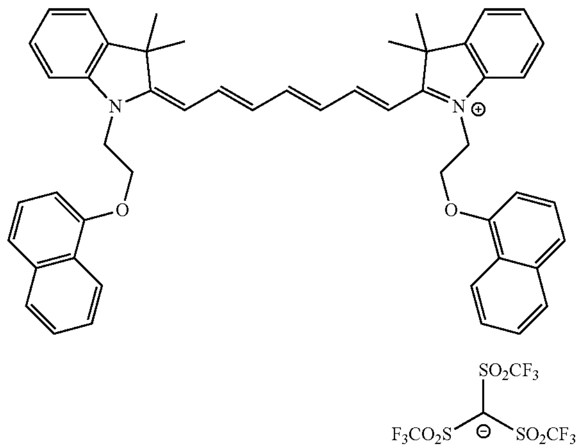
S-30
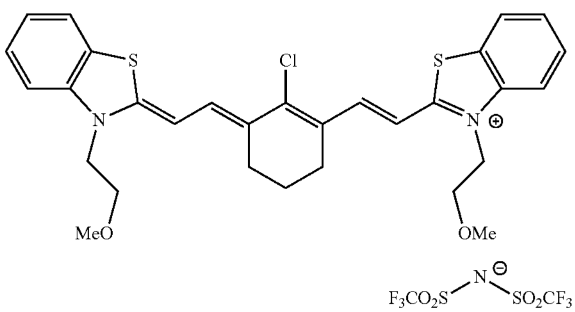
S-31
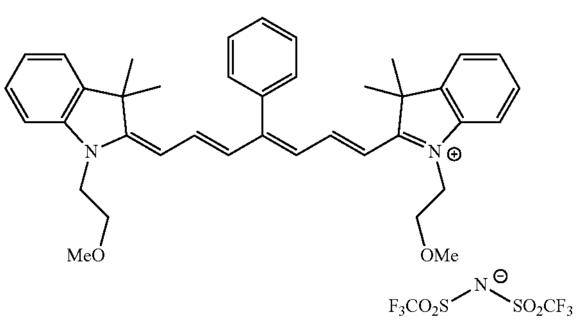
-continued
S-32
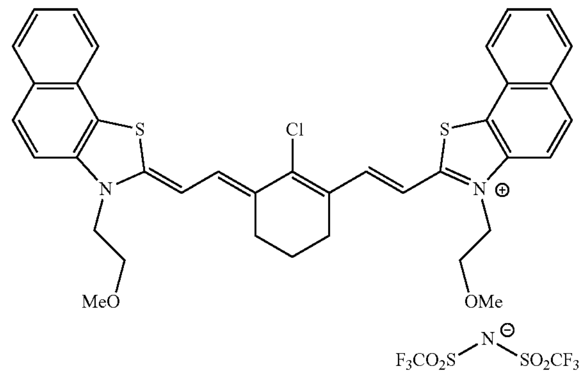
S-33
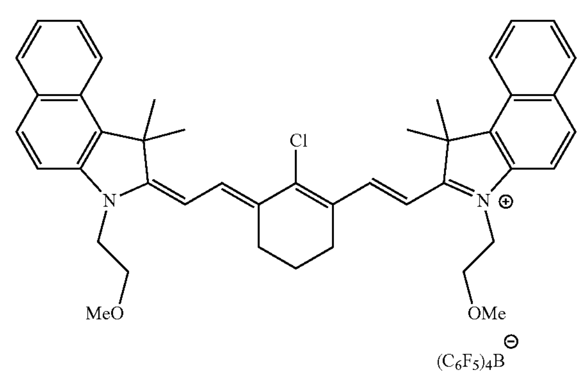

TABLE 9
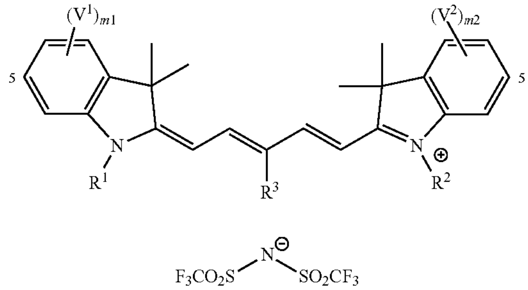
| Compound No. | $R^1$ | $R^2$ | $R^3$ | $V^1$ | m1 | $V^2$ | m2 |
|---|---|---|---|---|---|---|---|
| I-1 | Et | Et | H | — | 0 | — | 0 |
| I-2 | $CH_2CH_2OMe$ | $CH_2CH_2OMe$ | H | — | 0 | — | 0 |
| I-3 | 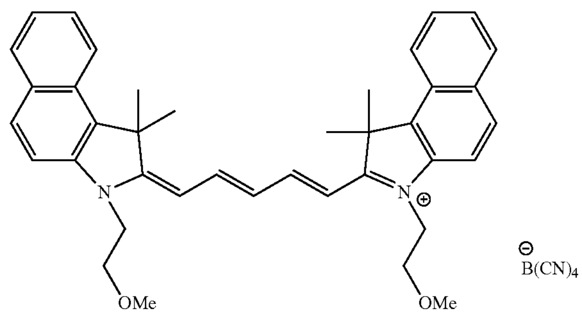 | | | | | | |
| I-4 | Et | Et | Me | 5: Cl | 1 | 5: Cl | 1 |
TABLE 10
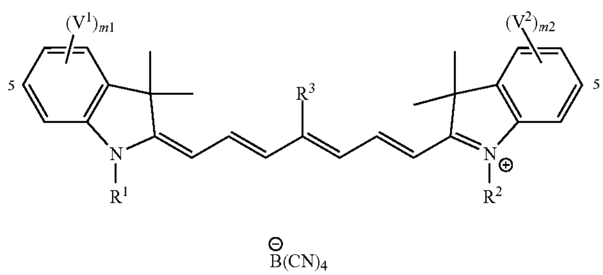
| Compound No. | $R^1$ | $R^2$ | $R^3$ | $V^1$ | m1 | $V^2$ | m2 |
|---|---|---|---|---|---|---|---|
| I-5 | Et | Et | H | — | 0 | — | 0 |
| I-6 | $CH_2CH_2OMe$ | $CH_2CH_2OMe$ | H | — | 0 | — | 0 |
| I-7 | 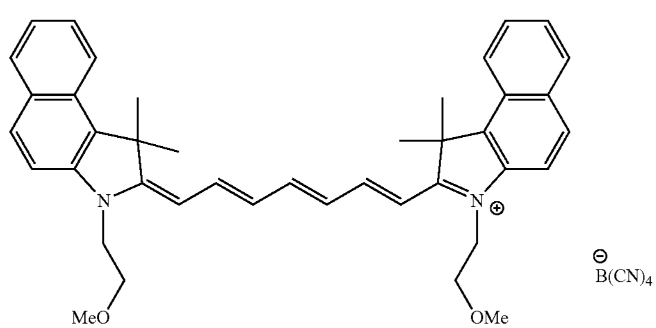 | | | | | | |
| I-8 | Et | Et | Me | 5: Cl | 1 | 5: Cl | 1 |

TABLE 11

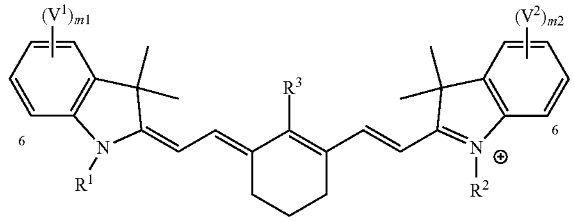

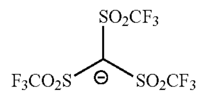

| Compound No. | $R^1$ | $R^2$ | $R^3$ | $V^1$ | m1 | $V^2$ | m2 |
|---|---|---|---|---|---|---|---|
| I-9 | Et | Et | H | — | 0 | — | 0 |
| I-10 | $CH_2CH_2OMe$ | $CH_2CH_2OMe$ | H | — | 0 | — | 0 |
| I-11 | 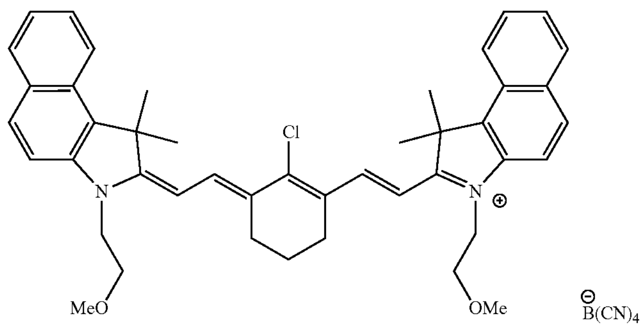 | | | | | | |
| I-12 | Et | Et | Cl | 6: MeO | 1 | 6: MeO | 1 |

(Oxonol Colorant Structure)

In one aspect of the colorant structure used in the present invention, a structure (oxonol colorant structure) derived from an oxonol colorant is used. As the oxonol colorant structure, a structure derived from a compound represented by the following Formula (Ox) is preferable.

Formula (Ox)

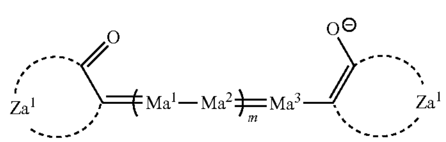

Qy

In the formula, $Za^1$ represents an atomic group that forms an acid nucleus, $Ma^1$, $Ma^2$, and $Ma^3$ each independently represent a methine group, m represents an integer of 0 to 3, Q represents an ion which neutralizes charge, and y represents the number of Q's for charge neutralization.

$Za^1$ represents an atomic group that forms an acid nucleus. The acid nucleus is defined by p. 198, "The Theory of the Photographic Process" (Fourth Edition, Edited by James, Macmillan, 1977). Specific examples of the acid nucleus include acid nuclei which may have a substituent: pyrazole-5-one, pyrazolidine-3,5-dione, imidazolin-5-one, hydantoin, 2- or 4-thiohydantoin, 2-iminooxazolidin-4-one, 2-oxazolin-5-one, 2-thiooxazolin-2,4-dione, isorhodamine, rhodamine, a 5- or 6-membered carbon ring (for example, indan-1,3-dione), thiophene-3-one, thiophene-3-one-1,1-dioxide, indolin-2-one, indolin-3-one, 2-oxoindazolinium, 5,7-dioxo-6,7-dihydrothiazolo[3,2-a]pyrimidine, 3,4-dihydroisoquinolin-4-one, 1,3-dioxane-4,6-dione, a barbituric acid, 2-thiobarbituric acid, coumarin-2,4-dione, indazoline-2-one, pyrido[1,2-a]pyrimidine-1,3-dione, pyrazolo[1,5-b]quinazolone, and pyrazolopyridone. Among these, pyrazole-5-one, a barbituric acid, 2-thiobarbituric acid, or 1,3-dioxane-4,6-dione (for example, Meldrum's acid) is preferable. 1,3-dioxane-4,6-dione is more preferable.

Examples of the substituent which is substituted with the acid nucleus of $Za^1$ include the groups described above regarding the substituent group T, the group represented by Formula A, the anionic group, and the cationic group.

$Ma^1$, $Ma^2$, and $Ma^3$ each independently represent a substituted or unsubstituted methine group.

The methine group may have a substituent or may be unsubstituted. Examples of the substituent include the substituents which may be included in the methine group of the cyanine colorant.

$Ma^1$, $Ma^2$, and $Ma^3$ represent preferably an unsubstituted methine group, or a methine group which is substituted with an alkyl group having 1 to 5 carbon atoms, an alkoxy group having 1 to 5 carbon atoms, an aryl group, a heteroaryl group, or a halogen atom.

m represents an integer of 0 to 3 and preferably 2 or 3.

Q represents an ion which neutralizes charge, and y represents the number of Q's for charge neutralization. Whether or not a compound is a cation or an anion or whether or not a compound has a net ionic charge depends on a substituent of the compound. The ion represented by Q may be a cation or an anion depending on the charge of a counter colorant molecule. In addition, in a case where the colorant molecule does not have charge, Q is not present. The ion represented by Q is not particularly limited and may be an ion derived from an inorganic compound or an ion derived from an organic compound. In addition, the charge of the ion represented by Q may be monovalent or polyvalent. Examples of the cation represented by Q include: a metal ion such as a sodium ion or a potassium ion; a quaternary ammonium ion; and an onium ion such as an oxonium ion, a sulfonium ion, a phosphonium ion, a selenonium ion, or an iodonium ion. On the other hand, examples of the anion represented by Q include: a halogen anion such as a chloride ion, a bromide ion, or a fluoride ion; a heteropoly acid ion such as a sulfate ion, a phosphate ion, or a hydrogen phosphate ion; an organic polyvalent anion such as a succinate ion, a maleate ion, a fumarate ion, or an aromatic disulfonate ion; a borate tetrafluoride ion; and a phosphate hexafluoride ion. As the cation represented by Q, a hydrogen ion, a metal ion, or an onium ion is preferable. In a case where Q represents a hydrogen ion, the hydrogen ion is a neutral free form.

The details of the compound represented by Formula (Ox) can be found in paragraphs “0039” to “0066” of JP2006-001875A, the content of which is incorporated herein by reference.

It is preferable that the compound represented by Formula (Ox) is bonded to another site of the near infrared absorbing colorant polymer through any site of $Za^1$, $Ma^1$, $Ma^2$, and $Ma^3$.

Specific examples of the compound represented by Formula (Ox) include compounds shown below and a structure included in specific examples of the near infrared absorbing colorant polymer described below. In the following formulae, Et represents an ethyl group, Ac represents an acetyl group, Ph represents a phenyl group, and Py represents a pyridyl group.

TABLE 12

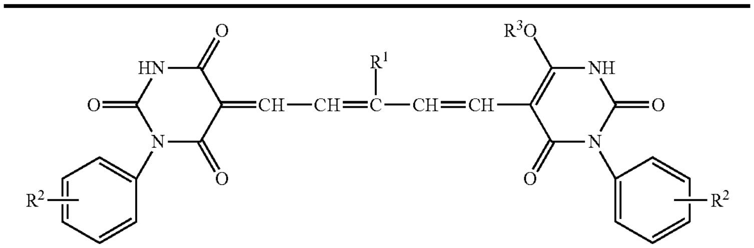

| Compound No. | $R^1$ | $R^2$ | $R^3$ |
|---|---|---|---|
| 0-1 | H | 3-NHAc | H |
| 0-2 | $CH_3$ | H | H |
| 0-3 | $CH_3$ | H | K |
| 0-4 | $CH_3$ | 3-NHAc | H |
| 0-5 | $CH_3$ | 3-$CONH_2$ | Na |
| 0-6 | $CH_3$ | 3-$SO_3K$ | H |
| 0-7 | Ph | H | H |
| 0-8 | Ph | 4-$CONH_2$ | K |
| 0-9 | Ph | 3-$CONH_2$ | H |
| 0-10 | Ph | 3-NHAc | H |
| 0-11 | Ph | 4-NHAc | Ca |
| 0-12 | Ph | 3-COOH | H |
| 0-13 | Py | 3-NHAc | H |
| 0-14 | Py | 3-NHCOEt | H |
| 0-15 | Py | 4-$CONH_2$ | $NHEt_3$ |
| 0-16 | Py | 4-COOH | H |

O-17

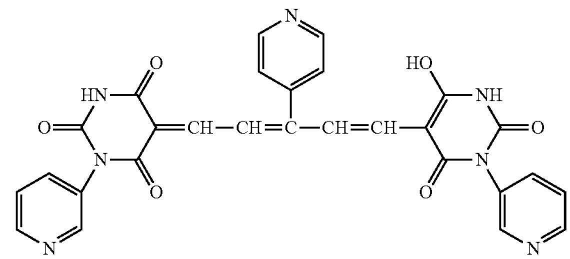

O-18

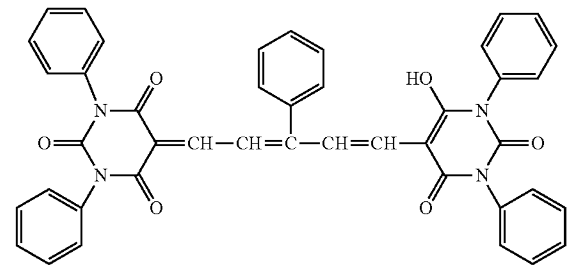

O-19

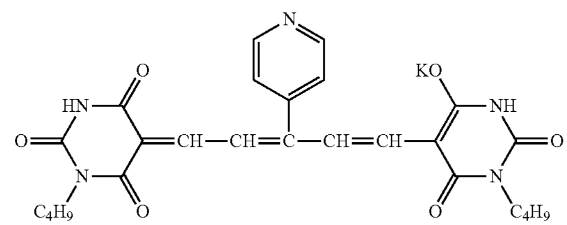

-continued

O-20

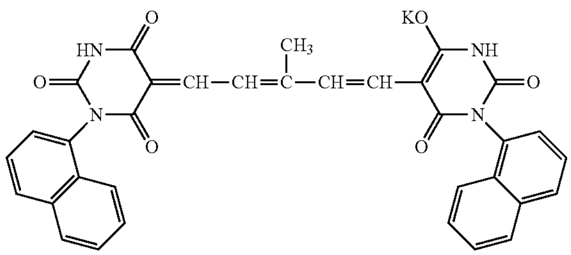

O-21

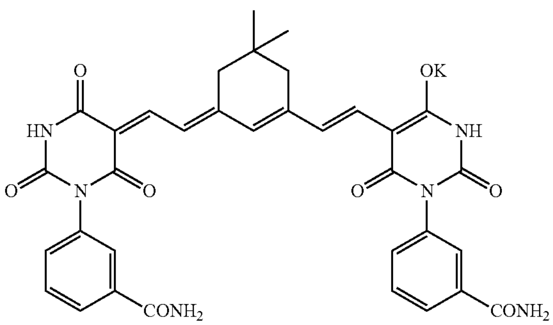

O-22

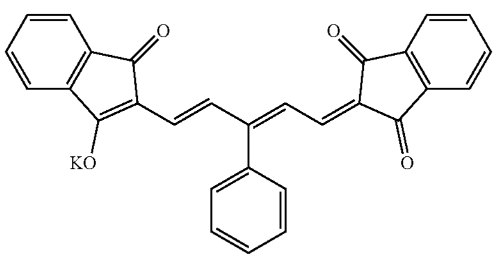

O-23

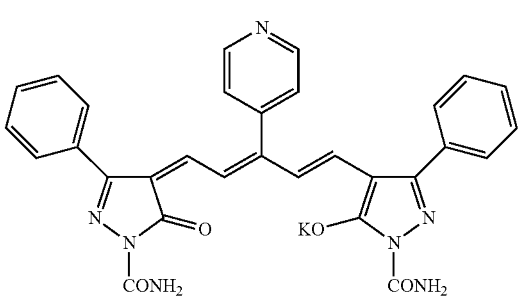

(Diimonium Colorant Structure)

In one aspect of the colorant structure used in the present invention, a structure (diimonium colorant structure) derived from a diimonium colorant is used. As the diimonium colorant structure, a structure derived from a compound represented by the following Formula (Im) is preferable.

Formula (Im)

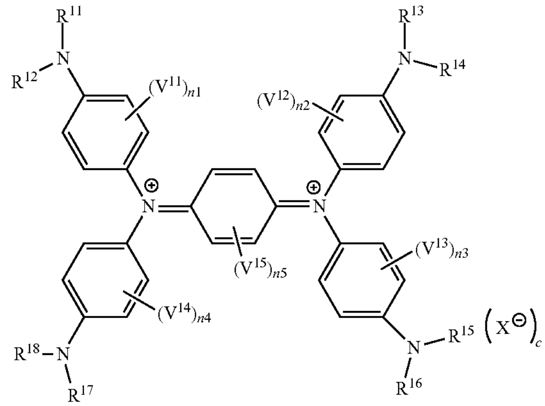

In the formula, $R^{11}$ to $R^{18}$ each independently represent an alkyl group or an aryl group.

$V^{11}$ to $V^{15}$ each independently represent an alkyl group, an aryl group, a halogen atom, an alkoxy group, or a cyano group, X represents an anion, and c represents the number of X's for balancing charge.

n1 to n5 each independently 0 to 4.

$R^{11}$ to $R^{18}$ each independently represent an alkyl group or an aryl group.

The number of carbon atoms in the alkyl group is preferably 1 to 20, more preferably 1 to 12, and still more preferably 1 to 8. The alkyl group may be linear, branched, or cyclic and is preferably linear or branched and more preferably linear.

The number of carbon atoms in the aryl group is preferably 6 to 25, more preferably 6 to 15, and still more preferably 6 to 12.

The alkyl group and the aryl group may have a substituent or may be unsubstituted. Examples of the substituent include the groups described above regarding the substituent group T, the group represented by Formula A, the anionic group, and the cationic group.

$V^{11}$ to $V^{15}$ each independently represent an alkyl group, an aryl group, a halogen atom, an alkoxy group, or a cyano group.

Examples of the halogen atom include a fluorine atom, a chlorine atom, a bromine atom, and an iodine atom.

The number of carbon atoms in the alkyl group is preferably 1 to 20, more preferably 1 to 12, and still more preferably 1 to 8. The alkyl group may be linear, branched, or cyclic and is preferably linear or branched and more preferably linear. The number of carbon atoms in the aryl group is preferably 6 to 25, more preferably 6 to 15, and still more preferably 6 to 12.

The number of carbon atoms in the alkoxy group is preferably 1 to 20, more preferably 1 to 12, and still more preferably 1 to 8. The alkoxy group may be linear, branched, or cyclic and is preferably linear or branched and more preferably linear.

n1 to n5 each independently 0 to 4. n1 to n4 represents preferably 0 to 2 and more preferably 0 or 1. n5 represents preferably 0 to 3 and more preferably 0 to 2.

It is preferable that the compound represented by Formula (Im) is bonded to another site of the near infrared absorbing colorant polymer through any site of $R^{11}$ to $R^{18}$ and $V^{11}$ to $V^{15}$.

Specific examples of the compound represented by Formula (Im) include compounds shown below and a structure included in specific examples of the near infrared absorbing colorant polymer described below. In the following table, Me represents a methyl group, Bu represents a butyl group, Bn represents a benzyl group, and Ph represents a phenyl group.

TABLE 13

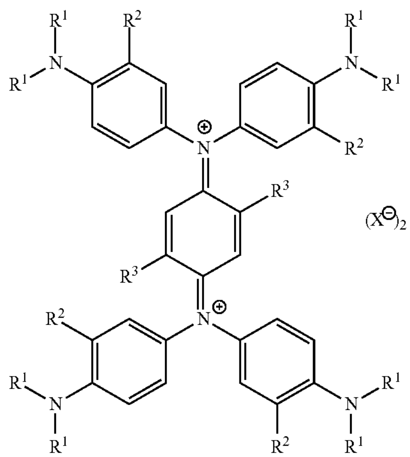

| Compound No. | $R^1$ | $R^2$ | $R^3$ | $X^\ominus$ |
|---|---|---|---|---|
| D-1 | n-Bu | H | H | 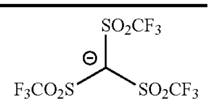 |
| D-2 | i-Bu | H | H | $CF_3SO_3^\ominus$ |
| D-3 | i-Bu | H | H | 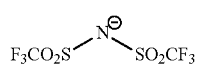 |
| D-4 | i-Bu | H | H | 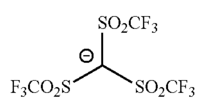 |
| D-5 | i-Bu | H | H | $^\ominus B(CN)_4$ |
| D-6 | n-$C_6H_{13}$ | H | H | 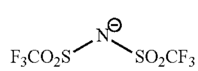 |
| D-7 | $CH_2CHEtC_4H_9$ | H | H | 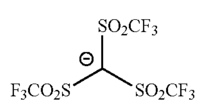 |
| D-8 | Bn | H | H | $^\ominus B(CN)_4$ |
| D-9 | Ph | H | H | 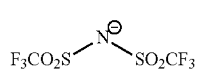 |
| D-10 | i-Bu | Me | H | 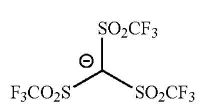 |
| D-11 | i-Bu | H | Me | $^\ominus B(CN)_4$ |

(Phthalocyanine Colorant Structure)

In one aspect of the colorant structure used in the present invention, a structure (phthalocyanine colorant structure) derived from a phthalocyanine colorant is used. As the phthalocyanine colorant structure, a structure derived from a compound represented by the following Formula (PC) is preferable.

(PC)

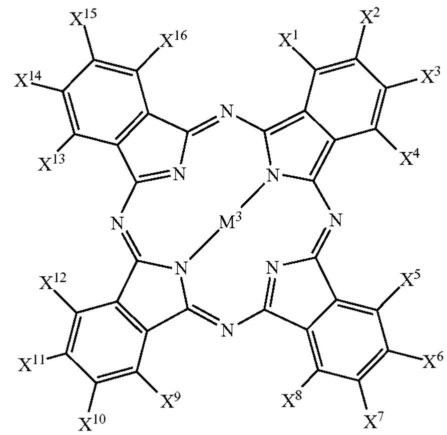

In Formula (PC), $X^1$ to $X^{16}$ each independently represent a hydrogen atom or a substituent, and $M^1$ represents Cu, V═O, or Ti═O.

Examples of the substituent represented by $X^1$ to $X^{16}$ include the groups described above regarding the substituent group T. Among these, an alkyl group, a halogen atom, an alkoxy group, a phenoxy group, an alkylthio group, a phenylthio group, an alkylamino group, or an anilino group is preferable. The substituent may further have a substituent. Examples of the substituent include the groups described above regarding the substituent group T, the group represented by Formula A, an anionic group, and a cationic group.

In particular, it is preferable that any one of $X^1$ to $X^4$, any one of $X^5$ to $X^8$, any one of $X^9$ to $X^{12}$, and any one of $X^{13}$ to $X^{16}$ each independently have at least one substituent selected from the group consisting of an alkoxy group, a phenoxy group, an alkylthio group, a phenylthio group, an alkylamino group, and an anilino group, and it is more preferable that any one of $X^1$ to $X^4$, any one of $X^5$ to $X^8$, any one of $X^9$ to $X^{12}$, and any one of $X^{13}$ to $X^{16}$ each independently have at least one substituent selected from the group consisting of an alkoxy group, a phenoxy group, an alkylthio group, a phenylthio group, an alkylamino group, and an anilino group.

It is preferable that the compound represented by Formula (PC) is bonded to another site of the near infrared absorbing colorant polymer through any site of $X^1$ to $X^{16}$.

Specific examples of the compound represented by Formula (PC) include a compound described in paragraph "0093" of JP2012-77153A and a compound derived from a colorant structure included in specific examples of the near infrared absorbing colorant polymer described below.

(Naphthalocyanine Colorant Structure)

In one aspect of the colorant structure used in the present invention, a structure (naphthalocyanine colorant structure) derived from a naphthalocyanine colorant is used. As the naphthalocyanine colorant structure, a structure derived from a compound represented by the following Formula (NPC) is preferable.

(NPC)

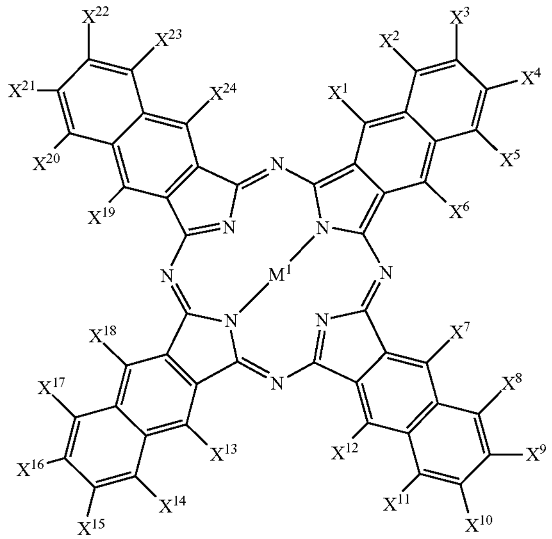

In Formula (NPC), $X^1$ to $X^{24}$ each independently represent a hydrogen atom or a substituent, and $M^1$ represents Cu or V═O.

Examples of the substituent represented by $X^1$ to $X^{24}$ include the groups described above regarding the substituent group T. Among these, an alkyl group, a halogen atom, an alkoxy group, a phenoxy group, an alkylthio group, a phenylthio group, an alkylamino group, or an anilino group is preferable. The substituent may further have a substituent. Examples of the substituent include the groups described above regarding the substituent group T, the group represented by Formula A, an anionic group, and a cationic group.

It is preferable that the compound represented by Formula (NPC) is bonded to another site of the near infrared absorbing colorant polymer through any site of $X^1$ to $X^{24}$.

Specific examples of the compound represented by Formula (NPC) include a compound described in paragraph "0093" of JP2012-77153A and a compound derived from a colorant structure included in specific examples of the near infrared absorbing colorant polymer described below.

<<Preferable Aspect of Near Infrared Absorbing Colorant Polymer>

It is preferable that the near infrared absorbing colorant polymer according to the present invention has a structure in which two or more near infrared absorbing colorant structures are bonded to a divalent or higher linking group.

In addition, it is preferable that the near infrared absorbing colorant polymer according to the present invention includes at least one selected from the group consisting of a repeating unit having a near infrared absorbing colorant structure at a side chain and a repeating unit having a near infrared absorbing colorant structure at a main chain.

In addition, it is preferable that the near infrared absorbing colorant polymer according to the present invention includes at least one selected from the group consisting of a repeating unit represented by the following Formula (A), a repeating unit represented by the following Formula (B), and a repeating unit represented by the following Formula (C), or is represented by the following Formula (D). That is, it is preferable that the near infrared absorbing colorant polymer according to the present invention is a near infrared absorbing colorant polymer (also referred to as "colorant polymer (A)") including a repeating unit represented by the following Formula (A), a near infrared absorbing colorant polymer (also referred to as "colorant polymer (B)") including a repeating unit represented by the following Formula (B), a near infrared absorbing colorant polymer (also referred to as "colorant polymer (C)") including a repeating unit represented by the following Formula (C), or a near infrared absorbing colorant polymer (also referred to as "colorant polymer (D)") represented by the following Formula (D).

<<<Colorant Polymer (A)>>>

It is preferable that the colorant polymer (A) includes the repeating unit represented by Formula (A). The proportion of the repeating unit represented by Formula (A) in the colorant polymer (A) is preferably 10 to 100 mass % with respect to all the repeating units constituting the near infrared absorbing colorant polymer. The lower limit is more preferably 20 mass % or higher, still more preferably 30 mass % or higher, and even still more preferably 50 mass % or higher. The upper limit is preferably 95 mass % or lower. In addition, the proportion of the repeating unit represented by Formula (A) in the colorant polymer (A) is preferably 5 to 50 mol %, more preferably 10 to 45 mol %, still more preferably 10 to 40 mol %, and even still more preferably 10 to 35 mol % with respect to all the repeating units constituting the near infrared absorbing colorant polymer.

(A)

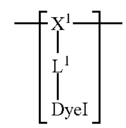

in Formula (A), $X^1$ represents a main chain of the repeating unit, and $L^1$ represents a single bond or a divalent linking group. DyeI represents a near infrared absorbing colorant structure.

In Formula (A), $X^1$ represents a main chain of the repeating unit, and typically represents a linking group which is formed by a polymerization reaction. For example, it is preferable that $X^1$ represents a main chain derived from a compound having a (meth)acryl group, a styrene group, a vinyl group, or an ether group. In addition, it is also preferable that $X^1$ represents a backbone-cyclic alkylene group. The group represented by $X^1$ is not particularly limited as long as it is a linking group formed of a well-known polymerizable monomer. The linking group is preferably selected from linking groups represented by the following formulae (XX-1) to (XX-25), is more preferably selected from linking groups represented by the following formulae (XX-1), (XX-2), (XX-10) to (XX-17), (XX-18), (XX-19), (XX-24), and (XX-25), and is still more preferably selected from linking groups represented by the following formulae (XX-1), (XX-2), (XX-10) to (XX-17), (XX-24), and (XX-25).

In the formulae, * represents linking to $L^1$ at a site represented by *. Me represents a methyl group. In addition, R in the formulae (XX-18) and (XX-19) represents a hydrogen atom, an alkyl group having 1 to 5 carbon atoms, or a phenyl group.

(XX-1)

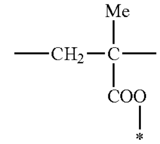

(XX-2)

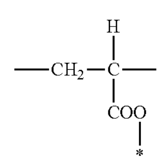

-continued
(XX-3)
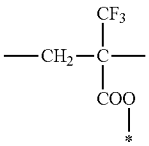
(XX-4)
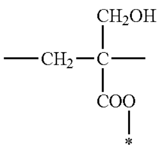
(XX-5)
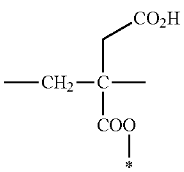
(XX-6)
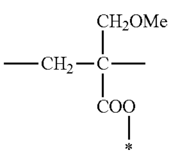
(XX-7)
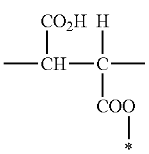
(XX-8)
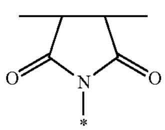
(XX-9)
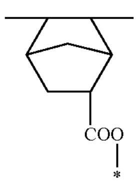
(XX-10)
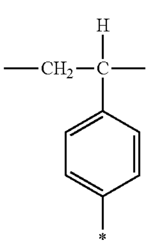
(XX-11)
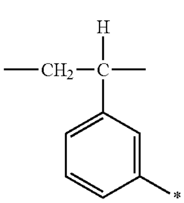
-continued
(XX-12)
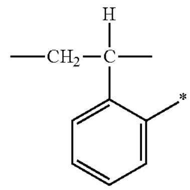
(XX-13)
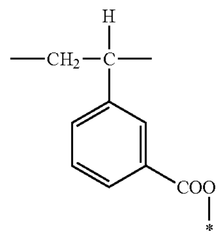
(XX-14)
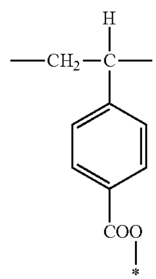
(XX-15)
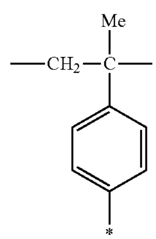
(XX-16)
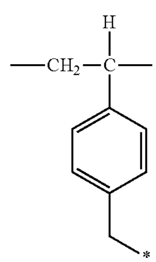
(XX-17)
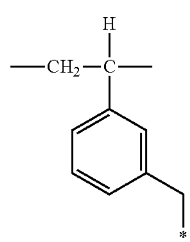
(XX-18)
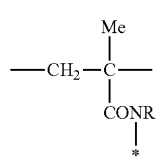

-continued (XX-19)

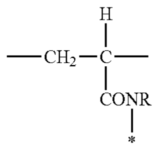

(XX-20)

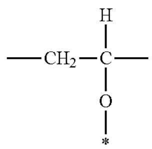

(XX-21)

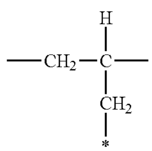

(XX-22)

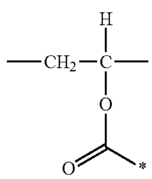

(XX-23)

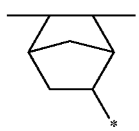

(XX-24)

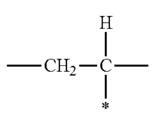

(XX-25)

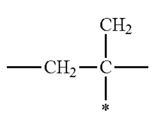

$L^1$ represents a single bond or a divalent linking group. Examples of the divalent linking group include an alkylene group having 1 to 30 carbon atoms, an arylene group having 6 to 30 carbon atoms, a heterocyclic linking group, —CH═CH—, —O—, —S—, —C(═O)—, —COO—, —NR—, —CONR—, —OCO—, —SO—, —$SO_2$—, and a linking group which is formed by two or more of the above groups linking to each other. Here, R's each independently represents a hydrogen atom, an alkyl group, an aryl group, or a heteroaryl group.

The number of carbon atoms in the alkylene group is preferably 1 to 30. The upper limit is more preferably 25 or less and still more preferably 20 or less. The lower limit is more preferably 2 or more and still more preferably 3 or more. The alkylene group may be linear, branched, or cyclic.

The number of carbon atoms in the arylene group is preferably 6 to 20 and more preferably 6 to 12.

It is preferable that the heterocyclic linking group is a 5- or 6-membered ring. It is preferable that heteroatoms included in the heterocyclic linking group are an oxygen atom, a nitrogen atom, and a sulfur atom. The number of heteroatoms included in the heterocyclic linking group is preferably 1 to 3.

$L^1$ represents preferably an alkylene group, an arylene group, —NH—, —CO—, —O—, —COO—, —OCO—, —S—, or a linking group including a combination of two or more selected from the above groups, and more preferably an alkylene group, an arylene group, or a divalent group including a combination of one or more selected from an alkylene group, an arylene group, —O—, —COO—, —OCO—, and —S—.

A linking group that links DyeI and $X^1$ may include —S—.

Regarding $L^1$, the number of atoms constituting a chain that links DyeI and $X^1$ is preferably 3 or more and more preferably 5 or more. The upper limit is, for example, 30 or less or 25 or less. For example, in the following (A-ppb-1), the number of atoms constituting a chain that links $X^1$ and DyeI is 14. In addition, in the following (A-ppb-8), the number of atoms constituting a chain that links $X^1$ and DyeI is 13. A numerical value shown in the structural formula is the number of atoms constituting a chain that links $X^1$ and DyeI.

(A-ppb-1)

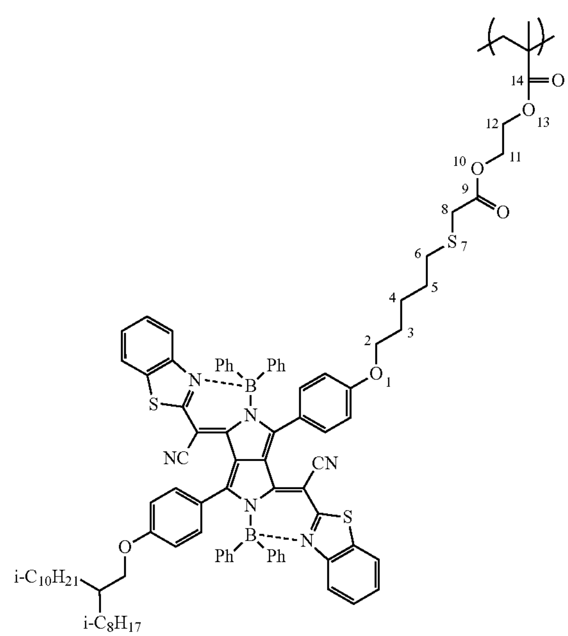

-continued (A-ppb-8)

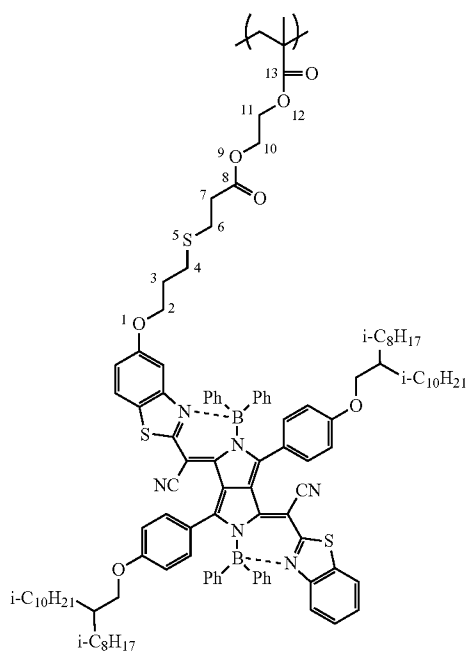

DyeI represents a near infrared absorbing colorant structure. It is preferable that the near infrared absorbing colorant structure represented by DyeI is a structure in which one or more arbitrary hydrogen atoms are removed from the near infrared absorbing colorant (colorant compound). In addition, it is preferable that a part of the near infrared absorbing colorant (colorant compound) is bonded to $X^1$ or $L^1$.

The colorant polymer including the repeating unit represented by Formula (A) can be synthesized using the following methods including: (1) a method of synthesizing a near infrared absorbing colorant having a polymerizable group by addition polymerization; and (2) a method of causing a polymer having a highly reactive functional group such as an isocyanate group, an acid anhydride group, or an epoxy group to react with a near infrared absorbing colorant having a functional group (for example, a hydroxyl group, a primary or secondary amino group, or a carboxyl group) which is reactive with the highly reactive functional group.

As the addition polymerization, well-known addition polymerization (radical polymerization, anionic polymerization, cationic polymerization) can be used. Among these, radical polymerization is preferable from the viewpoints of moderating reaction conditions and preventing the colorant skeleton from being decomposed. Well-known reaction conditions can be applied to the radical polymerization.

From the viewpoint of heat resistance, it is preferable that the colorant polymer including the repeating unit represented by Formula (A) is a radical polymer obtained by radical polymerization of a near infrared absorbing colorant having an ethylenically unsaturated bond.

Specific examples of the repeating unit represented by Formula (A) are as follows.

(A-ppb-1)

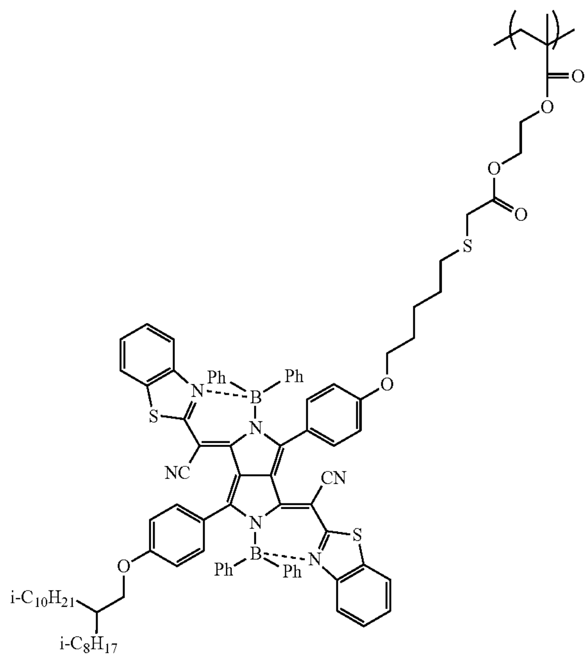

-continued
(A-ppb-2)
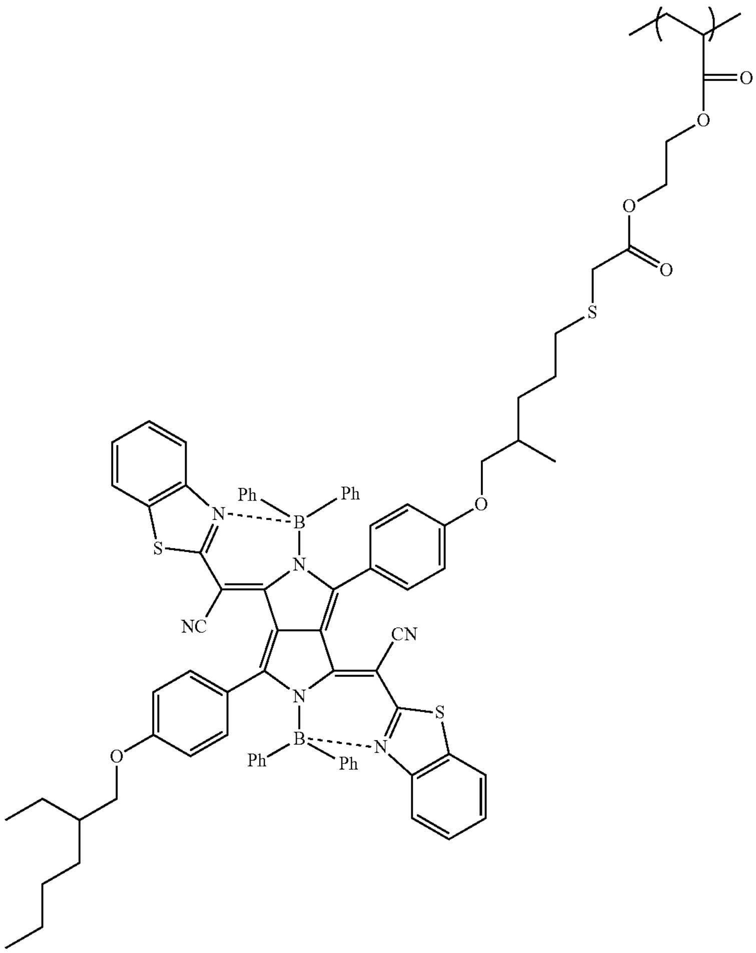
(A-ppb-3)
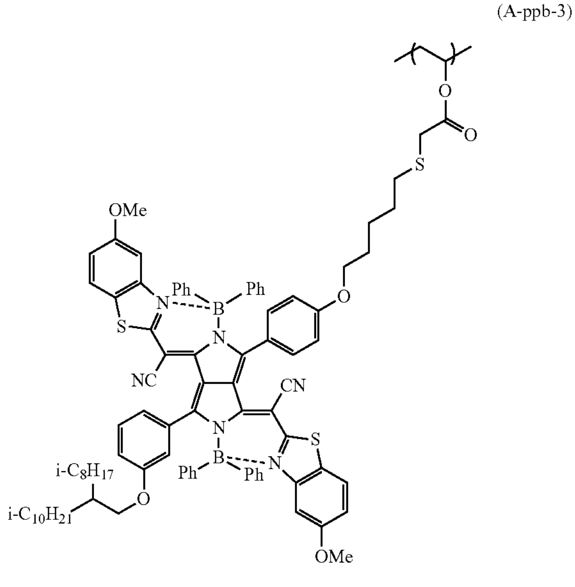
(A-ppb-4)
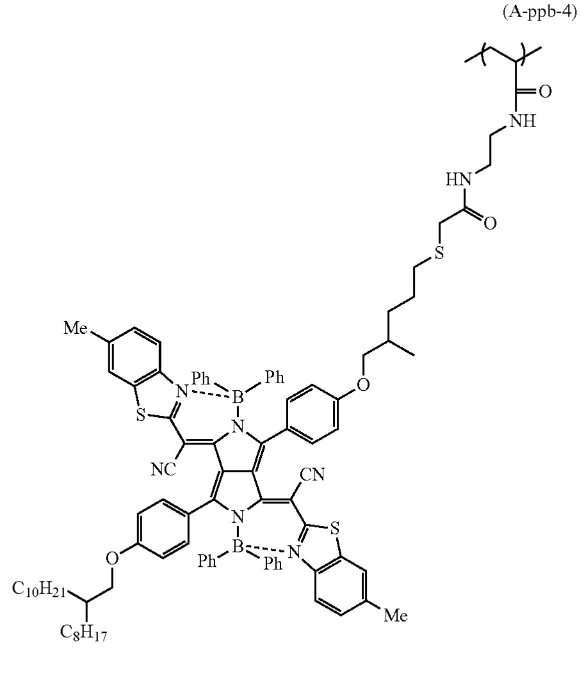

-continued
(A-ppb-5)
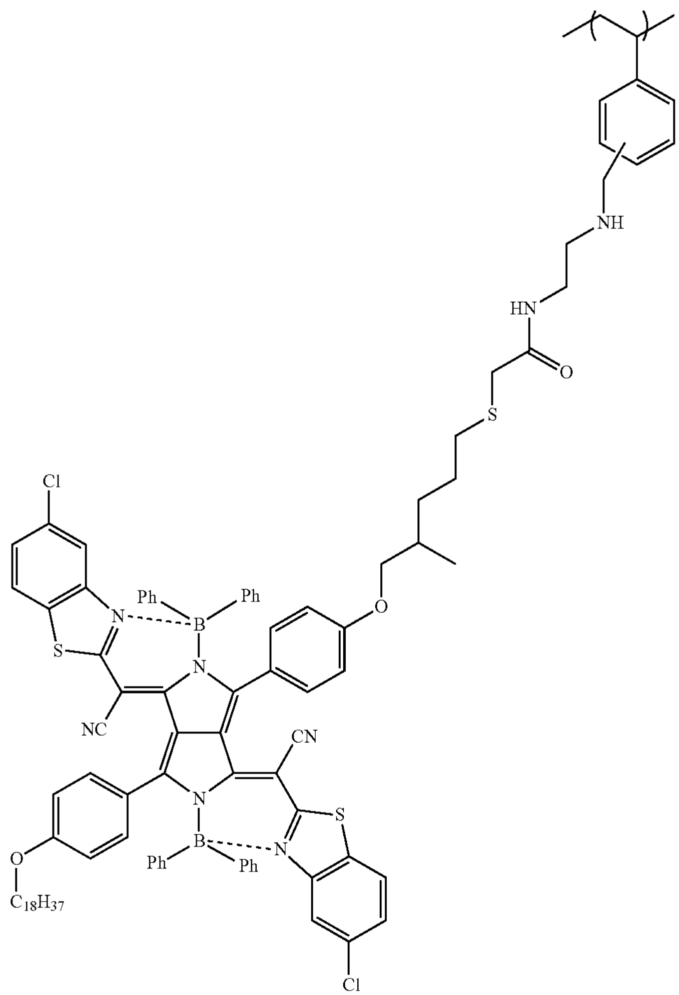
(A-ppb-6)
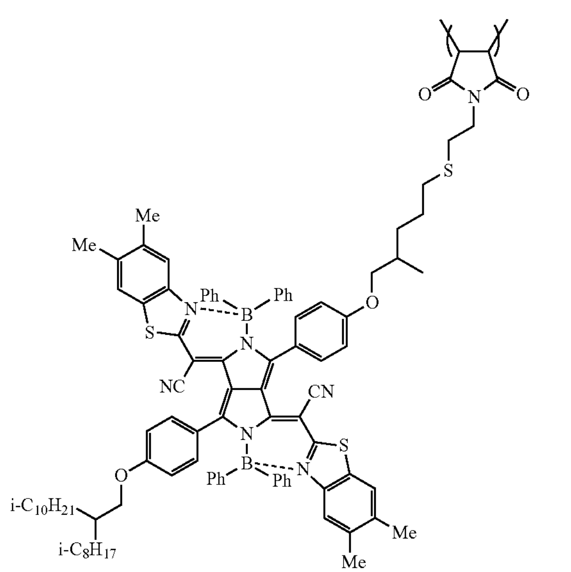
(A-ppb-7)
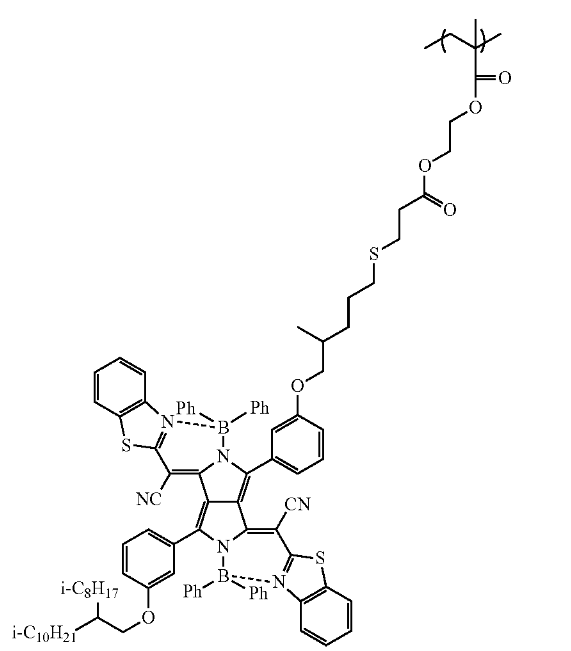

-continued
(A-ppb-8)
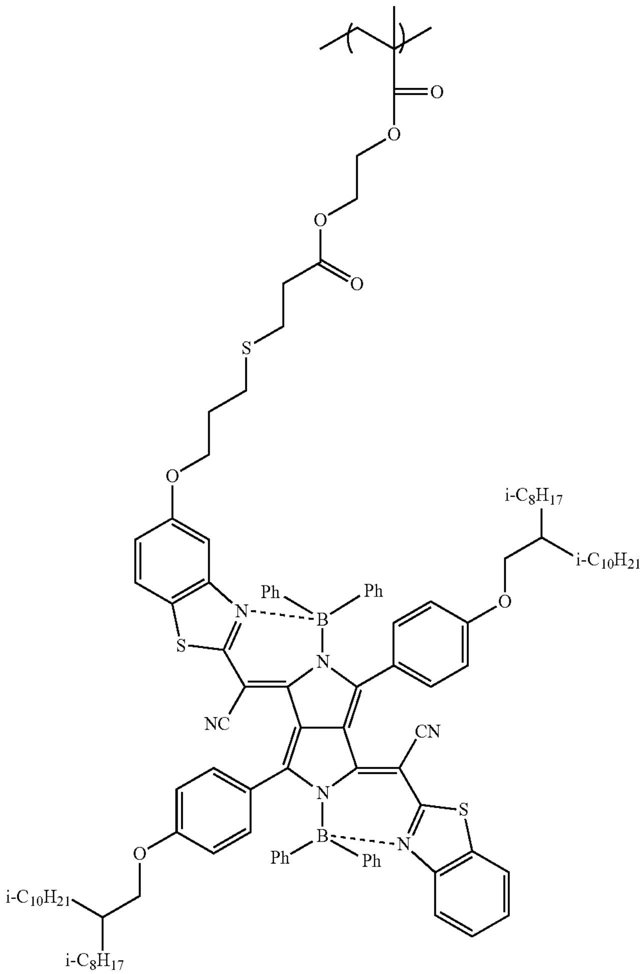
(A-ppb-9)
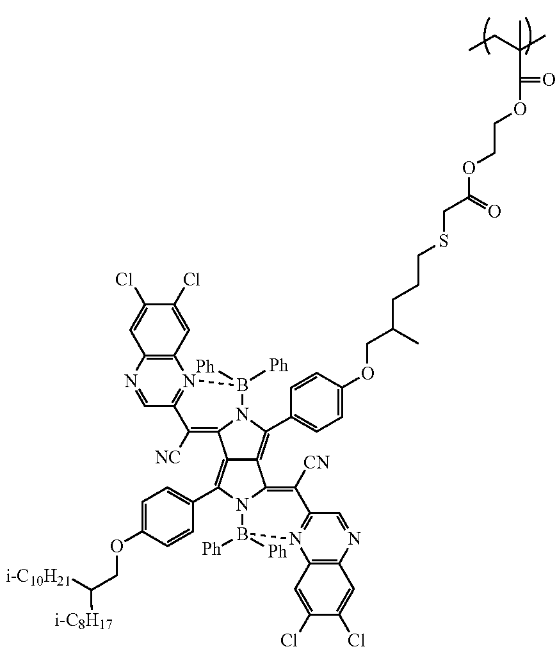
(A-ppb-10)
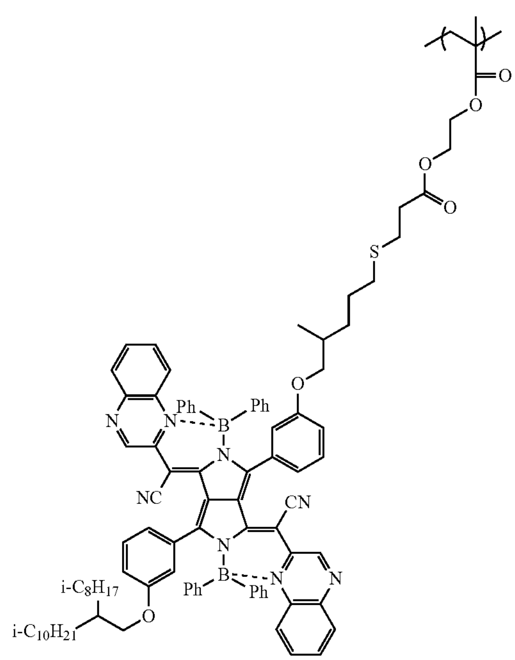

-continued
(A-ppb-11)
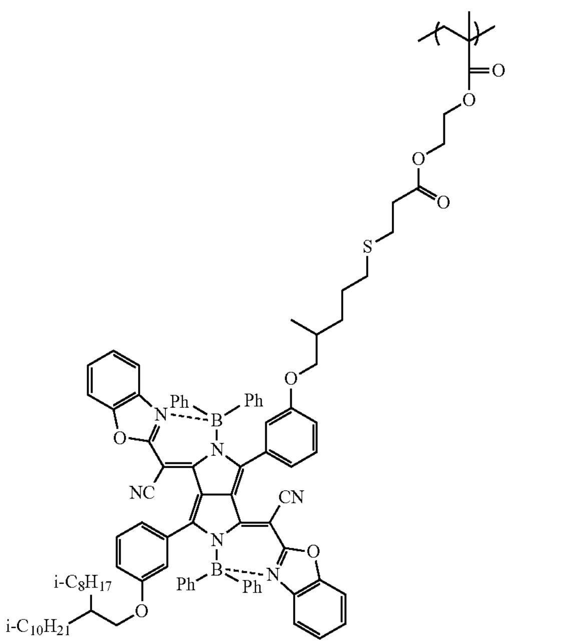
(A-ppb-12)
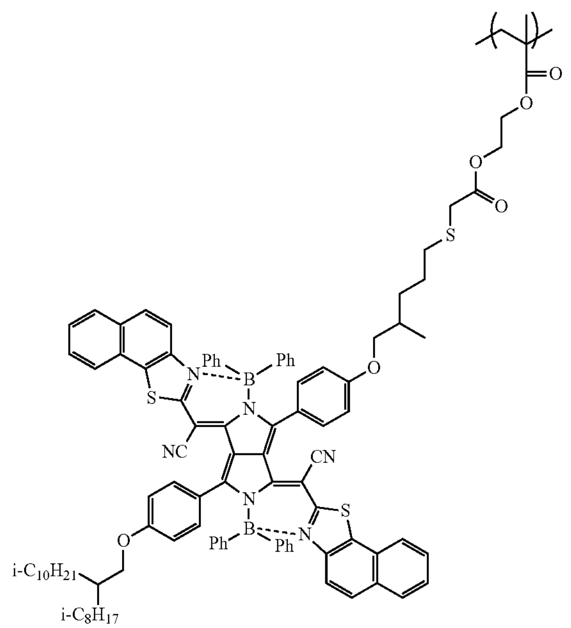
(A-ppb-13)
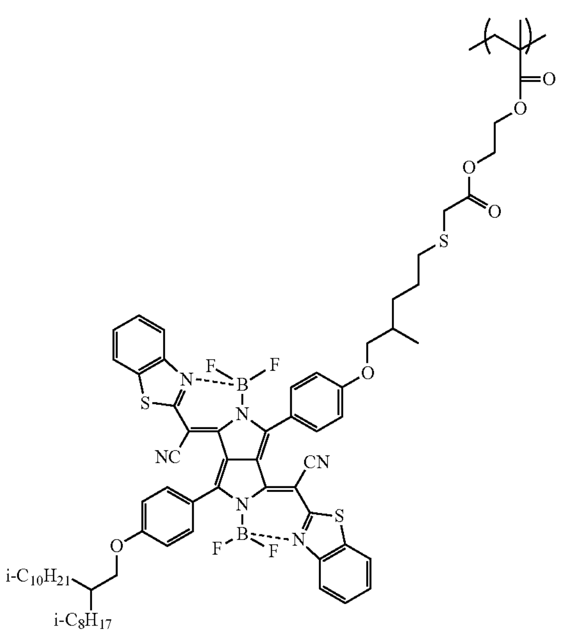
(A-ppb-14)
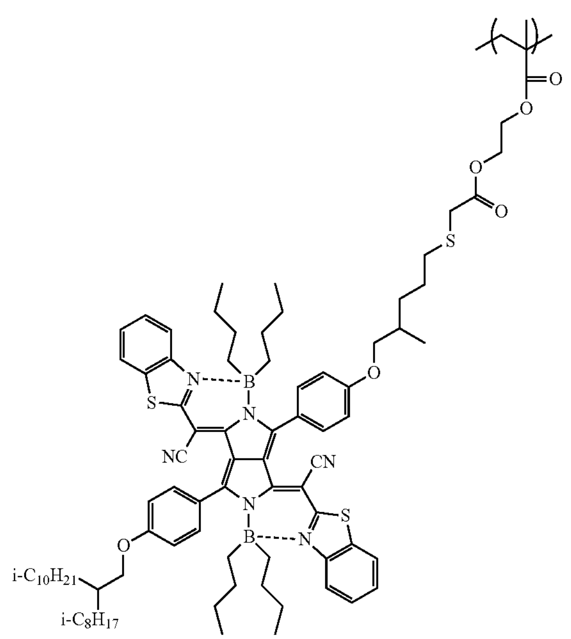

-continued
(A-ppb-15)
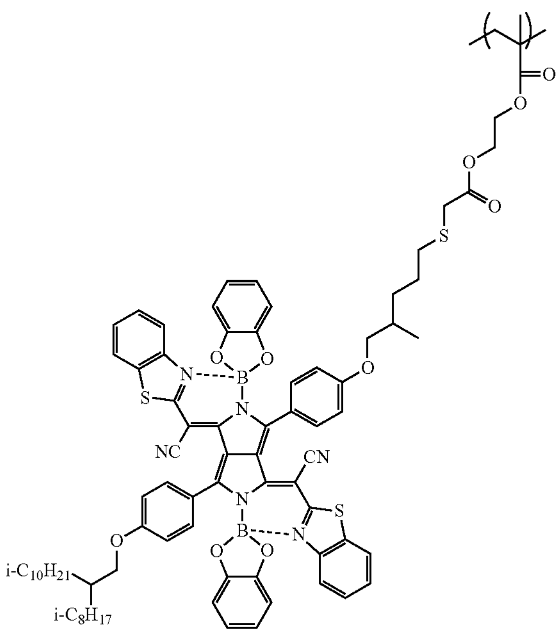
(A-ppb-16)
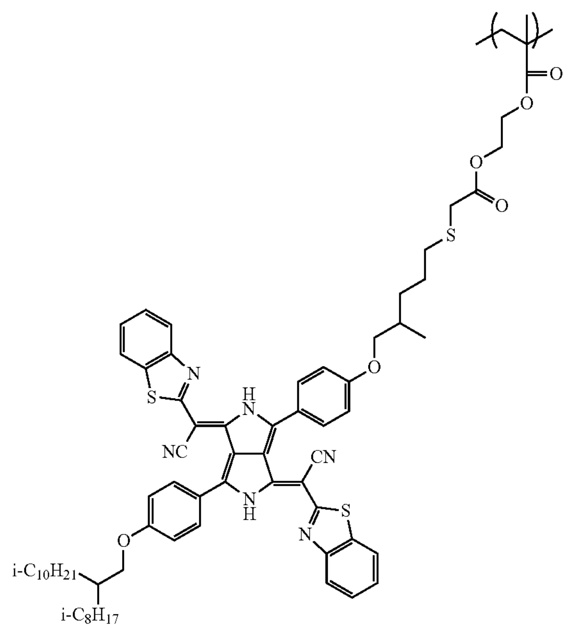
(A-sq-1)
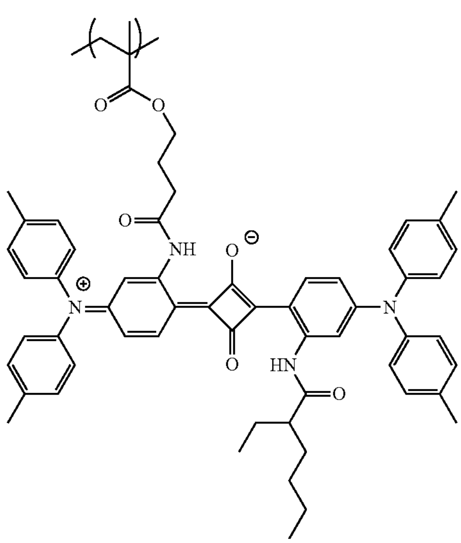
(A-sq-2)
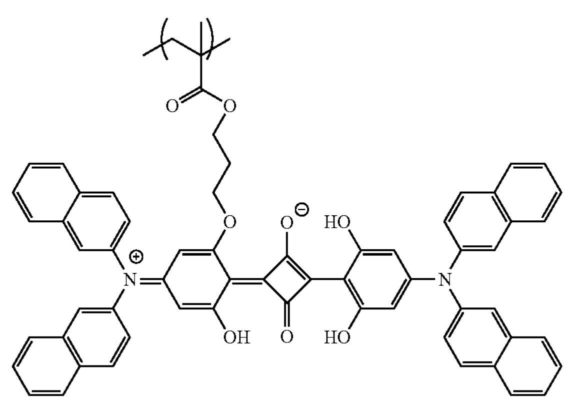

-continued
(A-sq-3)
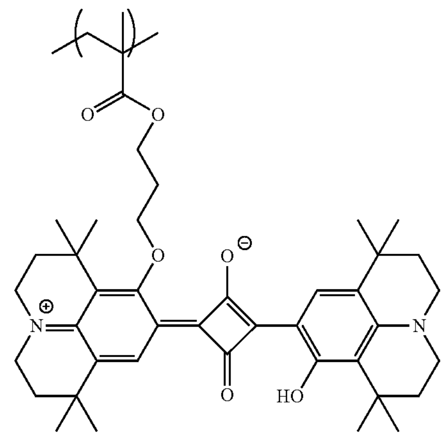
(A-sq-4)
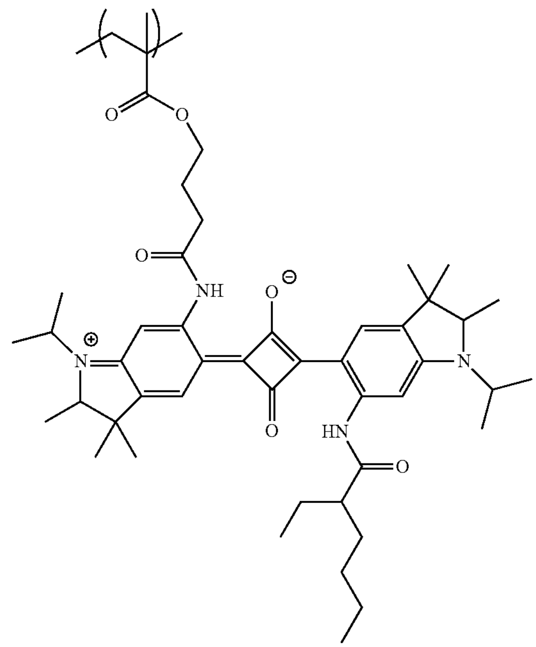
(A-sq-5)
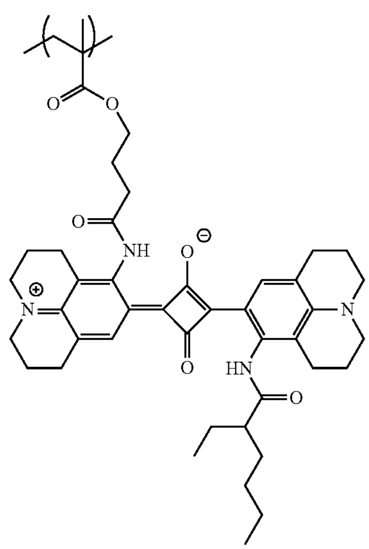
(A-sq-6)
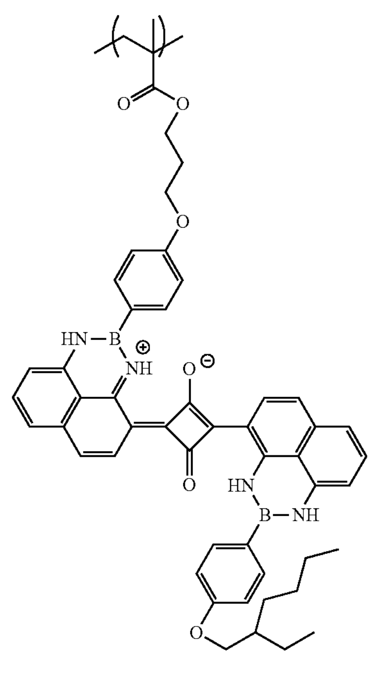

-continued
(A-sq-7)
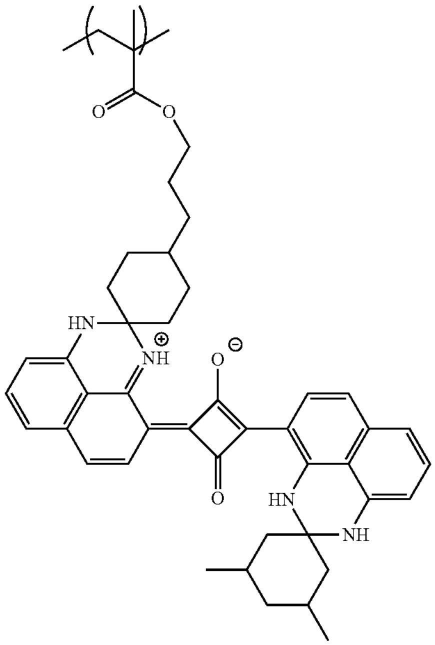
(A-sq-8)
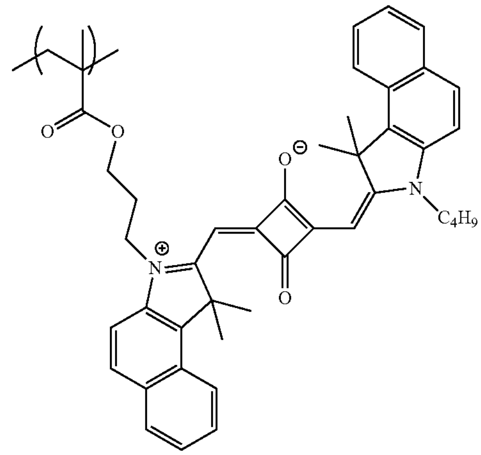
(A-sq-9)
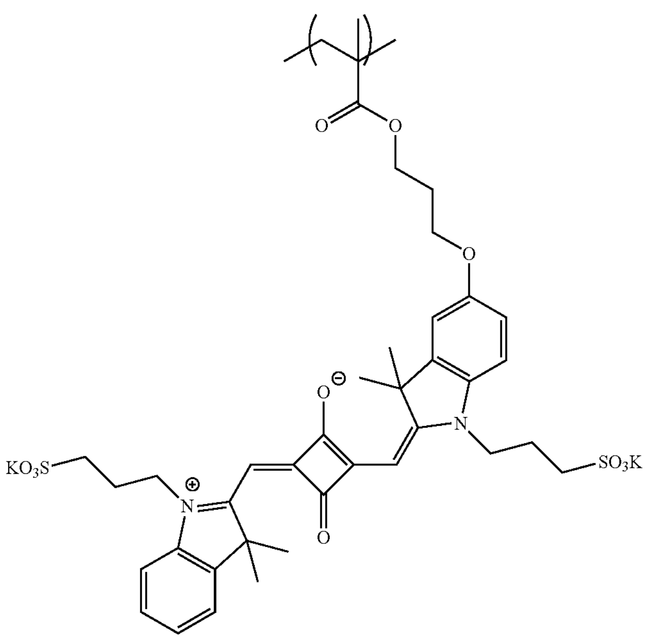

-continued
(A-sq-10)
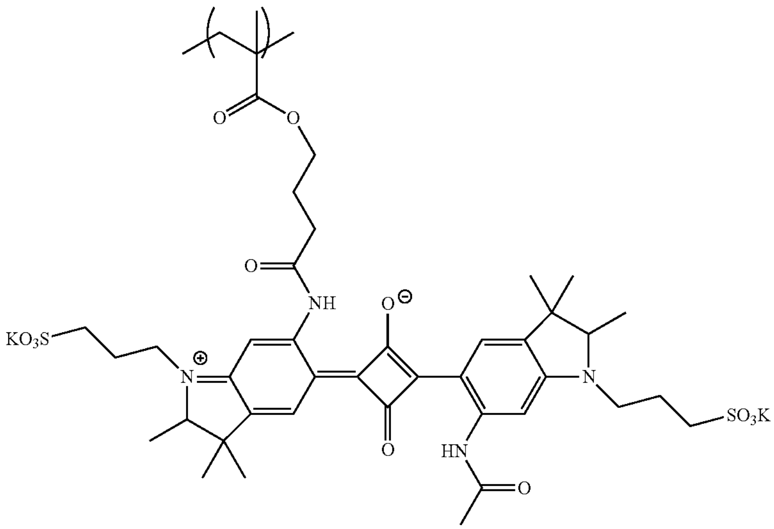
(A-cy-1)
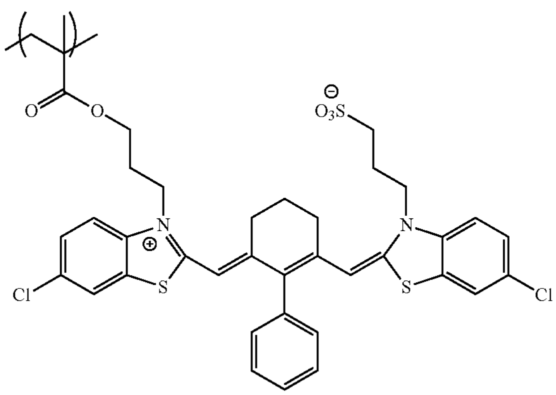
(A-cy-2)
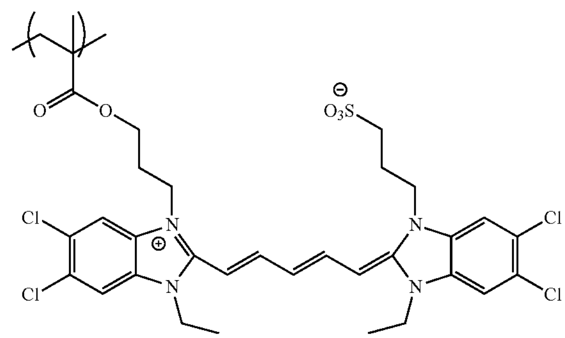
(A-cy-3)
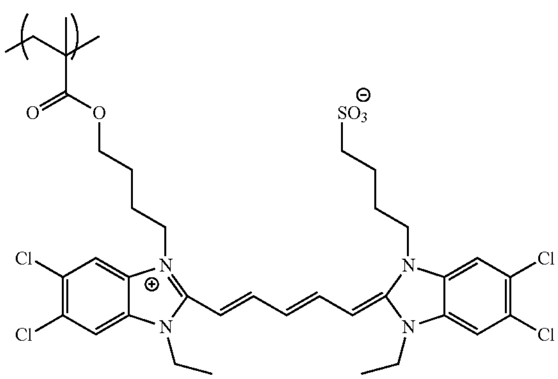
(A-cy-4)
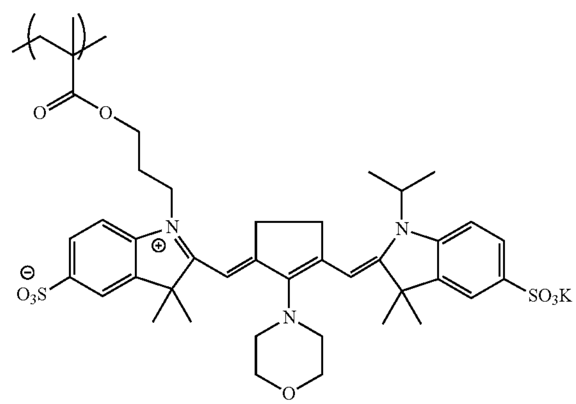

-continued
(A-cy-5)
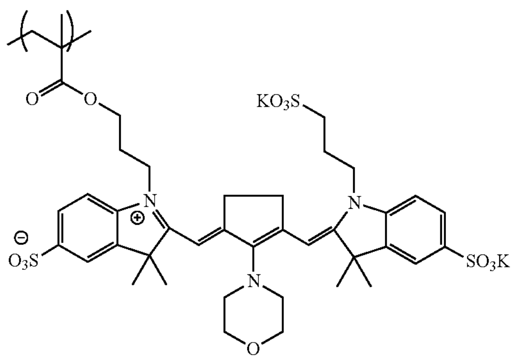
(A-cy-6)
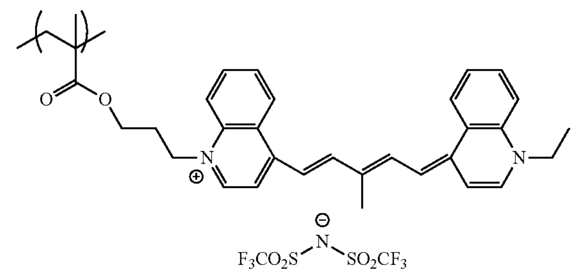
(A-cy-7)
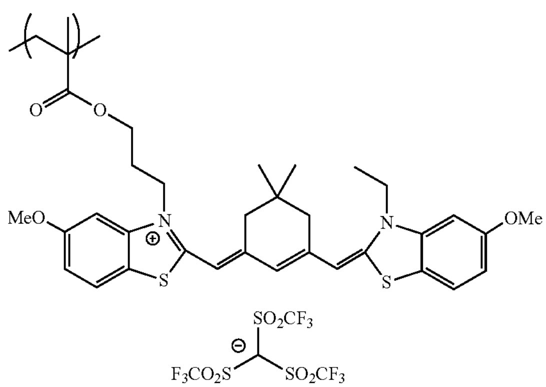
(A-cy-8)
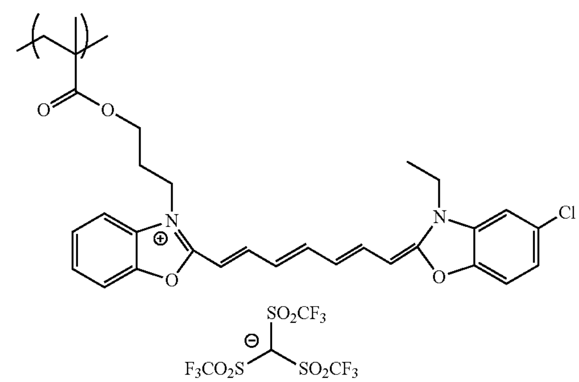
(A-cy-9)
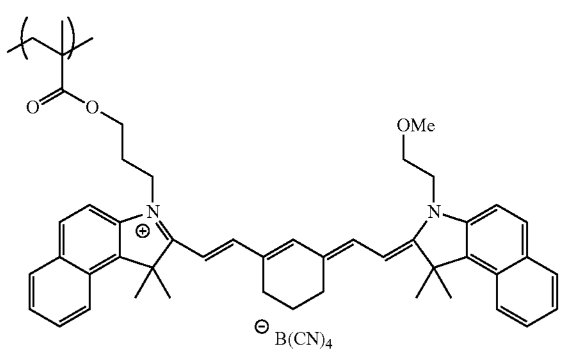
(A-cy-10)
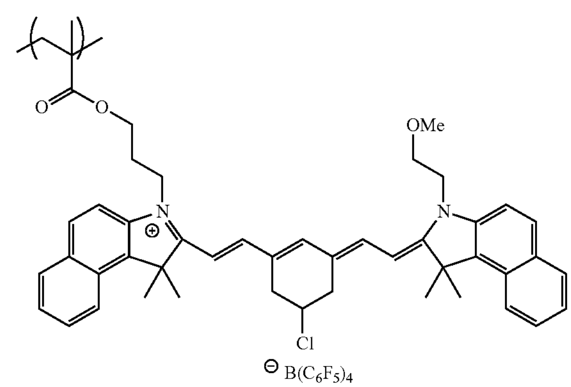
(A-ox-1)
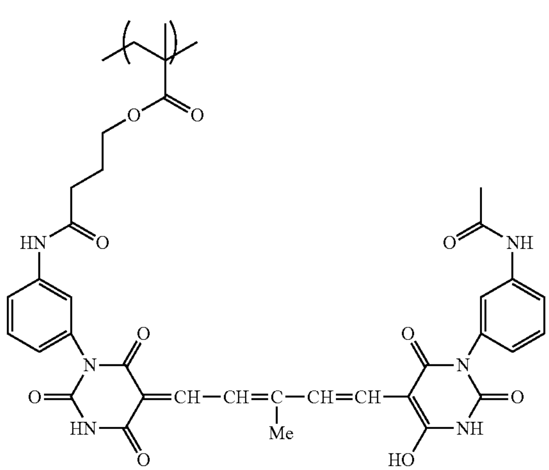
(A-ox-2)
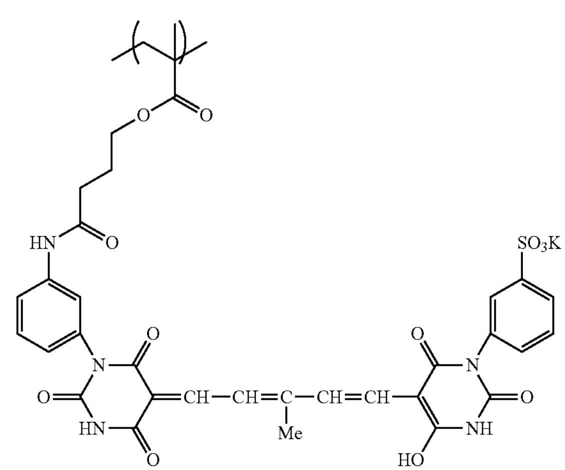

-continued
(A-ox-3)
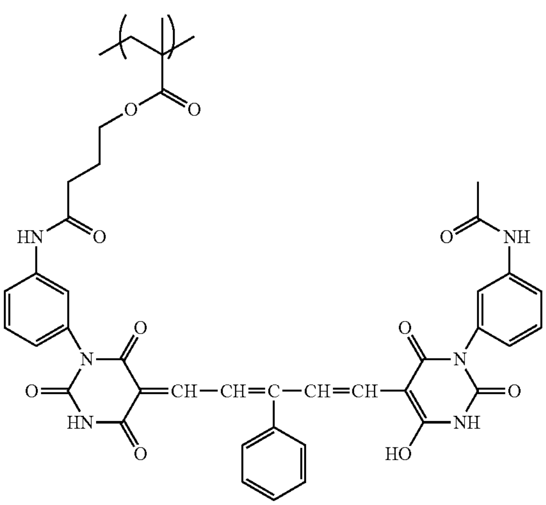
(A-ox-4)
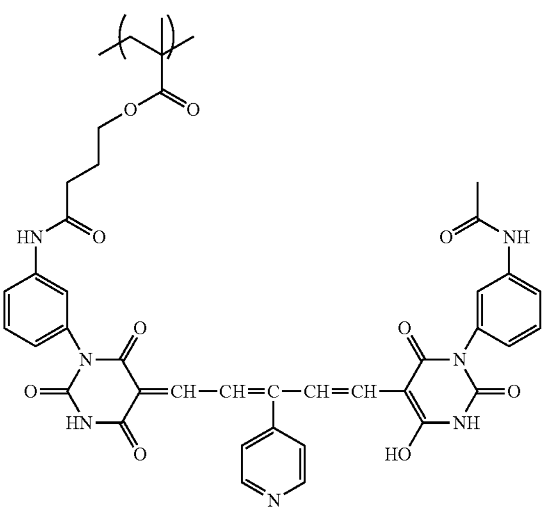
(A-ox-5)
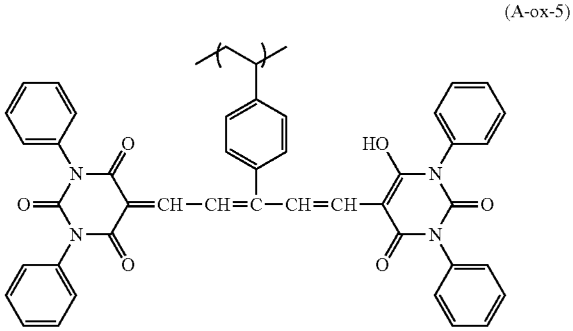
(A-ph-1)
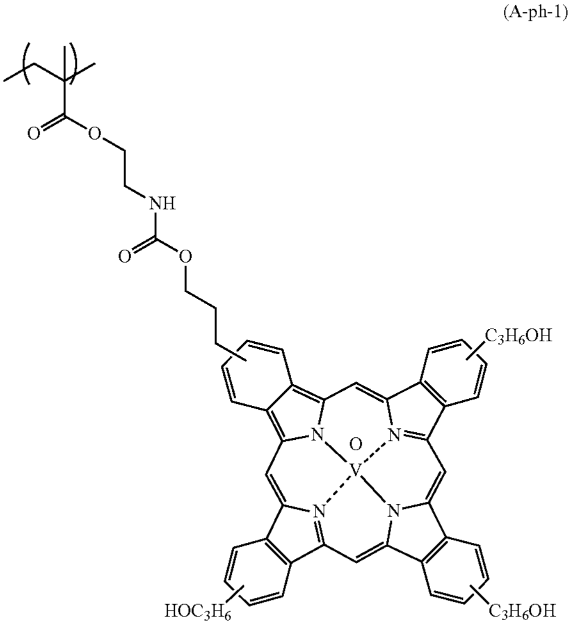

-continued
(A-ph-2)
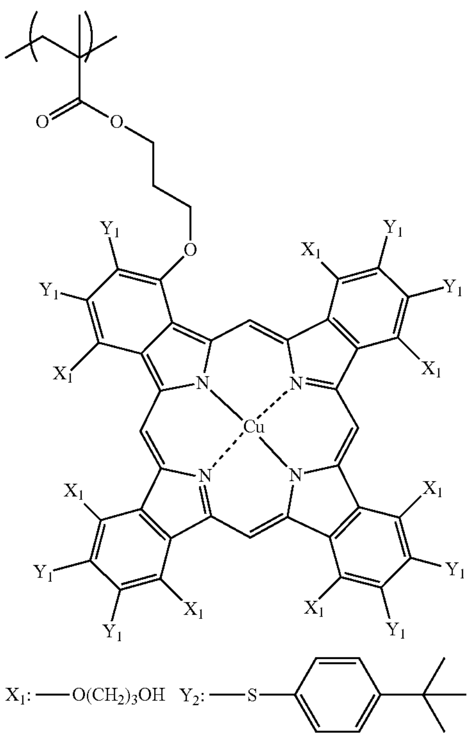
(A-ph-3)
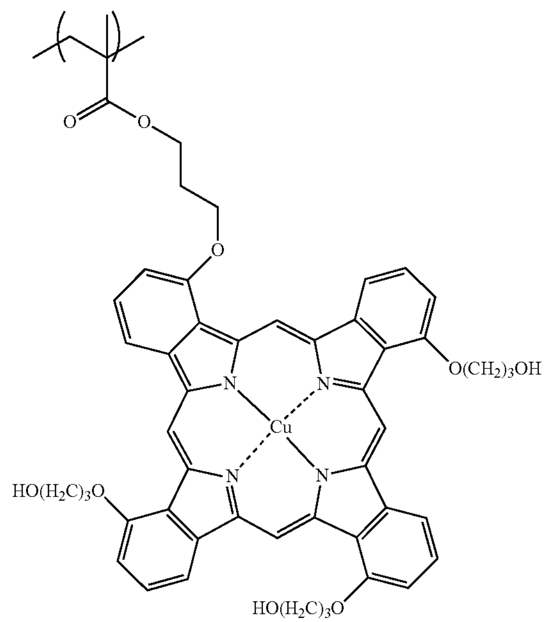
(A-ph-4)
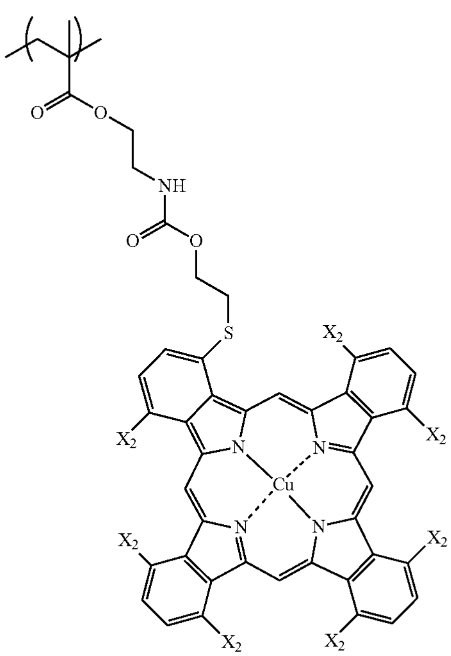
$X_2$: —$S(CH_2)_2OH$
(A-ph-5)
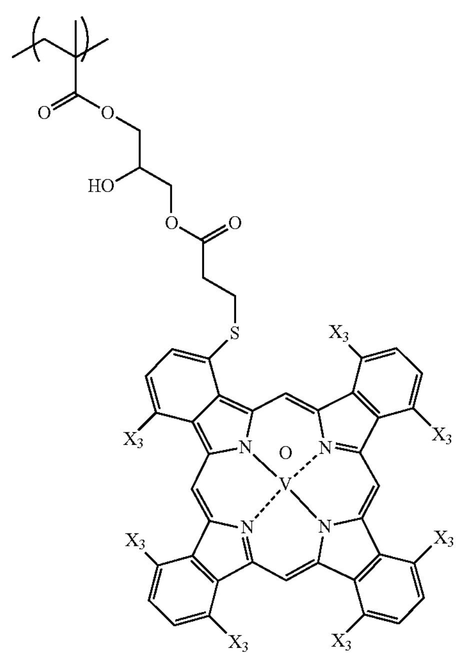
$X_3$: —$S(CH_2)_2CO_2H$ -continued
(A-ph-6)
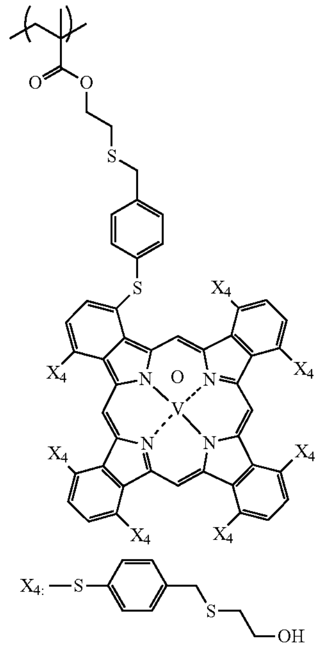
(A-ph-7)
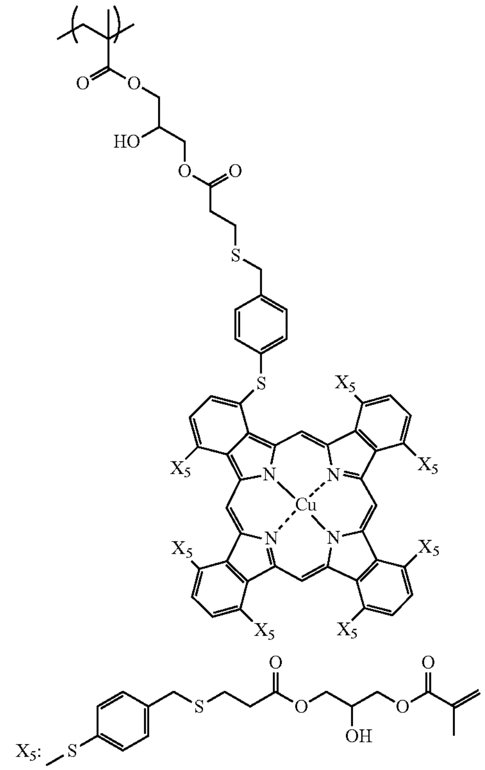
(A-ph-8)
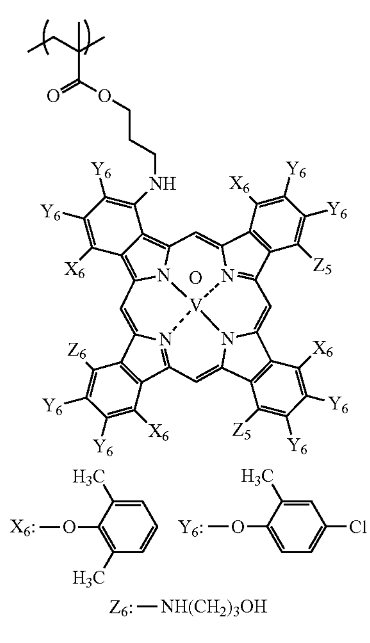
(A-na-1)
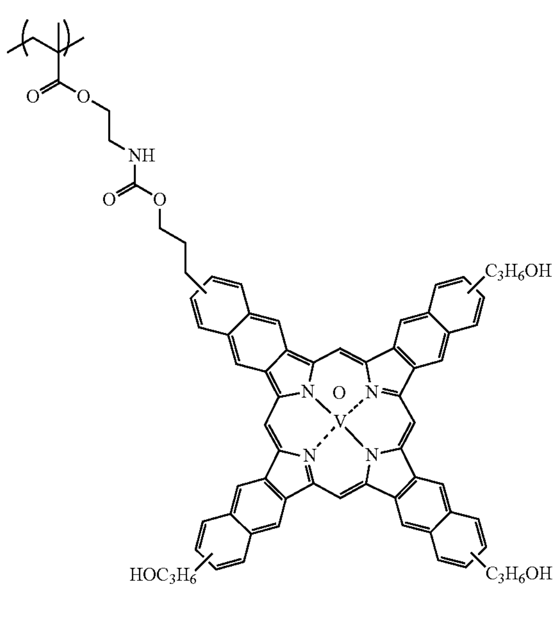

-continued
(A-na-2)
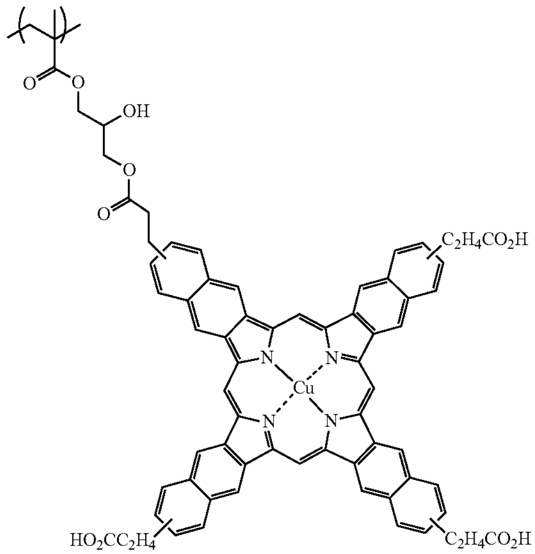
(A-na-3)
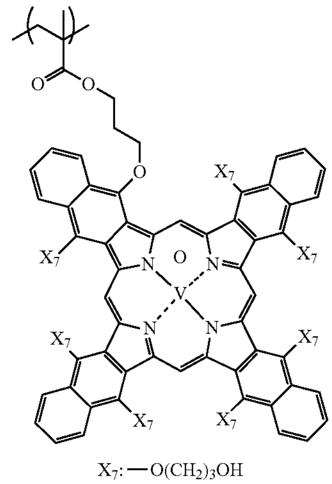
(A-na-4)
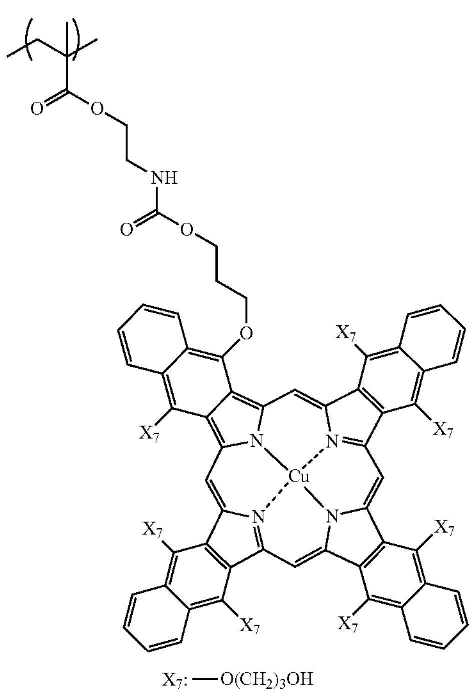
(A-di-1)
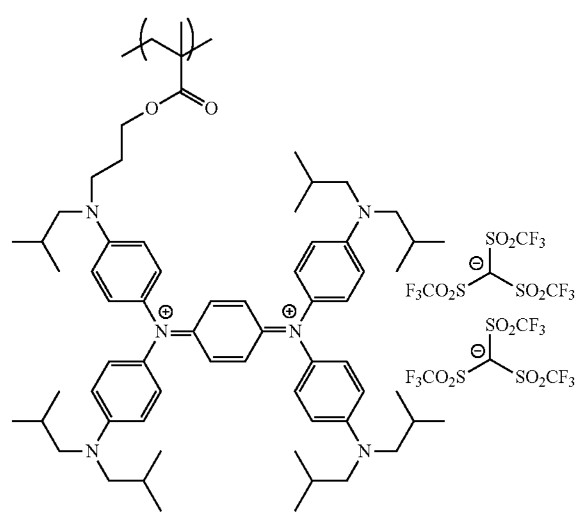

-continued (A-di-2)

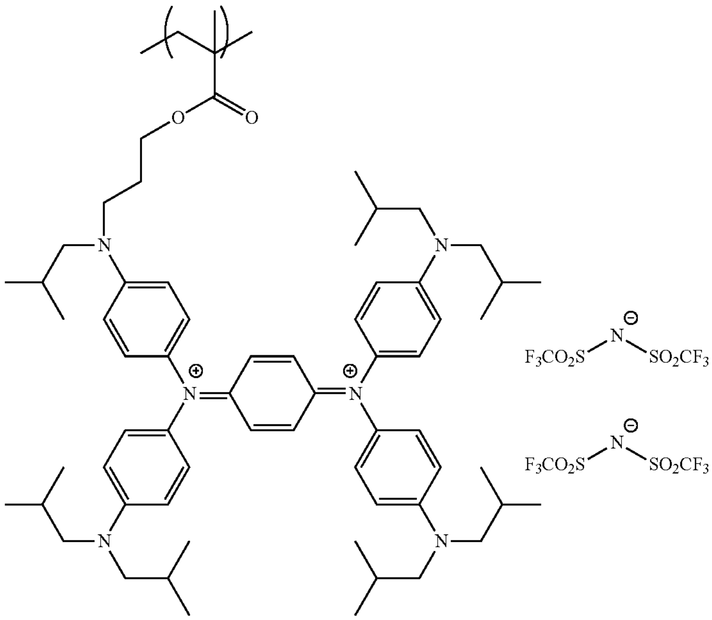

(Other Repeating Units)

The colorant polymer according to the present invention may include other repeating units in addition to the repeating unit represented by Formula (A). The other repeating units may have a functional group such as a curable group or an acid group. The other repeating units may not have a functional group. It is preferable that the colorant polymer includes one or more selected from a repeating unit having an acid group and a repeating unit having a curable group.

Examples of the curable group include a radically polymerizable group, a cyclic ether group (an epoxy group, an oxetanyl group), an oxazoline group, and a methylol group. Examples of the radically polymerizable group include an ethylenically unsaturated bond such as a vinyl group, a (meth)allyl group, or a (meth)acryloyl group. It is preferable that the curable group is a radically polymerizable group.

The proportion of the repeating unit having a curable group is preferably 0 to 50 mass % with respect to all the repeating units constituting the colorant polymer. The lower limit is preferably 1 mass % or higher and more preferably 3 mass % or higher. The upper limit is more preferably 35 mass % or lower, and still more preferably 30 mass % or lower.

Examples of the acid group include a carboxyl group, a sulfonate group, and a phosphate group. As the acid group, one kind may be used, or two or more kinds may be used.

The proportion of the repeating unit having an acid group is preferably 0 to 50 mass % with respect to all the repeating units constituting the colorant polymer. The lower limit is preferably 1 mass % or higher and more preferably 3 mass % or higher. The upper limit is more preferably 35 mass % or lower, and still more preferably 30 mass % or lower.

Examples of other functional groups include: a development promoting group such as a group in which 2 to 20 unsubstituted alkyleneoxy chains are repeated, lactone, an acid anhydride, amide, or a cyano group; and a hydrophobicity adjusting group such as a long-chain or cyclic alkyl group, an aralkyl group, an aryl group, a polyalkylene oxide group, a hydroxyl group, a maleimide group, or an amino group. The functional groups can be appropriately introduced.

In group in which 2 to 20 unsubstituted alkyleneoxy chains are repeated, the number of the alkyleneoxy chains repeated is preferably 2 to 15 and more preferably 2 to 10. One alkyleneoxy chain is represented by —$(CH_2)_nO$—, and n represents an integer of preferably 1 to 10, more preferably 1 to 5, and still more preferably 2 or 3.

Specific examples of the other repeating units are shown below, but the present invention is not limited thereto.

M-1

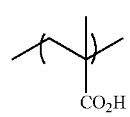

M-2

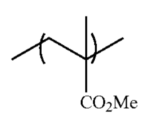

M-3

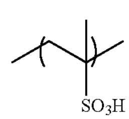

M-4

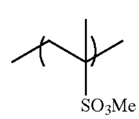

-continued
M-5
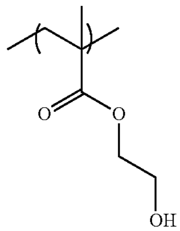
M-6
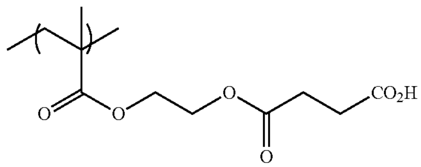
M-7
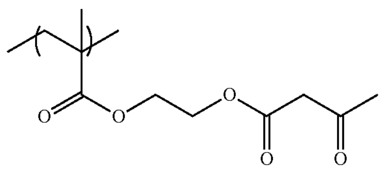
M-8
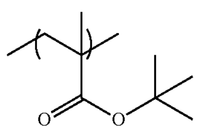
M-9
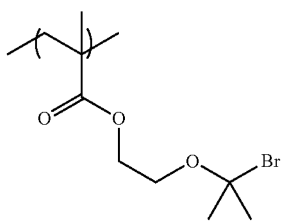
M-10
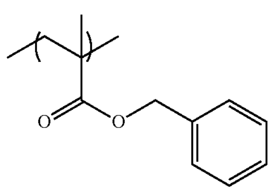
M-11
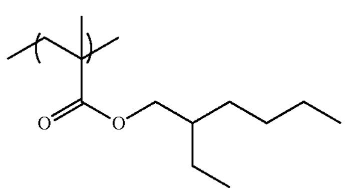
M-12
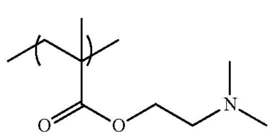
M-13
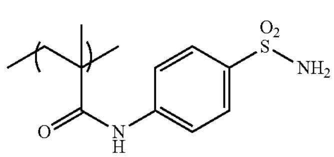
-continued
M-14
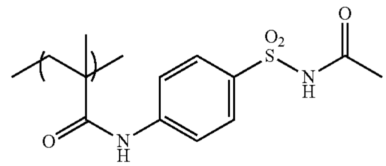
M-15
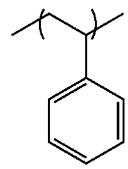
M-16
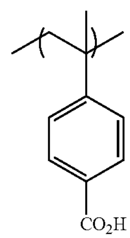
M-17
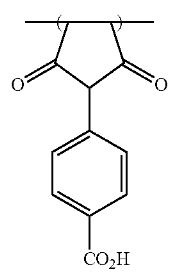
M-18
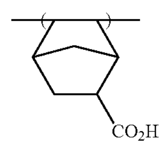
M-19
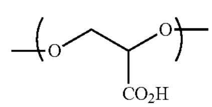
M-20
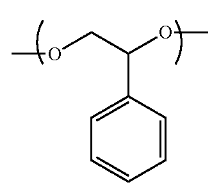
M-21
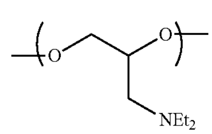
M-22
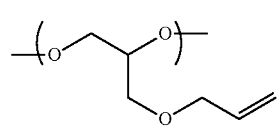

-continued

M-23

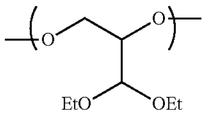

M-24

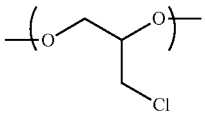

M-25

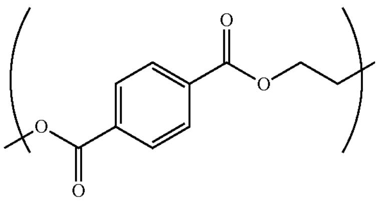

M-26

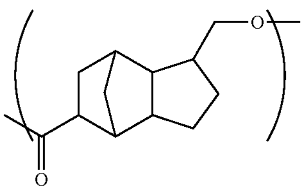

M-27

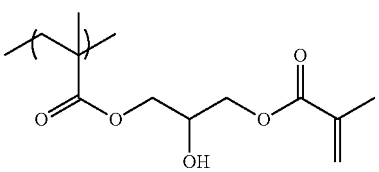

(M-28)

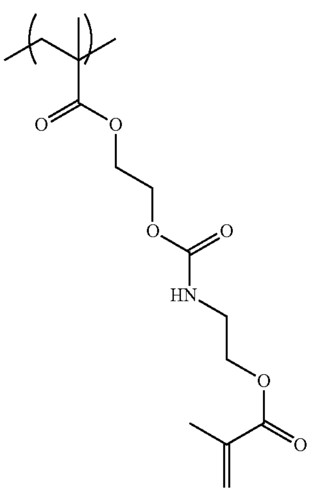

(M-29)

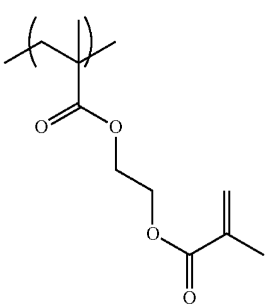

-continued (M-30)

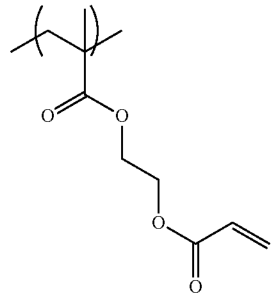

<<<Colorant Polymer (B)>>>

The colorant polymer (B) includes the repeating unit represented by Formula (B). The proportion of the repeating unit represented by Formula (B) in the colorant polymer (B) is preferably 10 to 100 mass % with respect to all the repeating units constituting the near infrared absorbing colorant polymer. The lower limit is more preferably 20 mass % or higher, still more preferably 30 mass % or higher, and even still more preferably 50 mass % or higher. The upper limit is preferably 95 mass % or lower.

(B)

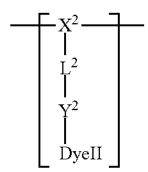

In Formula (B), $X^2$ represents a linking group which is formed by polymerization, $L^2$ represents a single bond or a divalent linking group, DyeII represents a near infrared absorbing colorant structure having a group capable of forming an ionic bond or a coordinate bond with $Y^2$, and $Y^2$ represents a group capable of forming an ionic bond or a coordinate bond with DyeII.

$X^2$ has the same definition and the same preferable range as those of $X^1$ in Formula (A).

$L^2$ represents a single bond or a divalent linking group. Examples of the divalent linking group include an alkylene group having 1 to 30 carbon atoms, an arylene group having 6 to 30 carbon atoms, a heterocyclic linking group, —CH═CH—, —O—, —S—, —C(═O)—, —COO—, —NR—, —CONR—, —OCO—, —SO—, —$SO_2$—, and a linking group which is formed by two or more of the above groups linking to each other. Here, R's each independently represents a hydrogen atom, an alkyl group, an aryl group, or a heteroaryl group. The details of the divalent linking group are the same as those of $L^1$ in Formula (A).

$L^2$ preferably represents a single bond, or represents an alkylene group, an arylene group, —NH—, —CO—, —O—, —COO—, —OCO—, or a divalent linking group including a combination of two or more selected from the above groups. In a case where $L^2$ represents a divalent linking group, the number of atoms that link $X^2$ and $Y^2$ is preferably 1 to 8, more preferably 1 to 5, and still more preferably 1 to 3.

$Y^2$ is not particularly limited as long as it forms an ionic bond or a coordinate bond with DyeII, and represents an anionic group or a cationic group.

Examples of the anionic group include —$SO_3^-$, —$COO^-$, —$PO_4^-$, —$PO_4H^-$, a bis(sulfonyl)imide anion, a tris(sulfonyl)methide anion, and a tetraaryl borate anion. As the anionic group, a group represented by Formula (Z-1), a group represented by Formula (Z-2), or a group represented by Formula (Z-3) is also preferable.

$*—Y^{11}-A^1$ Formula (Z-1)

In Formula (Z-1), * represents a binding site to $L^2$ in Formula (B), $Y^{11}$ represents a fluorinated alkylene group, and $A^1$ represents $SO_3^-$.

The number of carbon atoms in the fluorinated alkylene group represented by $Y^{11}$ is preferably 1 to 20, more preferably 1 to 10, and still more preferably 1 to 6. In addition, it is preferable the group represented by Formula (Z-1) is a perfluoroalkylene group.

$$*—Y^{12}\text{-}(A^2)_n \qquad \text{Formula (Z-2)}$$

In Formula (Z-2), * represents a binding site to $L^2$ in Formula (B).

$Y^{12}$ represents an anion including a boron atom, a carbon atom, a nitrogen atom, or a phosphorus atom.

In a case where $Y^{12}$ represents a boron atom, it is preferable that n represents 3 and $A^2$ represents a halogen atom, a cyano group, an alkyl group including at least one of a fluorine atom or a cyano group, or an aryl group including at least one of a fluorine atom or a cyano group.

In a case where $Y^{12}$ represents a carbon atom, it is preferable that n represents 2 and $A^2$ represents a halogen atom, a cyano group, an alkyl group including at least one of a fluorine atom or a cyano group, an aryl group including at least one of a fluorine atom or a cyano group, an alkylsulfonyl group which may include at least one of a fluorine atom or a cyano group, or an arylsulfonyl group which may include at least one of a fluorine atom or a cyano group. Two $A^2$'s may be bonded to each other to form a ring.

In a case where $Y^{12}$ represents a nitrogen atom, it is preferable that n represents 1 and $A^2$ represents an alkyl group including at least one of a fluorine atom or a cyano group, an aryl group including at least one of a fluorine atom or a cyano group, an alkylsulfonyl group which may include at least one of a fluorine atom or a cyano group, or an arylsulfonyl group which may include at least one of a fluorine atom or a cyano group.

In a case where $Y^{12}$ represents a phosphorus atom, it is preferable that n represents 1 or 3 and $A^2$ represents an alkyl group including at least one of a fluorine atom or a cyano group, an aryl group including at least one of a fluorine atom or a cyano group, an alkylsulfonyl group which may include at least one of a fluorine atom or a cyano group, or an arylsulfonyl group which may include at least one of a fluorine atom or a cyano group.

In a case where n represents 2 or more, a plurality of $A^2$'s may be the same as or different from each other.

In a case where Formula (Z-1) and Formula (Z-2) includes a fluorine atom, the proportion of fluorine atoms included in $Y^2$ is preferably 5% to 80% and more preferably 10% to 70% with respect to the number of all the atoms constituting $Y^2$.

Formula (Z-3)

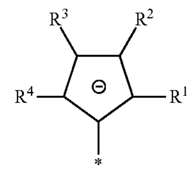

In Formula (Z-3), * represents a binding site to $L^2$ in Formula (B).

$R^1$ to $R^4$ each independently represent a cyano group or a fluorinated alkyl group.

Examples of the cationic group include a substituted or unsubstituted onium cation (for example, ammonium, pyridinium, imidazolium, or phosphonium). In particular, an ammonium cation is preferable. Examples of the ammonium cation include $—N(R)_3^+$. R's each independently represent a hydrogen atom or an alkyl group, and at least one of R's represent an alkyl group. The number of carbon atoms in the alkyl group is preferably 1 to 10 and more preferably 1 to 5. The alkyl group may be linear, branched, or cyclic and is preferably linear.

DyeII represents a near infrared absorbing colorant structure having a group capable of forming an ionic bond or a coordinate bond with $Y^2$. Examples of the group capable of forming an ionic bond or a coordinate bond with $Y^2$ include the anionic groups and the cationic groups described above regarding $Y^2$. In addition, in a case where the charge balance of DyeII is biased to cations or anions, $Y^2$ may be bonded to a cation site or an anion site of DyeII.

Specific examples of the repeating unit represented by Formula (B) are as follows.

(B-ppb-1)

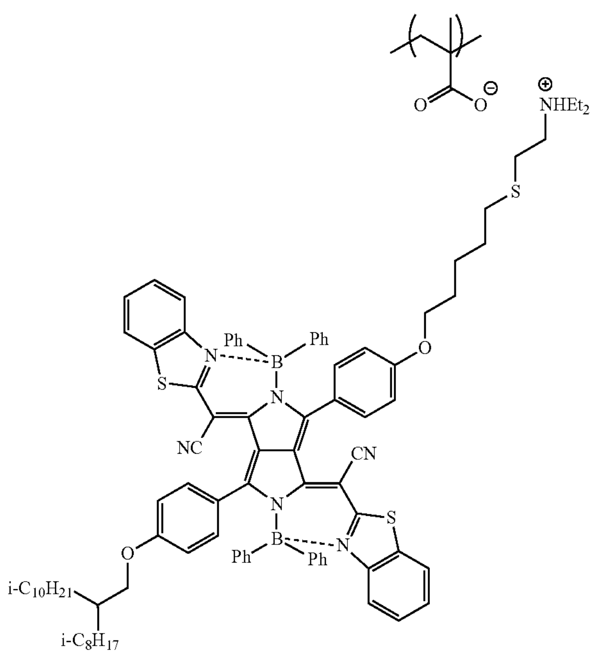

-continued
(B-ppb-2)
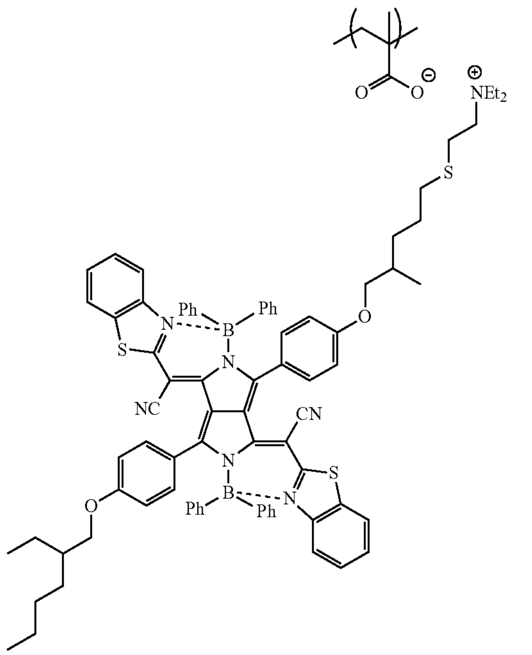
(B-ppb-3)
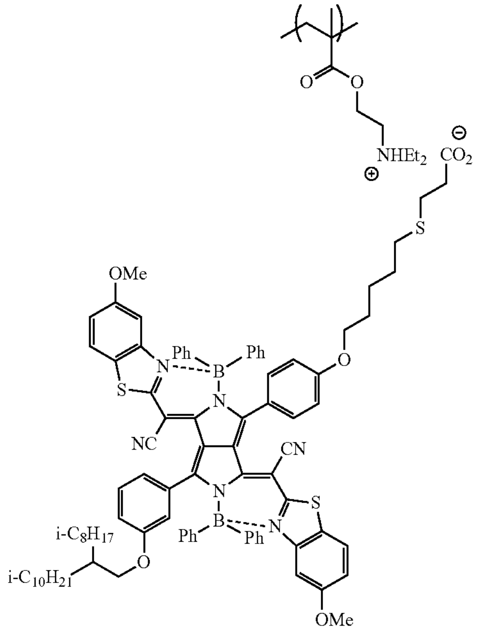
(B-ppb-4)
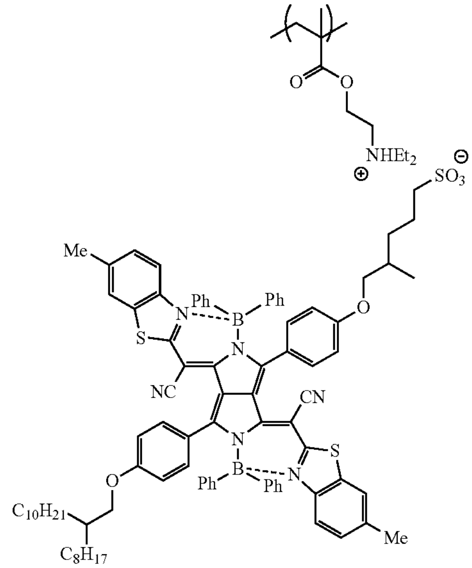

-continued
(B-ppb-5)
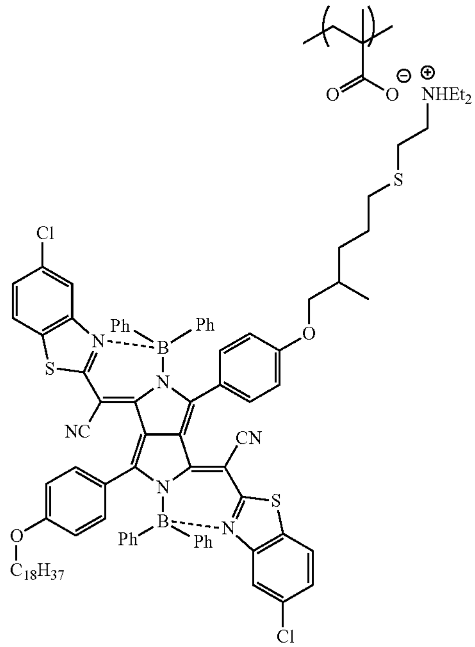
(B-ppb-6)
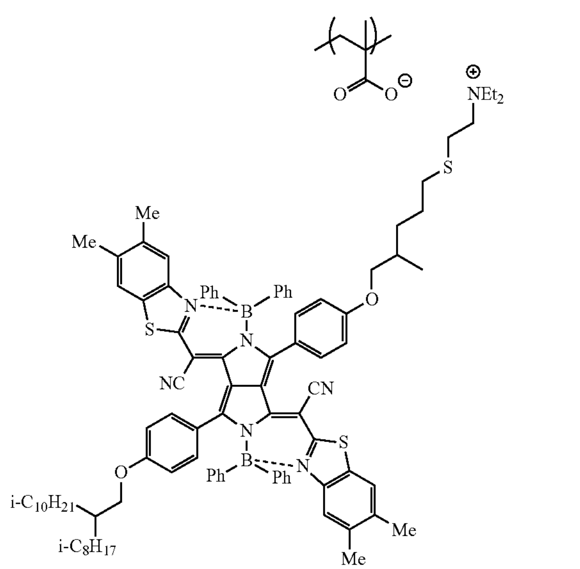
(B-ppb-7)
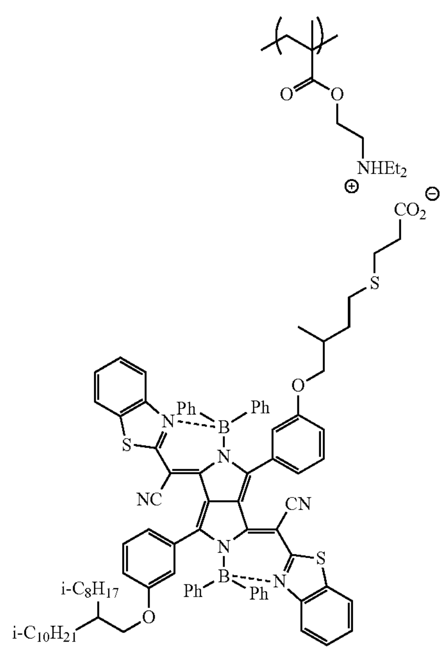

-continued
(B-ppb-8)
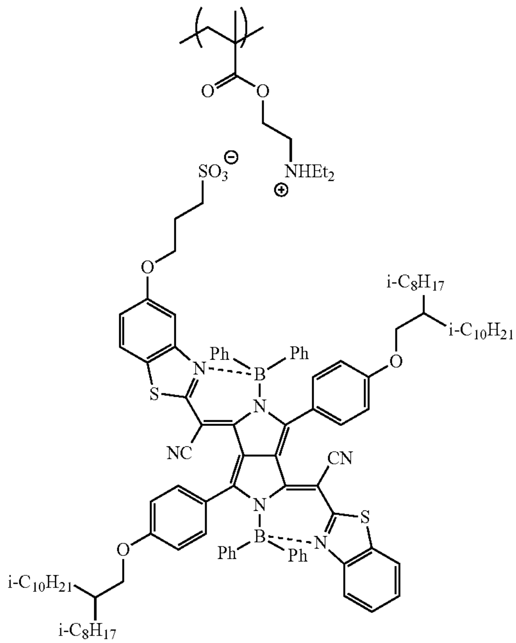
(B-ppb-9)
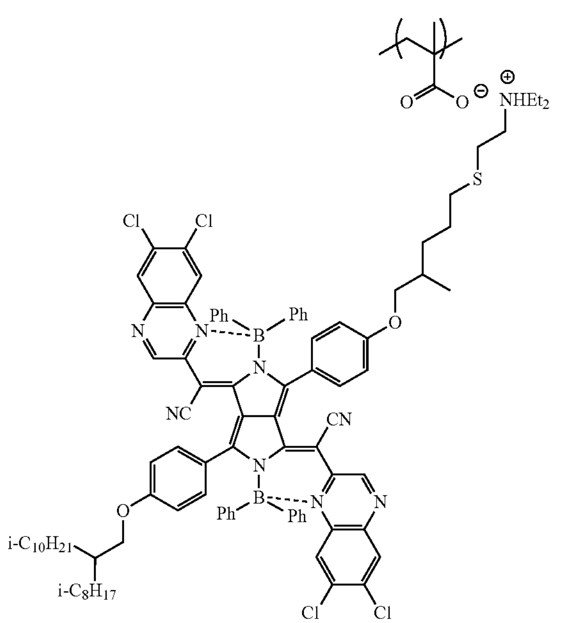
(B-ppb-10)
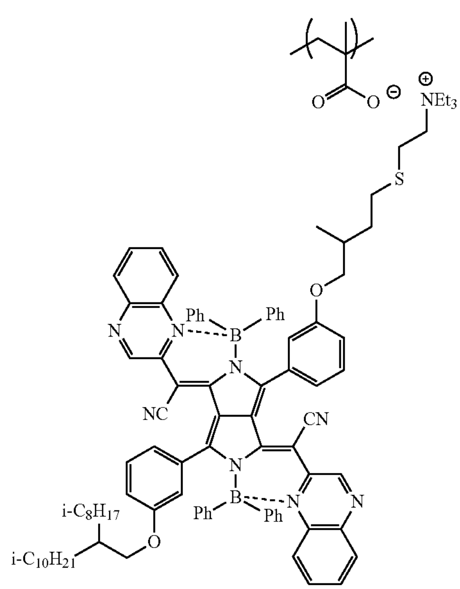

-continued
(B-ppb-11)
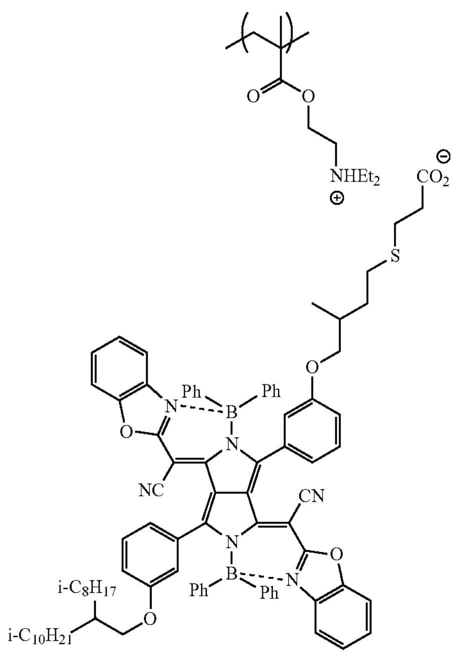
(B-ppb-12)
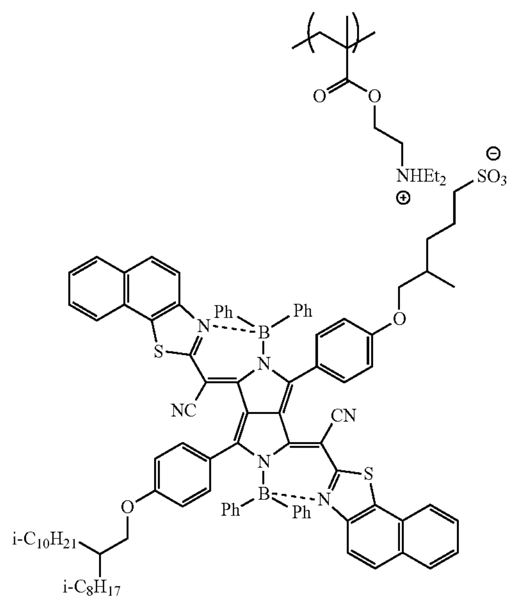
(B-ppb-13)
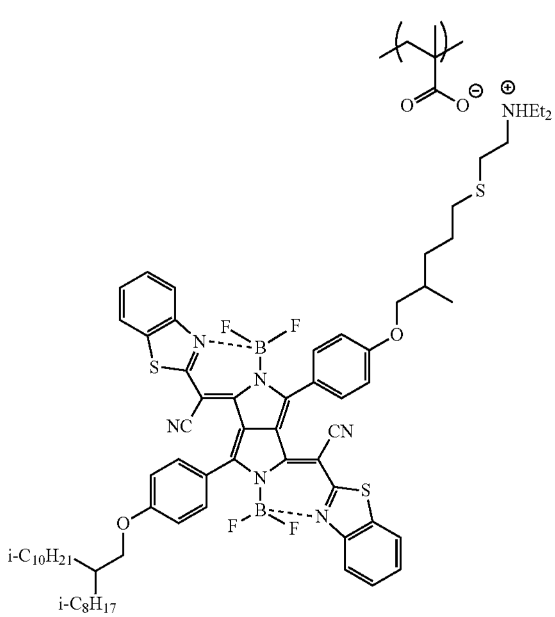
(B-ppb-14)
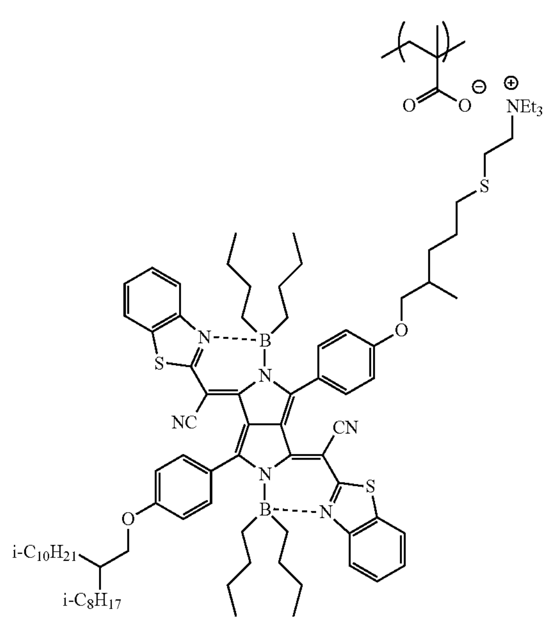

-continued
(B-ppb-15)
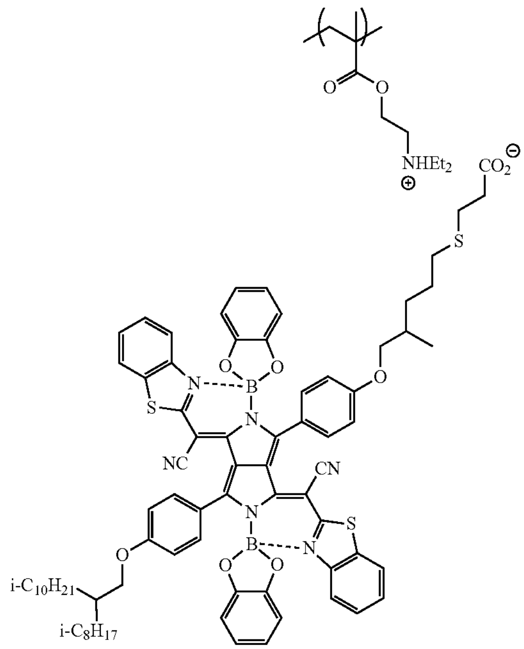
(B-ppb-16)
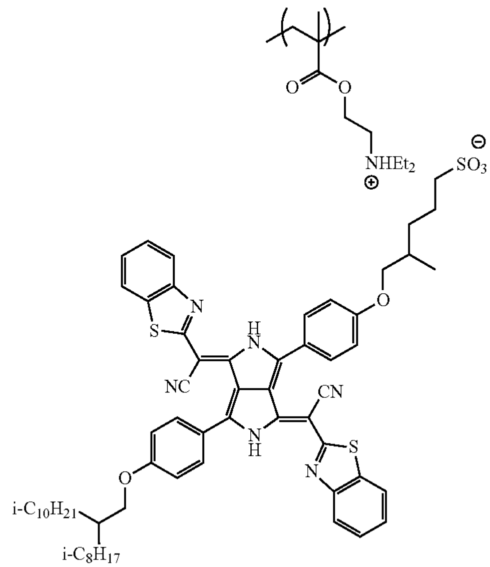
(B-sq-1)
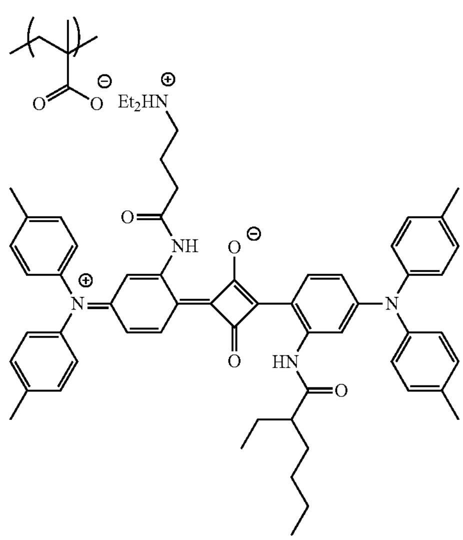
(B-sq-2)
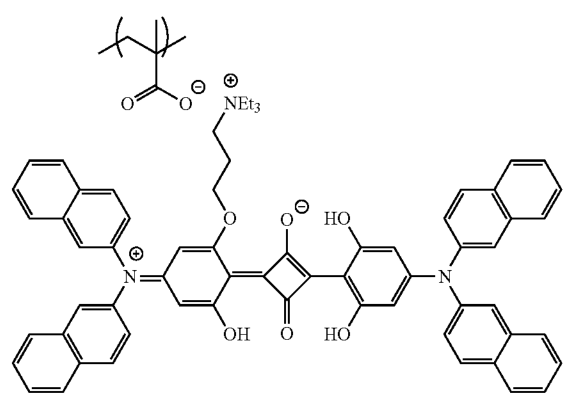

-continued
(B-sq-3)
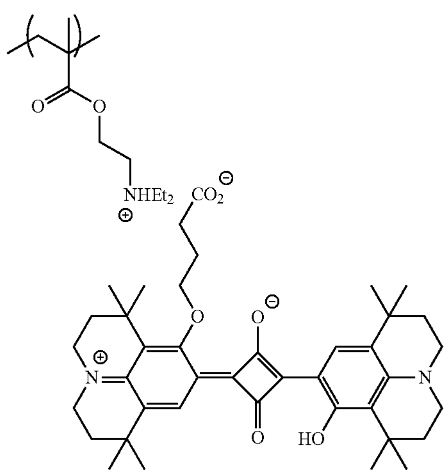
(B-sq-4)
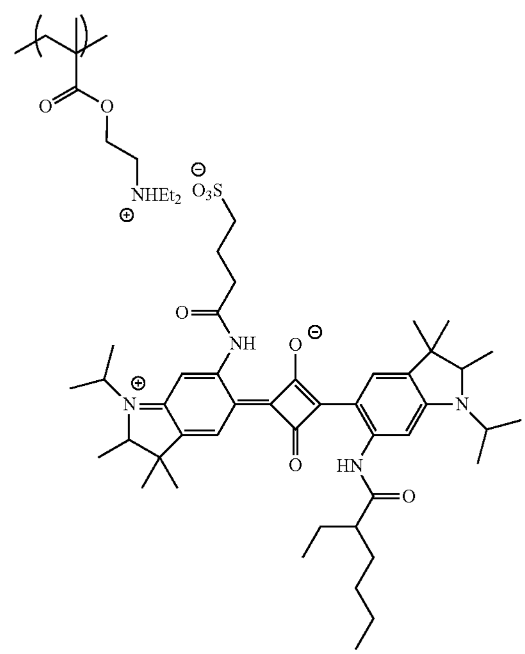
(B-sq-5)
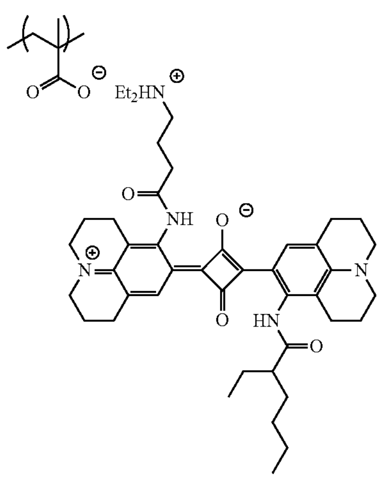
(B-sq-6)
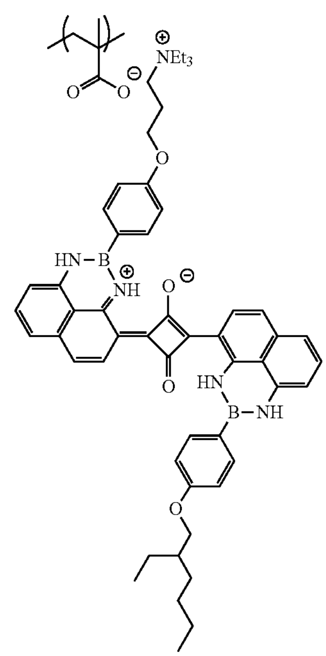

-continued
(B-sq-7)
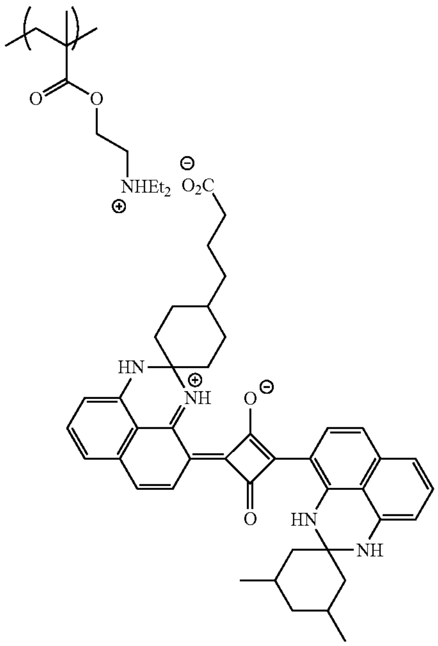
(B-sq-8)
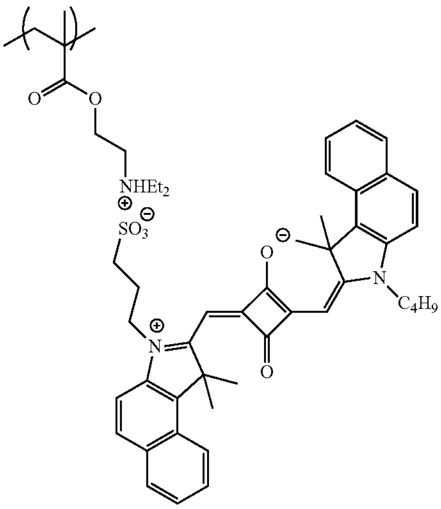
(B-sq-9)
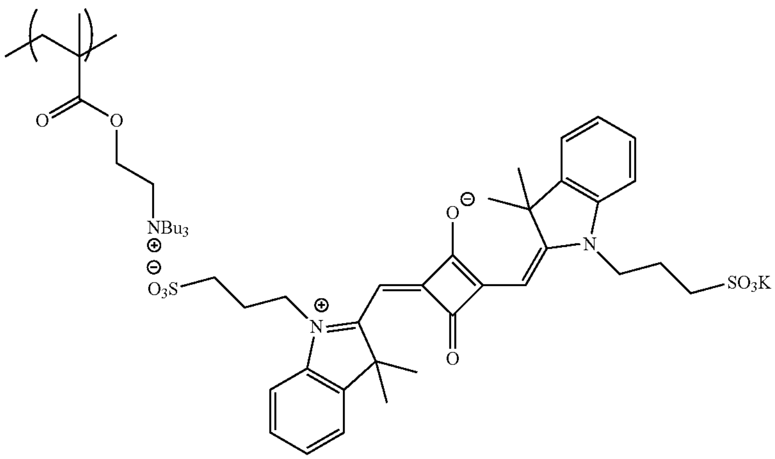
(B-sq-10)
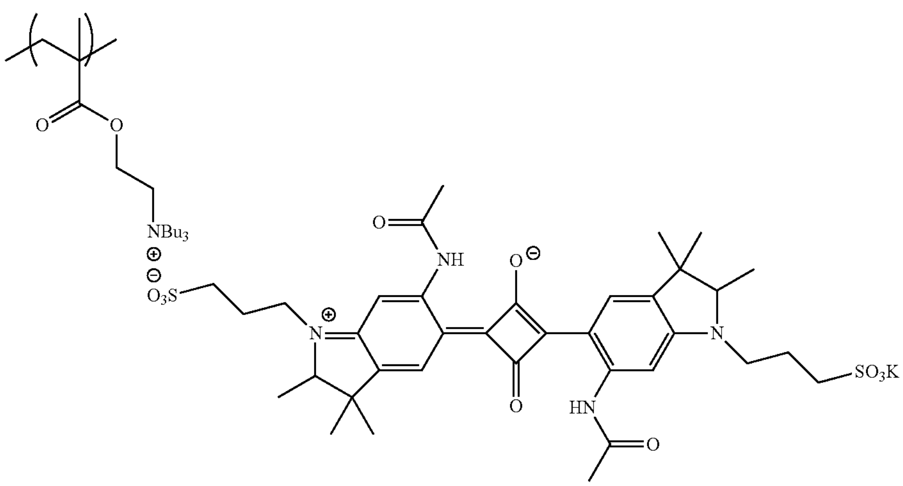

-continued
(B-cy-1)
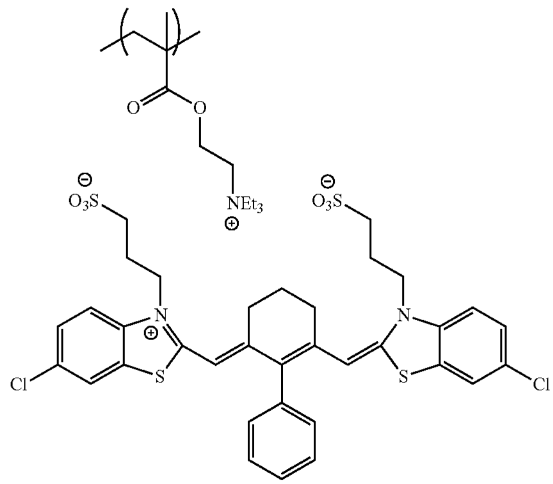
(B-cy-2)
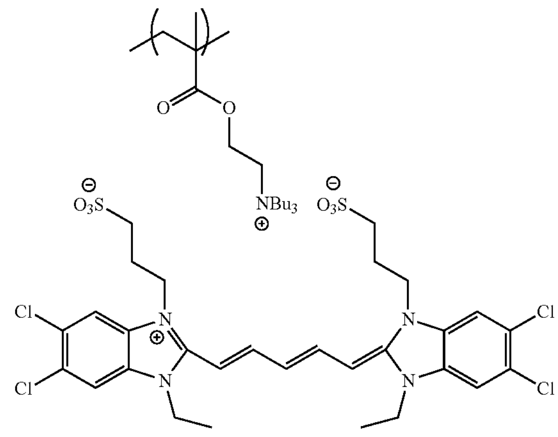
(B-cy-3)
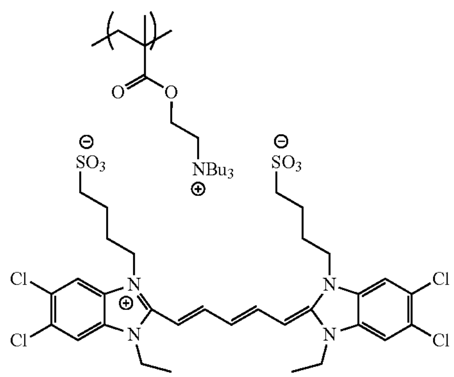
(B-cy-4)
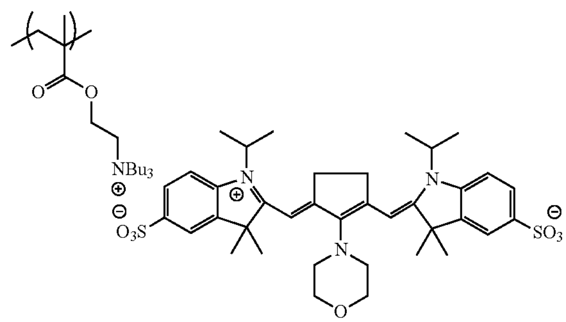
(B-cy-5)
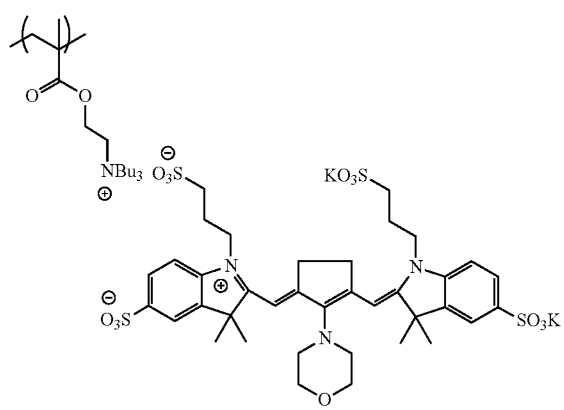
(B-cy-6)
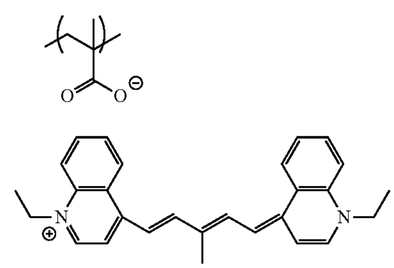
(B-cy-7)
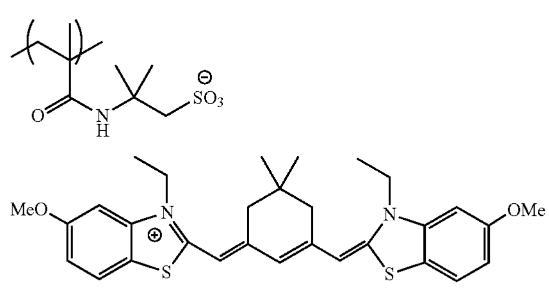
(B-cy-8)
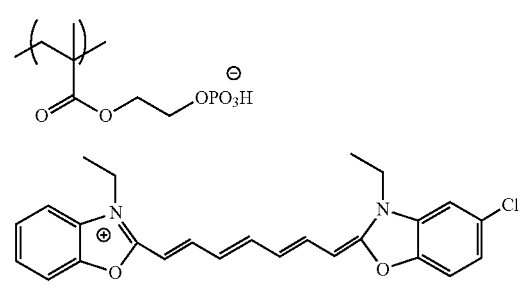

-continued
(B-cy-9)
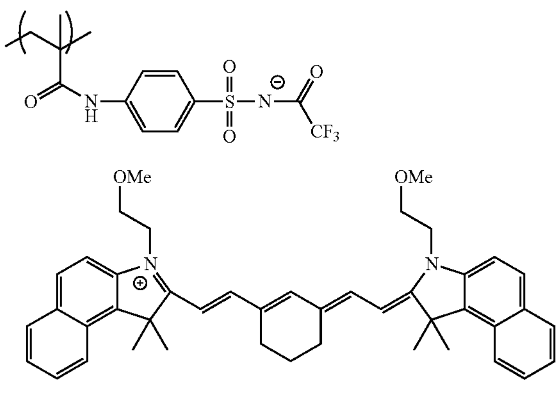
(B-cy-10)
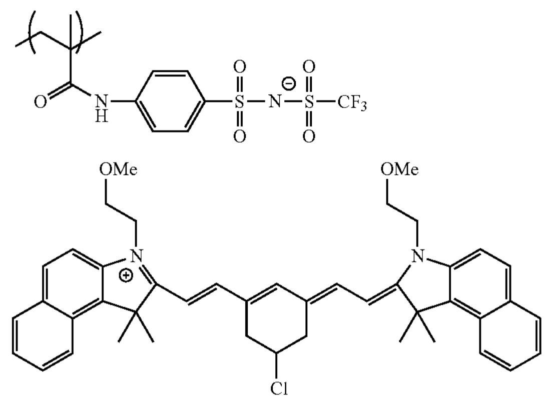
(B-ox-1)
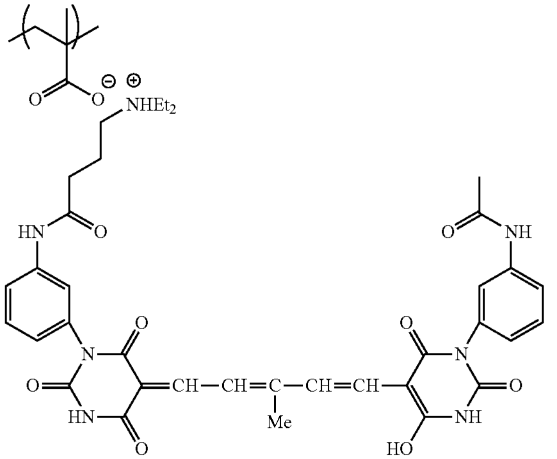
(B-ox-2)
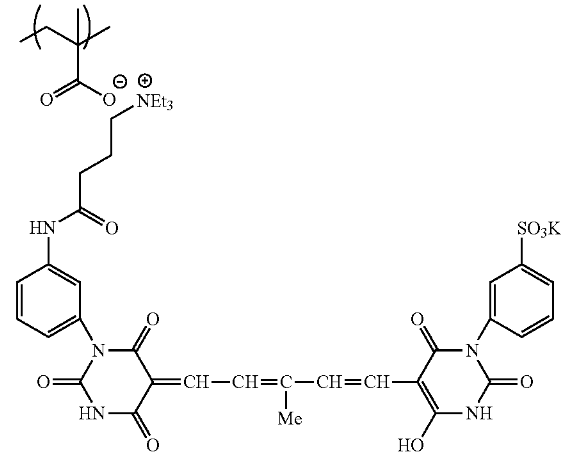
(B-ox-3)
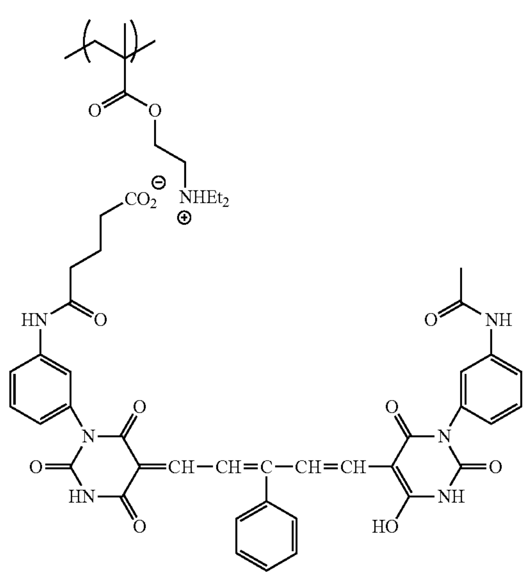
(B-ox-4)
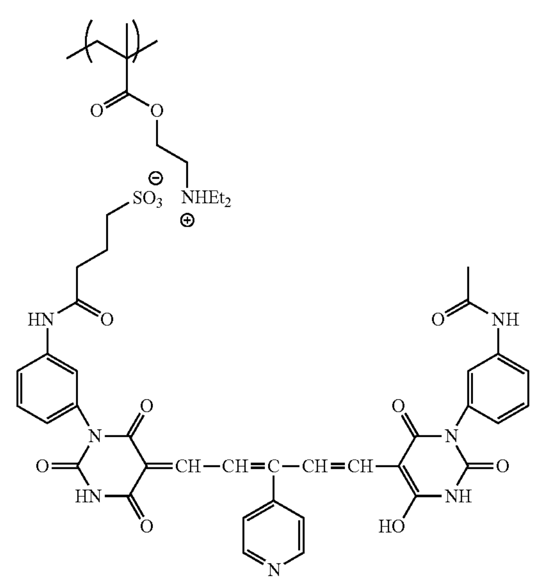

-continued
(B-ox-5)
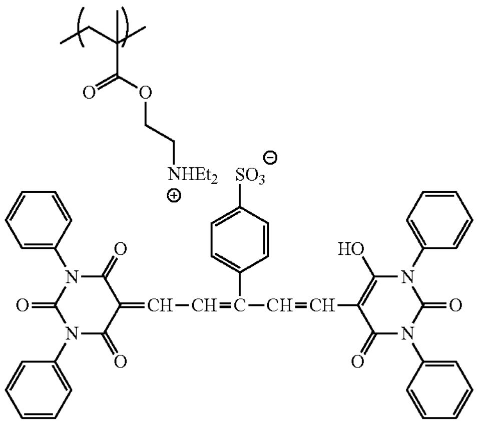
(B-ph-1)
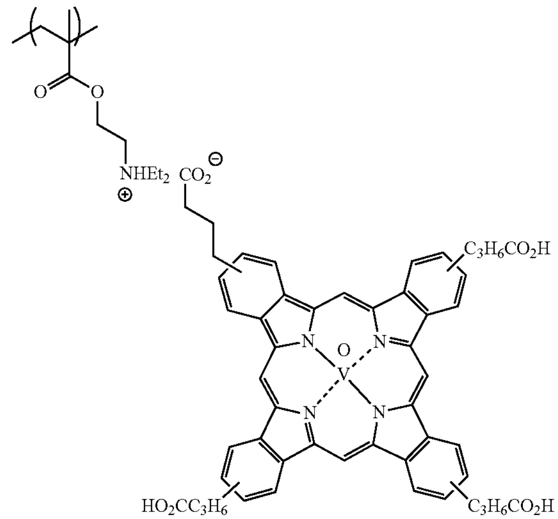
(B-ph-2)
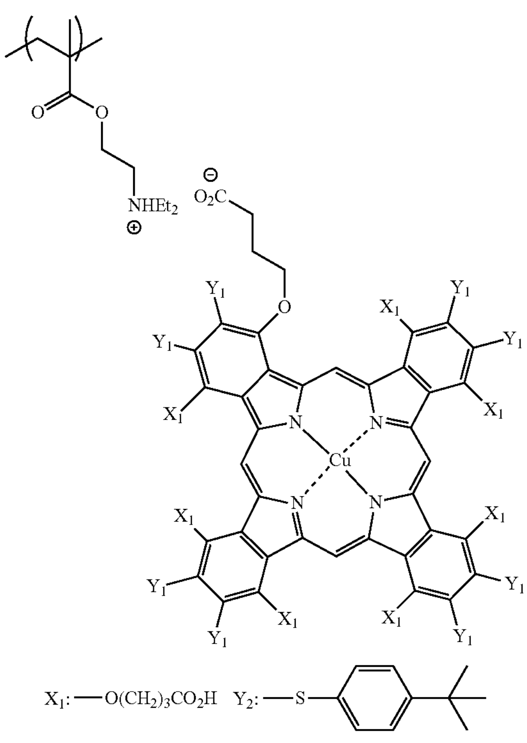
(B-ph-3)
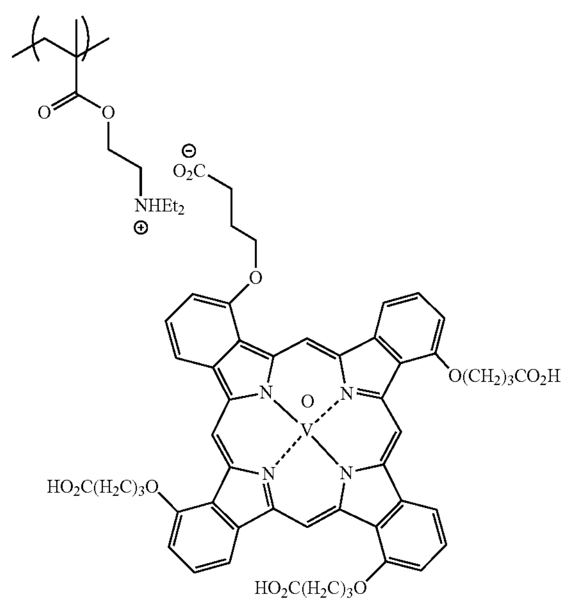

-continued
(B-ph-4)
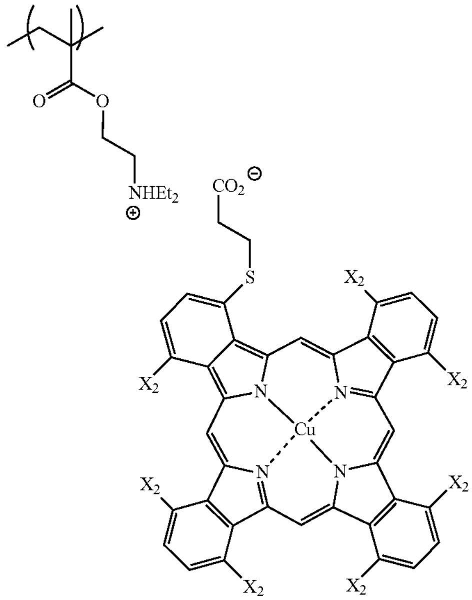
$X_2$: —$S(CH_2)_2CO_2H$
(B-ph-5)
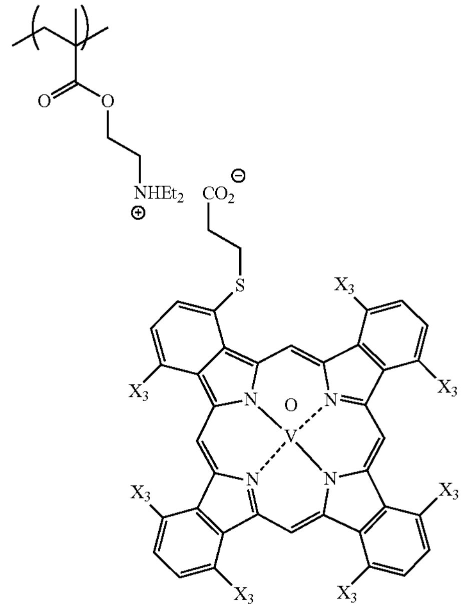
$X_3$: —$S(CH_2)_2CO_2H$
(B-ph-6)
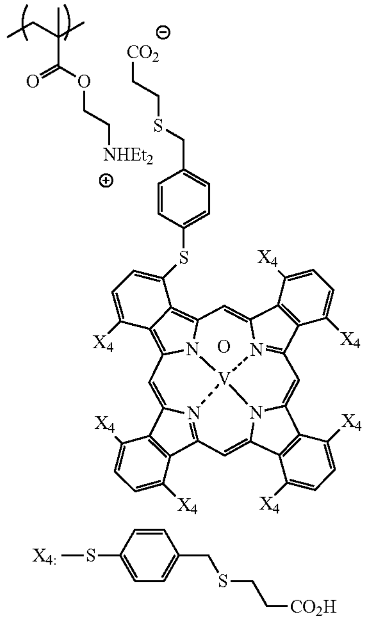
(B-ph-7)
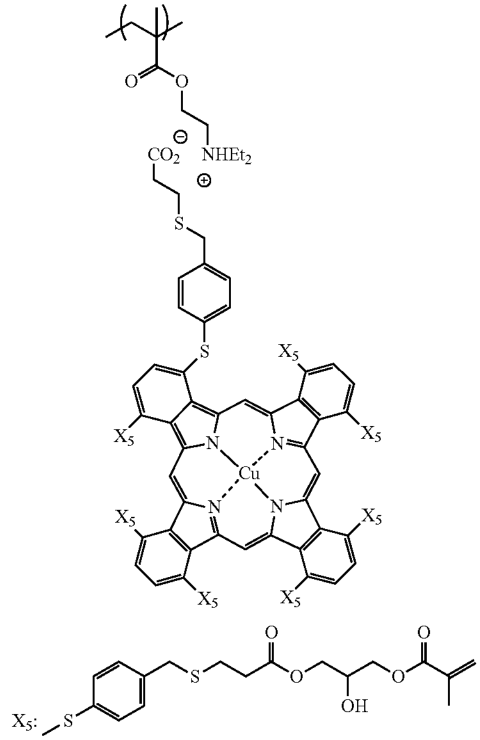

-continued
(B-ph-8)
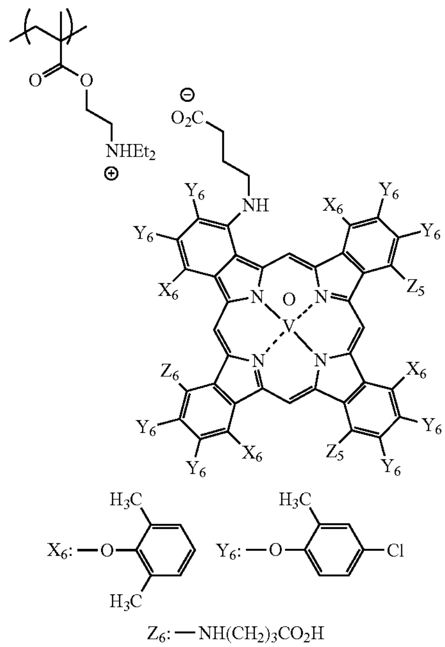
(B-na-1)
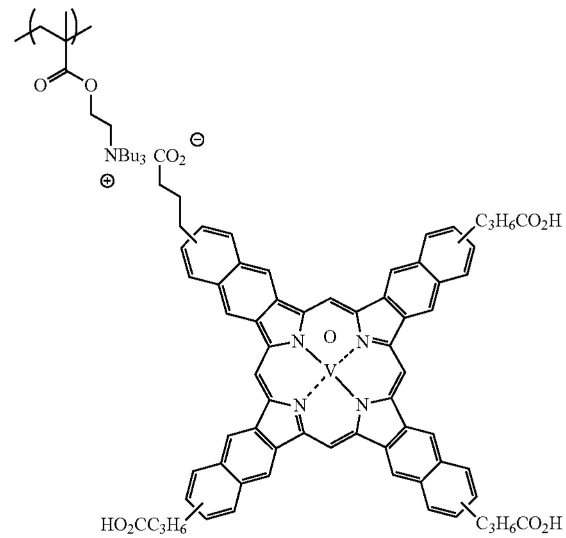
(B-na-2)
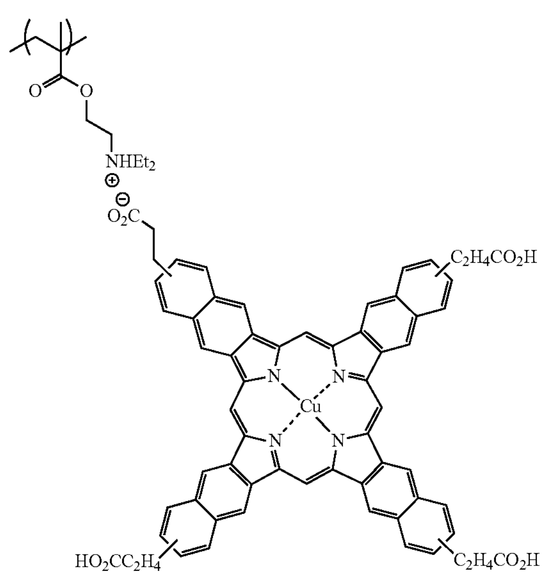
(B-na-3)
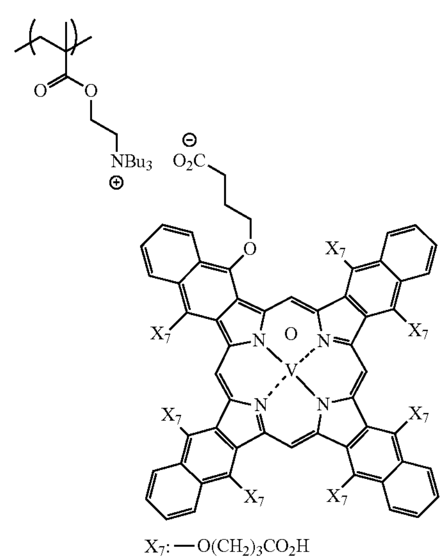

-continued (B-na-4)

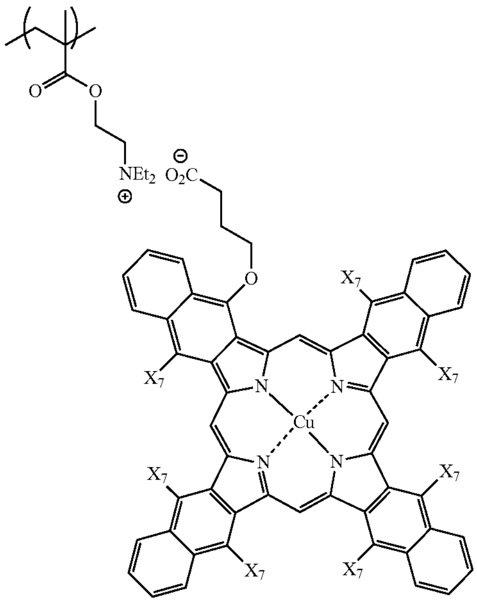

$X_7$: —$O(CH_2)_3CO_2H$ (B-di-1)

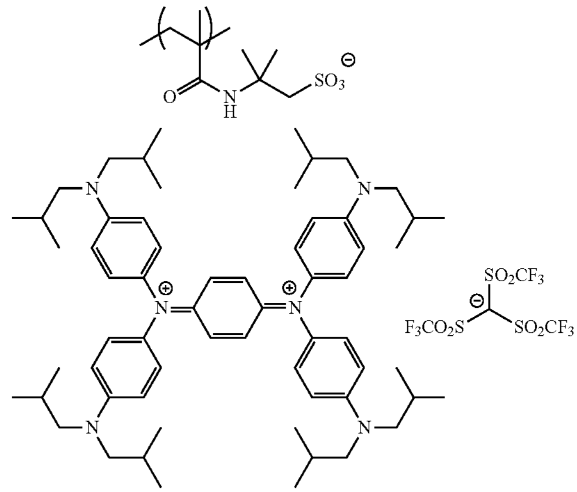

(B-di-2)

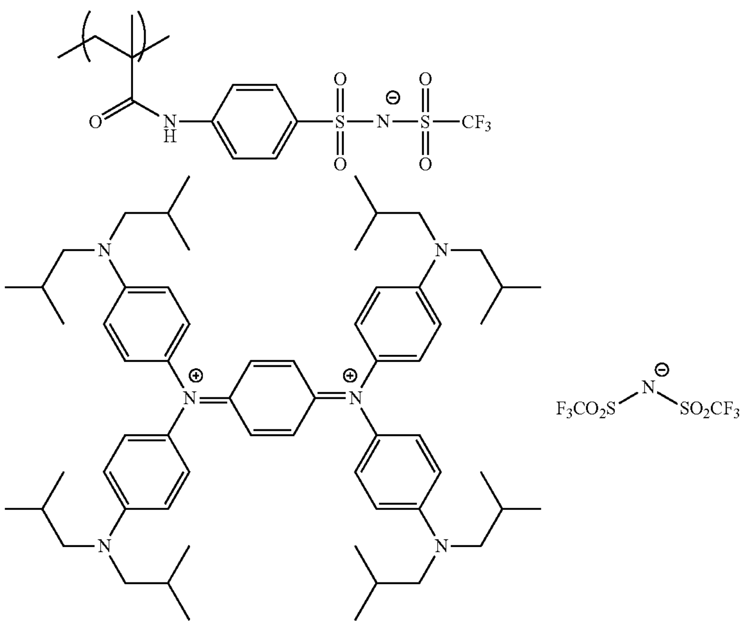

The colorant polymer (B) may include other repeating units described above regarding the colorant polymer (A) in addition to the repeating unit represented by Formula (B). In addition, the colorant polymer (B) may further include the repeating unit represented by Formula (A) and the repeating unit represented by Formula (C).

<<<Colorant Polymer (C)>>>

It is preferable that the colorant polymer (C) includes the repeating unit represented by Formula (C). The proportion of the repeating unit represented by Formula (C) in the colorant polymer (C) is preferably 10 to 100 mass % with respect to all the repeating units constituting the near infrared absorbing colorant polymer. The lower limit is more preferably 20 mass % or higher, still more preferably 30 mass % or higher, and even still more preferably 50 mass % or higher. The upper limit is preferably 95 mass % or lower.

$$-\!\!\left[\text{DyeIII}-\!\!\left(L^3\right)_m\right]\!\!- \tag{C}$$

In Formula (C), $L^3$ represents a single bond or a divalent linking group. DyeIII represents a near infrared absorbing colorant structure. m represents 0 or 1.

In Formula (C), $L^3$ represents a single bond or a divalent linking group. Examples of the divalent linking group include an alkylene group having 1 to 30 carbon atoms, an arylene group having 6 to 30 carbon atoms, a heterocyclic linking group, —CH═CH—, —O—, —S—, —C(═O)—, —COO—, —NR—, —CONR—, —OCO—, —SO—, —$SO_2$—, and a linking group which is formed by two or more of the above groups linking to each other. Here, R's each independently represents a hydrogen atom, an alkyl group, an aryl group, or a heterocyclic group.

The number of carbon atoms in the alkyl group and the alkylene group is preferably 1 to 30. The upper limit is more preferably 25 or less and still more preferably 20 or less. The lower limit is more preferably 2 or more and still more preferably 3 or more. The alkyl group and the alkylene group may be linear, branched, or cyclic.

The number of carbon atoms in the aryl group and the arylene group is preferably 6 to 20 and more preferably 6 to 12.

It is preferable that the heterocyclic linking group and the heterocyclic group are a 5- or 6-membered ring. It is preferable that heteroatoms included in the heterocyclic linking group and the heterocyclic group are an oxygen atom, a nitrogen atom, and a sulfur atom. The number of heteroatoms included in the heterocyclic linking group and heterocyclic group is preferably 1 to 3.

The alkylene group, the arylene group, the heterocyclic linking group, the alkyl group, the aryl group, and the heterocyclic group may be unsubstituted or may have a substituent. Examples of the substituent include a curable group and an acid group. Examples of the curable group include a radically polymerizable group such as a group having an ethylenically unsaturated bond, a cyclic ether group (an epoxy group, an oxetanyl group), an oxazoline group, and a methylol group. Examples of the group having an ethylenically unsaturated bond include a vinyl group, a (meth)allyl group, and a (meth)acryloyl group. Examples of the acid group include a carboxyl group, a sulfonate group, and a phosphate group. In addition, as the substituent, a development promoting group such as a group in which 2 to 20 unsubstituted alkyleneoxy chains are repeated, lactone, an acid anhydride, amide, or a cyano group, or a hydrophobicity adjusting group such as a long-chain or cyclic alkyl group, an aralkyl group, an aryl group, a polyalkylene oxide group, a hydroxyl group, a maleimide group, or an amino group may be used.

$L^3$ represents preferably an alkylene group, an arylene group, —NH—, —CO—, —O—, —COO—, —OCO—, —S—, or a linking group including a combination of two or more selected from the above groups.

DyeIII represents a near infrared absorbing colorant structure. It is preferable that the near infrared absorbing colorant structure represented by DyeIII is a structure in which one or more arbitrary hydrogen atoms are removed from the near infrared absorbing colorant (colorant compound).

m represents 0 or 1 and preferably 1.

The colorant polymer including the repeating unit represented by Formula (C) can be synthesized by sequential polymerization. Examples of the sequential polymerization include polyaddition (for example, a reaction between a diisocyanate compound and diol, a reaction between a diepoxy compound and dicarboxylic acid, or a reaction between tetracarboxylic dianhydride and diol) and polycondensation (for example, a reaction between dicarboxylic acid and diol or a reaction between dicarboxylic acid and diamine). Among these, the polyaddition reaction is preferable from the viewpoints of moderating reaction conditions and preventing the colorant structure from being decomposed. Well-known reaction conditions can be applied to the sequential polymerization.

Specific examples of the repeating unit represented by Formula (C) are as follows. In Structural Formula C-ph-1 of the following specific examples, "arbitrary one of $X_1$'s" or "arbitrary two of $X_1$'s" represent that the following group is bonded to the arbitrary $X_1$'s. The same can also be applied to C-ph-2, C-na-1, and C-na-2.

(C-ppb-1)

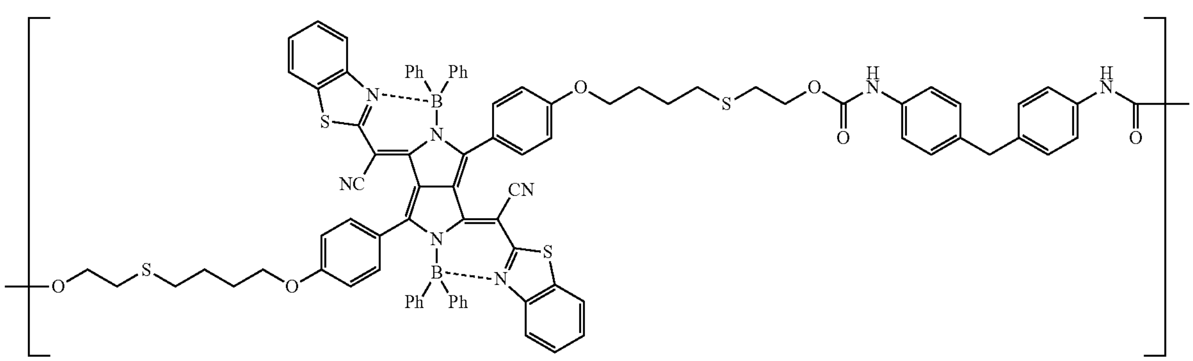

-continued
(C-ppb-2)
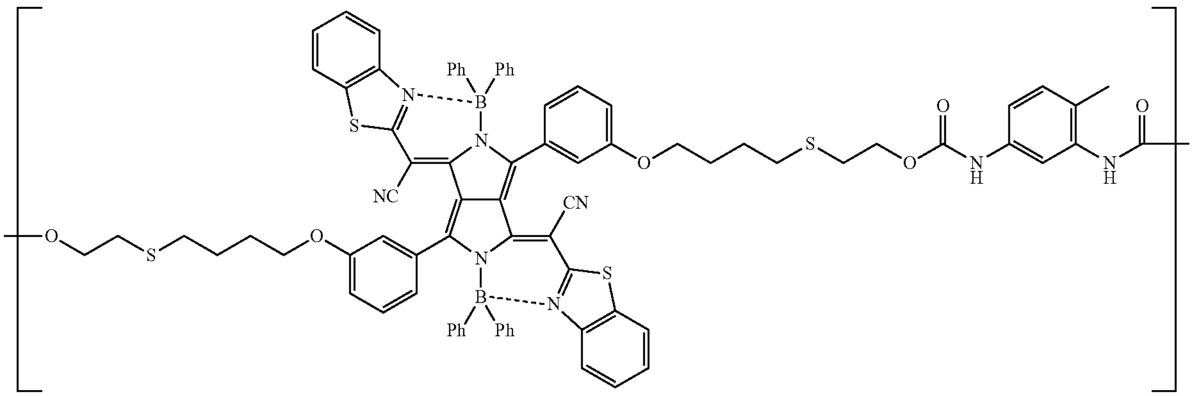
(C-ppb-3)
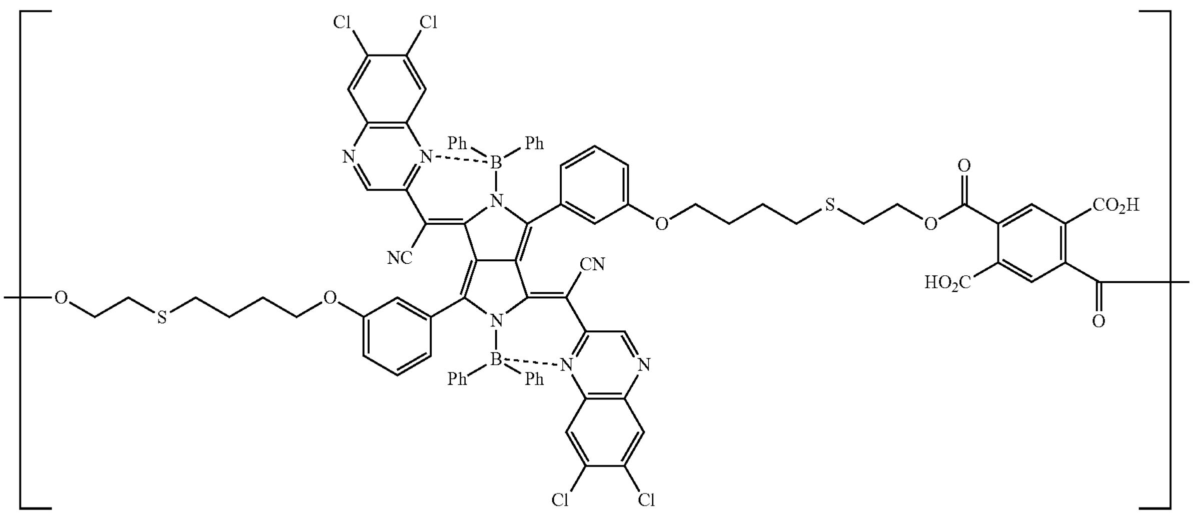
(C-ppb-4)
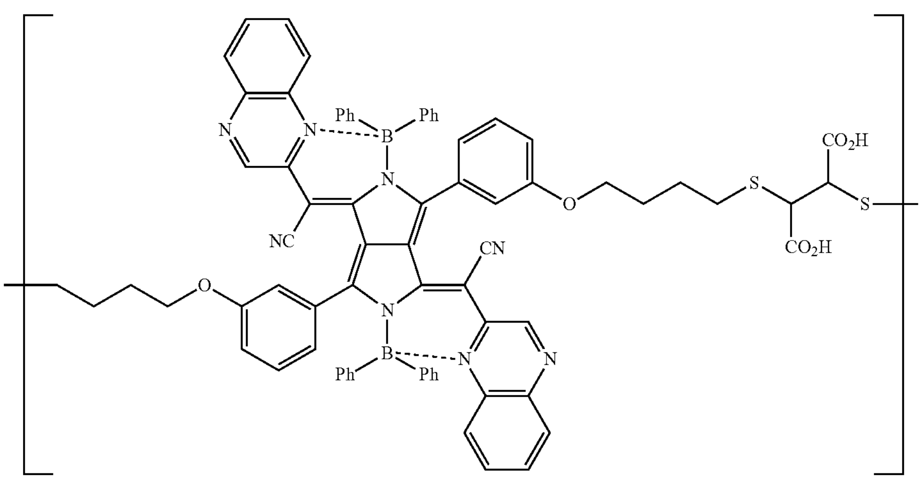

-continued
(C-ppb-5)
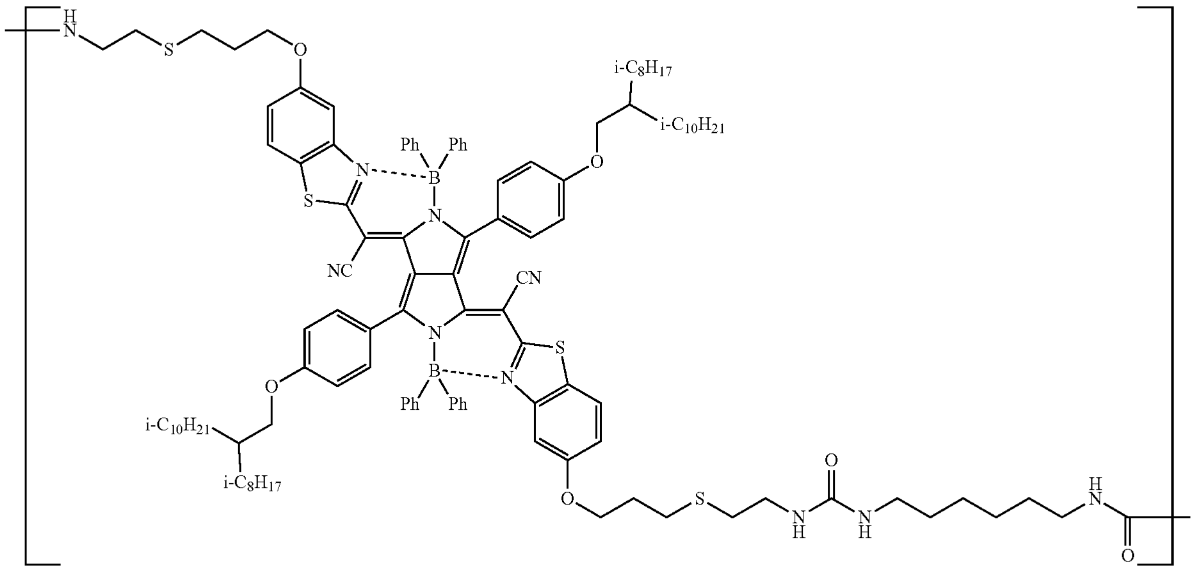
(C-ppb-6)
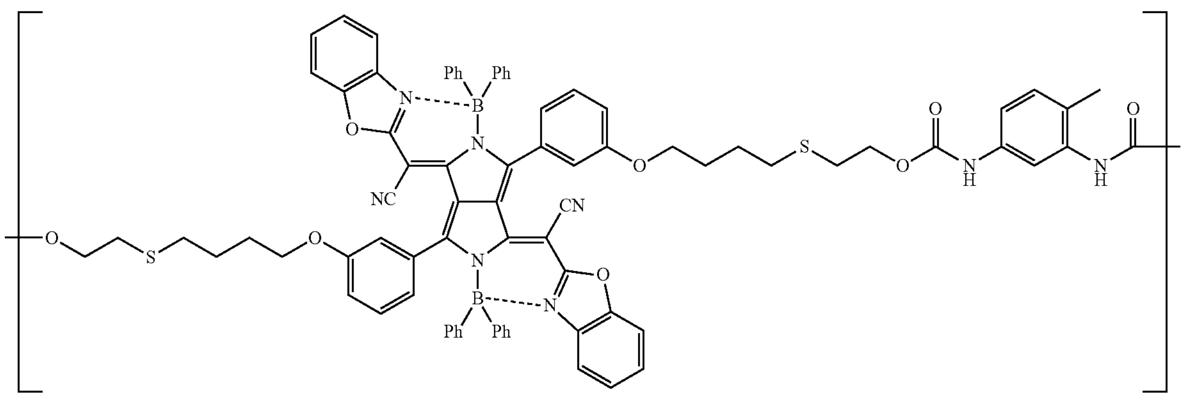
(C-sq-1)
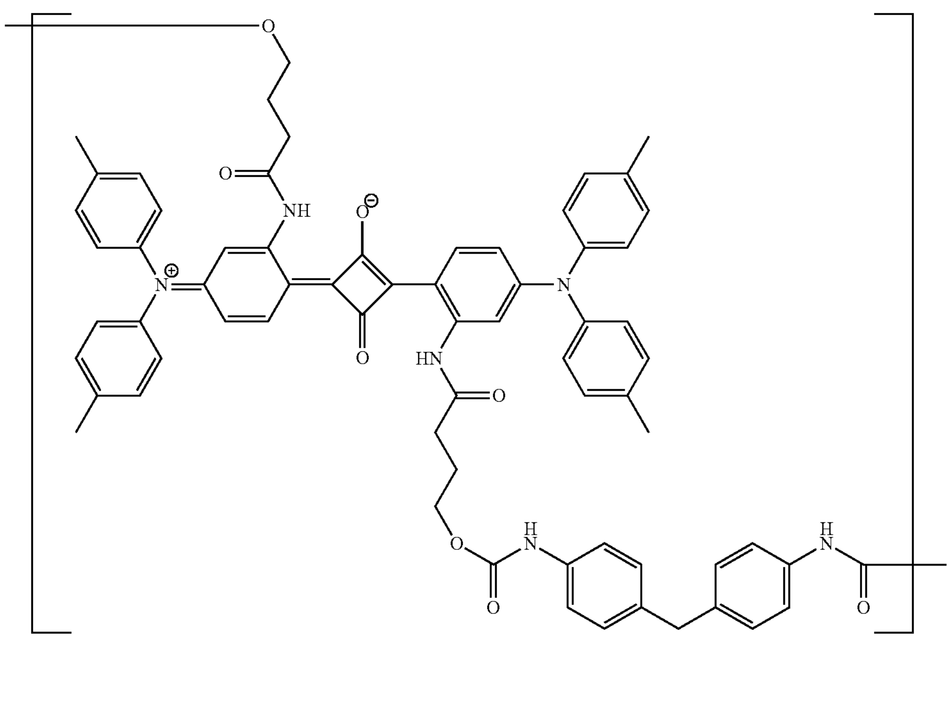

-continued
(C-sq-2)
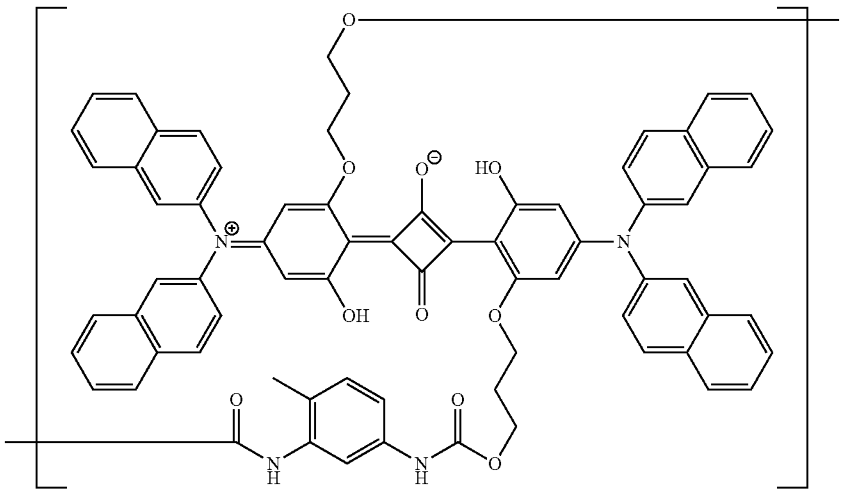
(C-sq-3)
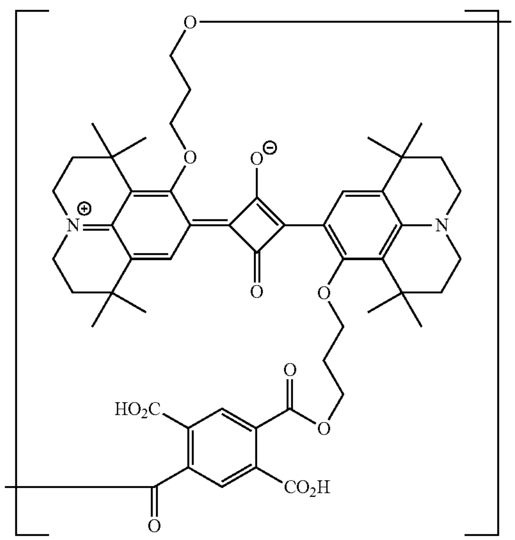
(C-sq-4)
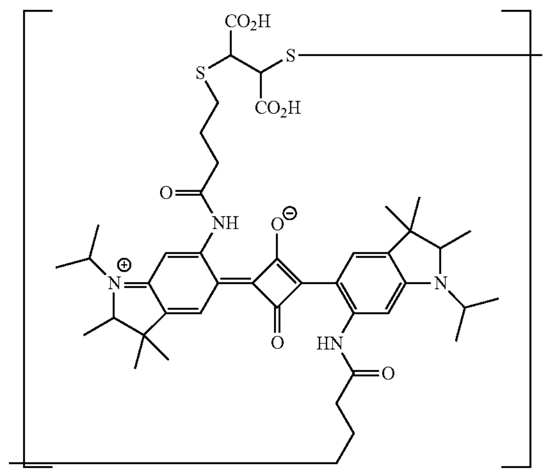
(C-sq-5)
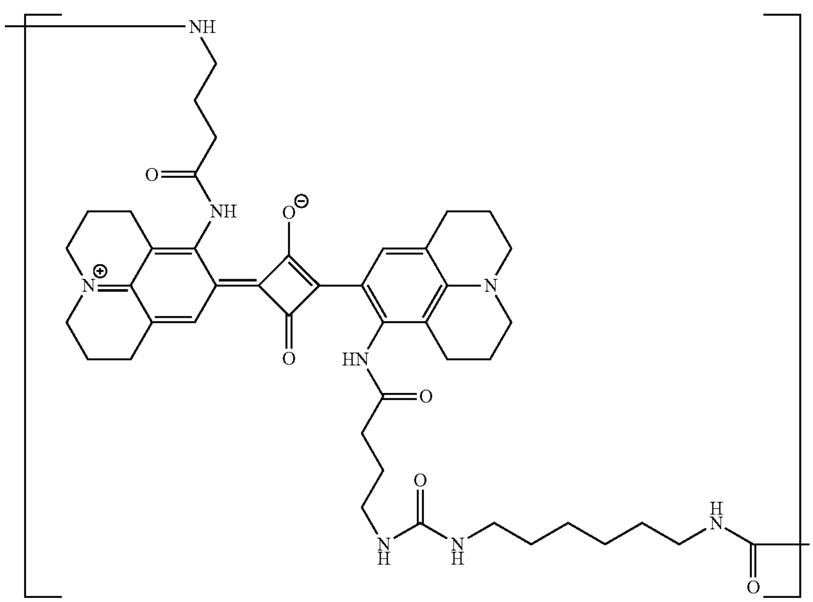

-continued
(C-sq-6)
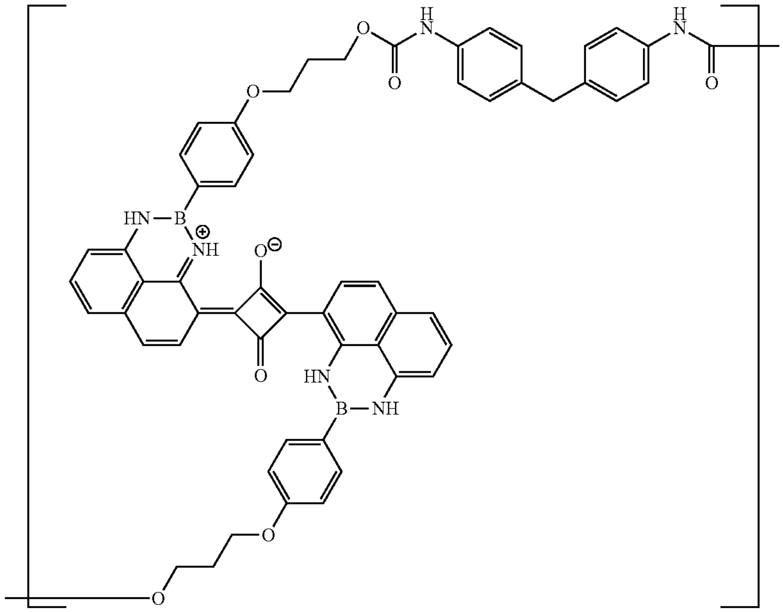
(C-sq-7)
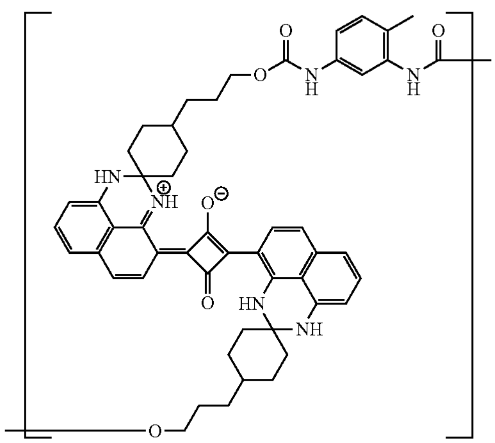
(C-sq-8)
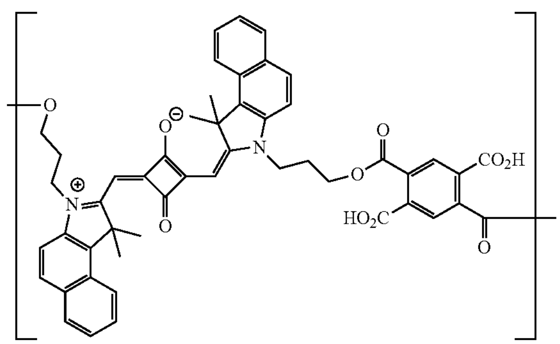
(C-sq-9)
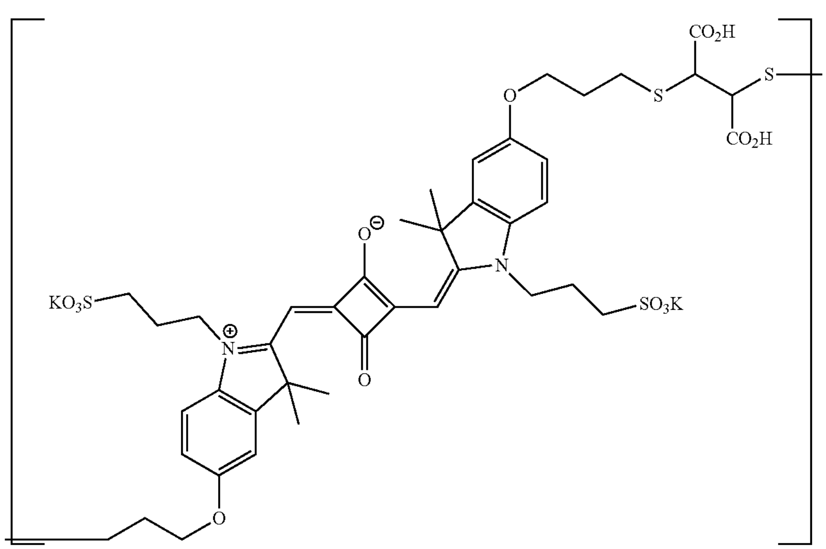

-continued
(C-sq-10)
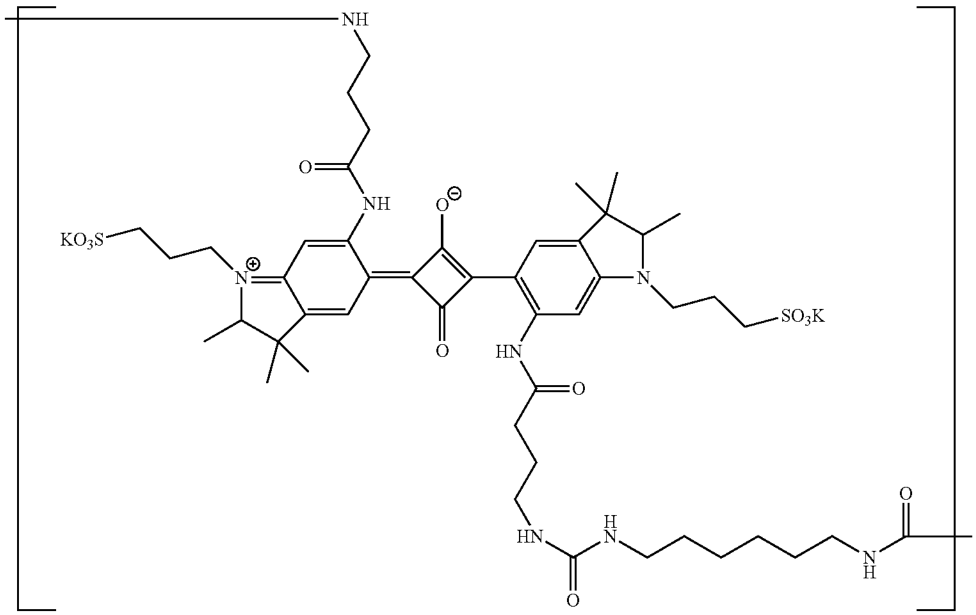
(C-cy-1)
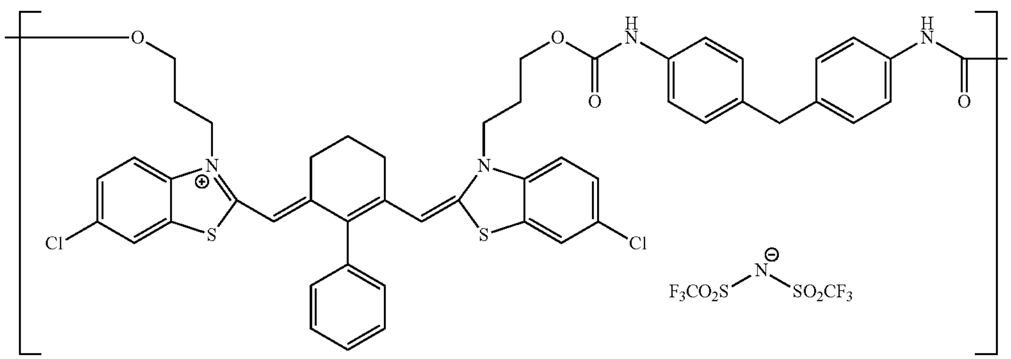
(C-cy-2)
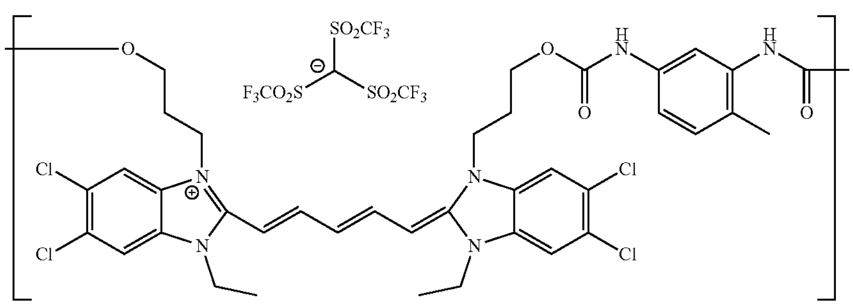

-continued
(C-cy-3)
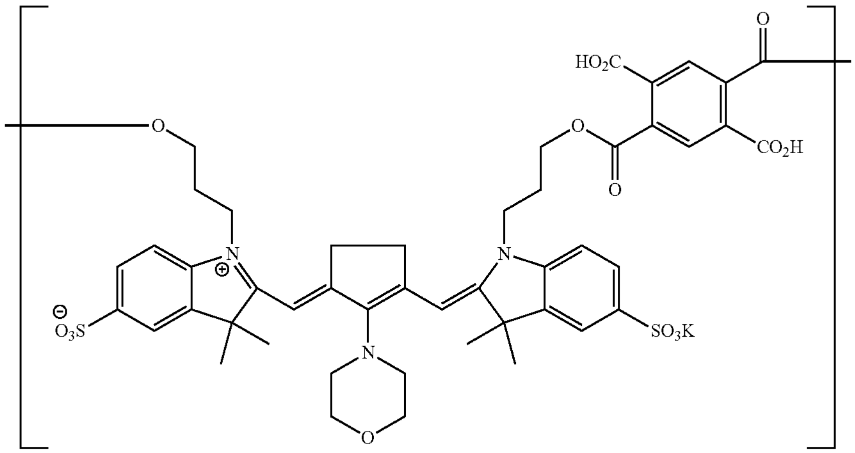
(C-cy-4)
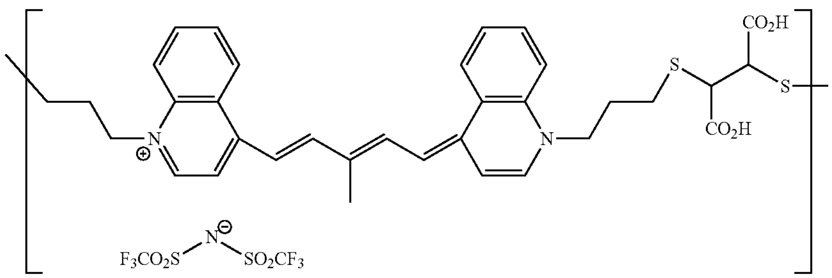
(C-cy-5)
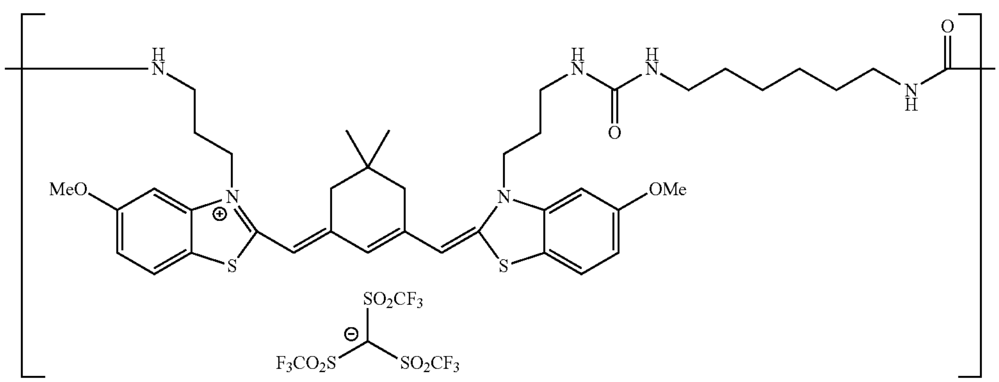
(C-cy-6)
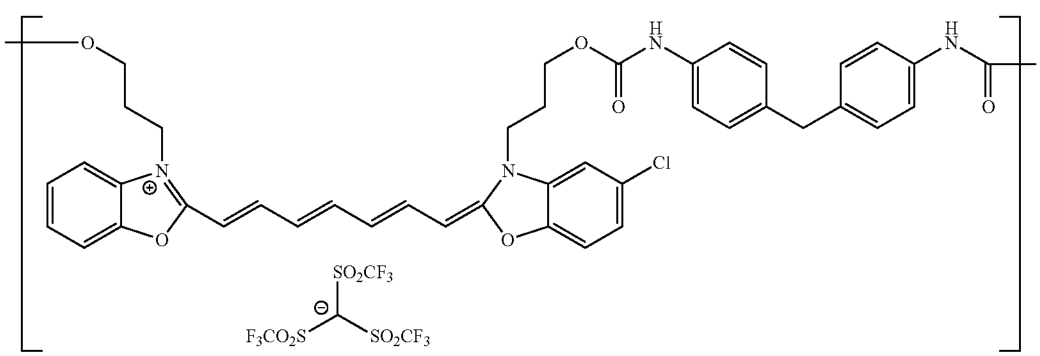

-continued
(C-cy-7)
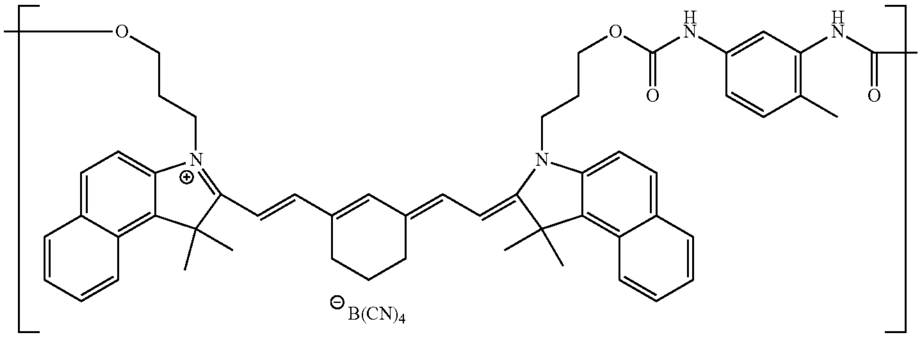
(C-cy-8)
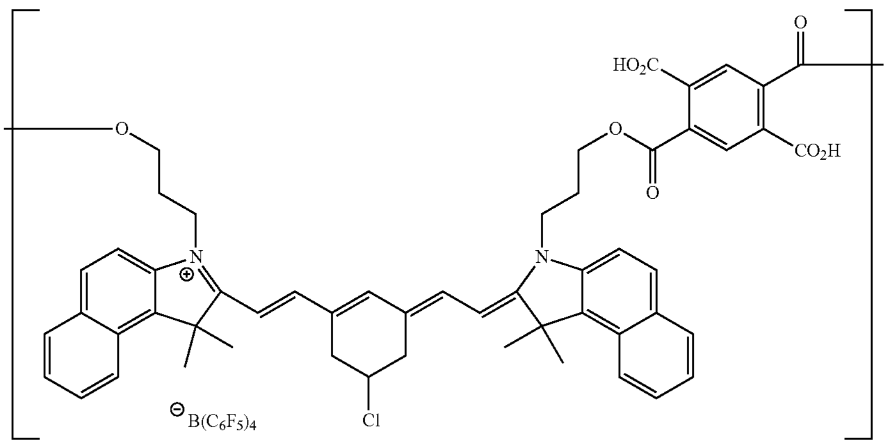
(C-ox-1)
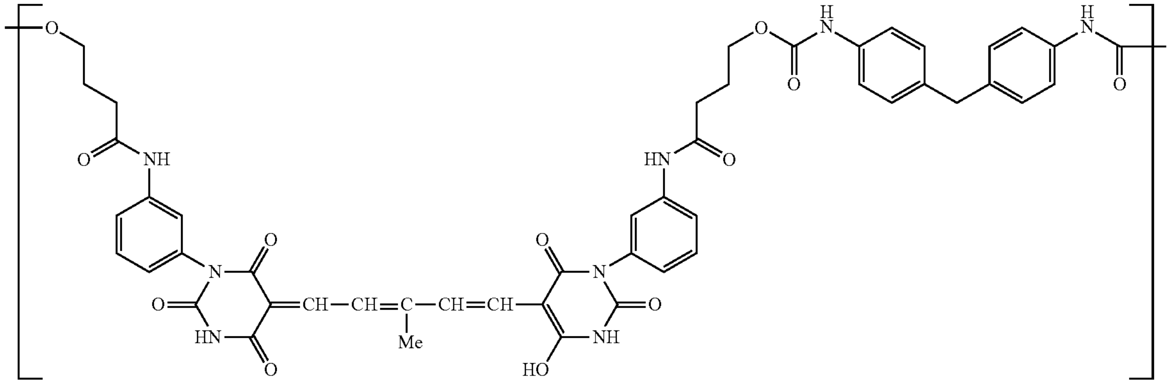

-continued
(C-ox-2)
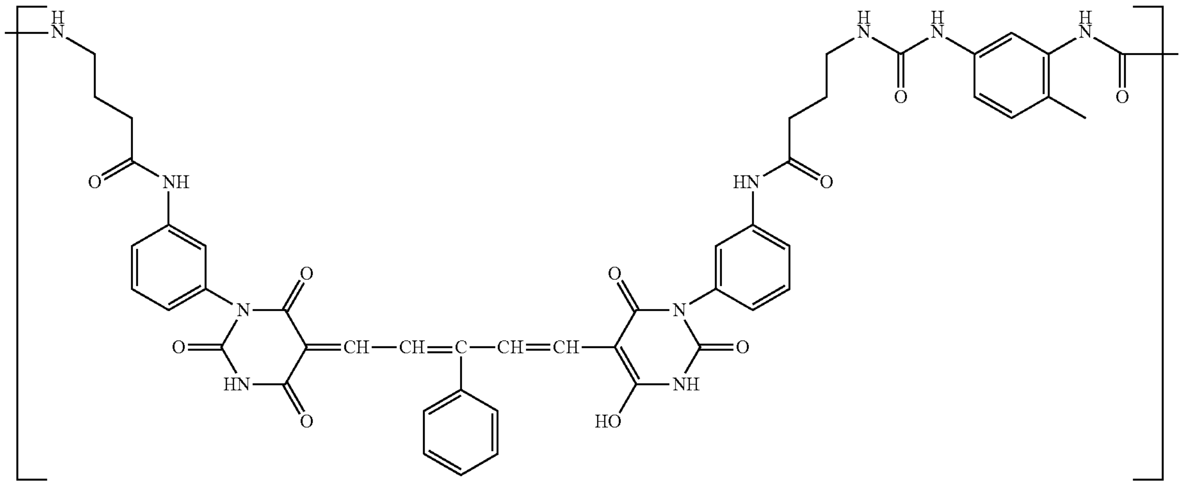
(C-ox-3)
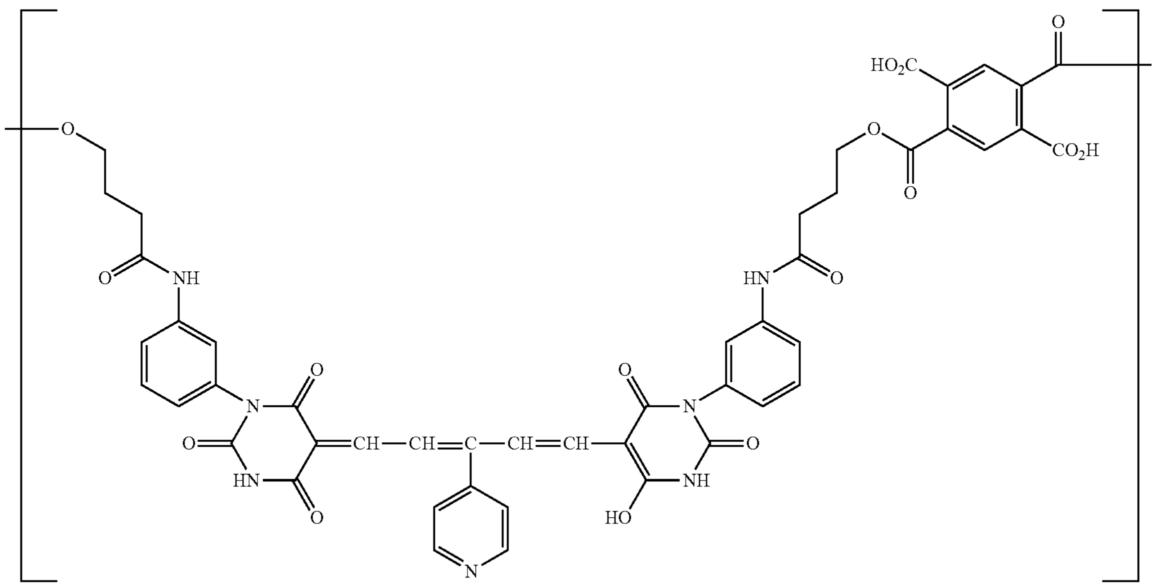
(C-ox-4)
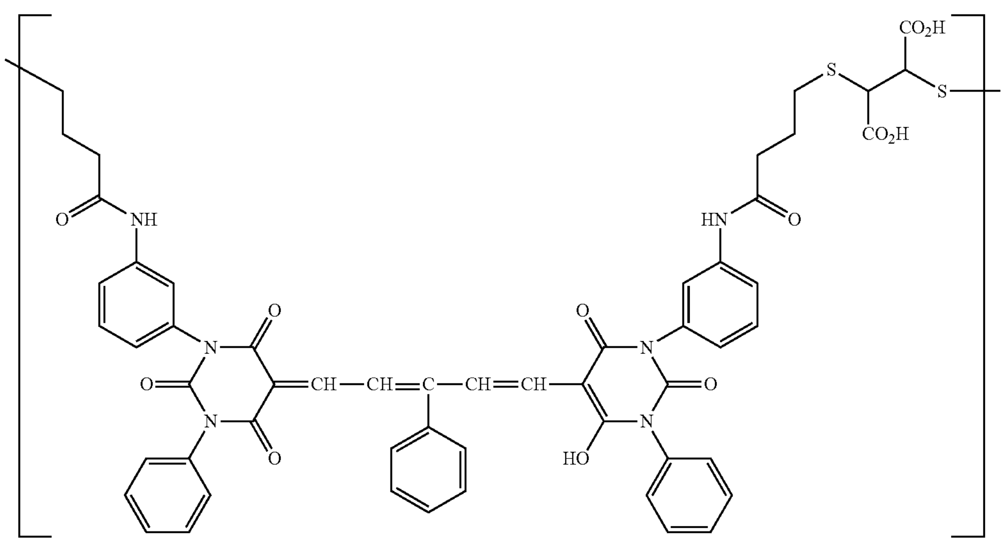

-continued
(C-ph-1)
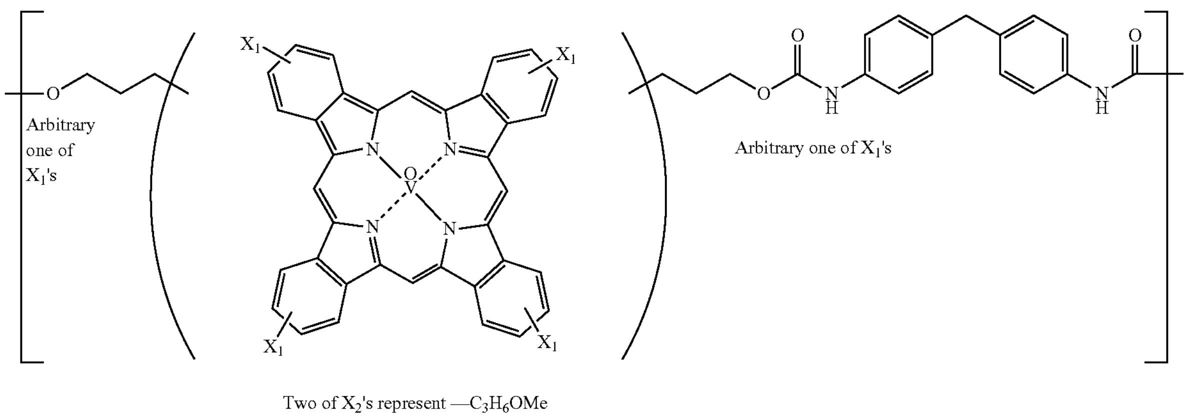
(C-ph-2)
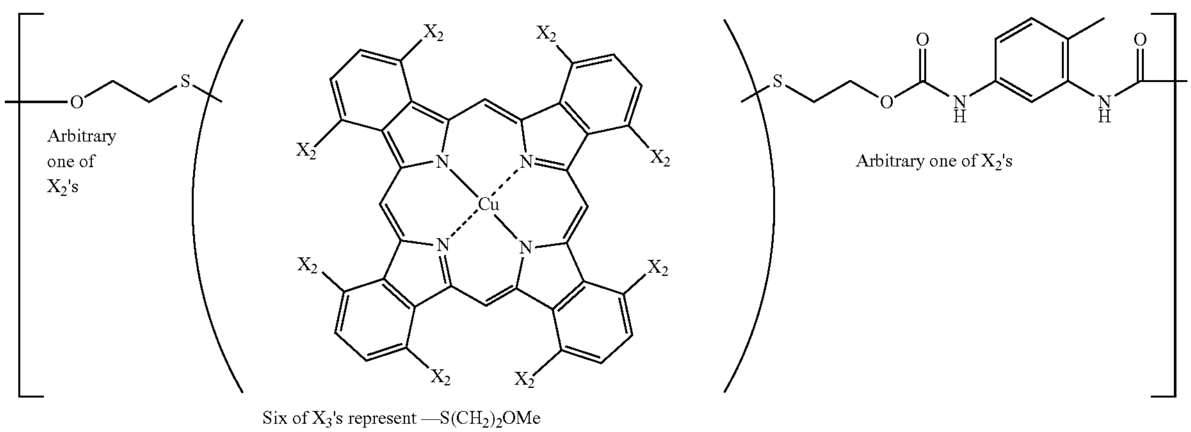
(C-na-1)
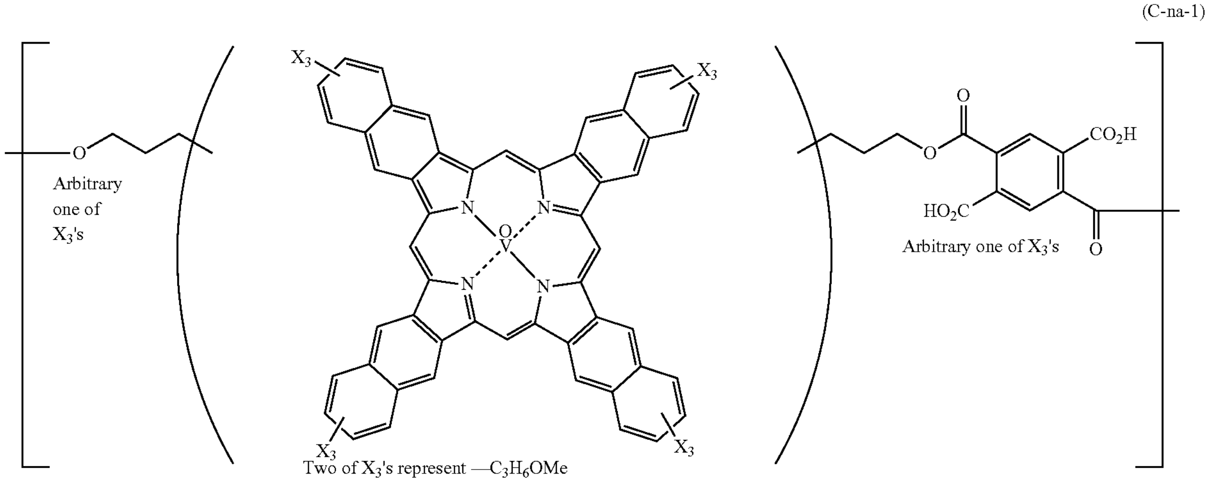

-continued
(C-na-2)
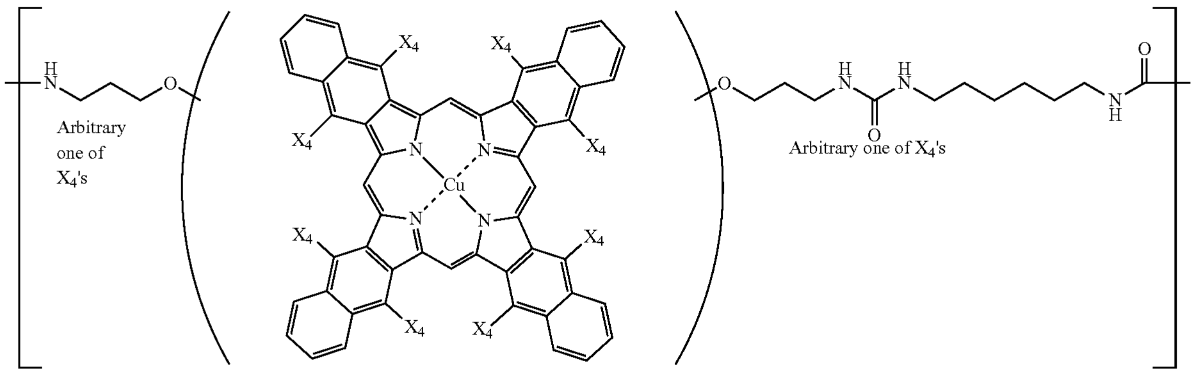
Six of $X_4$'s represent —$O(CH_2)_3OMe$
(C-di-1)
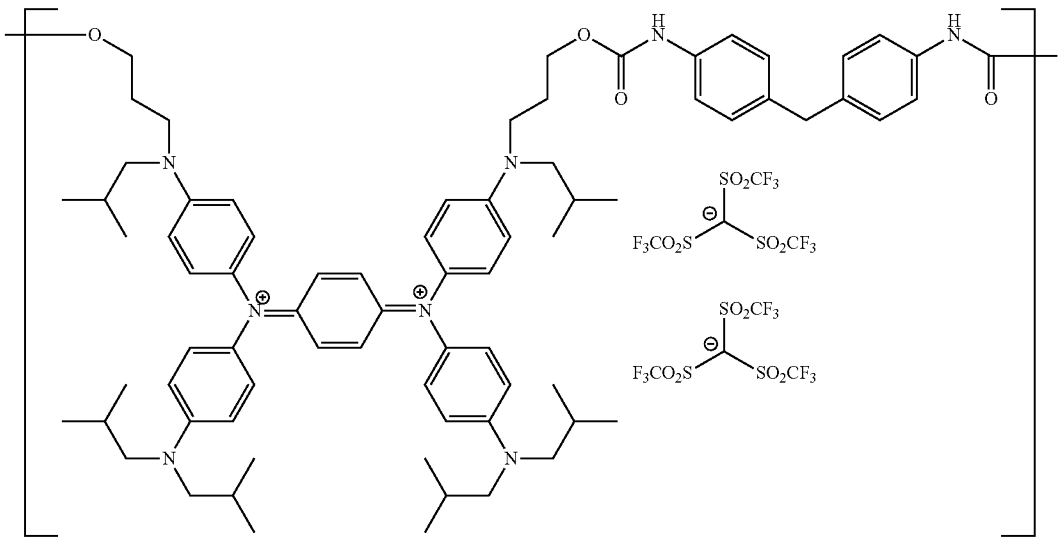
(C-di-2)
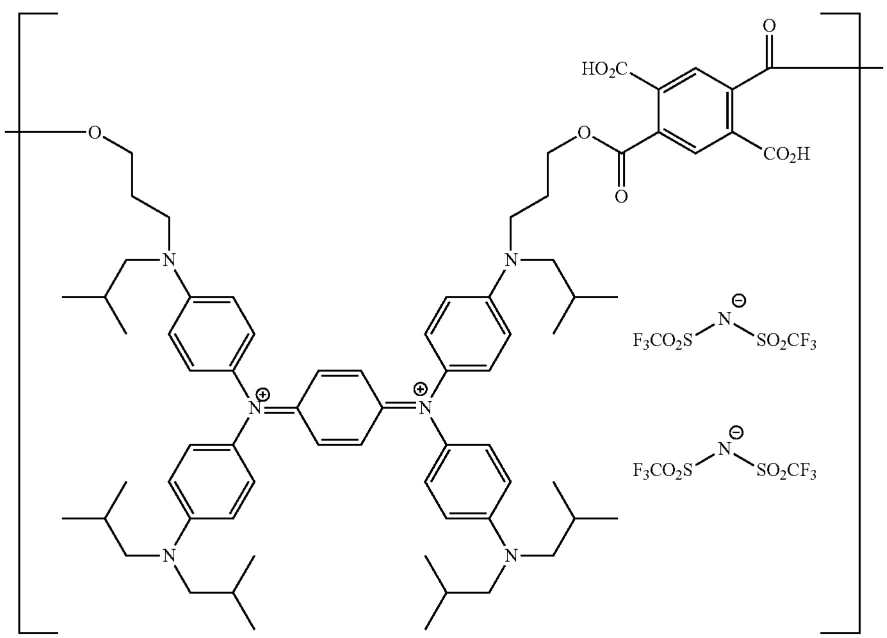

The colorant polymer (C) may include other repeating units described above regarding the colorant polymer (A) in addition to the repeating unit represented by Formula (C).

The colorant polymer (C) can be synthesized by sequential polymerization. Examples of the sequential polymerization include polyaddition (for example, a reaction between a diisocyanate compound and diol, a reaction between a diepoxy compound and dicarboxylic acid, or a reaction between tetracarboxylic dianhydride and diol) and polycondensation (for example, a reaction between dicarboxylic acid and diol or a reaction between dicarboxylic acid and diamine). Among these, the polyaddition reaction is preferable from the viewpoints of moderating reaction conditions and preventing the colorant skeleton from being decomposed. Well-known reaction conditions can be applied to the sequential polymerization.

<<<Colorant Polymer (D)>>>

It is preferable that the colorant polymer (D) is represented by Formula (D).

$$(\text{DyeIV})_{n}\!-\!L^{4}\!-\!(\text{P})_{k} \qquad \text{(D)}$$

In Formula (D), $L^4$ represents an (n+k)-valent linking group. n represents an integer of 2 to 20, and k represents an integer of 0 to 20. DyeIV represents a near infrared absorbing colorant structure, and P represents a substituent. In a case where n represents 2 or more, a plurality of DyeIV's may be different from each other. In a case where k represents 2 or more, a plurality of P's may be different from each other. n+k represents an integer of 2 to 20.

In Formula (D), n represents preferably 2 to 15, more preferably 2 to 14, still more preferably 2 to 8, even still more preferably 2 to 7, and even yet still more preferably 2 to 6.

The sum of n and k is preferably 2 to 20, more preferably 2 to 15, still more preferably 2 to 14, even still more preferably 2 to 8, even yet still more preferably 2 to 7, and even yet still more preferably 2 to 6.

In one colorant polymer, n and k each independently represent an integer. In the present invention, a plurality of colorant polymers in which n and k in Formula (D) each independently represent different integers may be used. Accordingly, in the composition according to the present invention, each of average values of n and k may not be an integer.

It is preferable that the (n+k)-valent linking group is a group composed of 1 to 100 carbon atoms, 0 to 10 nitrogen atoms, 0 to 50 oxygen atoms, 1 to 200 hydrogen atoms, and 0 to 20 sulfur atoms.

Specific examples of the (n+k)-valent linking group include a group (in which a ring structure may be formed) including one of the following structural unit or a combination of two or more of the structural units.

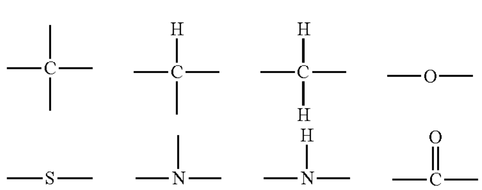

-continued

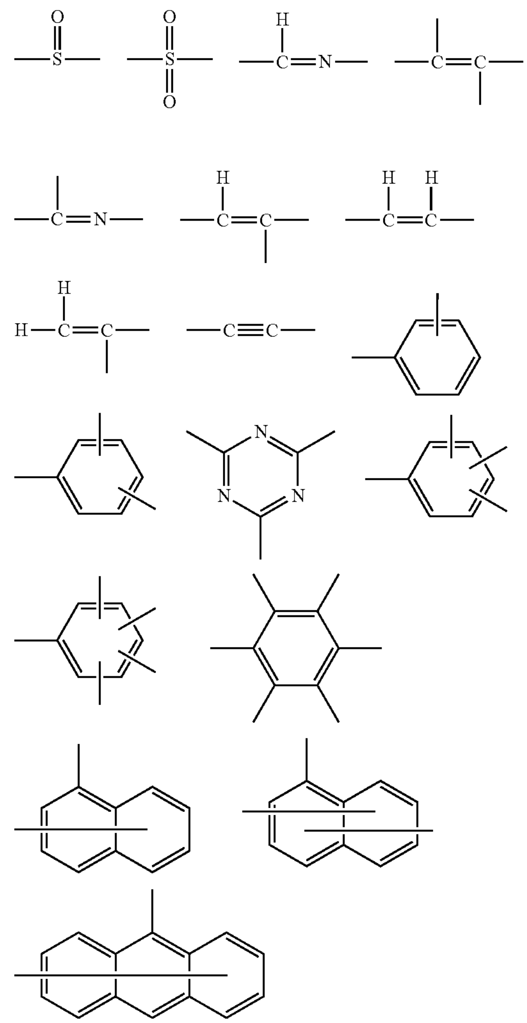

Specific examples of the (n+k)-valent linking group are as follows. However, the present invention is not limited to these examples. Other examples of the (n+k)-valent linking group include a linking group described in paragraphs "0071" and "0072" of JP2008-222950A and a linking group described in paragraph "0176" of JP2013-029760A. In the following structural formulae, * represents a binding site to DyeIV or P.

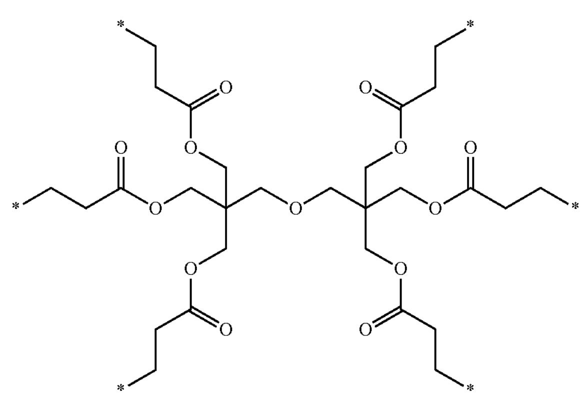

-continued

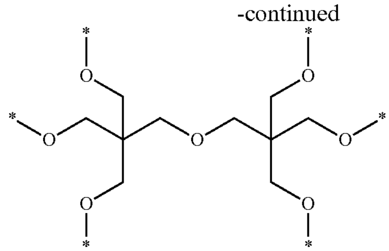

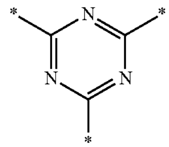

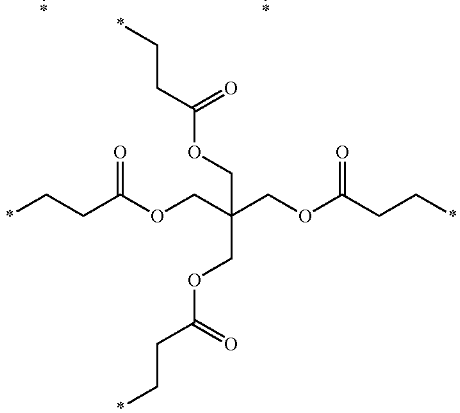

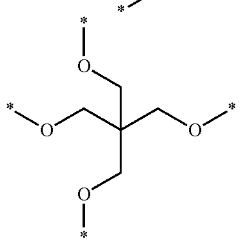

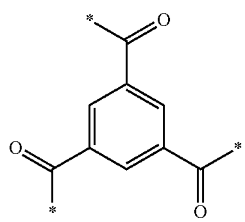

In Formula (D), P represents a substituent. Examples of the substituent include an acid group and a curable group. Examples of the curable group include a radically polymerizable group such as a group having an ethylenically unsaturated bond, a cyclic ether group (an epoxy group, an oxetanyl group), an oxazoline group, and a methylol group. Examples of the group having an ethylenically unsaturated bond include a vinyl group, a (meth)allyl group, and a (meth)acryloyl group. Examples of the acid group include a carboxyl group, a sulfonate group, and a phosphate group.

In addition, the substituent represented by P may be a monovalent polymer chain having a repeating unit. It is preferable that the monovalent polymer chain having a repeating unit is a monovalent polymer chain having a repeating unit derived from a vinyl compound. In a case where k represents 2 or more, k number of P's may be the same as or different from each other.

In a case where P represents a monovalent polymer chain having a repeating unit and k represents 1, it is preferable that P represents a monovalent polymer chain having 2 to 20 repeating units (preferably 2 to 15 repeating units and more preferably 2 to 10 repeating units) derived from a vinyl compound. In addition, in a case where P represents a monovalent polymer chain having a repeating unit and k represents 2 or more, it is preferable that the average number of repeating units derived from a vinyl compound in k number of P's is 2 to 20 (preferably 2 to 15 and more preferably 2 to 10).

In a case where P represents a monovalent polymer chain having a repeating unit, the number of repeating units in P where k represents 1, and the average number of repeating units in k number of P's where k represents 2 or more can be measured by nuclear magnetic resonance (NMR).

In a case where P represents a monovalent polymer chain having a repeating unit, examples of the repeating unit constituting P include the other repeating units described above regarding the colorant polymer (A). It is preferable that the other repeating units include one or more selected from the repeating unit having an acid group and the repeating unit having a curable group. In a case where the other repeating units the repeating unit having an acid group, developability can be improved. In a case where the other repeating units the repeating unit having a curable group, solvent resistance can be further improved.

In a case where P includes the repeating unit having an acid group, the proportion of the repeating unit having an acid group is preferably 10 to 80 mol % and more preferably 10 to 65 mol % with respect to all the repeating units constituting P.

In a case where P includes the repeating unit having a curable group, the proportion of the repeating unit having a curable group is preferably 10 to 80 mol % and more preferably 10 to 65 mol % with respect to all the repeating units constituting P. By P including the repeating unit having a curable group, color transfer properties can be further improved.

In Formula (D), DyeIV represents a near infrared absorbing colorant structure.

The near infrared absorbing colorant structure represented by DyeIV may be a structure in which one or more arbitrary hydrogen atoms are removed from the near infrared absorbing colorant (colorant compound), and a part of the near infrared absorbing colorant (colorant compound) may be bonded to $L^4$. In addition, DyeIV may represent a polymer chain which has a repeating unit having a near infrared absorbing colorant structure (a structure in which one or more arbitrary hydrogen atoms are removed from a near infrared absorbing colorant (colorant compound)) at a main chain or a side chain. The polymer chain is not particularly limited as long as it has a near infrared absorbing colorant structure, and is preferably one selected from a (meth)acrylic resin, a styrene resin, and a (meth)acryl-styrene resin. The repeating unit of the polymer chain is not particularly limited, and examples thereof include the repeating unit represented by Formula (A) and the repeating unit represented by Formula (C). In addition, the total proportion of the repeating units having a near infrared absorbing colorant structure is preferably 5 to 60%, more preferably 10 to 50 mol %, and still more preferably 20 to 40 mol % with respect to all the repeating units constituting the polymer chain.

The polymer chain may include other repeating units described above regarding the colorant polymer (A) in addition to the repeating unit having a near infrared absorbing colorant structure. It is preferable that the other repeating units include one or more selected from the repeating unit having an acid group and the repeating unit having a curable group.

In a case where the polymer chain includes the repeating unit having a curable group, the proportion of the repeating unit having a curable group is, for example, preferably 5 to 50 mol % and more preferably 10 to 40 mol % with respect to 100 mol % of all the repeating units constituting the polymer chain.

In a case where the polymer chain includes the repeating unit having an acid group, the proportion of the repeating unit having an acid group is, for example, preferably 5 to 50 mol % and more preferably 10 to 40 mol % with respect to 100 mol % of all the repeating units constituting the polymer chain.

The colorant polymer represented by Formula (D) and can be synthesized, for example, using the following methods:

(1) a method of performing a polymer reaction using a compound having a terminal into which a functional group selected from a carboxyl group, a hydroxyl group, an amino group, and the like is introduced, and an acid halide having a near infrared absorbing colorant structure, an alkyl halide having a near infrared absorbing colorant structure, or an isocyanate having a near infrared absorbing colorant structure;

(2) a method of performing a Michael addition reaction using a compound having a terminal into which a carbon-carbon double bond is introduced, and a thiol compound having a near infrared absorbing colorant structure;

(3) a method of causing a compound having a terminal into which a carbon-carbon double bond is introduced, and a thiol compound having a near infrared absorbing colorant structure to react with each other in the presence of a radical generator;

(4) a method of causing a polyfunctional thiol compound having a terminal into which a plurality of thiol groups are introduced and a compound having a carbon-carbon double bond and a near infrared absorbing colorant structure to react with each other in the presence of a radical generator; and (5) a method of performing radical polymerization using a vinyl compound in the presence of a thiol compound having a near infrared absorbing colorant structure.

It is preferable that the colorant polymer (D) has a structure represented by Formula (D-1).

$$(D^1\text{-}L^{42})_n\text{-}L^4\text{-}(L^{41}\text{-}P^1)_k \qquad \text{(D-1)}$$

In Formula (D-1), $L^4$ represents an (n+k)-valent linking group. n represents an integer of 2 to 20, and k represents an integer of 0 to 20. $D^1$ represents a near infrared absorbing colorant structure, and $P^1$ represents a substituent. In a case where n represents 2 or more, a plurality of $D^1$'s may be different from each other, and in a case where k represents 2 or more, a plurality of P's may be different from each other. n+k represents an integer of 2 to 20.

In Formula (D-1), $L^4$, n, and k have the same definitions and the same preferable ranges as those of $L^4$, n, and k in Formula (D).

In Formula (D-1), $L^{41}$ and $L^{42}$ each independently represent a single bond or a divalent linking group. In a case where a plurality of $L^{41}$'s and a plurality of $L^{42}$'s are present, $L^{41}$'s and $L^{42}$'s may be the same as or different from each other.

The divalent linking group is a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may have a substituent.

Specific examples of the divalent linking group include a group including one of the following structural unit or a combination of two or more of the structural units. $L^{41}$ and $L^{42}$ represent preferably a group including —S— and more preferably —S—.

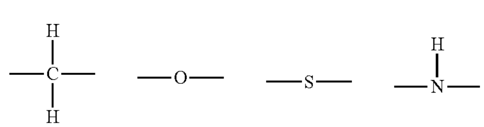

-continued

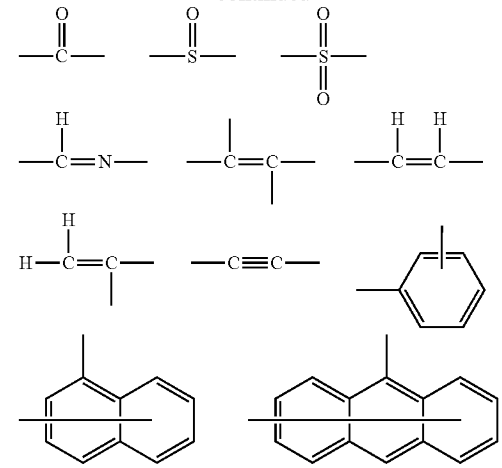

In Formula (D-1), $P^1$ represents a substituent.

Examples of the substituent include an acid group and a curable group. Examples of the curable group include a radically polymerizable group such as a group having an ethylenically unsaturated bond, a cyclic ether group (an epoxy group, an oxetanyl group), an oxazoline group, and a methylol group. Examples of the group having an ethylenically unsaturated bond include a vinyl group, a (meth)allyl group, and a (meth)acryloyl group. Examples of the acid group include a carboxyl group, a sulfonate group, and a phosphate group.

In addition, the substituent represented by $P^1$ may be a monovalent polymer chain having a repeating unit. It is preferable that the monovalent polymer chain having a repeating unit is a monovalent polymer chain having a repeating unit derived from a vinyl compound. In a case where k represents 2 or more, k number of $P^1$'s may be the same as or different from each other.

In a case where $P^1$ represents a monovalent polymer chain having a repeating unit and k represents 1, it is preferable that $P^1$ represents a monovalent polymer chain having 2 to 20 repeating units (preferably 2 to 15 repeating units and more preferably 2 to 10 repeating units) derived from a vinyl compound. In addition, in a case where $P^1$ represents a monovalent polymer chain having a repeating unit and k represents 2 or more, it is preferable that the average number of repeating units derived from a vinyl compound in k number of $P^1$'s is 2 to 20 (preferably 2 to 15 and more preferably 2 to 10).

In a case where $P^1$ represents a monovalent polymer chain having a repeating unit, examples of the repeating unit constituting $P^1$ include the other repeating units described above regarding the colorant polymer (A). It is preferable that the other repeating units include one or more selected from the repeating unit having an acid group and the repeating unit having a curable group.

In a case where $P^1$ includes the repeating unit having an acid group, the proportion of the repeating unit having an acid group is preferably 10 to 80 mol % and more preferably 10 to 65 mol % with respect to all the repeating units constituting $P^1$.

In a case where $P^1$ includes the repeating unit having a curable group, the proportion of the repeating unit having a curable group is preferably 10 to 80 mol % and more preferably 10 to 65 mol % with respect to all the repeating units constituting $P^1$.

In Formula (D-1), $D^1$ represents a near infrared absorbing colorant structure. $D^1$ may represent a near infrared absorbing colorant structure in which a part of a near infrared absorbing colorant (colorant compound) is bonded to $L^{42}$, or may represent a polymer chain which has a repeating unit having a near infrared absorbing colorant structure at a main chain or a side chain. The polymer chain is not particularly limited as long as it has a near infrared absorbing colorant structure, and is preferably one selected from a (meth)acrylic resin, a styrene resin, and a (meth)acryl-styrene resin. The repeating unit of the polymer chain is not particularly limited, and examples thereof include the repeating unit represented by Formula (A) and the repeating unit represented by Formula (C). In addition, the total proportion of the repeating units having a near infrared absorbing colorant structure is preferably 5 to 60%, more preferably 10 to 50 mol %, and still more preferably 20 to 40 mol % with respect to all the repeating units constituting the polymer chain.

The polymer chain may include other repeating units described above regarding the colorant polymer (A) in addition to the repeating unit having a near infrared absorbing colorant structure. It is preferable that the other repeating units include one or more selected from the repeating unit having an acid group and the repeating unit having a curable group.

It is preferable that the colorant polymer (D) has a structure represented by Formula (D-2).

$$(D^2\text{-S—}C^1\text{—}B^1)_n\text{-}L^4\text{-}(B^2\text{—}C^2\text{—S—}P^2)_k \qquad \text{(D-2)}$$

In Formula (D-2), $L^4$ represents an (n+k)-valent linking group. n represents an integer of 2 to 20, and k represents an integer of 0 to 20. $D^2$ represents a near infrared absorbing colorant structure, and $P^2$ represents a substituent. $B^1$ and $B^2$ each independently represent a single bond, —O—, —S—, —CO—, —NR—, —$O_2$C—, —$CO_2$—, —NROC—, or —CONR—. R represents a hydrogen atom, an alkyl group, or an aryl group. $C^1$ and $C^2$ each independently represent a single bond or a divalent linking group. S represents a sulfur atom. In a case where n represents 2 or more, a plurality of $D^2$'s may be different from each other, and in a case where k represents 2 or more, a plurality of $P^2$'s may be different from each other. n+k represents an integer of 2 to 20.

In Formula (D-2), $L^4$, n, and k have the same definitions and the same preferable ranges as those of $L^4$, n, and k in Formula (D).

In Formula (D-2), $B^1$ and $B^2$ each independently represent a single bond, —O—, —S—, —CO—, —NR—, —$O_2$C—, —$CO_2$—, —NROC—, or —CONR—, and preferably a single bond, —O—, —CO—, —$O_2$C—, —$CO_2$—, —NROC—, or —CONR—.

R represents a hydrogen atom, an alkyl group, or an aryl group.

The number of carbon atoms in the alkyl group represented by R is preferably 1 to 30 and more preferably 1 to 10. The alkyl group may be linear, branched, or cyclic.

The number of carbon atoms in the aryl group represented by R is preferably 6 to 30 and more preferably 6 to 12.

R represents preferably a hydrogen atom or an alkyl group and more preferably a hydrogen atom.

In Formula (D-2), $C^1$ and $C^2$ each independently represent a single bond or a divalent linking group.

As the divalent linking group, an alkylene group, an arylene group, or an oxyalkylene group is preferable, and an alkylene group or an oxyalkylene group is more preferable.

The number of carbon atoms in the alkylene group and the oxyalkylene group is preferably 1 to 30 and more preferably 1 to 10. The alkylene group and the oxyalkylene group may be linear, branched, or cyclic.

The number of carbon atoms in the arylene group is preferably 6 to 30 and more preferably 6 to 12.

In Formula (D-2), $P^2$ represents a substituent.

Examples of the substituent include an acid group and a curable group. Examples of the curable group include a radically polymerizable group such as a group having an ethylenically unsaturated bond, a cyclic ether group (an epoxy group, an oxetanyl group), an oxazoline group, and a methylol group. Examples of the group having an ethylenically unsaturated bond include a vinyl group, a (meth)allyl group, and a (meth)acryloyl group. Examples of the acid group include a carboxyl group, a sulfonate group, and a phosphate group.

In addition, the substituent represented by $P^2$ may be a monovalent polymer chain having a repeating unit. It is preferable that the monovalent polymer chain having a repeating unit is a monovalent polymer chain having a repeating unit derived from a vinyl compound. In a case where k represents 2 or more, k number of $P^2$'s may be the same as or different from each other.

In a case where $P^2$ represents a monovalent polymer chain having a repeating unit and k represents 1, it is preferable that $P^2$ represents a monovalent polymer chain having 2 to 20 repeating units (preferably 2 to 15 repeating units and more preferably 2 to 10 repeating units) derived from a vinyl compound. In addition, in a case where $P^2$ represents a monovalent polymer chain having a repeating unit and k represents 2 or more, it is preferable that the average number of repeating units derived from a vinyl compound in k number of $P^2$'s is 2 to 20 (preferably 2 to 15 and more preferably 2 to 10).

In a case where $P^2$ represents a monovalent polymer chain having a repeating unit, examples of the repeating unit constituting $P^2$ include the other repeating units described above regarding the colorant polymer (A). It is preferable that the other repeating units include one or more selected from the repeating unit having an acid group and the repeating unit having a curable group. In a case where $P^2$ includes the repeating unit having an acid group, the proportion of the repeating unit having an acid group is preferably 10 to 80 mol % and more preferably 10 to 65 mol % with respect to all the repeating units constituting $P^2$. In a case where $P^2$ includes the repeating unit having a curable group, the proportion of the repeating unit having a curable group is preferably 10 to 80 mol % and more preferably 10 to 65 mol % with respect to all the repeating units constituting $P^2$.

In Formula (D-2), $D^2$ represents a near infrared absorbing colorant structure. $D^2$ may represent a near infrared absorbing colorant structure in which a part of a near infrared absorbing colorant (colorant compound) is bonded to —S—, or may represent a polymer chain which has a repeating unit having a near infrared absorbing colorant structure at a main chain or a side chain. The polymer chain is not particularly limited as long as it has a near infrared absorbing colorant structure, and is preferably one selected from a (meth)acrylic resin, a styrene resin, and a (meth)acryl-styrene resin. The repeating unit of the polymer chain is not particularly limited, and examples thereof include the repeating unit represented by Formula (A) and the repeating unit represented by Formula (C). In addition, the total proportion of the repeating units having a near infrared absorbing colorant structure is preferably 5 to 60%, more preferably 10 to 50 mol %, and still more preferably 20 to 40 mol % with respect to all the repeating units constituting the polymer chain.

The polymer chain may include other repeating units described above regarding the colorant polymer (A) in addition to the repeating unit having a near infrared absorbing colorant structure. It is preferable that the other repeating units include one or more selected from the repeating unit having an acid group and the repeating unit having a curable group.

Specific examples of Formula (D) are as follows.

(D-ppb-1)

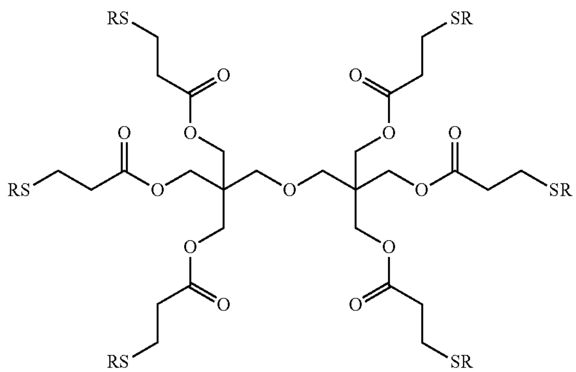

R =

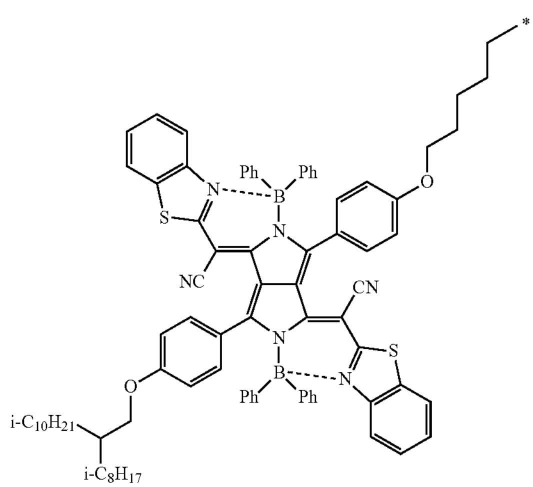

(D-ppb-2)

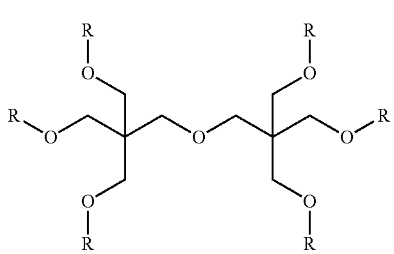

-continued

R =

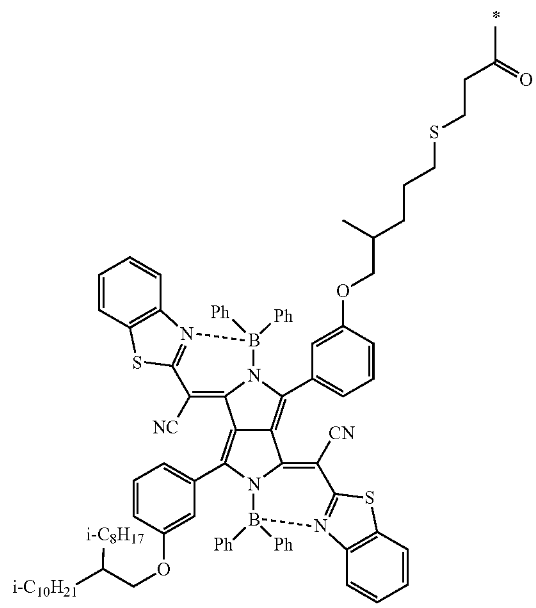

(D-ppb-3)

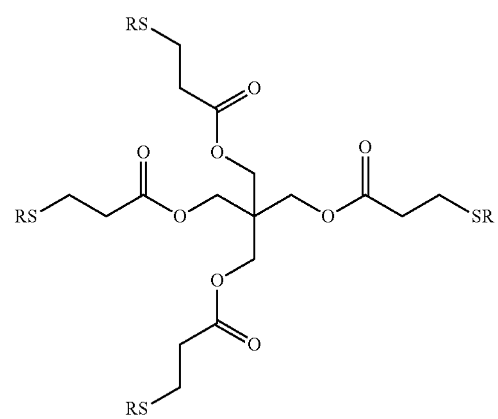

R =

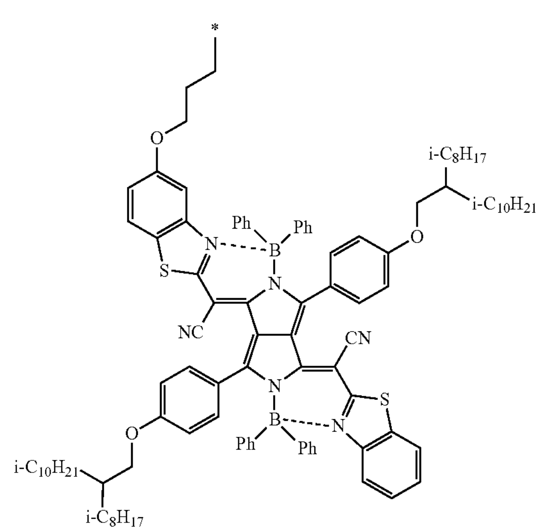

-continued
(D-ppb-4)
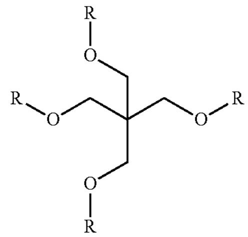
R =
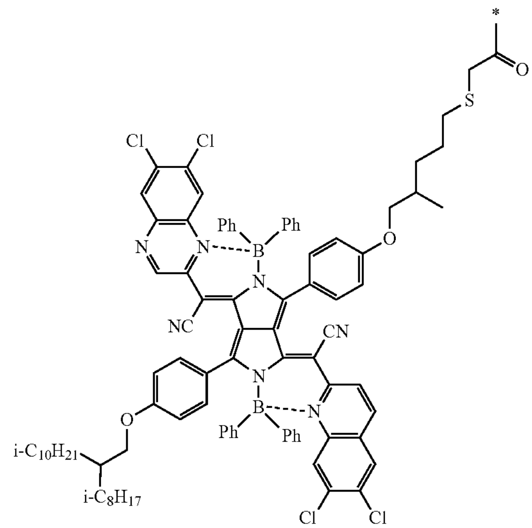
(D-ppb-5)
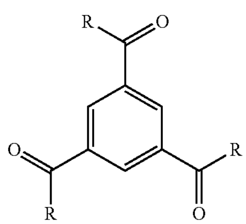
R =
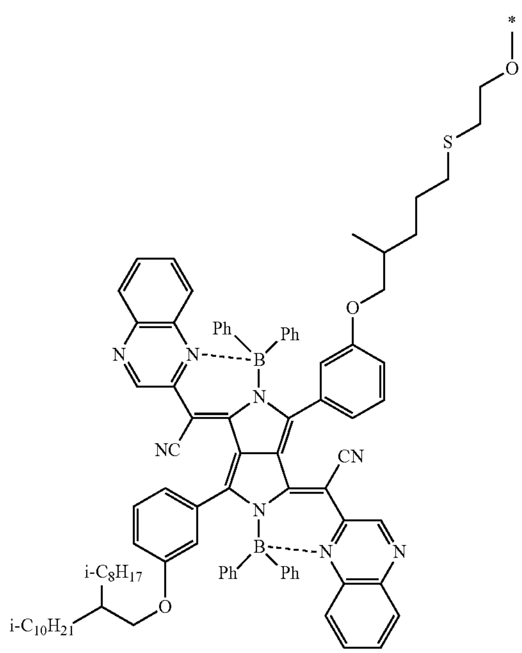
-continued
(D-ppb-6)
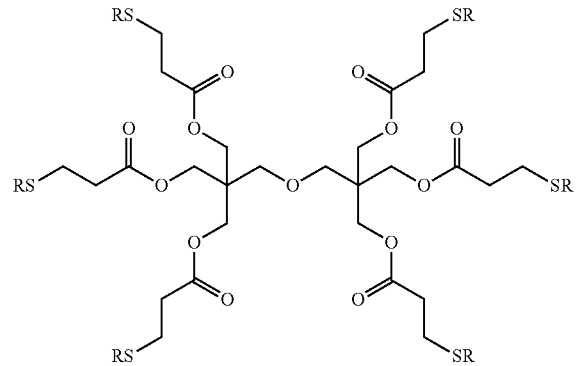
R =
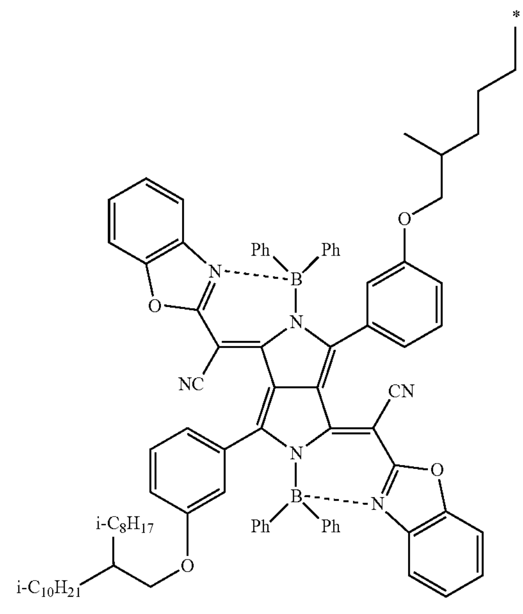
(D-sq-1)
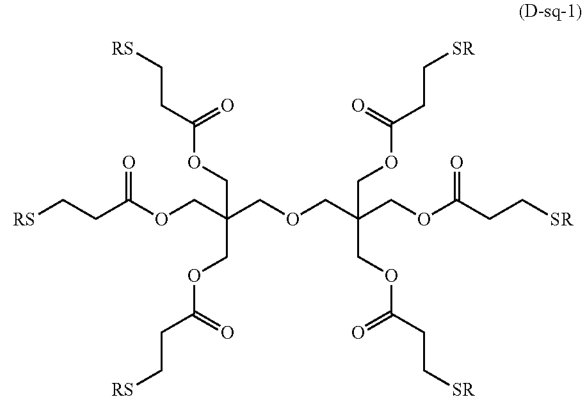

-continued
R =
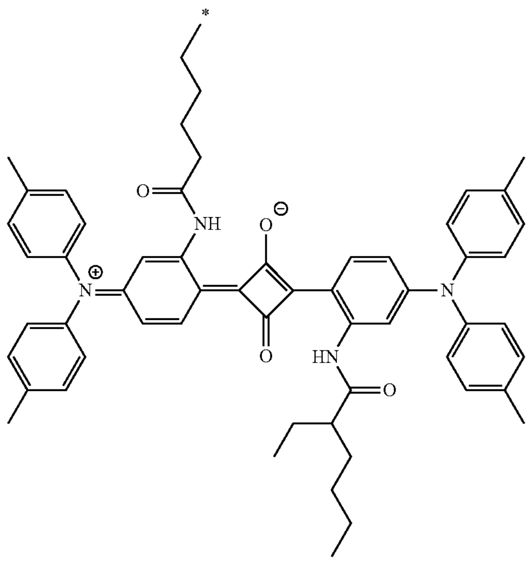
(D-sq-2)
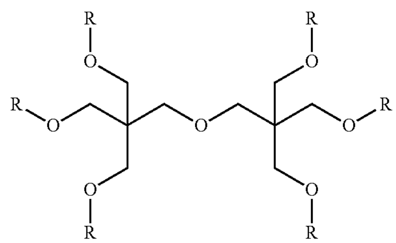
R =
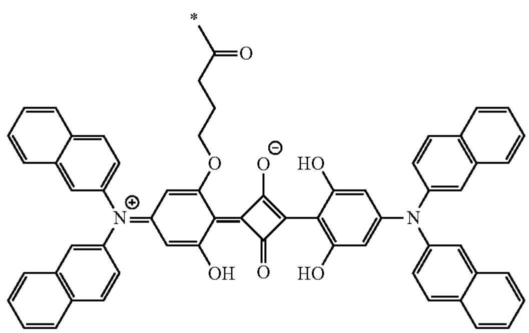
(D-sq-3)
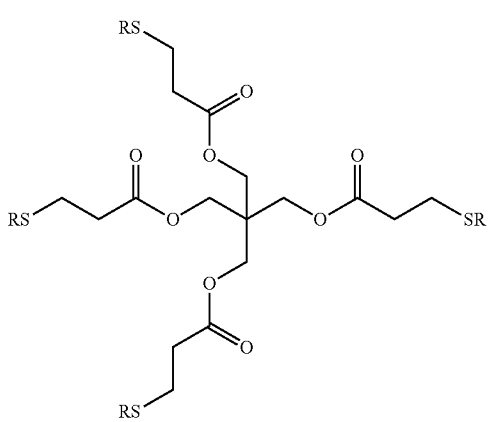
-continued
R =
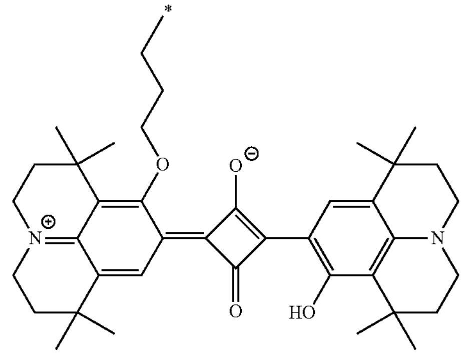
(D-sq-4)
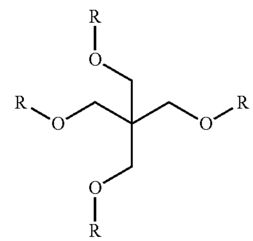
R =
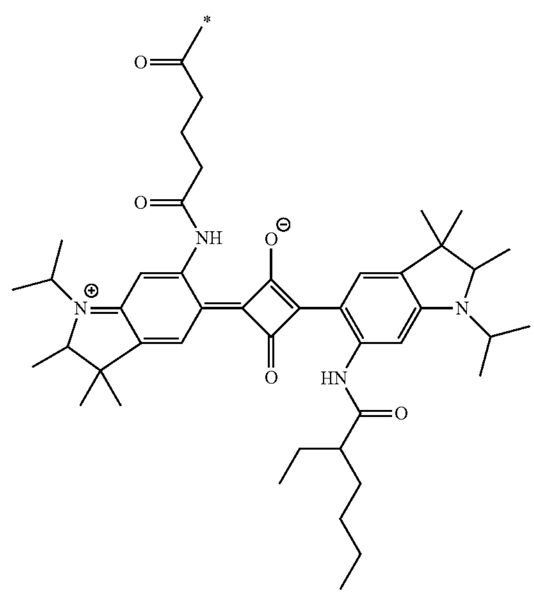
(D-sq-5)
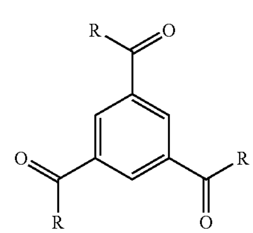

-continued
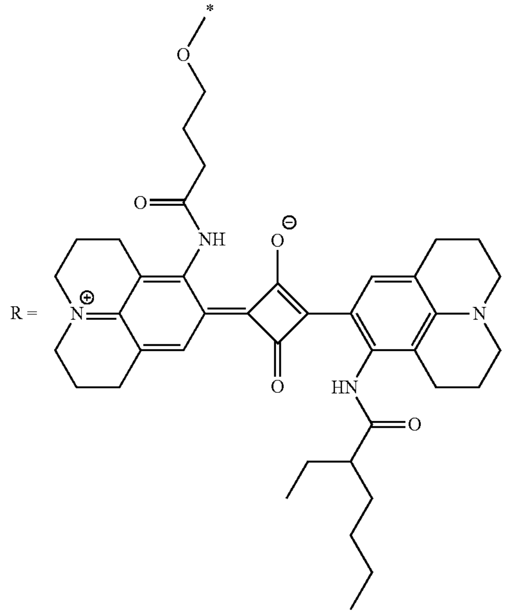
(D-sq-6)
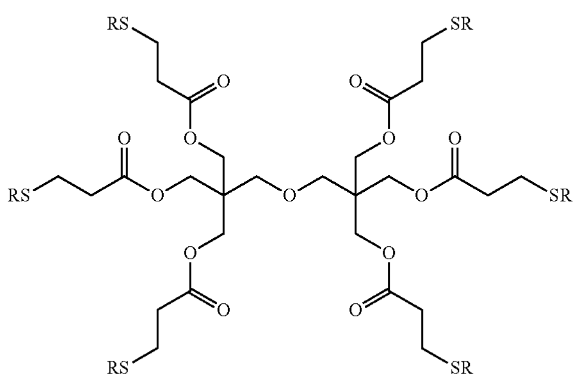
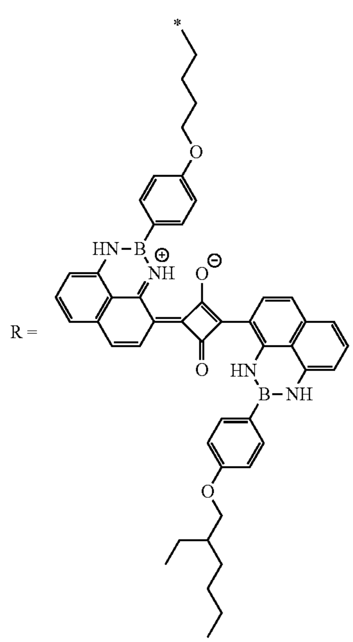
-continued
(D-sq-7)
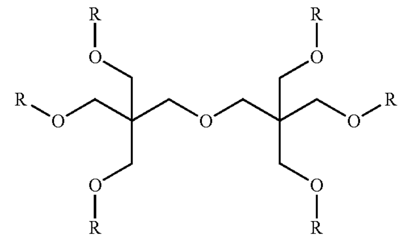
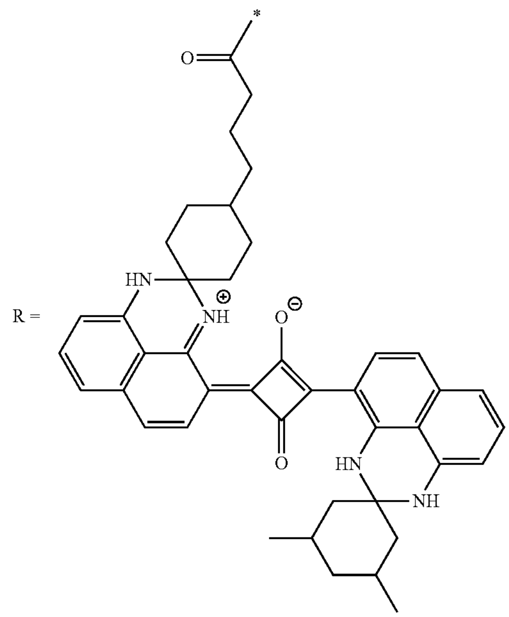
(D-sq-8)
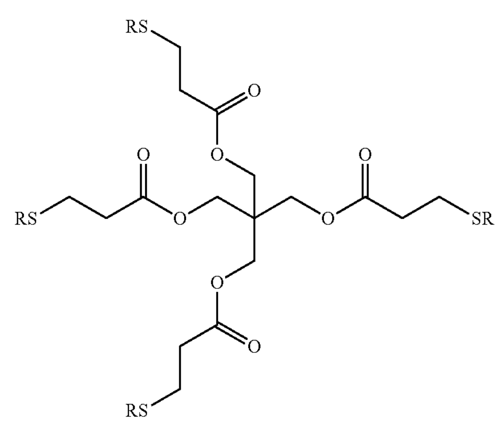

R =
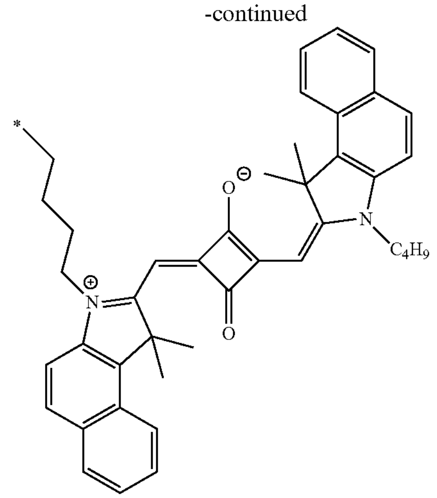
(D-sq-9)
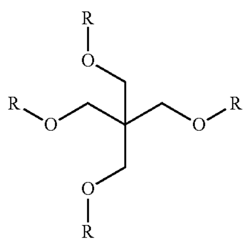
R =
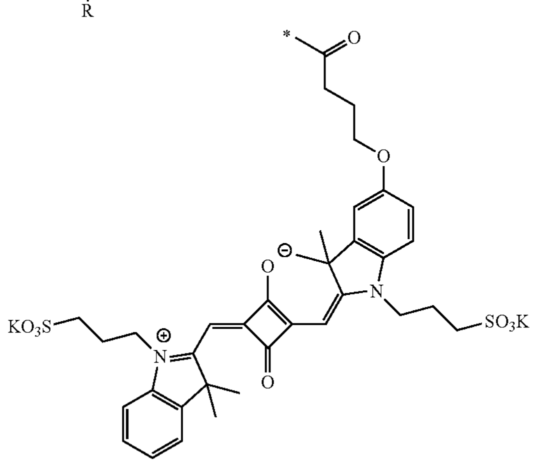
(D-sq-10)
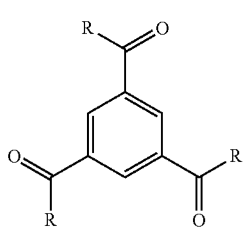
R =
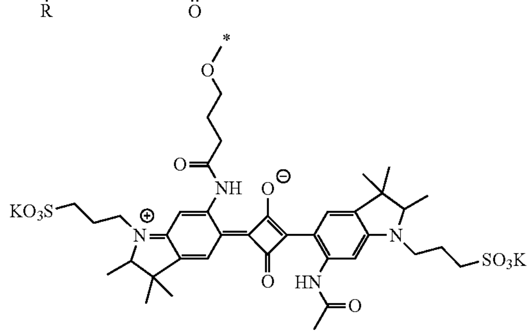
(D-cy-1)
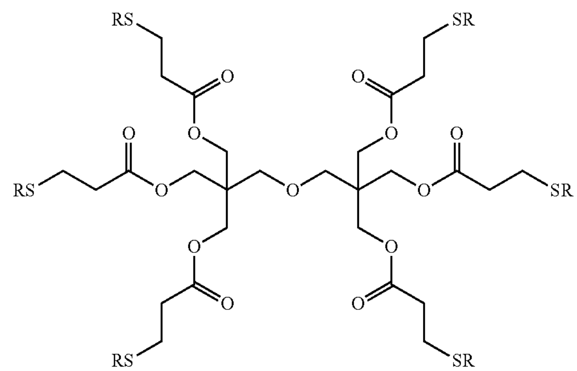
R =
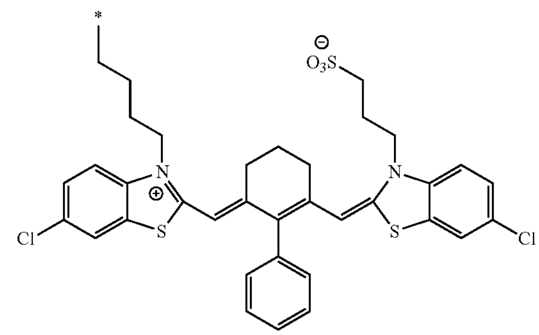
(D-cy-2)
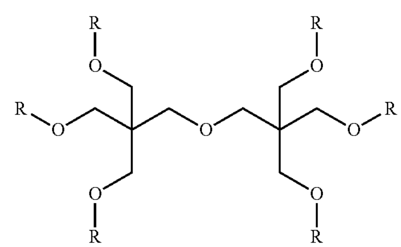
R =
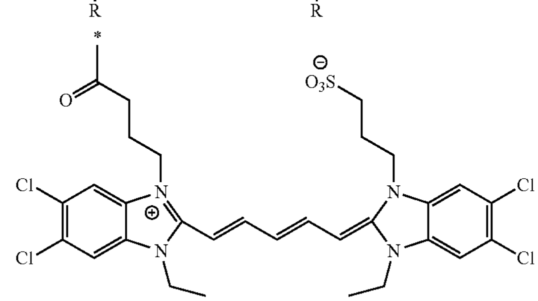
(D-cy-3)
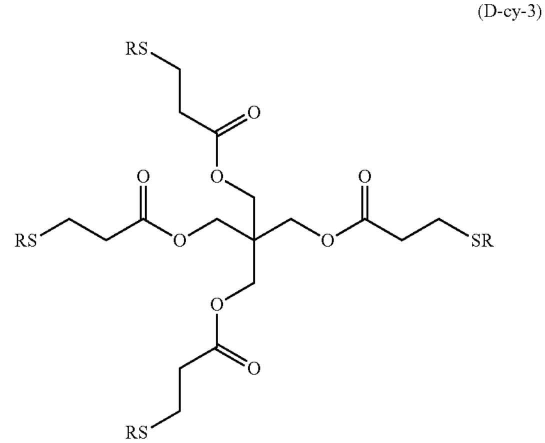

-continued
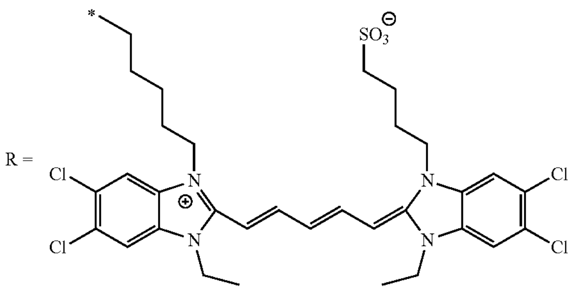
(D-cy-4)
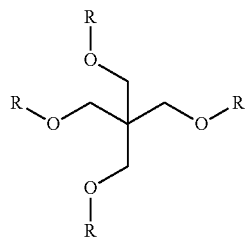
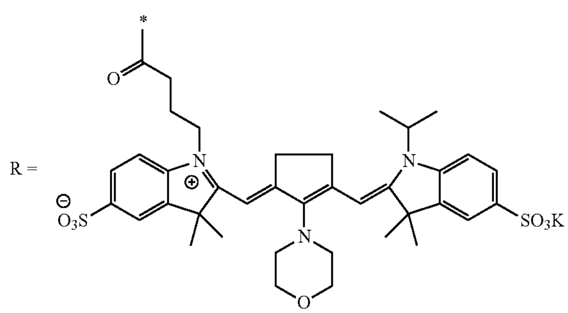
(D-cy-5)
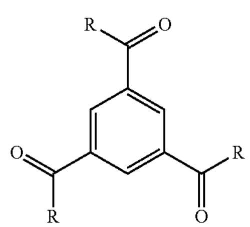
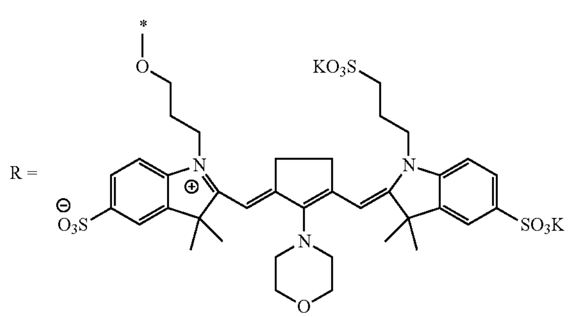
-continued
(D-cy-6)
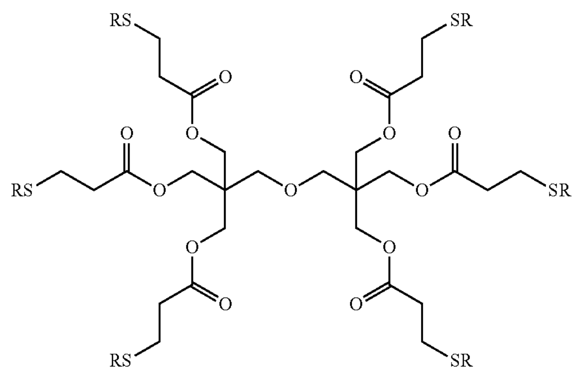
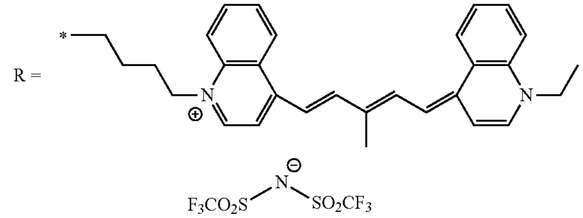
(D-cy-7)
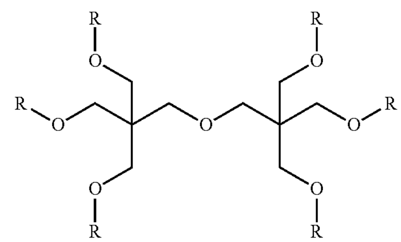
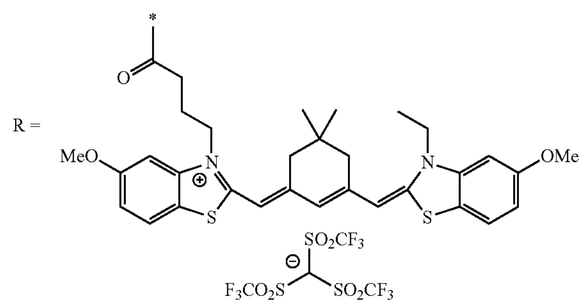
(D-cy-8)
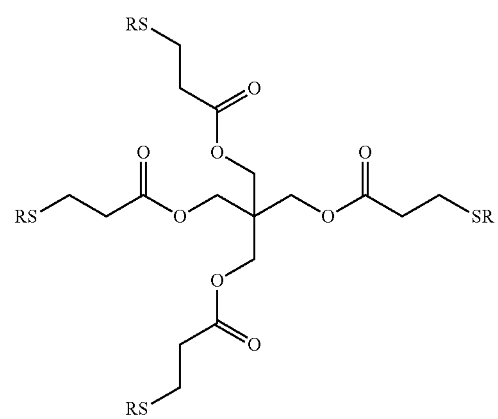

-continued
R =
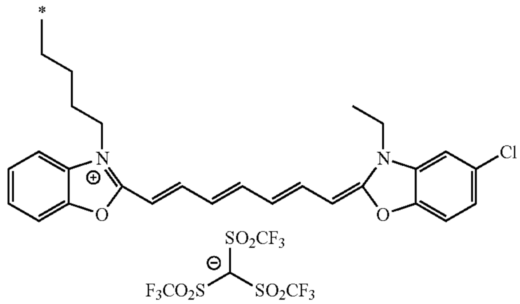
(D-cy-9)
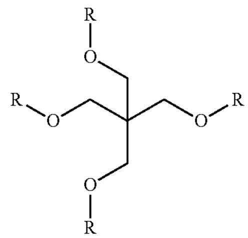
R =
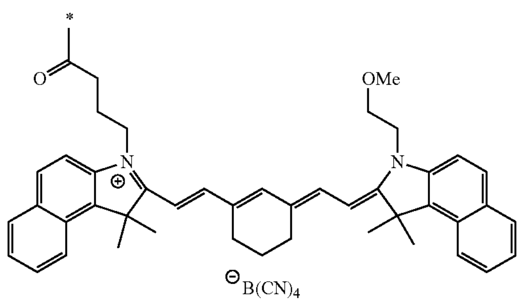
(D-cy-10)
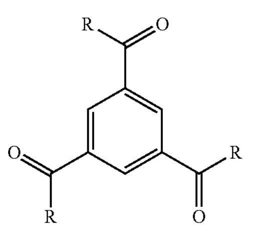
R =
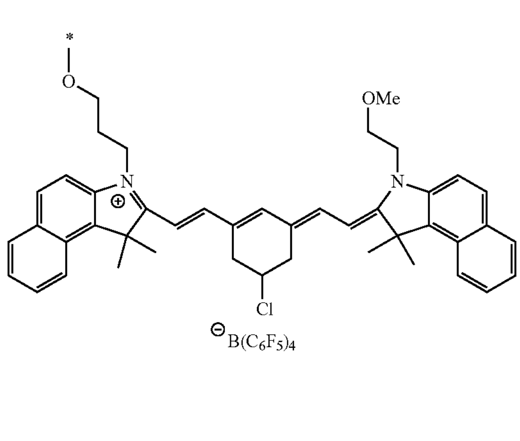
-continued
(D-ox-1)
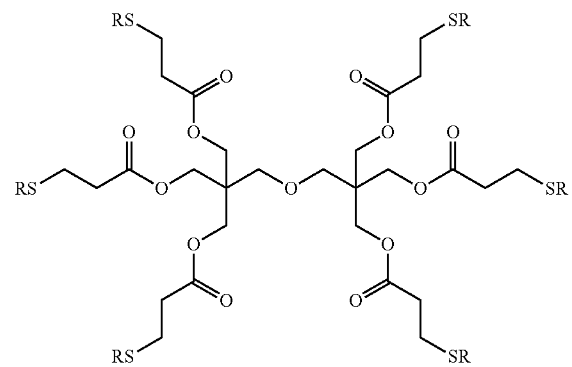
R =
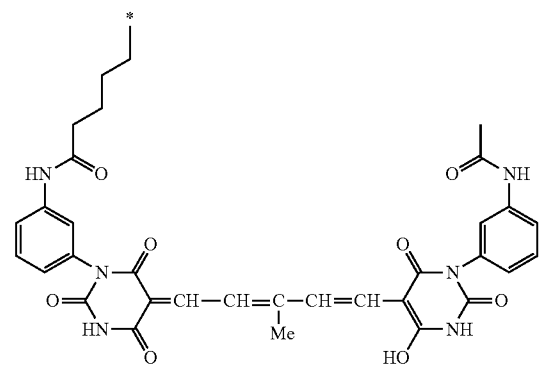
(D-ox-2)
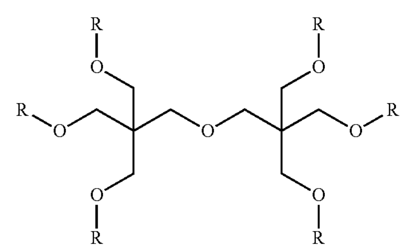
R =
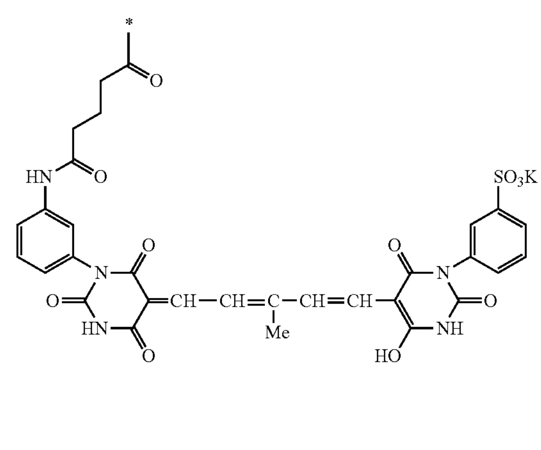

-continued
(D-ox-3)
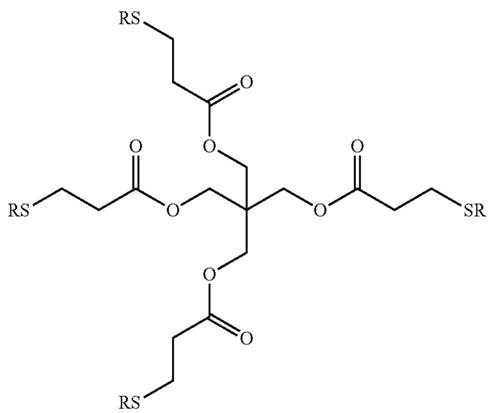
R =
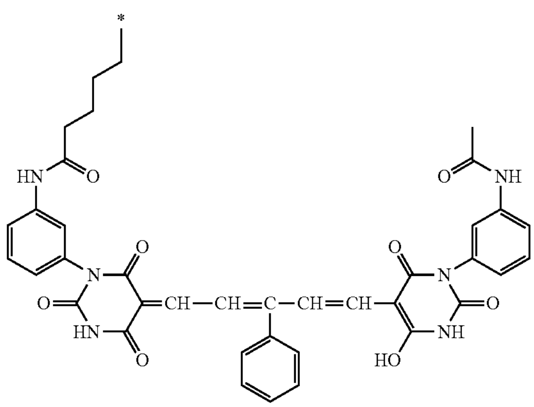
(D-ox-4)
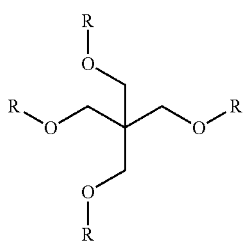
R =
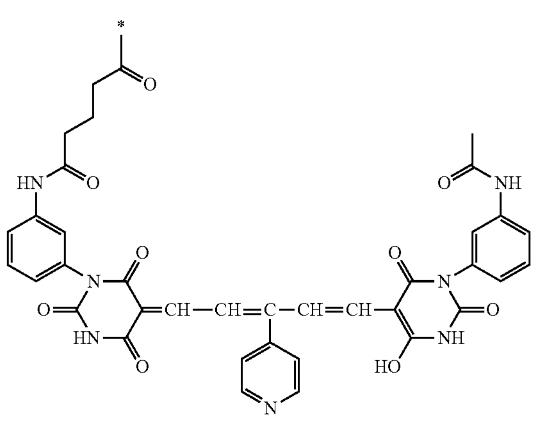
-continued
(D-ox-5)
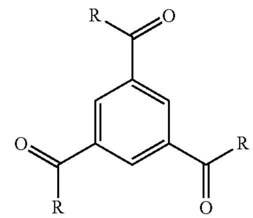
R =
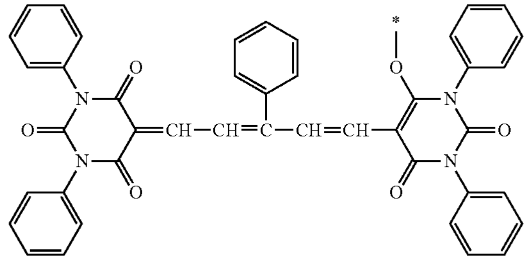
(D-ph-1)
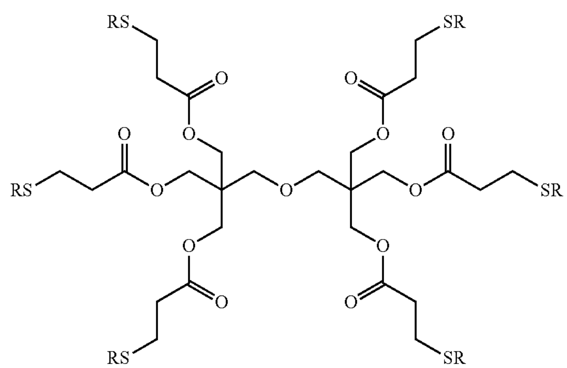
R =
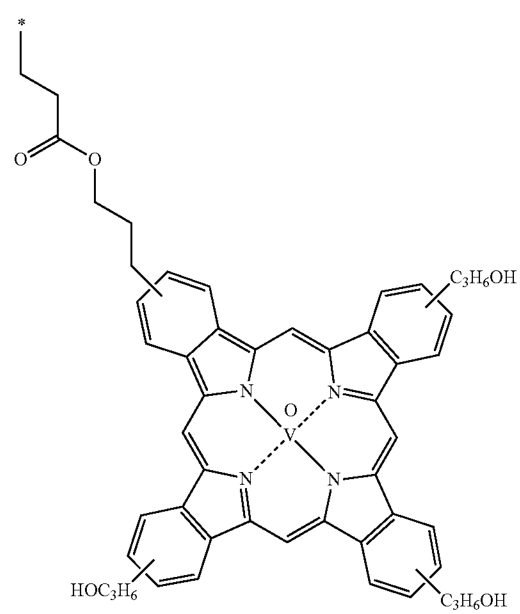

-continued
(D-ph-2)
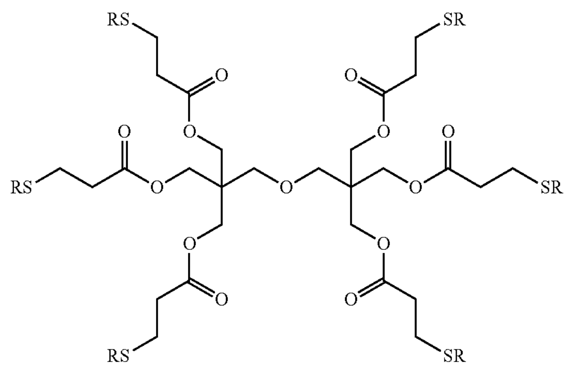
R =
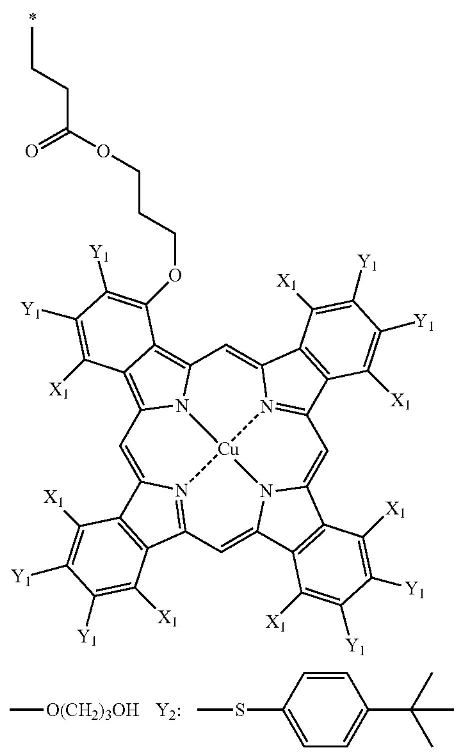
(D-ph-3)
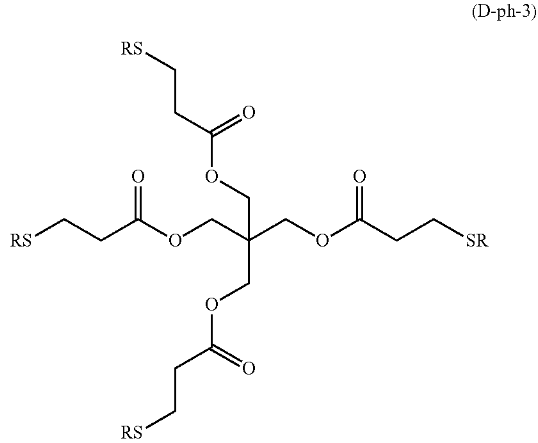
-continued
R =
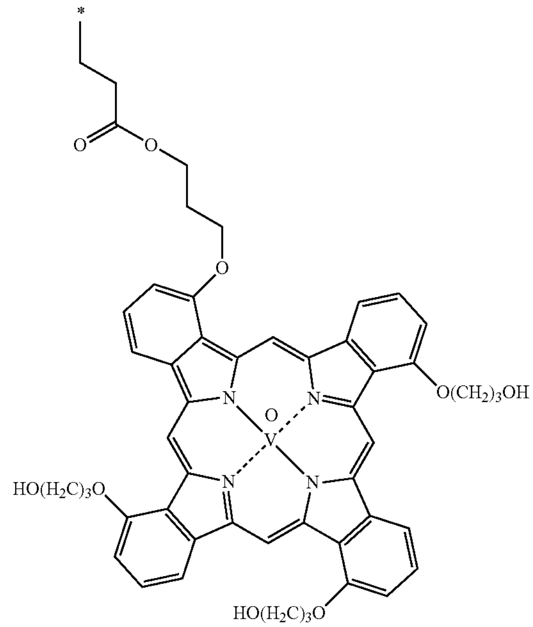
(D-ph-4)
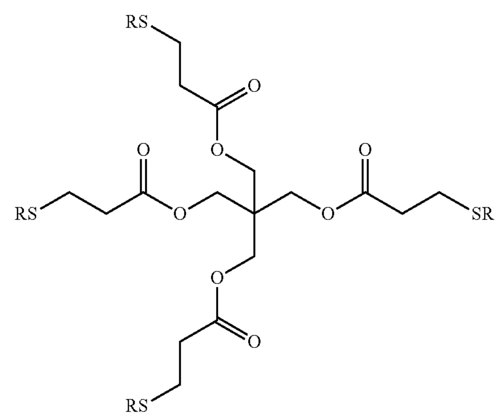
R =
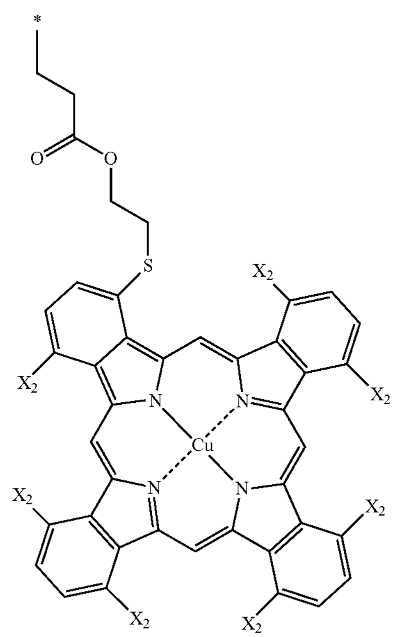

-continued
$X_2$: —$S(CH_2)_2OH$
(D-ph-5)
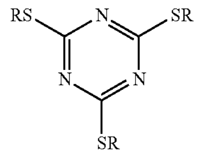
R =
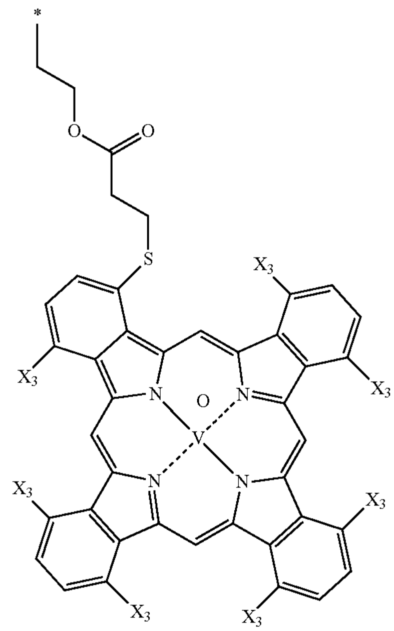
$X_3$: —$S(CH_2)_2CO_2H$
(D-ph-6)
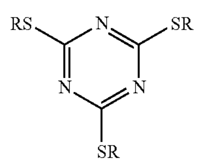
R =
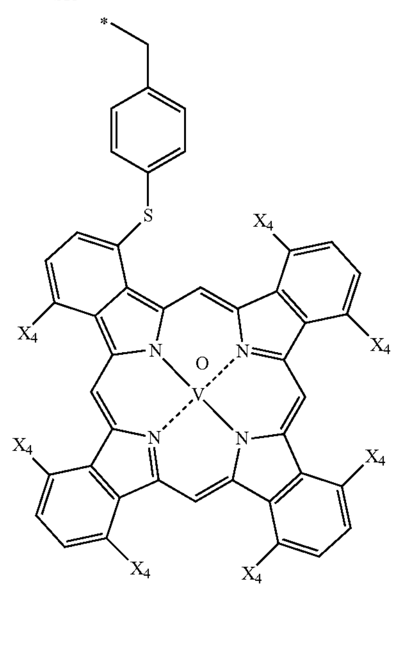
-continued
$X_4$:
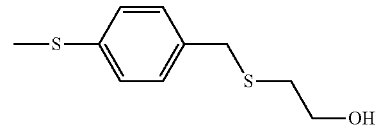
(D-ph-7)
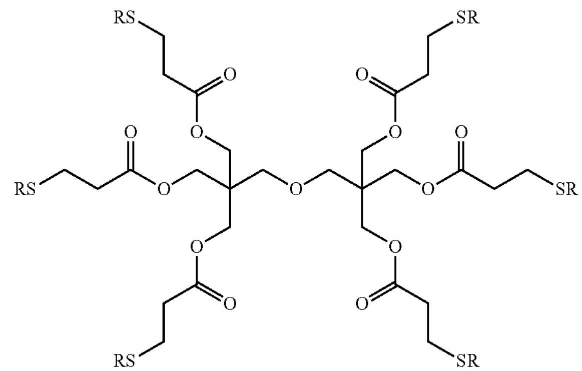
R =
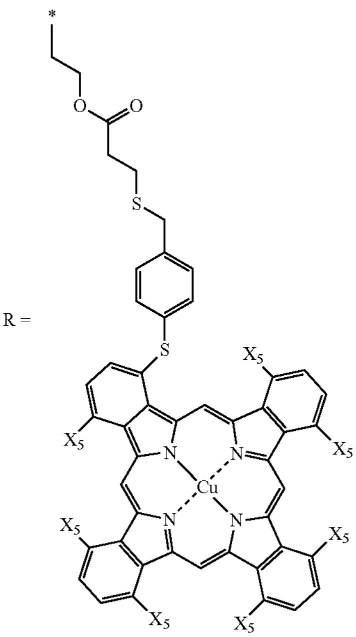
$X_5$:
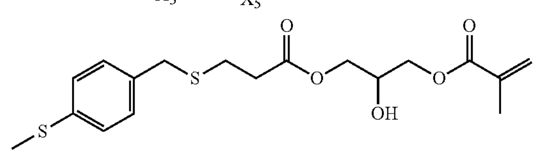
(D-ph-8)
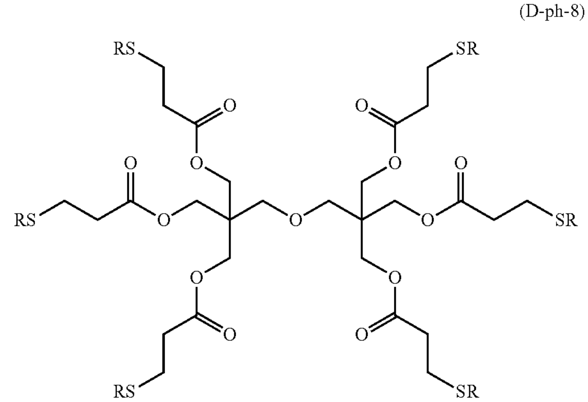

R =
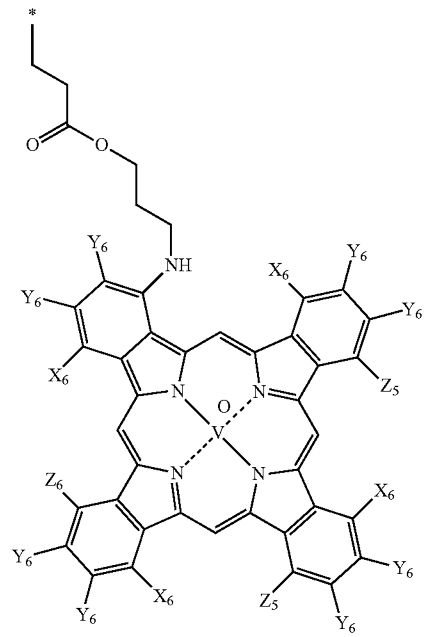
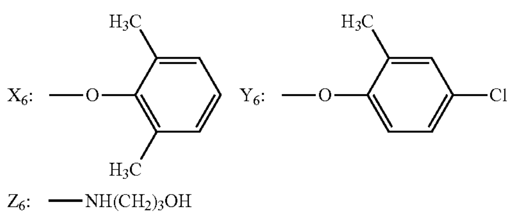
(D-na-1)
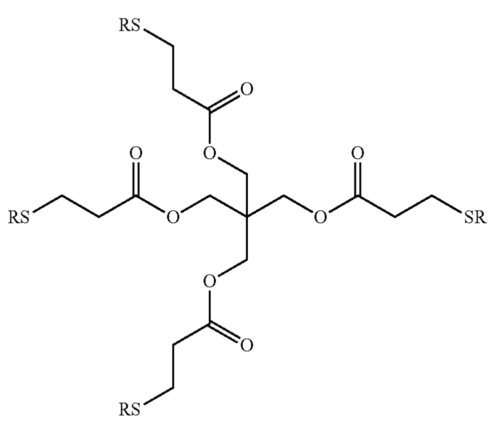
R =
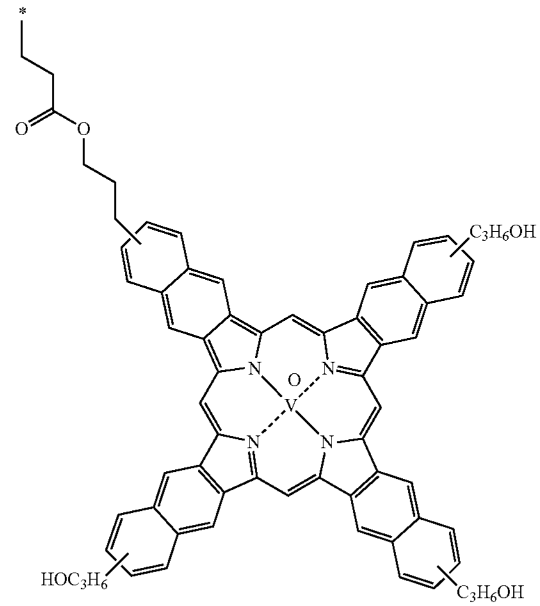
(D-na-2)
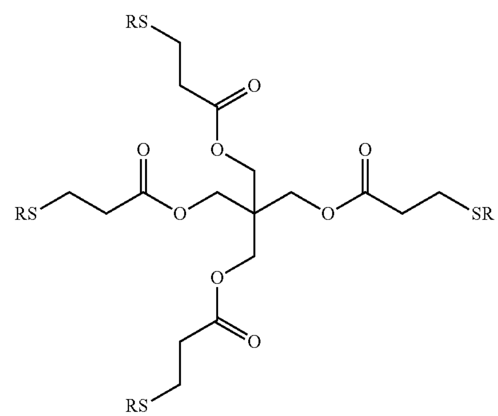
R =
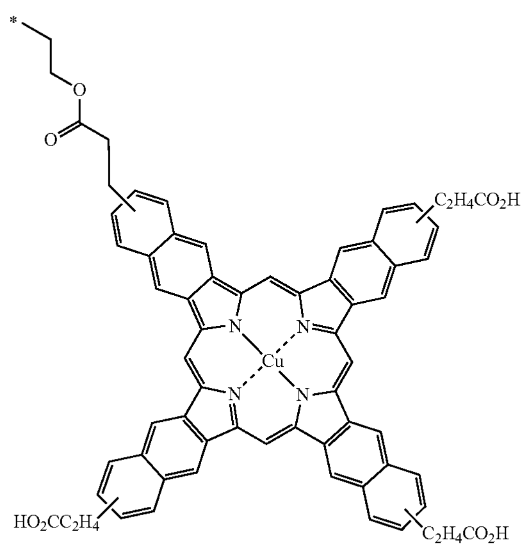

-continued
(D-na-3)
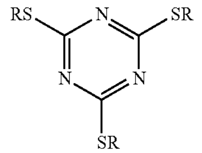
R =
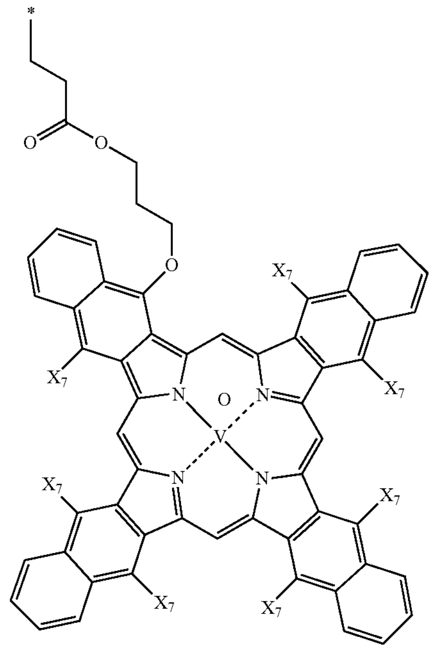
$X_7$: —$O(CH_2)_3OH$
(D-na-4)
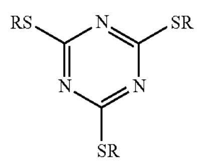
R =
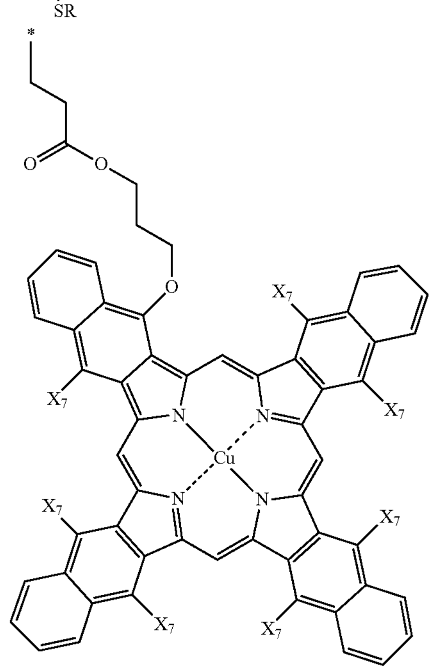
$X_7$: —$O(CH_2)_3OH$
-continued
(D-di-1)
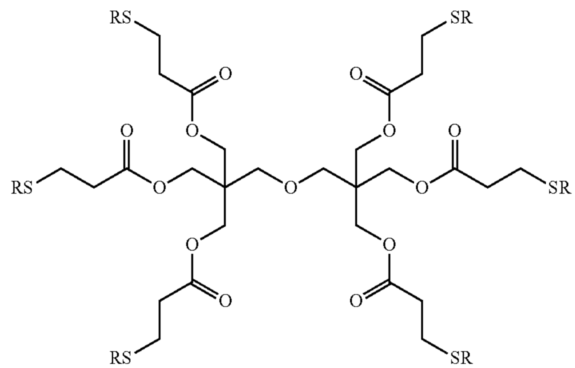
R =
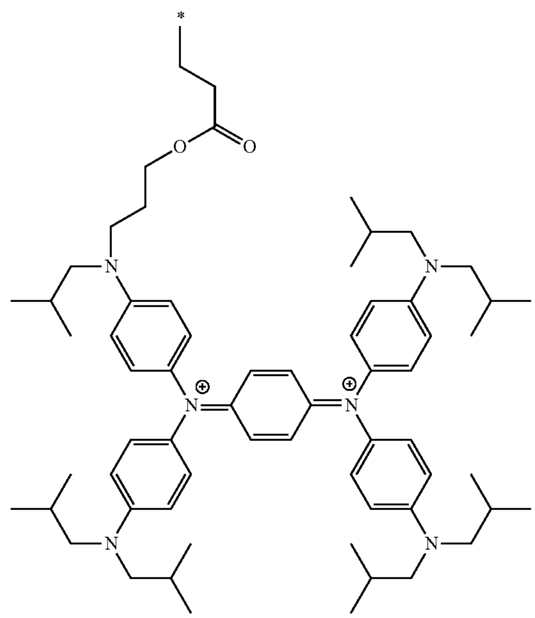
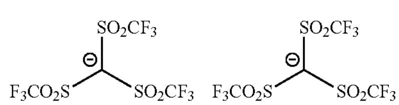
(D-di-2)
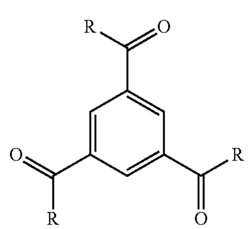

-continued

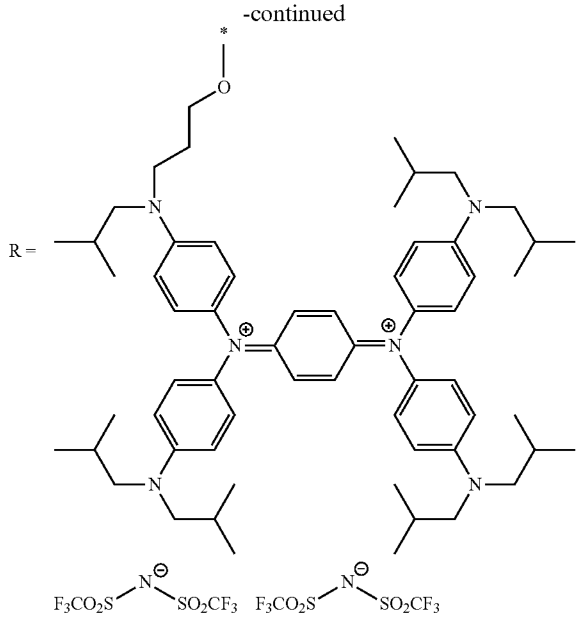

<<Near Infrared Absorbing Colorant Polymer>>

The weight-average molecular weight (Mw) of the near infrared absorbing colorant polymer is preferably 2000 to 30000. The lower limit is more preferably 3000 or higher and still more preferably 4000 or higher. The upper limit is more preferably 20000 or lower and still more preferably 15000 or lower. By satisfying the above-described range, solvent resistance and color transfer properties are further improved. Further heat resistance and light fastness are improved.

In the present invention, the weight-average molecular weight (Mw) of the colorant polymer is a value in terms of polystyrene obtained by gel permeation chromatography (GPC), and specifically is a value measured using a method described in Examples described below.

The acid value of the near infrared absorbing colorant polymer is preferably 10 mgKOH/g or higher, more preferably 20 mgKOH/g or higher, still more preferably 30 mgKOH/g or higher, and even still more preferably 40 mgKOH/g or higher. In addition, the upper limit of the acid value is preferably 400 mgKOH/g or lower, more preferably 300 mgKOH/g or lower, still more preferably 200 mgKOH/g or lower, even still more preferably 150 mgKOH/g or lower, and even yet still more preferably 100 mgKOH/g or lower. By satisfying the above-described range, developability can be further improved, and a development residue can be further improved.

A curable group value of the near infrared absorbing colorant polymer is preferably 0.1 mmol/g or higher, more preferably 0.2 mmol/g or higher, and still more preferably 0.3 mmol/g or higher. In a case where the curable group value is 0.4 mmol/g or higher, solvent resistance of a film can be further improved. In addition, color loss of a film caused by a developer or a peeling solution can be more effectively suppressed. The upper limit of the curable group value is not particularly limited and, for example, is preferably 2.0 mmol/g or lower and more preferably 1.5 mmol/g or lower. The curable group value can be calculated by dividing the number of curable groups introduced into the near infrared absorbing colorant polymer by the molecular weight of the near infrared absorbing colorant polymer. In addition, the curable group value can be measured using analysis means such as nuclear magnetic resonance (1H-NMR).

<Composition>

A composition according to the present invention includes the near infrared absorbing colorant polymer according to the present invention and a solvent.

In the composition according to the present invention, the near infrared absorbing colorant polymer according to the present invention may be dissolved or dispersed in the solvent. In the composition according to the present invention, in a case where the near infrared absorbing colorant polymer is present in a state where it is dispersed in the solvent, the near infrared absorbing colorant polymer may further include a dispersant described below.

The content of the near infrared absorbing colorant polymer is preferably 0.01 to 50 mass % with respect to the total solid content of the composition according to the present invention. The lower limit is preferably 0.1 mass % or higher and more preferably 0.5 mass % or higher. The upper limit is preferably 30 mass % or lower, and more preferably 15 mass % or lower. In a case where the composition according to the present invention includes two or more near infrared absorbing colorant polymers, it is preferable that the total content of the two or more near infrared absorbing colorant polymers is in the above-described range.

<<Other Infrared Absorbers>>

The composition according to the present invention may include an infrared absorber (also referred to as "other infrared absorber") other than the near infrared absorbing colorant polymer according to the present invention.

The infrared absorber denotes a compound having an absorption in an infrared range (preferably a wavelength range of 650 to 1000 nm). It is preferable that the infrared absorber is a compound having a maximal absorption at a wavelength of 650 nm or longer. The maximal absorption of the infrared absorber is present preferably in a wavelength range of 650 to 1000 nm, more preferably in a wavelength range of 700 to 1000 nm, and still more preferably in a wavelength range of 800 to 1000 nm.

Examples of the other infrared absorber include a pyrrolopyrrole compound, a copper compound, a cyanine compound, a phthalocyanine compound, a diimmonium compound, a thiol complex compound, a transition metal oxide compound, a squarylium compound, a naphthalocyanine compound, a quaterrylene compound, a dithiol metal complex compound, a croconium compound, and an oxole compound.

Examples of the phthalocyanine compound include oxotitanyl phthalocyanine. Examples of the naphthalocyanine compound include oxovanadyl naphthalocyanine. As the phthalocyanine compound, the naphthalocyanine compound, the diimmonium compound, the cyanine compound, the squarylium compound, or the croconium compound, for example, one of compounds described in paragraphs "0010" to "0081" of JP2010-111750A may be used, the content of which are incorporated in this specification. The cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference.

Specific examples of the pyrrolopyrrole compound include the following compounds. In addition, other specific examples of the pyrrolopyrrole compound include compounds described in paragraphs "0049" to "0058" of JP2009-263614A.

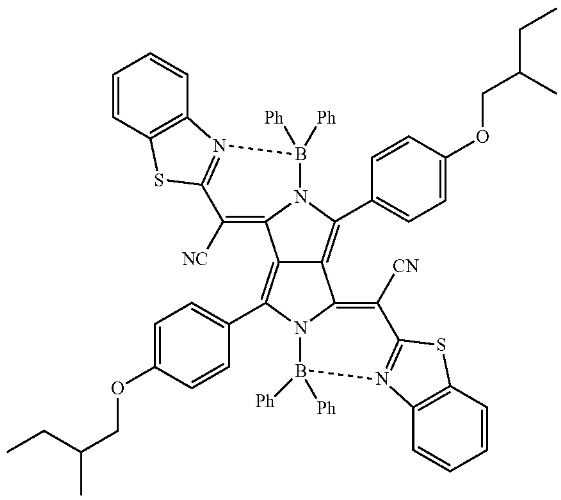

In a case where the composition according to the present invention includes the other infrared absorber, the content of the other infrared absorber is preferably 0.1 to 50 parts by mass, more preferably 0.5 to 30 parts by mass, and still more preferably 1.0 to 15 parts by mass with respect to 100 parts by mass of the near infrared absorbing colorant polymer according to the present invention.

In addition, the composition may also not substantially include the other infrared absorber. The composition substantially not including the other infrared absorber represent that, for example, the content of the other infrared absorber is preferably 0.1 parts by mass or lower, more preferably 0.05 parts by mass or lower, still more preferably 0.01 parts by mass or lower, and even still more preferably 0 parts by mass or lower with respect to 100 parts by mass of the near infrared absorbing colorant polymer according to the present invention.

<<Chromatic Colorant, Black Colorant, Coloring Material that Shields Visible Light>>

The composition according to the present invention may include at least one selected from a chromatic colorant and a black colorant (hereinafter, a chromatic colorant and a black colorant will also be collectively called "visible colorant"). In the present invention, "chromatic colorant" denotes a colorant other than a white colorant and a black colorant. It is preferable that the chromatic colorant is a colorant having an absorption in a wavelength range of 400 nm or longer and shorter than 650 nm.

(Chromatic Colorant)

In the present invention, the chromatic colorant may be a pigment or a dye.

It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment.

In addition, regarding a particle size distribution of the secondary particles of the pigment (hereinafter, simply referred to as "particle size distribution") which can be used, it is preferable that secondary particles having a particle size of (average particle size±100) nm account for 70 mass % or higher, preferably, 80 mass % or higher in the pigment. The particle size distribution of the secondary particles can be measured using a scattering intensity distribution.

The average particle size of primary particles can be obtained by observing a pigment with a scanning electron microscope (SEM) or a transmission electron microscope (TEM), measuring particle sizes of 100 particles in a region where particles do not aggregate, and obtaining an average value of the measured particle sizes.

The pigment is preferably an organic pigment, and examples thereof are as follows. However, the present invention is not limited to the examples:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triphenylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-34966A can also be used.

In addition, as the dye, at least one of an acid dye or a derivative thereof may be suitably used. Furthermore, for example, at least one of a direct dye, a basic dye, a mordant dye, an acid mordant dye, an azoic dye, a dispersed dye, an oil-soluble dye, a food dye, or a derivative thereof can be suitably used.

Specific examples of the acid dye are shown below, but the present invention is not limited to these examples. For example, the following dyes and derivatives thereof can be used:

acid alizarin violet N;

acid blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, and 324:1;

acid chrome violet K;

acid Fuchsin and acid green 1, 3, 5, 9, 16, 25, 27, and 50;

acid orange 6, 7, 8, 10, 12, 50, 51, 52, 56, 63, 74, and 95;
acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274;
acid violet 6B, 7, 9, 17, and 19;
acid yellow 1, 3, 7, 9, 11, 17, 23, 25, 29, 34, 36, 42, 54, 72, 73, 76, 79, 98, 99, 111, 112, 114, 116, 184, and 243; and
Food Yellow 3.

In addition to the above-described examples, an azo acid dye, a xanthene acid dye, and a phthalocyanine acid dye are preferably used, and acid dyes, such as C.I. Solvent Blue 44 and 38, C.I. Solvent Orange 45, Rhodamine B, and Rhodamine 110 and derivatives of the dyes are also preferably used.

Among these, it is preferable that the dye is a colorant selected from the group consisting of a triarylmethane dye, an anthraquinone dye, an azomethine dye, a benzylidene dye, an oxonol dye, a cyanine dye, a phenothiazine dye, a pyrrolopyrazole azo methine dye, a xanthene dye, a phthalocyanine dye, a benzopyran dye, an indigo dye, a pyrazole azo dye, an anilino azo dye, a pyrazolotriazole azo dye, a pyridone azo dye, an anthrapyridone dye, and a pyrromethene dye.

Further, a combination of a pigment and a dye may be used.

(Black Colorant)

In the present invention, it is preferable that the black colorant is an organic black colorant. In the present invention, the black colorant as the coloring material that shields visible light denotes a material that absorbs visible light and allows at least a part of infrared light. Accordingly, in the present invention, examples of the black colorant as the coloring material that shields visible light do not include carbon black and titanium black. As the black colorant as the coloring material that shields visible light, for example, a bisbenzofuranone compound, an azomethine compound, a perylene compound, or an azo compound can also be used.

Examples of the bisbenzofuranone compound include compounds described in JP2010-534726A, JP2012-515233A, and JP2012-515234A. For example, "Irgaphor Black" (manufactured by BASF SE) is available.

Examples of the perylene compound include C.I. Pigment Black 31 and 32.

Examples of the azomethine compound include compounds described in JP1989-170601A (JP-H1-170601A) and JP1990-34664A (JP-H2-34664A). For example, "CHROMOFINE BLACK A1103" (manufactured by Dainichiseika Color & Chemicals Mfg. Co., Ltd.) is available. The azo compound is not particularly limited, and for example, a compound represented by the following Formula (A-1) can be suitably used.

A-1

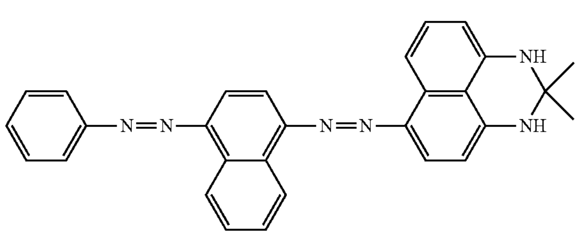

(Coloring Material that Shields Visible Light)

In a case where an infrared transmitting filter is manufactured using the composition according to the present invention, it is preferable that the composition includes a coloring material that shields visible light.

In addition, it is preferable that black, gray, or a color similar to black or gray is exhibited using a combination of a plurality of coloring materials that shields visible light.

In addition, it is preferable that the coloring material that shields visible light is a material that absorbs light in a wavelength range of violet to red.

In addition, it is preferable that the coloring material that shields visible light is a material that shields light in a wavelength range of 450 to 650 nm.

In the present invention, it is preferable that the coloring material that shields visible light satisfies at least one of the following requirement (1) or (2), and it is more preferable that the coloring material that shields visible light satisfies the requirement (1).

(1): An aspect in which the coloring material that shields visible light includes two or more chromatic colorants (2): An aspect in which the coloring material that shields visible light includes a black colorant In addition, in the present invention, the black colorant as the coloring material that shields visible light denotes a material that absorbs visible light and allows at least a part of infrared light. Accordingly, in the present invention, the organic black colorant as the coloring material that shields visible light does not denote a black colorant that absorbs both visible light and infrared light, for example, carbon black or titanium black.

In the present invention, it is preferable that the coloring material that shields visible light is a material in which a ratio A/B of a minimum value A of an absorbance in a wavelength range of 450 to 650 nm to a maximum value B of an absorbance in a wavelength range of 900 to 1300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants.

In a case where the coloring material that shields visible light includes two or more chromatic colorants, the chromatic colorants are selected from the group consisting of a red colorant, a green colorant, a blue colorant, a yellow colorant, a violet colorant, and an orange colorant.

In a case where the coloring material that shields visible light is formed using a combination of two or more chromatic colorants, examples of the combination of chromatic colorants are as follows.

(1) An aspect in which the coloring material that shields visible light includes a yellow colorant, a blue colorant, a violet colorant, and a red colorant (2) An aspect in which the coloring material that shields visible light includes a yellow colorant, a blue colorant, and a red colorant (3) An aspect in which the coloring material that shields visible light includes a yellow colorant, a violet colorant, and a red colorant (4) An aspect in which the coloring material that shields visible light includes a yellow colorant and a violet colorant (5) An aspect in which the coloring material that shields visible light includes a green colorant, a blue colorant, a violet colorant, and a red colorant (6) An aspect in which the coloring material that shields visible light includes a violet colorant and an orange colorant (7) An aspect in which the coloring material that shields visible light includes a green colorant, a violet colorant, and a red colorant (8) An aspect in which the coloring material that shields visible light includes a green colorant and a red colorant Specific examples of the aspect (1) include C.I. Pigment Yellow 139 or 185 as a yellow pigment, C.I. Pigment Blue 15:6 as a blue pigment, C.I. Pigment Violet 23 as a violet pigment, and C.I. Pigment Red 254 or 224 as a red pigment.

Specific examples of the aspect (2) include C.I. Pigment Yellow 139 or 185 as a yellow pigment, C.I. Pigment Blue 15:6 as a blue pigment, and C.I. Pigment Red 254 or 224 as a red pigment.

Specific examples of the aspect (3) include C.I. Pigment Yellow 139 or 185 as a yellow pigment, C.I. Pigment Violet 23 as a violet pigment, and C.I. Pigment Red 254 or 224 as a red pigment.

Specific examples of the aspect (4) include C.I. Pigment Yellow 139 or 185 as a yellow pigment, and C.I. Pigment Violet 23 as a violet pigment.

Specific examples of the aspect (5) include C.I. Pigment Green 7 or 36 as a green pigment, C.I. Pigment Blue 15:6 as a blue pigment, C.I. Pigment Violet 23 as a violet pigment, and C.I. Pigment Red 254 or 224 as a red pigment.

Specific examples of the aspect (6) include C.I. Pigment Violet 23 as a violet pigment, and C.I. Pigment Orange 71 as an orange pigment.

Specific examples of the aspect (7) include C.I. Pigment Green 7 or 36 as a green pigment, C.I. Pigment Violet 23 as a violet pigment, and C.I. Pigment Red 254 or 224 as a red pigment.

Specific examples of the aspect (8) include C.I. Pigment Green 7 or 36 as a green pigment, and C.I. Pigment Red 254 or 224 as a red pigment.

For example, ratios (mass ratios) between the respective colorants are as follows.

TABLE 14

| No. | Yellow Pigment | Green Pigment | Blue Pigment | Violet Pigment | Red Pigment | Orange Pigment |
|---|---|---|---|---|---|---|
| 1 | 0.1 to 0.4 | | 0.1 to 0.6 | 0.01 to 0.3 | 0.1 to 0.6 | |
| 2 | 0.1 to 0.4 | | 0.1 to 0.6 | | 0.2 to 0.7 | |
| 3 | 0.1 to 0.6 | | | 0.1 to 0.6 | 0.1 to 0.6 | |
| 4 | 0.2 to 0.8 | | | 0.2 to 0.8 | | |
| 5 | | 0.1 to 0.4 | 0.1 to 0.4 | 0.1 to 0.4 | 0.1 to 0.4 | |
| 6 | | | | 0.2 to 0.6 | | 0.4 to 0.8 |
| 7 | | 0.1 to 0.5 | | 0.2 to 0.7 | 0.1 to 0.4 | |
| 8 | | 0.5 to 0.8 | | | 0.2 to 0.5 | |

In a case where the composition according to the present invention includes a visible colorant, the content of the visible colorant is preferably 0.01 to 50 mass % with respect to the total solid content of the composition according to the present invention. The lower limit is preferably 0.1 mass % or higher and more preferably 0.5 mass % or higher. The upper limit is preferably 30 mass % or lower, and more preferably 15 mass % or lower.

The content of the visible colorant is preferably 10 to 1000 parts by mass and more preferably 50 to 800 parts by mass with respect to 100 parts by mass of the total content of the near infrared absorbing colorant polymer according to the present invention and the other infrared absorber.

In addition, it is preferable that the total content of the near infrared absorbing colorant polymer according to the present invention, the other infrared absorber, and the visible colorant is 0.01 to 50 mass % with respect to the total solid content of the composition according to the present invention. The lower limit is preferably 0.1 mass % or higher and more preferably 0.5 mass % or higher. The upper limit is preferably 30 mass % or lower, and more preferably 15 mass % or lower.

<<Resin>>

The composition according to the present invention may include a resin. The resin is mixed, for example, in order to disperse the pigment and the like in the composition and to be used as a binder. The resin which is mainly used to disperse the pigments and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher.

The content of the resin is preferably 10 to 80 mass % and more preferably 20 to 60 mass % with respect to the total solid content of the composition. The composition may include one resin or two or more resins. In a case where the coloring composition includes two or more resins, it is preferable that the total content of the two or more resins is in the above-described range.

(Dispersant)

Examples of the dispersant include: a polymer dispersant such as a resin having an amine group (polyamideamine or a salt thereof), an oligo imine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate;

In terms of a structure, the polymer dispersant can be further classified into a linear polymer, a terminal-modified polymer, a graft polymer, and a block polymer.

In addition, as the polymer dispersant, a resin having an acid value of 60 mgKOH/g or higher (more preferably 60 mgKOH/g or higher and 300 mgKOH/g or lower) can be preferably used.

Examples of the terminal-modified polymer include a polymer having a phosphate group at a terminal thereof described in JP1991-112992A (JP-H3-112992A) or JP2003-533455A, a polymer having a phosphate group at a terminal thereof described in JP2002-273191A, and a polymer having a partial skeleton or a heterocycle of an organic colorant described in JP1997-77994A (JP-H9-77994A). In addition, polymers described in JP2007-277514A in which two or more anchor sites (for example, an acid group, a basic group, a partial skeleton or a heterocycle of an organic colorant) to a pigment surface are introduced into a terminal thereof are also preferable due to its dispersion stability.

Examples of the graft polymer include a reaction product of poly(low-alkylene imine) and polyester described in JP1979-37082A (JP-S54-37082A), JP1996-507960A (JP-H8-507960A), or JP2009-258668A, a reaction product of polyallylamine and polyester described in JP1997-169821A (JP-H9-169821A), a copolymer of a macromonomer and a nitrogen-containing monomer described in JP1998-339949A (JP-H10-339949A) or JP2004-37986A, a graft polymer having a partial skeleton or a heterocycle of an organic colorant described in JP2003-238837A, JP2008-9426A, or JP2008-81732A, and a copolymer of a macromonomer and an acid group-containing monomer described in JP2010-106268A.

As the macromonomer used for manufacturing the graft polymer by radical polymerization, a well-known macromonomer can be used, and examples thereof include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLACCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H2-272009A). Among these, from the viewpoint of the dispersibility and dispersion stability of the pigment dispersion and the developability of the composition in which the pigment dispersion is used, a polyester macromonomer having excellent flexibility and solvent compatibility is more preferable, and the polyester macromonomer represented by the polyester macromonomer described in JP1990-272009A (JP-H2-272009A) is most preferable.

As the block polymer, a block polymer described in JP2003-49110A or JP2009-52010A is preferable.

The resin is available as a commercially available product, and specific examples thereof include: "Disperbyk-101 (polyamideamine phosphate), 107 (carboxylate), 110, 111 (copolymer containing an acid group), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" all of which are manufactured by Kao Corporation; "SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; HINOACT T-8000E manufactured by Kawaken Fine Chemicals Co., Ltd.; organosiloxane polymer KP341 manufactured by Shin-Etsu Chemical Co., Ltd.; "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd. and "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "IONET S-20" manufactured by Sanyo Chemical Industries Ltd.

Among these resins, one kind may be used alone, or two or more kinds may be used in combination. In addition, an alkali-soluble resin described below can also be used as the dispersant. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid at a side chain thereof, and a resin obtained by modifying a polymer having a hydroxyl group with an acid anhydride. Among these, a (meth)acrylic acid copolymer is preferable. In addition, an N-position-substituted maleimide monomer copolymer described in JP1998-300922A (JP-H10-300922A), an ether dimer copolymer described in JP2004-300204A, or an alkali-soluble resin having a polymerizable group described in JP1995-319161A (JP-H7-319161A) is also preferable.

The content of the dispersant is preferably 1 to 80 parts by mass, more preferably 5 to 70 parts by mass, and still more preferably 10 to 60 parts by mass with respect to 100 parts by mass of the pigment.

(Alkali-Soluble Resin)

The composition according to the present invention can include an alkali-soluble resin as a resin. By the composition including the alkali-soluble resin, developability and pattern formability is improved. The alkali-soluble resin can also be used as the dispersant or the binder. In a case where a pattern is not formed, the alkali-soluble resin may not be used.

The molecular weight of the alkali-soluble resin is not particularly limited, and the weight-average molecular weight (Mw) thereof is preferably 5000 to 100000. In addition, the number-average molecular weight (Mn) of the alkali-soluble resin is preferably 1000 to 20000.

The alkali-soluble resin may be a linear organic polymer and can be appropriately selected from alkali-soluble resins having at least one group for promoting alkali solubility in a molecule (preferably a molecule having an acrylic copolymer or a styrene copolymer as a main chain).

As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali solubility (hereinafter, also referred to as an acid group) include a carboxyl group, a phosphate group, a sulfonate group, and a phenolic hydroxyl group. A group that is soluble in an organic solvent and is developable with a weakly alkaline aqueous solution is preferable, and (meth)acrylic acid is more preferable. Among these acid groups, one kind may be used alone, or two or more kinds may be used in combination.

During the preparation of the alkali-soluble resin, for example, a well-known radical polymerization method can be used. Polymerization conditions under which the alkali-soluble resin is prepared using a radical polymerization method, for example, the temperature, the pressure, the kind and amount of a radical initiator, and the kind of a solvent can be easily set by those skilled in the art and can also be experimentally set.

As the alkali-soluble resin, a polymer having a carboxylic acid at a side chain thereof is preferable, and examples thereof include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxyl group at a side chain thereof; and a resin obtained by adding an acid anhydride to a polymer having a hydroxyl group. In particular, a copolymer of (meth)acrylic acid and another monomer which is copolymerizable with the (meth) acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth) acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphtyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of other monomers include a N-position-substituted maleimide monomer described in JP1998-300922A (H10-300922A) (for example, N-phenylmaleimide or N-cyclohexylmaleimide). Among these monomers which are copolymerizable with the (meth)acrylic acid, one kind may be used alone, or two or more kinds may be used in combination.

In addition, in order to improve a crosslinking effect of the film, an alkali-soluble resin having a polymerizable group may be used. Examples of the polymerizable group include a (meth)allyl group and a (meth)acryloyl group. As the alkali-soluble resin having a polymerizable group, an alkali-soluble resin having a polymerizable group at a side chain thereof is preferable.

Examples of the alkali-soluble resin having a polymerizable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRY-CURE RD-F8 (manufactured by Nippon Shokubai Co., Ltd.).

As the alkali-soluble resin, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth) acrylate can be preferably used, and examples thereof include: a copolymer including 2-hydroxypropyl (meth) acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

In addition, as a commercially available product, for example, FF-426 (manufactured by Fujikura Kasei Co., Ltd.) can also be used.

As the alkali-soluble resin, a polymer (a) obtained by copolymerization of monomer components including at least one of a compound represented by the following Formula (ED1), or a compound represented by the following Formula (ED2) (hereinafter, these compounds will also be referred to as "ether dimer") is also preferable.

(ED1)

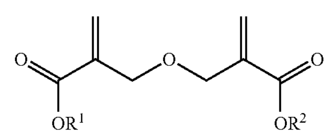

In Formula (ED1), $R^1$ and $R^2$ each independently represent a hydrogen atom or a hydrocarbon group having 1 to 25 carbon atoms which may have a substituent.

(ED2)

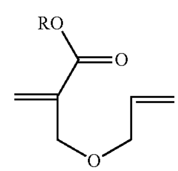

In Formula (ED2), R represents a hydrogen atom or an organic group having 1 to 30 carbon atoms. Specific examples of Formula (ED2) can be found in the description of JP2010-168539A The hydrocarbon group having 1 to 25 carbon atoms represented by $R^1$ and $R^2$ in Formula (ED1) which may have a substituent is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Specific examples of the ether dimer can be found in paragraph "0317" of JP2013-29760A, the content of which is incorporated herein by reference. Among these ether dimers, one kind may be used alone, or two or more kinds may be used in combination. The polymer (a) may be obtained by copolymerization with another monomer.

The alkali-soluble resin may include a structural unit which is derived from a compound represented by the following Formula (X).

(X)

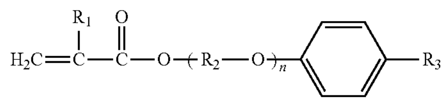

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

In Formula (X), the number of carbon atoms in the alkylene group of $R_2$ is preferably 2 to 3. In addition, the number of carbon atoms in the alkyl group of $R_3$ is preferably 1 to 20 and more preferably 1 to 10, and the alkyl group of $R_3$ may have a benzene ring. Examples of the alkyl group having a benzene ring represented by $R_3$ include a benzyl group and a 2-phenyl(iso)propyl group.

Specific examples of the alkali-soluble resin are as follows.

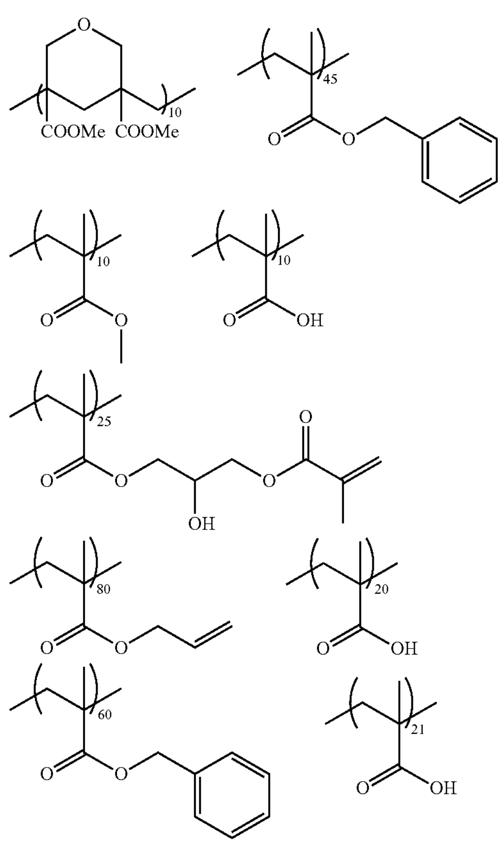

-continued

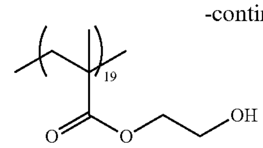

The details of the alkali-soluble resin can be found in paragraphs "0558" to "0571" of JP2012-208494A (corresponding to paragraphs "0685" to "0700" of US2012/0235099A), the content of which is incorporated herein by reference.

Further, a copolymer (B) described in paragraphs "0029" to "0063" and an alkali-soluble resin used in Examples of JP2012-32767A, a binder resin described in paragraphs "0088" to "0098" and a binder resin used in Examples of JP2012-208474A, a binder resin described in paragraphs "0022" to "0032 and a binder resin used in Examples of JP2012-137531A, a binder resin described in paragraphs "0132" to "0143" and a binder resin used in Examples of JP2013-024934A, a binder resin described in paragraphs "0092" to "0098" and Examples of JP2011-242752A, or a binder resin described in paragraphs "0030" to "0072" of JP2012-032770A can also be used. The content of which is incorporated herein by reference.

The acid value of the alkali-soluble resin is preferably 30 to 500 mgKOH/g. The lower limit is more preferably 50 mgKOH/g or higher and still more preferably 70 mgKOH/g or higher. The upper limit is more preferably 400 mgKOH/g or lower, still more preferably 200 mgKOH/g or lower, even still more preferably 150 mgKOH/g or lower, and even yet still more preferably 120 mgKOH/g or lower.

The content of the alkali-soluble resin is preferably 0.1 to 50 mass % with respect to the total solid content of the composition. The lower limit is preferably 0.5 mass %% or higher, more preferably 1 mass % or higher, still more preferably 2 mass % or higher, and even still more preferably 3 mass % or higher. The upper limit is more preferably 30 mass % or lower, and still more preferably 10 mass % or lower. The composition according to the present invention may include one alkali-soluble resin or two or more alkali-soluble resins. In a case where the coloring composition includes two or more alkali-soluble resins, it is preferable that the total content of the two or more alkali-soluble resins is in the above-described range.

<Other Resins>

In the composition according to the present invention, in addition to the above-described resins, another resin such as a cyclic olefin resin, an aromatic polyether resin, a polyimide resin, a fluorene polycarbonate resin, a fluorene polyester resin, a polycarbonate resin, a polyamide (aramid) resin, a polyarylate resin, a polysulfone resin, a polyethersulfone resin, a polyparaphenylene resin, a polyamide imide resin, a polyethylene naphthalate resin, or a fluorinated aromatic resin can be used. The other resin can be preferably used as, for example, a binder. The details of the other resin can be found in paragraphs "0086" to "0103" of JP2015-040895A, the content of which is incorporated herein by reference. Examples of a commercially available product of the other resin include a cyclic olefin resin "ARTON G" (manufactured by JSR Corporation).

The content of the other resin is preferably 0.1 to 50 mass % with respect to the total solid content of the composition. For example, the lower limit is preferably 0.5 mass % or higher and more preferably 1 mass % or higher. For example, the upper limit is more preferably 45 mass % or lower and still more preferably 40 mass % or lower. As the other resin, one kind may be used alone, or two or more kinds may be used in combination. In a case where two or more resins are used in combination, it is preferable that the total content of the two or more resins is in the above-described range.

<<Pigment Derivative>>

The composition according to the present invention may include a pigment derivative. Examples of the pigment derivative include a compound having a structure in which a portion of a pigment is substituted with an acidic group, a basic group, or a phthalimidomethyl group. It is preferable that the pigment derivative has an acidic group or a basic group from the viewpoints of dispersibility and dispersion stability.

Examples of an organic pigment for forming the pigment derivative include a pyrrolopyrrole pigment, a quinoline pigment, a benzimidazolone pigment, a diketo pyrrolo pyrrole pigment, an azo pigment, a phthalocyanine pigment, an anthraquinone pigment, a quinacridone pigment, a dioxazine pigment, a perinone pigment, a perylene pigment, a thioindigo pigment, an isoindoline pigment, an isoindolinone pigment, a quinophthalone pigment, a threne pigment, and a metal complex pigment.

In addition, as the acidic group included in the pigment derivative, a sulfonic acid, a carboxylic acid, or a quaternary ammonium salt thereof is preferable, a carboxylate group or a sulfonate group is more preferable, and a sulfonate group is still more preferable. As the basic group included in the pigment derivative, an amino group is preferable, and a tertiary amino group is more preferable.

As the pigment derivative, a pyrrolopyrrole pigment derivative, a quinoline pigment derivative, a benzimidazolone pigment derivative, or an isoindoline pigment derivative, is preferable, and a pyrrolopyrrole pigment derivative is more preferable.

The content of the pigment derivative is preferably 1 to 50 mass % and more preferably 3 to 30 mass % with respect to the total mass of the pigments. Among these pigment derivatives, one kind may be used alone, or two or more kinds may be used in combination.

<<Curable Compound>>

It is preferable that the composition according to the present invention includes a curable compound. As the curable compound, a well-known compound which is cross-linkable by a radical, an acid, or heat can be used. Examples of the compound include a compound having a group having an ethylenically unsaturated bond, a cyclic ether (epoxy, oxetane) group, or a methylol group. Examples of the group having an ethylenically unsaturated bond include a vinyl group, a (meth)allyl group, and a (meth)acryloyl group.

In the present invention, the curable compound is preferably a polymerizable compound and more preferably a radically polymerizable compound.

(Polymerizable Compound)

In the present invention, the polymerizable compound may have any chemical form such as a monomer, a prepolymer, that is, a dimer, a trimer, or an oligomer, or a mixture or polymer thereof. In a case where the polymerizable compound is a radically polymerizable compound, a monomer is preferable.

The molecular weight of the polymerizable compound is preferably 100 to 3000. The upper limit is preferably 2000 or lower and more preferably 1500 or lower. The lower limit is preferably 150 or higher and more preferably 250 or higher.

The polymerizable compound is preferably a (meth)acrylate compound having 3 to 15 functional groups and more preferably a (meth)acrylate compound having 3 to 6 functional groups.

Examples of the monomer and the prepolymer include an unsaturated carboxylic acid (for example, acrylic acid, methacrylic acid, itaconic acid, crotonic acid, isocrotonic acid, or maleic acid), an ester or amide of an unsaturated carboxylic acid, and a polymer thereof. Among these, an ester of an unsaturated carboxylic acid and an aliphatic polyhydric alcohol compound, an amide of an unsaturated carboxylic acid and an aliphatic polyamine compound, or a polymer thereof is preferable. In addition, for example, an adduct of an unsaturated carboxylic acid ester or amide having a nucleophilic substituent, such as a hydroxyl group, an amino group, or a mercapto group, with a monofunctional or polyfunctional isocyanate or epoxy, or a dehydrated condensate of an unsaturated carboxylic acid ester or amide having a nucleophilic substituent with a monofunctional or polyfunctional carboxylic acid is also preferably used. In addition, a reactant of an unsaturated carboxylic acid ester or amide having an electrophilic substituent such as an isocyanate group or an epoxy group with a monofunctional or polyfunctional alcohol, amine, or thiol, or a reactant of an unsaturated carboxylic acid ester or amide having a leaving substituent such as a halogen group or a tosyloxy group with a monofunctional or polyfunctional alcohol, amine, or thiol is also preferable. In addition, a group of compounds in which the unsaturated carboxylic acid is substituted with, for example, an unsaturated phosphonic acid, a vinylbenzene derivative such as styrene, vinyl ether, or allyl ether can also be used.

As specific examples of the compounds, compounds described in paragraphs "0095" to "0108" of JP2009-288705A can be preferably used in the present invention.

In the present invention, as the polymerizable compound, a compound having one or more ethylenically unsaturated bonds and having a boiling point of 100° C. or higher under normal pressure is also preferable. Examples of the compound include compounds described in paragraph "0227" of JP2013-29760 and paragraphs "0254" to "0257" of JP2008-292970A, the content of which is incorporated herein by reference.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E as a commercially available product; manufactured by Shin-Nakamura Chemical Co., Ltd.), and a compound having a structure (for example, SR454 or SR499; manufactured by Sartomer) in which the (meth) acryloyl group is bonded through an ethylene glycol or a propylene glycol residue is preferable. Oligomers of the above-described examples can be used. In addition, KAYARAD RP-1040 or DPCA-20 (manufactured by Nippon Kayaku Co., Ltd.) can also be used.

Hereinafter, a preferable aspect of the polymerizable compound will be described.

The polymerizable compound may have an acid group such as a carboxyl group, a sulfonate group, or a phosphate group. As the polymerizable compound having an acid group, an ester of an aliphatic polyhydroxy compound and an unsaturated carboxylic acid is preferable. A polymerizable compound having an acid group obtained by causing a nonaromatic carboxylic anhydride to react with an unreacted hydroxyl group of an aliphatic polyhydroxy compound is more preferable. In particular, it is still more preferable that, in this ester, the aliphatic polyhydroxy compound is at least of pentaerythritol or dipentaerythritol. Examples of a commercially available product of the monomer having an acid group include M-305, M-510, and M-520 as polybasic acid-modified acrylic oligomer (manufactured by Toagosei Co., Ltd.).

The acid value of the polymerizable compound having an acid group is preferably 0.1 to 40 mgKOH/g and more preferably 5 to 30 mgKOH/g. In a case where the acid value of the polymerizable compound is 0.1 mgKOH/g or higher, development solubility is excellent. In a case where the acid value of the polymerizable compound is 40 mgKOH/g or lower, there are advantageous effects in manufacturing and handleability. Further, photopolymerization performance is excellent, and curing properties are excellent.

In addition, a compound having a caprolactone structure is also preferable as the polymerizable compound.

The compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth) acrylic acid, and ε-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. In particular, a compound having a caprolactone structure represented by the following Formula (Z-1) is preferable.

(Z-1)

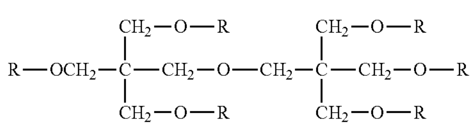

In Formula (Z-1), all of six R's represent a group represented by the following Formula (Z-2), or one to five R's among the six R's represent a group represented by the following Formula (Z-2) and the remaining R's represent a group represented by the following Formula (Z-3).

(Z-2)

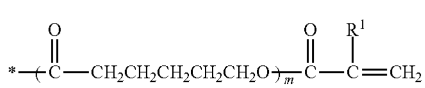

In Formula (Z-2), $R^1$ represents a hydrogen atom or a methyl group, m represents an integer of 1 or 2, and "*" represents a direct bond.

(Z-3)

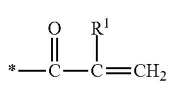

In Formula (Z-3), $R^1$ represents a hydrogen atom or a methyl group, and "*" represents a direct bond.

The polymerizable compound having a caprolactone structure is commercially available as for example, KAYARAD DPCA series (manufactured by Nippon Kayaku Co., Ltd.), and examples thereof include DPCA-20 (a compound in which m=1 in Formulae (Z-1) to (Z-3), the number of groups represented by Formula (Z-2)=2, and all of $R^1$'s represent a hydrogen atom), DPCA-30 (a compound in which m=1 in Formulae (Z-1) to (Z-3), the number of groups represented by Formula (Z-2)=3, and all of $R^1$'s represent a hydrogen atom), DPCA-60 (a compound in which m=1 in Formulae (Z-1) to (Z-3), the number of groups represented by Formula (Z-2)=6, and all of $R^1$'s represent a hydrogen atom), and DPCA-120 (a compound in which m=2 in Formulae (Z-1) to (Z-3), the number of groups represented by Formula (Z-2)=6, and all of R's represent a hydrogen atom).

As the polymerizable compound, a compound represented by Formula (Z-4) or (Z-5) can be used.

(Z-4)

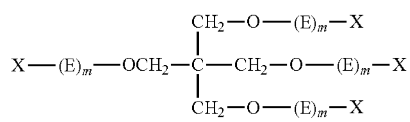

(Z-5)

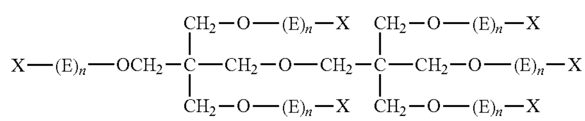

In Formulae (Z-4) and (Z-5), E's each independently represent —$((CH_2)_yCH_2O)$— or —$((CH_2)_yCH(CH_3)O)$—, y's each independently represent an integer of 0 to 10, and X's each independently represent a (meth)acryloyl group, a hydrogen atom, or a carboxyl group.

In Formula (Z-4), the total number of (meth)acryloyl groups is 3 or 4, m's each independently represent an integer of 0 to 10, and the sum of m's is an integer of 0 to 40.

In Formula (Z-5), the total number of (meth)acryloyl groups is 5 or 6, n's each independently represent an integer of 0 to 10, and the sum of n's is an integer of 0 to 60.

In Formula (Z-4), m represents preferably an integer of 0 to 6 and more preferably an integer of 0 to 4.

In addition, the sum of m's is preferably an integer of 2 to 40, more preferably an integer of 2 to 16, and still more preferably an integer of 4 to 8.

In Formula (Z-5), n represents preferably an integer of 0 to 6 and more preferably an integer of 0 to 4.

In addition, the sum of n's is preferably an integer of 3 to 60, more preferably an integer of 3 to 24, and still more preferably an integer of 6 to 12.

In addition, it is preferable that, in —$((CH_2)_yCH_2O)$— or —$((CH_2)_yCH(CH_3)O)$— of Formula (Z-4) or (Z-5), a terminal thereof on an oxygen atom side is bonded to X.

Among these compounds represented by Formula (Z-4) or (Z-5), one kinds may be used alone, or two or more kinds may be used in combination. In particular, it is preferable that all of six X's in Formula (Z-5) represent an acryloyl group, and a mixture of a compound in which all of six X's in Formula (Z-5) represent an acryloyl group and a compound in which at least one among six X's represents a hydrogen atom is also preferable. With the above-described configuration, developability can be further improved.

In addition, the total content of the compound represented by Formula (Z-4) or (Z-5) in the polymerizable compound is preferably 20 mass % or higher and more preferably 50 mass % or higher.

The compound represented by Formula (Z-4) or (Z-5) can be synthesized through well-known steps of the related art including: a step of bonding a ring-opened skeleton using a ring-opening addition reaction between pentaerythritol or dipentaerythritol and ethylene oxide or propylene oxide; and a step of causing, for example, (meth)acryloyl chloride to react with a terminal hydroxyl group of the ring-opened skeleton to introduce a (meth)acryloyl group to the terminal hydroxyl group. The respective steps are well-known in the art, and those skilled in the art can easily synthesize the compound represented by Formula (Z-4) or (Z-5).

In the compound represented by Formula (Z-4) or (Z-5), at least one of a pentaerythritol derivative or a dipentaerythritol derivative is more preferable.

Specific examples of the pentaerythritol derivative and/or the dipentaerythritol derivative include compounds represented by the following Formulae (a) to (f) (hereinafter, also referred to as "Exemplary Compounds (a) to (f)"). Among these, Exemplary Compound (a), (b), (e), or (f) is preferable.

(a)

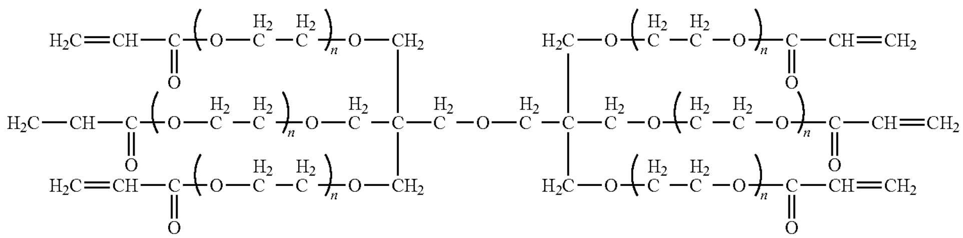

(The sum of n's is 6)

(b)

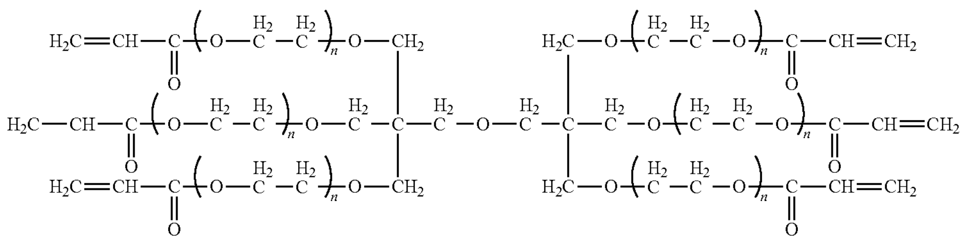

(The sum of n's is 12)

(c)

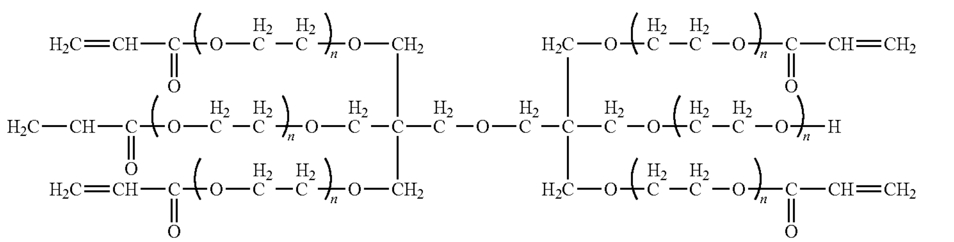

(The sum of n's is 12)

(d)

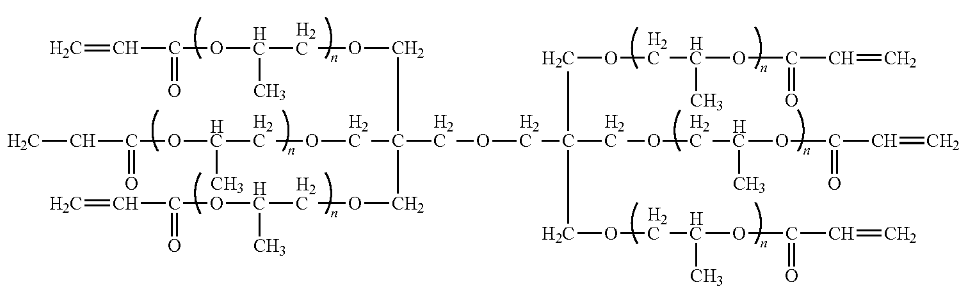

(The sum of n's is 6)

-continued (e)

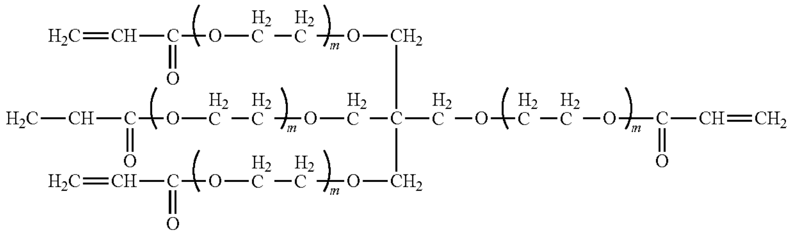

(The sum of m's is 4)

(f)

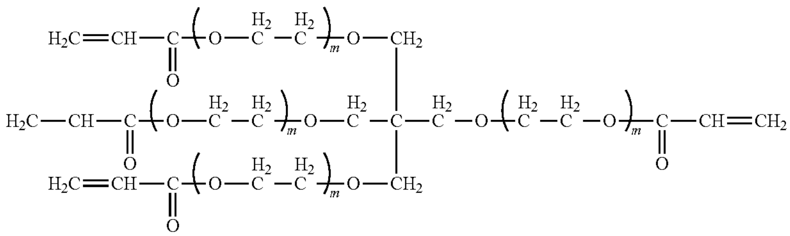

(The sum of m's is 12)

Examples of a commercially available product of the polymerizable compound represented by Formula (Z-4) or (Z-5) include SR-494 (manufactured by Sartomer) which is a tetrafunctional acrylate having four ethyleneoxy chains, DPCA-60 (manufactured by Nippon Kayaku Co., Ltd.) which is a hexafunctional acrylate having six pentyleneoxy chains, and TPA-330 (manufactured by Nippon Kayaku Co., Ltd.) which is a trifunctional acrylate having three isobutyleneoxy chains.

As the polymerizable compound, a urethane acrylate described in JP1973-41708B (JP-S48-41708B), JP1976-37193A (JP-S51-37193A), JP1990-32293B (JP-H2-32293B), or JP1990-16765B (JP-H2-16765B), or a urethane compound having a ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. In addition, a composition having an excellent film speed can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A).

Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-306I, AH-600, T-600 and AI-600 (manufactured by Kyoeisha Chemical Co., Ltd.).

(Compound Having Epoxy Group)

In the present invention, as the curable compound, a compound having an epoxy group can also be used.

In a case where a pattern is formed using a dry etching method, a compound having an epoxy group is preferably used as the curable compound.

As the compound having an epoxy group, a compound having two or more epoxy groups in one molecule is preferable. By using the compound having two or more epoxy groups in one molecule, the effects of the present invention can be more effectively achieved. The number of epoxy groups in one molecule is preferably 2 to 10, more preferably 2 to 5, and still more preferably 3.

It is preferable that the compound having an epoxy group in the present invention has a structure in which two benzene rings are linked to each other through a hydrocarbon group. As the hydrocarbon group, an alkylene group having 1 to 6 carbon atoms is preferable.

In addition, it is preferable that the epoxy groups are linked to each other through a linking group. Examples of the linking group include an alkylene group, an arylene group, —O—, a structure represented by —NR'— (R' represents a hydrogen atom, an alkyl group which may have a substituent, or an aryl group which may have a substituent and preferably represents a hydrogen atom), and a group having at least one selected from —$SO_2$—, —CO—, —O—, and —S—.

In the compound having an epoxy group, an epoxy equivalent (=the molecular weight of the compound having an epoxy group/the number of epoxy groups) is preferably 500 g/eq or lower, more preferably 100 to 400 g/eq, and still more preferably 100 to 300 g/eq.

The compound having an epoxy group may be a low molecular weight compound (for example, molecule weight: lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 3000 or lower, more preferably 2000 or lower, and still more preferably 1500 or lower.

Examples of the compound having an epoxy group include an epoxy resin which is a glycidyl-etherified product of a phenol compound, an epoxy resin which is a glycidyl-etherified product of various novolac resins, an alicyclic epoxy resin, an aliphatic epoxy resin, a heterocyclic epoxy resin, a glycidyl ester epoxy resin, a glycidyl amine epoxy resin, an epoxy resin which is a glycidylated product of a halogenated phenol, a condensate of a silicon compound having an epoxy group and another silicon compound, and a copolymer of a polymerizable unsaturated compound having an epoxy group and another polymerizable unsaturated compound.

Examples of the epoxy resin which is a glycidyl-etherified product of a phenol compound include: 2-[4-(2,3-epoxypropoxy)phenyl]-2-[4-[1,1-bis[4-(2,3-hydroxy)phenyl]ethyl]phenyl]propane, bisphenol A, bisphenol F, bisphenol S, 4,4'-biphenol, tetramethyl bisphenol A, dimethyl bisphenol A, tetramethyl bisphenol F, dimethyl bisphenol F, tetramethyl bisphenol S, dimethyl bisphenol S, tetramethyl-4,4'-biphenol, dimethyl-4,4'-biphenol, 1-(4-hydroxyphenyl)-2-[4-(1,1-bis-(4-hydroxyphenyl)ethyl)phenyl]propane, 2,2'-methylene-bis(4-methyl-6-t-butylphenol), 4,4'-butylidene-bis(3-methyl-6-t-butylphenol), trishydroxyphenylmethane, resorcinol, hydroquinone, pyrogallol, fluoroglycinol, a phenol having a diisopropylidene skeleton; a phenol having a fluorene skeleton such as 1,1-di-4-hydroxyphenyl fluorene; and an epoxy resin which is a glycidyl-etherified product of a polyphenol compound, such as phenolic polybutadiene.

Examples of the epoxy resin which is a glycidyl-etherified product of a novolac resin include glycidyl-etherified products of various novolac resins including: novolac resins which contain various phenols, for example, phenol, cresols, ethyl phenols, butyl phenols, octyl phenols, bisphenols such as bisphenol A, bisphenol F, or bisphenol S, or naphthols; phenol novolac resins having a xylylene skeleton; phenol novolac resins having a xylylene skeleton; phenol novolac resins having a biphenyl skeleton; or phenol novolac resins having a fluorene skeleton.

Examples of the alicyclic epoxy resin include an alicyclic epoxy resin having an aliphatic ring skeleton such as 3,4-epoxycyclohexylmethyl-(3,4-epoxy)cyclohexylcarboxylate or bis(3,4-epoxycyclohexylmethyl)adipate.

Examples of the aliphatic epoxy resin include glycidyl ethers of polyhydric alcohols such as 1,4-butanediol, 1,6-hexanediol, polyethylene glycol, or pentaerythritol.

Examples of the heterocyclic epoxy resin include an heterocyclic epoxy resin having a heterocycle such as an isocyanuric ring or a hydantoin ring.

Examples of the glycidyl ester epoxy resin include an epoxy resin including a carboxylic acid ester such as hexahydrophthalic acid diglycidyl ester.

Examples of the glycidyl amine epoxy resin include an epoxy resin which is a glycidylated product of an amine such as aniline or toluidine.

Examples of the epoxy resin which is a glycidylated product of a halogenated phenol include an epoxy resin which is a glycidylated product of a halogenated phenol such as brominated bisphenol A, brominated bisphenol F, brominated bisphenol S, brominated phenol novolac, brominated cresol novolac, chlorinated bisphenol S, or chlorinated bisphenol A.

Examples of a commercially available product of the copolymer of a polymerizable unsaturated compound having an epoxy group and another polymerizable unsaturated compound include MARPROOF G-0150M, G-0105SA, G-0130SP, G-0250SP, G-1005S, G-1005SA, G-1010S, G-2050M, G-01100, and G-01758. Examples of the polymerizable unsaturated compound having an epoxy group include glycidyl acrylate, glycidyl methacrylate, and 4-vinyl-1-cyclohexene-1,2-epoxide. In addition, examples of a copolymer of the other polymerizable unsaturated compound include methyl (meth)acrylate, benzyl (meth)acrylate, cyclohexyl (meth)acrylate, styrene, and vinyl cyclohexane. Among these, methyl (meth)acrylate, benzyl (meth) acrylate, or styrene is preferable.

As a condensate of a silicon compound having an epoxy group and another silicon compound, an silicone skeleton epoxy resin is preferable. The silicone skeleton epoxy resin is a resin having an epoxy group which has a silicone bond (Si—O bond) as a main skeleton. For example, the epoxy resin having a silicone skeleton can be obtained by polymerization of a silicon compound having an epoxy group and another silicon compound. For example, a hydrolysis condensate of an alkoxysilane compound having an epoxy group and an alkoxysilane having a methyl group or a phenyl group, or a polycondensate of an alkoxysilane compound having an epoxy group and a silanol terminal silicone oil is used. In addition, an addition polymerization product of a silicone resin having a hydrosilyl group (SiH group) and an epoxy compound having a unsaturated hydrocarbon group such as a vinyl group can also be used. It is preferable that the silicone skeleton epoxy resin is obtained through two steps of manufacturing process by using a silanol terminal silicone oil (a) and a silicon compound (b) having an epoxy group (and optionally an alkoxy silicon compound (f)) as raw materials. The details of the silicone skeleton epoxy resin can be found in paragraphs "0015" to "0072" of JP2014-214262A, the content of which is incorporated herein by reference.

In addition, as the compound having an epoxy group, compounds described in paragraphs "0034" to "0036" of JP2013-011869A, paragraphs "0147" to "0156" of JP2014-043556A, paragraphs "0085" to "0092" of JP2014-089408A, and paragraphs "0015" to "0072" of JP2014-214262A can also be used. The contents of which are incorporated herein by reference. Examples of a commercially available product of the compound having an epoxy group include "EHPE3150" (manufactured by Daicel Corporation), "EPICLON N660" (manufactured by DIC Corporation), and "DENACOL EX-614B" (manufactured by Nagase ChemteX Corporation).

The content of the curable compound is preferably 0.1 to 40 mass % with respect to the total solid content of the composition. For example, the lower limit is preferably 0.5 mass % or higher and more preferably 1 mass % or higher. For example, the upper limit is more preferably 30 mass % or lower and still more preferably 20 mass % or lower. As the curable compound, one kind may be used alone, or two or more kinds may be used in combination. In a case where two or more resins are used in combination, it is preferable that the total content of the two or more resins is in the above-described range.

<<Photopolymerization Initiator>>

It is preferable that the composition according to the present invention includes a photopolymerization initiator.

The photopolymerization initiator is not particularly limited as long as it has an ability to initiate the polymerization of the polymerizable compound, and can be selected from well-known photopolymerization initiators. For example, a photopolymerization initiator having photosensitivity to light in a range from the ultraviolet range to the visible range is preferable. In addition, the photopolymerization initiator may be an activator which causes an action with a photo-excited sensitizer to generate active radicals, or may be an initiator which initiates cationic polymerization depending on the kinds of monomers.

In a case where a radically polymerizable compound is used as the polymerizable compound, it is preferable that the photopolymerization initiator is a photoradical polymerization initiator.

In addition, it is preferable that the photopolymerization initiator is at least one compound having a molar absorption coefficient of at least 50 in a range of about 300 nm to 800 nm (preferably 330 nm to 500 nm).

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in Great German Patent No. 3337024, a compound described in J. Org. Chem.; 29, 1527 (1964) by F. C. Schaefer et al., a compound described in JP1987-58241A (JP-S62-58241A), a compound described in JP1993-281728A (JP-H5-281728A), a compound described in JP1993-34920A (JP-S5-34920A), and a compound described in U.S. Pat. No. 4,212,976A (for example, a compound having an oxadiazole skeleton).

In addition, from the viewpoint of exposure sensitivity, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, and a halomethyl oxadiazole compound, a 3-aryl-substituted coumarin compound is preferable.

Among these, a trihalomethyltriazine compound, an α-aminoketone compound, an acylphosphine compound, a phosphine oxide compound, an oxime compound, a triarylimidazole dimer, an onium compound, a benzophenone compound, or an aminoacetophenone compound is more preferable, and at least one compound selected from the group consisting of a trihalomethyltriazine compound, an α-amino ketone compound, an oxime compound, a triarylimidazole dimer, and a benzophenone compound is still more preferable.

In particular, in a case where the film according to the present invention is used for a solid image pickup element, it is necessary to form a fine pattern in a sharp shape, and thus it is important to obtain excellent curing properties and perform development without a residue remaining in a non-exposed portion. From these viewpoint, it is more preferable that an oxime compound is used as the photopolymerization initiator. In particular, in a case where a fine pattern is formed in a solid image pickup element, a stepper is used for exposure for curing, and this exposure device may be damaged by halogen, and it is also necessary to reduce the addition amount of the photopolymerization initiator to be small. Therefore, in consideration of this point, it is more preferable that an oxime compound is used as the photopolymerization initiator for forming a fine pattern in a solid image pickup element or the like. In addition, by using the oxime compound, color transfer properties can be further improved.

Specific examples of the photopolymerization initiator can be found in paragraphs "0265" to "0268" of JP2013-29760A, the content of which is incorporated herein by reference.

As the photopolymerization initiator, a hydroxyacetophenone compound, an aminoacetophenone compound, or an acylphosphine compound can also be preferably used. More specifically, for example, an aminoacetophenone initiator described in JP1998-291969A (JP-H10-291969A) or an acylphosphine initiator described in JP4225898B can also be used.

As the hydroxyacetophenone initiator, for example, IRGACURE-184, DAROCUR-1173, IRGACURE-500, IRGACURE-2959, or IRGACURE-127 (trade name, all of which are manufactured by BASF SE) can be used.

As the aminoacetophenone initiator, IRGACURE-907, IRGACURE-369, or IRGACURE-379EG (trade name, all of which are manufactured by BASF SE) which is a commercially available product can be used. As the aminoacetophenone initiator, a compound described in JP2009-191179A whose absorption wavelength is adjusted to match with that of a light source having a long wavelength of, for example, 365 nm or 405 nm can also be used.

As the acylphosphine initiator, IRGACURE-819, or DAROCUR-TPO (trade name, all of which are manufactured by BASF SE) which is a commercially available product can be used.

As the photopolymerization initiator, for example, an oxime compound is more preferable.

Specific examples of the oxime compound include a compound described in JP2001-233842A, a compound described in JP2000-80068A, and a compound described in JP2006-342166A.

Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy) iminobutane-2-one, and 2-ethoxycarbonyloxyimino-1-phenylpropane-1-one.

In addition, examples of the oxime compound include a compound described in J. C. S. Perkin II (1979), pp. 1653-1660, J. C. S. Perkin II (1979), pp. 156-162 and Journal of Photopolymer Science and Technology (1995), pp. 202-232, or JP2000-66385A; and a compound described in JP2000-80068A, JP2004-534797A, or JP2006-342166A.

As a commercially available product of the oxime compound, IRGACURE-OXE01 (manufactured by BASF SE) and IRGACURE-OXE02 (manufactured by BASF SE) can also be preferably used. In addition, TR-PBG-304 (manufactured by Changzhou Tronly New Electronic Materials Co., Ltd.), and ADEKA ARKLS NCI-831 and ADEKA ARKLS NCI-930 (all of which are manufactured by ADEKA Corporation) can also be used.

In addition, in addition to the above-described oxime compounds, for example, a compound described in JP2009-519904A in which oxime is linked to a N-position of carbazole, a compound described in U.S. Pat. No. 7,626,957B in which a hetero substituent is introduced into the benzophenone site, a compound described in JP2010-15025A or US2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an maximal absorption at 405 nm and having excellent sensitivity to a light source of g-rays may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

(OX-1)

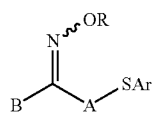

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may have another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable.

These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

In the present invention, a compound represented by the following Formula (1) or (2) can also be used as the photopolymerization initiator.

(1)

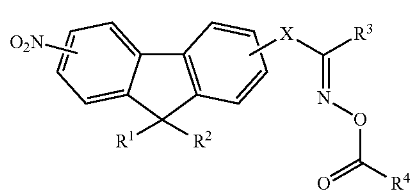

-continued (2)

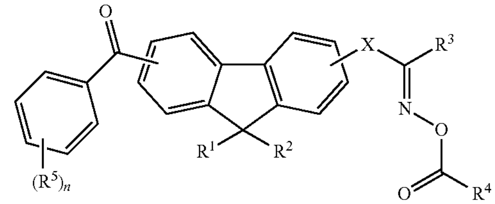

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an arylalkyl group having 7 to 30 carbon atoms, in a case where $R^1$ and $R^2$ represent a phenyl group, the phenyl groups may be bonded to each other to form a fluorene group, $R^3$ and $R^4$ each independently represent a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms, and X represents a direct bond or a carbonyl group.

In Formula (2), $R^1$, $R^2$, $R^3$, and $R^4$ have the same definitions as those of $R^1$, $R^2$, $R^3$, and $R^4$ in Formula (1), $R^5$ represents —$R^6$, —$OR^6$, —$SR^6$, —$COR^6$, —$CONR^6R_6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents a hydrogen atom, an alkyl group having 1 to 20 carbon atoms, an aryl group having 6 to 30 carbon atoms, an arylalkyl group having 7 to 30 carbon atoms, or a heterocyclic group having 4 to 20 carbon atoms, X represents a direct bond or a carbonyl group, and a represents an integer of 0 to 4.

In Formulae (1) and (2), it is preferable that $R^1$ and $R^2$ each independently represent a methyl group, an ethyl group, an n-propyl group, i-propyl, a cyclohexyl group, or a phenyl group. It is preferable that $R^3$ represents a methyl group, an ethyl group, a phenyl group, a tolyl group, or a xylyl group.

It is preferable that $R^4$ represents an alkyl group having 1 to 6 carbon atoms or a phenyl group. It is preferable that $R^5$ represents a methyl group, an ethyl group, a phenyl group, a tolyl group, or a naphthyl group. It is preferable that X represents a direct bond.

Specific examples of the compounds represented by Formulae (1) and (2) include compounds described in paragraphs "0076" to "0079" of JP2014-137466A. The content is incorporated herein by reference.

In the present invention, as the photopolymerization initiator, an oxime compound having a nitro group can be used. It is preferable that the oxime compound having a nitro group is a dimer. Specific examples of the oxime compound having a nitro group include compounds described in paragraphs "0031" to "0047" of JP2013-114249A and paragraphs "0008" to "0012" and "0070" to "0079" of JP2014-137466A, paragraphs "0007" to 0025" of JP4223071B, and ADEKA ARKLS NCI-831 (manufactured by Adeka Corporation).

The oxime compound preferably has a maximal absorption in a wavelength range of 350 nm to 500 nm, more preferably has an absorption wavelength in a wavelength range of 360 nm to 480 nm, and still more preferably has a high absorbance at 365 nm and 405 nm.

The molar absorption coefficient of the oxime compound at 365 nm or 405 nm is preferably 1000 to 300000, more preferably 2000 to 300000, and still more preferably 5000 to 200000 from the viewpoint of sensitivity.

The molar absorption coefficient of the compound can be measured using a well-known method. For example, it is preferable that the absorption coefficient can be measured using an ultraviolet-visible spectrophotometer (Cary-5 spectrophotometer, manufactured by Varian Medical Systems, Inc.) and ethyl acetate as a solvent at a concentration of 0.01 g/L.

Hereinafter, specific examples of the oxime compound which are preferably used in the present invention are shown below, but the present invention is not limited thereto.

(C-1)

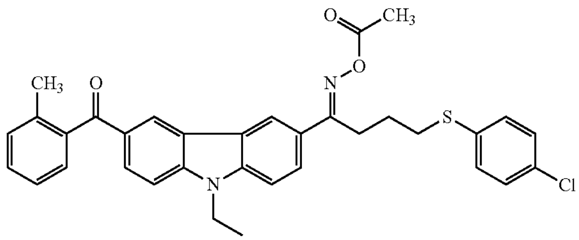

(C-2)

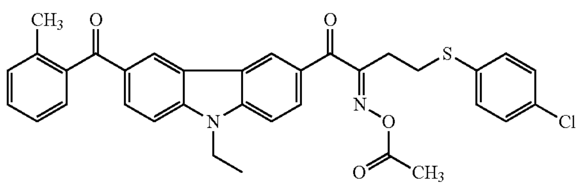

(C-3)

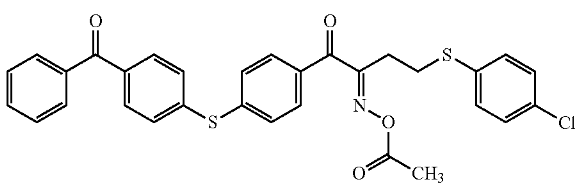

(C-4)

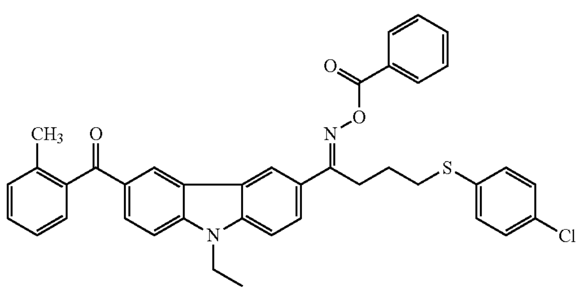

(C-5)

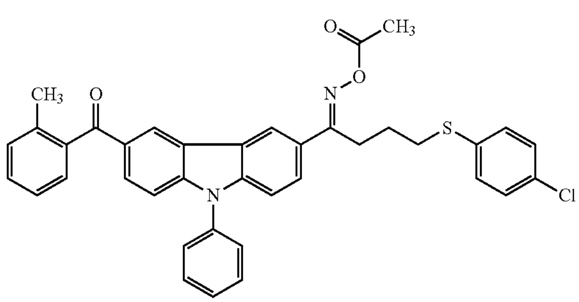

-continued (C-6)

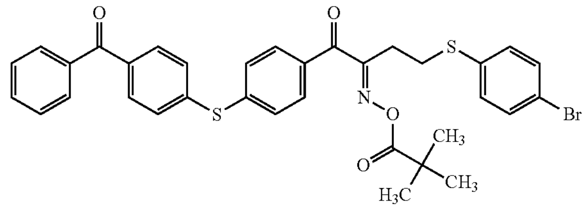

(C-7)

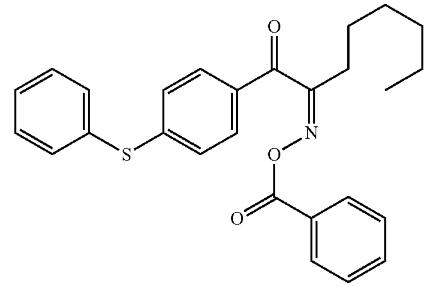

(C-8)

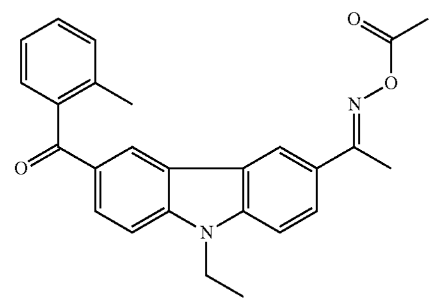

(C-9)

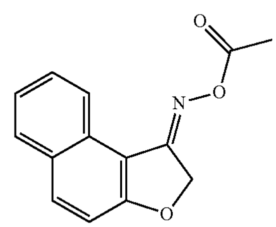

(C-10)

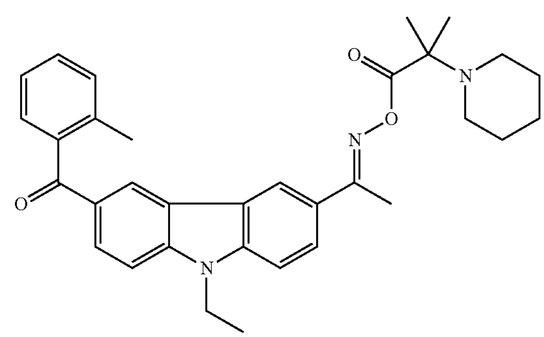

-continued (C-11)

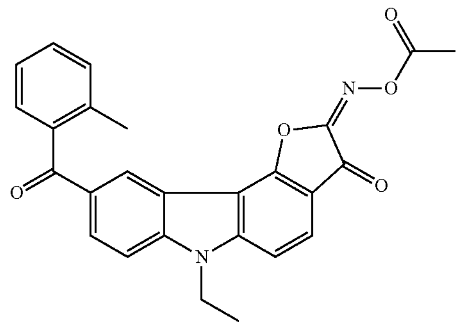

(C-12)

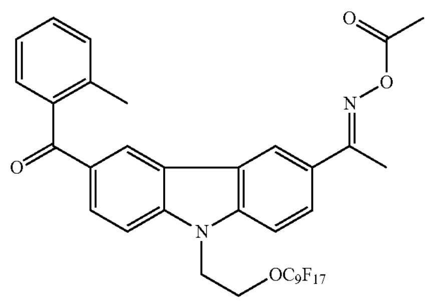

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

The content of the photopolymerization initiator is preferably 0.1 to 50 mass %, more preferably 0.5 to 30 mass %, and still more preferably 1 to 20 mass % with respect to the total solid content of the composition. In the above-described range, excellent sensitivity and pattern formability can be obtained. The composition according to the present invention may include one photopolymerization initiator or two or more photopolymerization initiators. In a case where the coloring composition includes two or more photopolymerization initiators, it is preferable that the total content of the two or more photopolymerization initiators is in the above-described range.

<<Acid Anhydride, Polycarboxylic Acid>>

In a case where the composition according to the present invention includes a compound having an epoxy group, It is preferable that the composition further includes at least one selected from an acid anhydride and a polycarboxylic acid.

Specific examples of the acid anhydride include phthalic anhydride, trimellitic anhydride, pyromellitic anhydride, maleic anhydride, tetrahydrophthalic anhydride, methyltetrahydrophthalic anhydride, methylnadic anhydride, nadic anhydride, hexahydrophthalic anhydride, methylhexahydrophthalic anhydride, glutaric anhydride, 2,4-diethylglutaric anhydride, 3,3-dimethylglutaric anhydride, butanetetracarboxylic anhydride, bicyclo[2,2,1]heptane-2,3-dicarboxylic anhydride, methylbicyclo[2,2,1]heptane-2,3-dicarboxylic anhydride, and cyclohexane-1,3,4-tricarboxylic acid-3,4 anhydride. In particular, methyltetrahydrophthalic anhydride, methylnadic anhydride, nadic anhydride, hexahydrophthalic anhydride, methylhexahydrophthalic anhydride, 2,4-diethylglutaric anhydride, butanetetracarboxylic anhydride, bicyclo[2,2,1]heptane-2,3-dicarboxylic anhydride, or methylbicyclo[2,2,1]heptane-2,3-dicarboxylic anhydride, or cyclohexane-1,3,4-tricarboxylic acid-3,4 anhydride is preferable from the viewpoints of light fastness, transparency, and workability.

The polycarboxylic acid is a compound having at least two carboxyl groups. The polycarboxylic acid is not particularly limited as long as a geometric isomer or an optical isomer is present in the following compound. As the polycarboxylic acid, a bifunctional to hexafunctional carboxylic acid is preferable. For example, an alkyltricarboxylic acid such as 1,2,3,4-butanetetracarboxylic acid, 1,2,3-propanetricarboxylic acid, 1,3,5-pentanetricarboxylic acid, or citric acid; an alicyclic polycarboxylic acid such as phthalic acid, hexahydrophthalic acid, methylhexahydrophthalic acid, tetrahydrophthalic acid, methyltetrahydrophthalic acid, cyclohexanetricarboxylic acid, nadic acid, or methylnadic acid; a polymer of an unsaturated fatty acid such as linolenic acid or oleic acid and a dimer which is a reduction product thereof; a linear alkyl diacid such as malic acid is preferable, hexanedioic acid, pentanedioic acid, heptanedioic acid, octanedioic acid, nonanedioic acid, or decanedioic acid is more preferable, and butanedioic acid is still more preferable from the viewpoint of heat resistance and transparency of a cured product.

In addition, as the polycarboxylic acid, a polycarboxylic acid resin obtained by an addition reaction of a both terminal carbinol-modified silicone oil, a polyhydric alcohol compound having two or more hydroxyl groups in a molecule, a compound having one carboxylic anhydride in a molecule, and optionally a compound having two or more carboxylic anhydride groups in a molecule can also be used. The details of the polycarboxylic acid resin can be found in paragraphs “0075” to “0105” of JP2014-214262A, the content of which is incorporated herein by reference.

The content of the acid anhydride and the polycarboxylic acid is preferably 0.01 to 20 parts by mass, more preferably 0.01 to 10 parts by mass, and still more preferably 0.1 to 6.0 parts by mass with respect to 100 parts by mass of the compound having an epoxy group.

<<Solvent>>

The composition according to the present invention may include a solvent. Examples of the solvent include an organic solvent. Basically, the solvent is not particularly limited as long as it satisfies the solubility of each component and the coating properties of the composition. However, it is preferable that the organic solvent is selected in consideration of the coating properties and safety of the composition.

Preferable examples of the organic solvent are as follows:

an ester, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, or butyl oxyacetate (for example, methyl methoxyacetate, ethyl methoxyacetate, butyl methoxyacetate, methyl ethoxyacetate, or ethyl ethoxyacetate)), a 3-oxypropionic acid alkyl ester (for example, 3-methyl oxypropionate or 3-ethyl oxypropionate (for example, methyl 3-methoxypropionate, ethyl 3-methoxypropionate, methyl 3-ethoxypropionate, or ethyl 3-ethoxypropionate)), a 2-oxypropionic acid alkyl ester (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methylpropionate or ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate or ethyl 2-oxobutanoate;

an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, or propylene glycol monopropyl ether acetate;

a ketone, for example, methyl ethyl ketone, cyclohexanone, cyclopentanone, 2-heptanone, or 3-heptanone; and an aromatic hydrocarbon, for example, toluene or xylene.

Among these organic solvents, one kind may be used alone, or two or more kinds may be used in combination.

In a case where two or more organic solvents are used in combination, in particular, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, as the organic solvent, an organic solvent containing 0.8 mmol/L or lower of a peroxide is preferable, and an organic solvent containing no peroxide is more preferable.

In the present invention, as the solvent, a solvent having a low metal content is preferably used. For example, the metal content of the solvent is preferably 10 ppb or lower. Optionally, a solvent having a metal content at a ppt level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. During the filtering using a filter, the pore size of a filter is preferably 10 nm or less, more preferably 5 nm or less, and still more preferably 3 nm or less. As a material of the filter, polytetrafluoroethylene, polyethylene, or nylon is preferable.

The solvent may include an isomer (a compound having the same number of atoms and a different structure). In addition, the organic solvent may include only one isomer or a plurality of isomers.

The content of the solvent is preferably 10 to 90 mass %, more preferably 20 to 80 mass %, and still more preferably 25 to 75 mass % with respect to the total mass of the composition.

<<Polymerization Inhibitor>>

The composition according to the present invention may include a polymerization inhibitor in order to prevent unnecessary thermal polymerization of the polymerizable compound during the manufacturing or storage of the composition. Examples of the polymerization inhibitor include a phenol hydroxyl group-containing compound, a N-oxide compound, a piperidine-1-oxyl free-radical compound, a pyrrolidine-1-oxyl free-radical compound, a N-nitrosophenylhydroxyamine, a diazonium compound, a cationic dye, a sulfide group-containing compound, a nitro group-containing compound, a phosphorus compound, a lactone compound, and a transition metal compound (for example, $FeCl_3$ or $CuCl_2$). In addition, the compounds may be composite compounds in which a plurality of structures which exhibit a polymerization inhibition function such as a phenol skeleton or a phosphorus-containing skeleton are present in the same molecule. For example, a compound described in JP1998-126307A (JP-H10-46035A) is also preferably used. Specific examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine cerium (III) salt. Among these, p-methoxyphenol is preferable. Among these, p-methoxyphenol is preferable.

The content of the polymerization inhibitor is preferably 0.01 to 5 mass % with respect to the total solid content of the composition.

<<Substrate Adhesive>>

The composition according to the present invention may include a substrate adhesive.

As the substrate adhesive, a silane coupling agent, a titanate coupling agent, or an aluminum coupling agent can be preferably used.

Examples of the silane coupling agent include methyl trimethoxysilane, dimethyl dimethoxysilane, methyltriethoxysilane, and dimethyl diethoxysilane, phenyltriethoxysilane, n-propyltrimethoxysilane, n-propyltriethoxysilane, hexyl trimethoxysilane, hexyl triethoxysilane, octyl triethoxysilane, decyl trimethoxysilane, 1,6-bis(trimethoxysilyl)hexane, trifluoropropyltrimethoxysilane, hexamethyldisilazane, vinyl trimethoxysilane, vinyltriethoxysilane, 2-(3,4-epoxycyclohexyl)ethyltrimethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylethyldimethoxysilane, 3-methacryloxypropyltriethoxysilane, 3-acryloxypropyltrimethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxy silane, N-(vinylbenzyl)-2-aminoethyl-3-aminopropyltrimethoxy silane, tris-(trimethoxysilylpropyl)isocyanurate, 3-ureidopropyltriethoxysilane, 3-mercaptopropylmethyldimethoxysilane, 3-mercaptopropyltrimethoxysilane, and bis(triethoxysilylpropyl)tetrasulfide, and 3-isocyanatepropyltriethoxysilane. In addition to the above-described examples, an alkoxy oligomer can be used. In addition, the following compounds can also be used.

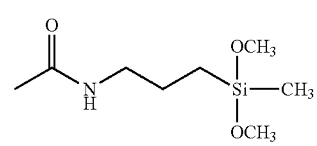

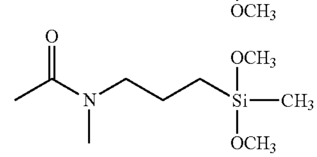

-continued

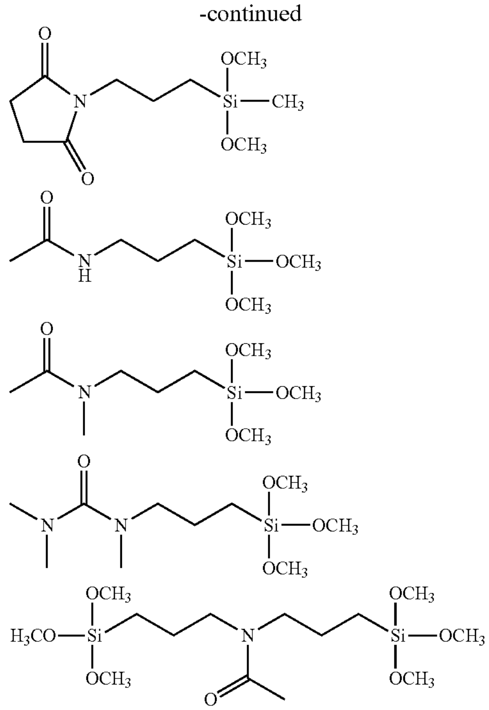

Examples of a commercially available product of the silane coupling agent include KBM-13, KBM-22, KBM-103, KBE-13, KBE-22, KBE-103, KBM-3033, KBE-3033, KBM-3063, KBM-3066, KBM-3086, KBE-3063, KBE-3083, KBM-3103, KBM-3066, KBM-7103, SZ-31, KPN-3504, KBM-1003, KBE-1003, KBM-303, KBM-402, KBM-403, KBE-402, KBE-403, KBM-1403, KBM-502, KBM-503, KBE-502, KBE-503, KBM-5103, KBM-602, KBM-603, KBM-903, KBE-903, KBE-9103, KBM-573, KBM-575, KBM-9659, KBE-585, KBM-802, KBM-803, KBE-846, KBE-9007, X-40-1053, X-41-1059A, X-41-1056, X-41-1805, X-41-1818, X-41-1810, X-40-2651, X-40-2655A, KR-513, KC-895, KR-500, X-40-9225, X-40-9246, X-40-9250, KR-401N, X-40-9227, X-40-9247, KR-510, KR-9218, KR-213, X-40-2308, and X-40-9238 (all of which are manufactured by Shin-Etsu Chemical Co., Ltd.).

In addition, as the silane coupling agent, a silane coupling agent Y having at least a silicon atom, a nitrogen atom, and a curable functional group in a molecule and having a hydrolyzable group bonded to a silicon atom can also be used.

The hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, an acyloxy group, and an alkenyloxy group. In a case where the hydrolyzable group has carbon atoms, the number of carbon atoms is preferably 6 or less and more preferably 4 or less. In particular, an alkoxy group having 4 or less carbon atoms or an alkenyloxy group having 4 or less carbon atoms is preferable.

The silane coupling agent Y has at least one silicon atom in a molecule thereof, and the silicon atom can be bonded to the following atoms and substituents. These atoms or substituents may be the same as or different from each other. Examples of the atoms and substituents bonded to the silicon atom include a hydrogen atom, a halogen atom, a hydroxyl group, an alkyl group having 1 to 20 carbon atoms, an alkenyl group, an alkynyl group, an aryl group, an amino group which can be substituted with at least one of an alkyl group or an aryl group, a silyl group, an alkoxy group having 1 to 20 carbon atoms, and an aryloxy group. These substituents may be further substituted with a silyl group, an alkenyl group, an alkynyl group, an aryl group, an alkoxy group, an aryloxy group, a thioalkoxy group, an amino group which can be substituted with at least one of an alkyl group or an aryl group, a halogen atom, a sulfonamide group, an alkoxycarbonyl group, an amide group, a urea group, an ammonium group, an alkylammonium group, a carboxyl group or a salt thereof, or a sulfo group or a salt thereof.

At least one hydrolyzable group is bonded to the silicon atom. The definition of the hydrolyzable group is as described above.

The silane coupling agent Y may include a group represented by the following Formula (Z).

$$*\text{—}Si(R^{z1})_{3-m}(R^{z2})_m \quad \text{Formula (Z)}$$

$R^{z1}$ represents an alkyl group, $R^{z2}$ represents a hydrolyzable group, and m represents an integer of 1 to 3. The number of carbon atoms in the alkyl group represented by $R^{z1}$ is preferably 1 to 5 and more preferably 1 to 3. The definition of the hydrolyzable group represented by $R^{z2}$ is as described above.

The silane coupling agent Y includes at least one nitrogen atom in a molecule thereof. It is preferable that the nitrogen atom is present in the form of a secondary amino group or a tertiary amino group, that is, it is preferable that the nitrogen atom has at least one organic group as a substituent. Regarding the structure of the amino group, the amino group may be present in a molecule in the form of a partial structure of a nitrogen-containing heterocycle, or may be present as an substituted amino group such as aniline. Here, examples of the organic group include an alkyl group, an alkenyl group, an alkynyl group, an aryl group, and a combination thereof. These organic groups may further have a substituent, and examples of the substituent which can be introduced include a silyl group, an alkenyl group, an alkynyl group, an aryl group, an alkoxy group, an aryloxy group, a thioalkoxy group, an amino group, a halogen atom, a sulfonamide group, an alkoxycarbonyl group, a carbonyloxy group, an amide group, a urea group, an alkyleneoxy group, an ammonium group, an alkylammonium group, a carboxyl group or a salt thereof, and a sulfo group.

In addition, it is preferable that the nitrogen atom is bonded to a curable functional group through an arbitrary organic linking group. Preferable examples of the organic linking group include the above-described substituents which can be introduced into the nitrogen atom and the organic group bonded to the nitrogen atom.

The silane coupling agent Y includes at least one curable functional group in a molecule thereof. The curable functional group is preferably one or more groups selected from the group consisting of a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth) acrylamide group, a styryl group, and a maleimide group, and more preferably one or more groups selected from the group consisting of a (meth)acryloyloxy group, an epoxy group, and an oxetanyl group.

The silane coupling agent Y includes at least one curable functional group in a molecule thereof, and may include two or more curable functional groups in a molecule. From the viewpoints of sensitivity and stability, the number of curable functional groups in a molecule of the silane coupling agent Y is preferably 2 to 20, more preferably 4 to 15, and still more preferably 6 to 10.

Examples of the silane coupling agent Y include a compound represented by the following Formula (Y).

$$(R^{y3})_n\text{-LN—Si}(R^{y1})_{3-m}(R^{y2})_m \qquad \text{Formula (Y)}$$

$R^{y1}$ represents an alkyl group, $R^{y2}$ represents a hydrolyzable group, and $R^{y3}$ represents a curable functional group. LN represents a (n+1) valent linking group having a nitrogen atom. m represents an integer of 1 to 3, and n represents an integer of 1 or more.

n in Formula (Y) represents an integer of 1 or more. The upper limit is, for example, preferably 20 or less, more preferably 15 or less, and still more preferably 10 or less. The lower limit is, for example, preferably 2 or more, more preferably 4 or more, and still more preferably 6 or more. In addition, n may represent 1.

LN in Formula (Y) represents a group having a nitrogen atom.

Examples of the group having a nitrogen atom include at least one group selected from groups represented by the following Formula (LN-1) to (LN-4), and a group of a combination of at least one group selected from groups represented by the following Formula (LN-1) to (LN-4), —CO—, —$CO_2$—, —O—, —S—, and —$SO_2$—. The alkylene group may be linear or branched. The alkylene group and the arylene group may have a substituent or may be unsubstituted. Examples of the substituent include a halogen atom and a hydroxyl group.

(LN-1)

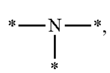

(LN-2)

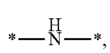

(LN-3)

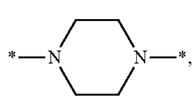

(LN-4)

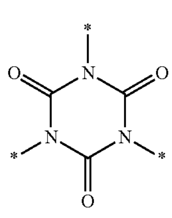

In the formula, * represents a direct bond.

Specific examples of the silane coupling agent Y include the following compounds. In the formula, Et represents an ethyl group. Other examples of the silane coupling agent Y include a compound described in paragraphs "0018" to "0036" of JP2009-288703A, the content of which is incorporated herein by reference.

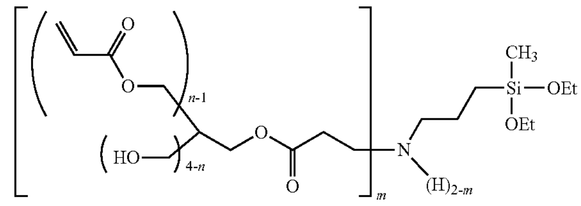

n = 4, 3, 2 (n = 4 main reactant)

m = 2 or 1 (m = 2 main product)

The content of the substrate adhesive is preferably 0.1 to 30 mass %, more preferably 0.5 to 20 mass %, and still more preferably 1 to 10 mass % with respect to the total solid content of the composition.

<<Surfactant>>

The composition according to the present invention may include various surfactants from the viewpoint of further improving coating properties. As the surfactants, various surfactants such as a fluorine surfactant, a nonionic surfactant, a cationic surfactant, an anionic surfactant, or a silicone surfactant can be used.

By the composition including a fluorine surfactant, liquid characteristics (for example, fluidity) of a coating solution prepared from the composition are further improved, and the uniformity in coating thickness and liquid saving properties can be further improved.

That is, in a case where a film is formed using a coating solution prepared using the composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Examples of the fluorine surfactant include a surfactant described in paragraphs "0060" to "0064" of JP2014-41318A (paragraphs "0060" to "0064" of corresponding WO2014/17669 and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, F780, and RS-72-K (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC1068, SC-381, SC-383, S393, and KH-40 (all of which are manufactured by Asahi Glass Co., Ltd.); and PolyFox, PF636, PF656, PF6320, PF6520, and PF7002 (all of which are manufactured by OMNOVA Solutions Inc.). As the fluorine surfactant, a block polymer can also be used, and specific examples thereof include a compound described in JP2011-89090A.

As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

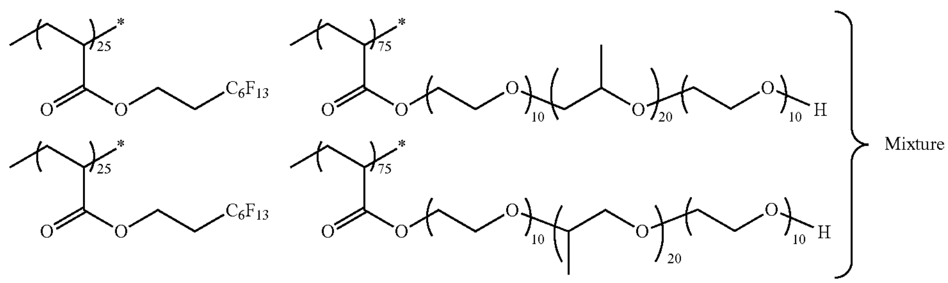

The weight-average molecular weight of the compound is preferably 3000 to 50000 and, for example, 14000.

In addition, as the fluorine surfactant, a fluorine-containing polymer having an ethylenically unsaturated group at a side chain can also be preferably used. Specific examples include compounds described in paragraphs "0050" of "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Specific examples of the nonionic surfactant include glycerol, trimethylolpropane, trimethylolethane, an ethoxylate and a propoxylate thereof (for example, glycerol propoxylate or glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters PLURONIC L10, L31, L61, L62, 10R5, 17R2, and 25R2 and TETRONIC 304, 701, 704, 901, 904, and 150R1 (all of which are manufactured by BASF SE); and SOLSPERSE 20000 (manufactured by Lubrication Technology Inc.). In addition, NCW-101, NCW-1001, or NCW-1002 (manufactured by Wako Pure Chemical Industries, Ltd.) can also be used.

Specific examples of the cationic surfactant include a phthalocyanine derivative (trade name: EFKA-745, manufactured by Morishita Co., Ltd.), an organosiloxane polymer KP341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.), and SANDET BL (manufactured by Sanyo Chemical Industries Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The content of the surfactant is preferably 0.001 to 2.0 mass % and more preferably 0.005 to 1.0 mass % with respect to the total solid content of the composition.

<<Ultraviolet Absorber>>

The composition according to the present invention may include an ultraviolet absorber.

As the ultraviolet absorber, a well-known compound can be used. As the ultraviolet absorber, a conjugated diene compound having an amino group is preferable, and examples thereof include a compound described in paragraphs "0038" to "0052" of JP2009-217221A. For example, the following compound can be used.

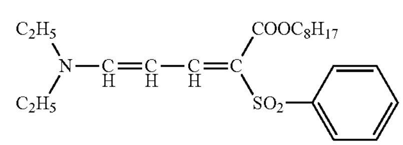

Examples of a commercially available product of the ultraviolet absorber include UV503 (manufactured by Daito Chemical Co., Ltd.).

The content of the ultraviolet absorber is preferably 0.01 to 10 mass % and more preferably 0.01 to 5 mass % with respect to the mass of the total solid content of the composition.

<<Other Components>>

The composition according to the present invention optionally includes: a chain transfer agent such as N,N-dialkylamino benzoic acid alkyl ester or 2-mercapto-benzothiazole; a thermal polymerization initiator such as an azo compound or a peroxide compound; a thermal polymerization component; a plasticizer such as dioctyl phthalate; a developability improving agent such as a low molecular weight organic carboxylic acid; and other various additives such as an antioxidant, or an aggregation inhibitor.

In addition, in order to increase the degree of cure of a film during heating after development, a thermal curing agent can be added. Examples of the thermal curing agent include a thermal polymerization initiator such as an azo compound or a peroxide, a novolac resin, a resol resin, an epoxy compound, and a styrene compound.

Depending on materials used and the like, the composition may include a metal element. From the viewpoint of, for example, suppressing the generation of defects, the content of a Group 2 element (for example, calcium or magnesium) in the composition is controlled to be preferably 50 ppm or lower and more preferably 0.01 to 10 ppm. In addition, the total amount of inorganic metal salts in the composition is controlled to be preferably 100 ppm or lower and more preferably 0.5 to 50 ppm.

<Method of Preparing Composition>

The composition according to the present invention can be prepared by mixing the above-described components with each other.

During the preparation of the composition, the respective components may be mixed with each other collectively, or may be mixed with each other sequentially after dissolved and dispersed in a solvent. In addition, during mixing, the order of addition or working conditions are not particularly limited. For example, all the components may be dissolved or dispersed in a solvent at the same time to prepare the composition. Optionally, at least either two or more solutions or two or more dispersions may be appropriately prepared using the respective components, and the solutions or dispersions may be mixed with each other during use (during application) to prepare the composition.

In a case where a pigment is used, it is preferable that the composition is prepared using a method including: preparing a pigment dispersion by dispersing the pigment and optionally other components such as a resin, an solvent, or a pigment derivative; and mixing the obtained pigment dispersion with other components of the composition. Examples of a process for dispersing the pigment include a process in which compression, squeezing, impact, shearing, cavitation, or the like is used as a mechanical force used for the dispersion. Specific examples of the process include a beads mill, a sand mill, a roll mill, a ball mill, a paint shaker, a Microfluidizer, a high-speed impeller, a sand grinder, a project mixer, high-pressure wet atomization, and ultrasonic dispersion. During the pulverization of the pigment using a sand mill (beads mill), it is preferable that the process is performed under conditions for increasing the pulverization efficiency, for example, by using beads having a small size and increasing the filling rate of the beads. In addition, it is preferable that coarse particles are removed by filtering, centrifugal separation, and the like. A process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the pigment, the pigment may be refined in a salt milling step. A material, a device, process conditions, and the like used in the salt milling step can be found in, for example, JP2015-194521A and JP2012-046629A.

During the preparation of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In the above-described range, fine foreign matter, which inhibits a fine and smooth composition in the next step, can be reliably removed. In addition, a fibrous filter material is also preferably used, and examples of the filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

A second filter may be formed of the same material as that of the first filter.

For example, the filtering using the first filter may be performed only on the dispersion, and the filtering using the second filter may be performed on a mixture of the dispersion and other components.

<Film>

Next, a film according to the present invention will be described.

The film according to the present invention is obtained by curing the above-described composition according to the present invention. The film according to the present invention can be used as an infrared cut filter or an infrared transmitting filter. The film according to the present invention may be a film having a pattern or a film (flat film) not having a pattern.

In a case where the film according to the present invention is used as an infrared transmitting filter, the film is a filter which is obtained using a composition including the near infrared absorbing colorant polymer according to the present invention and the coloring material that shields visible light. In this case, it is preferable that the film is a filter in which a layer of the coloring material that shields visible light is separately present in addition to a layer including the near infrared absorbing colorant polymer. In a case where the film according to the present invention is used as an infrared transmitting filter, the near infrared absorbing colorant polymer according to the present invention has a function of limiting an infrared range of light to be transmitted (infrared light) to a long wavelength side.

In the present invention, "infrared cut filter" refers to a filter that allows transmission of light (visible light) in the visible range and shields light (infrared light) in the infrared range. The infrared cut filter may be a filter that allows transmission of light in the entire wavelength range of the visible range, or may be a filter that allows transmission of light in a specific wavelength range of the visible range and shields light in another specific wavelength range of the visible range. In addition, in the present invention, "infrared transmitting filter" refers to a filter that shields light in the visible range and allows transmission of light (infrared light) in the infrared range. The wavelength of infrared light that transmits through the infrared transmitting filter can be appropriately selected according to the use.

The infrared cut filter may have not only a function as an infrared cut filter but also a function as a color filter by including a chromatic colorant. In the present invention, "color filter" refers to a filter that allows transmission of light in a specific wavelength range of the visible range and shields light in another specific wavelength range of the visible range.

In a case where the film according to the present invention is used as at least one of an infrared cut filter or an infrared transmitting filter, an infrared cut filter and an infrared transmitting filter can be used in combination. By using an infrared cut filter and an infrared transmitting filter in combination with an infrared transmitting filter, this combination can be preferably used for an infrared sensor that detects infrared light at a specific wavelength.

In a case where both an infrared cut filter and an infrared transmitting filter are used in combination, both the infrared cut filter and the infrared transmitting filter may be films (films according to the present invention) which are formed using the composition according to the present invention. Alternatively, among the infrared cut filter and the infrared transmitting filter, one may be a film (film according to the present invention) which is formed using the composition according to the present invention, and the other one may be a film which is formed using a composition other than the composition according to the present invention.

In addition, in a case where the film according to the present invention is used as an infrared cut filter, the infrared cut filter may be or may not be adjacent to a color filter in the thickness direction. In a case where the infrared cut filter is not adjacent to the color filter in the thickness direction, the infrared cut filter may be formed on another substrate other than a substrate on which the color filter is formed, or another member (for example, a microlens or a planarizing layer) constituting a solid image pickup element may be interposed between the infrared cut filter and the color filter.

The thickness of the film according to the present invention can be adjusted according to the purpose. The thickness is preferably 20 μm or less, more preferably 10 μm or less, and still more preferably 5 μm or less. For example, the lower limit of the thickness is preferably 0.1 μm or more, more preferably 0.2 μm or more, and still more preferably 0.3 μm or more.

The film according to the present invention can be used in various devices such as a solid image pickup element such as CCD or CMOS, an infrared sensor, or an image display device.

<Optical Filter>

Next, an optical filter according to the present invention will be described. The optical filter according to the present invention includes the film according to the present invention. The optical filter according to the present invention can be preferably used as an infrared cut filter or an infrared transmitting filter. In addition, it is also preferable that the optical filter according to the present invention includes a pixel which is formed using the film according to the present invention and a pixel selected from the group consisting of a red pixel, a green pixel, a blue pixel, a magenta pixel, a yellow pixel, a cyan pixel, a black pixel, and an achromatic pixel <Pattern Forming Method>

A pattern forming method according to the present invention includes: forming an composition layer on a support using the composition according to the present invention; and forming a pattern on the composition layer using a photolithography method or a dry etching method.

In a case where a laminate an infrared cut filter and a color filter are laminated is manufactured, pattern formation on the infrared cut filter and pattern formation on the color filter may be separately performed. In addition, pattern formation may be performed on the laminate in which the infrared cut filter and the color filter are laminated (that is, pattern formation on the infrared cut filter and pattern formation on the color filter may be simultaneously performed).

The case where pattern formation on the infrared cut filter and pattern formation on the color filter are separately performed denotes the following aspect. Pattern formation is performed on any one of the infrared cut filter and the color filter. Next, the other filter layer is formed on the filter layer on which the pattern is formed. Next, pattern formation is performed on the filter layer on which a pattern is not formed.

A pattern forming method may be a pattern forming method using photolithography or a pattern forming method using dry etching.

In a case where the pattern forming method using photolithography is adopted, a dry etching step is not necessary, and an effect that the number of steps can be reduced can be obtained.

In a case where the pattern forming method using dry etching is adopted, a photolithography function is not necessary. Therefore, an effect that the concentration of the infrared absorber or the like in the composition can increase can be obtained.

In a case where the pattern formation on the infrared cut filter and the pattern formation on the color filter are separately performed, the pattern formations on the respective filter layers may be performed using only the photolithography method or only the dry etching method. In addition, after performing the pattern formation on one filter layer using the photolithography method, the pattern formation may be performed on the other filter layer using the dry etching method. In a case where the pattern formation is performed using a combination of the dry etching method and the photolithography method, it is preferable that a pattern is formed on a first layer using the dry etching method and a pattern is formed on a second or subsequent layer using the photolithography method.

It is preferable that the pattern formation using the photolithography method includes: forming a composition layer on a support using each composition; exposing the composition layer in a pattern shape; and forming a pattern by removing a non-exposed portion by development. Optionally, the pattern formation further includes: baking the composition layer (pre-baking step); and baking the developed pattern (post-baking step).

In addition, It is preferable that the pattern formation using the dry etching method includes: forming a composition layer on a support using each composition and curing the cured composition layer; forming a photoresist layer on the cured composition layer; a step of obtaining a resist pattern by patterning the photoresist layer by exposure and development; and forming a pattern by dry-etching the cured composition layer by using the resist pattern as an etching mask. Hereinafter, the respective steps will be described.

<<Step of Forming Composition Layer>>

In the step of forming a composition layer, a composition layer is formed on a support using each of the compositions.

As the support, for example, a substrate for a solid image pickup element obtained by providing a solid image pickup element (light-receiving element) such as CCD or CMOS on a substrate (for example, a silicon substrate) can be used.

The pattern according to the present invention may be formed on a solid image pickup element-formed surface (front surface) of the substrate for a solid image pickup element, or may be formed on a solid image pickup element non-formed surface (back surface) thereof.

Optionally, an undercoat layer may be provided on the support to improve adhesion with a layer above the support, to prevent diffusion of materials, or to make a surface of the substrate flat.

As a method of applying the composition to the support, various methods such as slit coating, an ink jet method, spin coating, cast coating, roll coating, or screen printing can be used.

The composition layer formed on the support may be dried (pre-baked). In a case where a pattern is formed through a low-temperature process, pre-baking is not necessarily performed.

In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 to 300 seconds, more preferably 40 to 250 seconds, and still more preferably 80 to 220 seconds. Drying can be performed using a hot plate, an oven, or the like.

In a case where the pattern formation is simultaneously performed on a plurality of layers, it is preferable that a composition for forming each of the layers is applied to the composition layer to form another composition layer.

(Case where Pattern is Formed Using Photolithography Method)

<<Exposure Step>>

Next, the composition layer is exposed in a pattern shape (exposure step). For example, the composition layer is exposed in a pattern shape using an exposure device such as a stepper through a mask having a predetermined mask pattern, thereby exposing a pattern. As a result, an exposed portion can be cured.

As radiation (light) used during the exposure, ultraviolet rays such as g-rays or i-rays are preferably used (i-rays are more preferably used). For example, the irradiation dose (exposure dose) is preferably 30 to 5000 mJ/cm$^2$. The upper limit is preferably 3000 mJ/cm$^2$ or lower, more preferably 2000 mJ/cm$^2$ or lower, and still more preferably 1500 mJ/cm$^2$ or lower. The lower limit is preferably 50 mJ/cm$^2$ or higher and more preferably 80 mJ/cm$^2$ or higher.

<<Development Step>>

Next, a pattern is formed by removing a non-exposed portion by development. The non-exposed portion can be removed by development using a developer. As a result, a non-exposed portion of the composition layer in the exposure step is eluted into the developer, and only the photocured portion remains.

As the developer, an organic alkali developer which does not cause damages to a solid image pickup element as a substrate, a circuit or the like is desired.

For example, the temperature of the developer is preferably 20° C. to 30° C. The developing time is preferably 20 to 180 seconds. In addition, in order to further improve residue removing properties, a step of shaking the developer off per 60 seconds and supplying a new developer may be repeated multiple times.

Examples of an alkaline agent used in the developer include an organic alkaline compound such as ammonia water, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, 1,8-diazabicyclo-[5,4,0]-7-undecene, or dimethyl bis(2-hydroxyethyl)ammonium hydroxide. As the developer, an alkaline aqueous solution is preferably used in which the above alkaline agent is diluted with pure water such that a concentration thereof is 0.001 to 10 mass % and preferably 0.01 to 1 mass %.

In addition, an inorganic alkali may be used as the developer. Preferable examples of the inorganic alkali include sodium hydroxide, potassium hydroxide, sodium carbonate, sodium bicarbonate, sodium silicate, and sodium metasilicate.

In addition, a surfactant may be used as the developer. Examples of the surfactant include the surfactants described above regarding the coloring composition. Among these, a nonionic surfactant is preferable.

In a case where a developer including the alkaline aqueous solution is used, in general, it is preferable that the film is rinsed with pure water after development.

After the development, it is preferable that the film is dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and even still more preferably 90° C. or lower. The lower limit is, for example, 50° C. or higher.

The film after the development is post-baked continuously or batchwise using heating means such as a hot plate, a convection oven (hot air circulation dryer), a high-frequency heater under the above-described conditions. In addition, in a case where a pattern is formed through a low-temperature process, post-baking is not necessarily performed.

(Case where Pattern is Formed Using Dry Etching Method)

The pattern formation using the dry etching method can be performed by curing the composition layer formed on the support to form a cured composition layer, and then etching the cured composition layer with etching gas by using a patterned photoresist layer as a mask.

Specifically, it is preferable that a positive type or negative type radiation sensitive composition is applied to the cured composition layer and is dried such that a photoresist layer is formed. It is preferable that pre-baking is further performed in order to form the photoresist layer. In particular, in a preferable embodiment, as a process of forming the photoresist, baking after exposure or baking after development (post-baking) is performed.

As the photoresist layer, a positive type radiation sensitive composition, which is reactive with radiation including ultraviolet rays (g-rays, h-rays, i-rays), far ultraviolet rays such as excimer laser, electron beams, ion beams, and X-rays, is preferably used. Among the radiations, g-rays, h-rays, or i-rays are preferable, and i-rays are more preferable.

Specifically, as the positive type radiation sensitive composition, a composition including a quinonediazide compound and an alkali-soluble resin is preferable. The positive type radiation sensitive composition including a quinonediazide compound and an alkali-soluble resin uses a configuration in which a quinonediazide group is decomposed into a carboxyl group by irradiation of light having a wavelength of 500 nm or shorter such that the state of the composition is converted from alkali-insoluble to alkali-soluble. The positive type photoresist has significantly high resolution and thus is used to prepare an integrated circuit such as an integrated circuit (IC) or a large scale integration (LSI). Examples of the quinonediazide compound include a naphthoquinonediazide compound. Examples of a commercially available product of the quinonediazide compound include "FHi622BC" (manufactured by Fujifilm Electronic Materials Co., Ltd.).

The thickness of the photoresist layer is preferably 0.1 to 3 μm, more preferably 0.2 to 2.5 μm, and still more preferably 0.3 to 2 μm. It is preferable that the positive type radiation sensitive composition is applied using the above-described methods of applying the composition.

Next, by exposing and developing the photoresist layer, a resist pattern (patterned photoresist layer) including a group of resist through-holes is formed. The formation of the resist pattern is not particularly limited and can be appropriately optimized and performed using a well-known photolithography technique of the related art. By providing the group of resist through-holes in the photoresist layer by exposure and development, a resist pattern used as an etching mask in the next etching is provided on the cured composition layer.

The exposure of the photoresist layer can be performed by exposing the positive type or negative type radiation sensitive composition with g-rays, h-rays, i-rays, or the like (preferably i-rays) through a predetermined mask pattern. By performing development using a developer after exposure, a photoresist is removed from a region where a color pattern is desired to be formed.

As the developer, any developer can be used as long as it has no effect on a cured composition layer including a colorant and an exposed portion of a positive resist and a non-cured portion of a negative resist are soluble therein. For example, a combination of various solvents or an alkaline aqueous solution can be used. It is preferable that the alkaline aqueous solution is prepared by dissolving an alkaline compound such that the concentration thereof is 0.001 to 10 mass % and preferably 0.01 to 5 mass %. Examples of the alkaline compound include sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, 1,8-diazabicyclo[5,4,0]-7-undecene, and dimethyl bis(2-hydroxyethyl)ammonium hydroxide. In a case where an alkaline aqueous solution is used, in general, a rinsing treatment using water is performed after development.

Next, patterning is performed by dry-etching the colored layer using the resist pattern as an etching mask so as to form a group of through-holes in the cured composition layer.

From the viewpoint of forming a pattern cross-section in a substantially rectangular shape or the viewpoint of further reducing damages to the support, it is preferable that dry etching is performed according the following embodiment.

In the preferable embodiment, first etching, second etching, and over etching is performed. In the first etching, etching is performed using a mixed gas of fluorine gas and oxygen gas ($O_2$) up to a region (depth) where the support is not exposed. In the second etching, after the first etching, etching is performed using a mixed gas of nitrogen gas ($N_2$) and oxygen gas ($O_2$) preferably up to a region (depth) where the support is exposed. In the over etching, etching is performed after the support is exposed. Hereinafter, a specific method of dry etching, the first etching, the second etching, and the over etching will be described.

The dry etching is performed after obtaining etching conditions in advance using the following method.

(1) An etching rate (nm/min) in the first etching, and an etching rate (nm/min) in the second etching are calculated, respectively.

(2) A time required to perform etching up to a desired thickness in the first etching, and a time required to perform etching up to a desired thickness in the second etching are calculated, respectively.

(3) The first etching is performed for the etching time calculated in (2).

(4) The second etching is performed for the etching time calculated in (2). Alternatively, an etching time may be determined based on a detected end point, and the second etching may be performed for the determined etching time.

(5) An over etching time is calculated in consideration of the total etching time of (3) and (4), and the over etching is performed for the calculated over etching time.

From the viewpoint of processing an organic material, which is a film to be etched, in a rectangular shape, it is preferable that a mixed gas used in the first etching step includes fluorine gas and oxygen gas ($O_2$). In addition, by performing etching up to a region where the support is not exposed in the first etching step, damages to the support can be avoided. In addition, after etching is performed using a mixed gas of fluorine gas and oxygen gas up to a region where the support is not exposed in the first etching step, in second etching step and the over etching step, it is preferable that etching is performed using a mixed gas of nitrogen gas and oxygen gas from the viewpoint of avoiding damages to the support.

It is important to determine a ratio between the etching amount in the first etching step and the etching amount in the second etching step such that the rectangularity obtained by etching in the first etching step does not deteriorate. A latter ratio in the total etching amount (the sum of the etching amount in the first etching step and the etching amount in the second etching step) is preferably higher than 0% and 50% or lower and more preferably 10% to 20%. The etching amount refers to a value which is calculated from a difference between the thickness of a film to be etched before etching and the thickness of the film remaining after etching.

In addition, it is preferable that the etching includes over etching. It is preferable that the over etching is performed after setting an over etching ratio. In addition, it is preferable that the over etching ratio is calculated based on a first etching time. The over etching ratio can be arbitrarily set and is preferably 30% or lower, more preferably 5 to 25%, and still more preferably 10 to 15% with respect to the total etching time of the etching process from the viewpoints of obtaining etching resistance of a photoresist and maintaining rectangularity of an etched pattern.

Next, the resist pattern (that is, the etching mask) remaining after etching is removed. It is preferable that the removal of the resist pattern includes: a step of applying a peeling solution or a solvent to the resist pattern such that the resist pattern can be removed; and a step of removing the resist pattern using rinse water.

Examples of the step applying a peeling solution or a solvent to the resist pattern such that the resist pattern can be removed include a step of applying a peeling solution or a solvent to at least the resist pattern and holding the peeling solution and the solvent for a predetermined time to perform puddle development. The time for which the peeling solution or the solvent is held is not particularly limited and is preferably several tens of seconds to several minutes.

In addition, examples of the step of removing the resist pattern using rinse water include a step of spraying rinse water to the resist pattern through a spray type or shower type spray nozzle to remove the resist pattern. As the rinse water, pure water is preferably used. In addition, examples of the spray nozzle include: a spray nozzle in which a spraying range includes the entire region of the support; and a movable spray nozzle in which a movable range includes the entire region of the support. In a case where the spray nozzle is movable, the nozzle moves twice or more in a region from the center of the support to end portions of the support to spray rinse water during the step of removing the resist pattern. As a result, the resist pattern can be more effectively removed.

In general, the peeling solution may further include an organic solvent or an inorganic solvent. Examples of the organic solvent include (1) a hydrocarbon compound, (2) a halogenated hydrocarbon compound, (3) an alcohol compound, (4) an ether or acetal compound, (5) a ketone or aldehyde compound, (6) an ester compound, (7) a polyhydric alcohol compound, (8), a carboxylic acid or acid anhydride compound, (9) a phenol compound, (10) a nitrogen-containing compound, (11) a sulfur-containing compound, and (12) a fluorine-containing compound. It is preferable that the peeling solution includes a nitrogen-containing compound, and it is more preferable that the peeling solution includes an acyclic nitrogen-containing compound and a cyclic nitrogen-containing compound.

It is preferable that the acyclic nitrogen-containing compound is an acyclic nitrogen-containing compound having a hydroxyl group. Specific examples of the acyclic nitrogen-containing compound having a hydroxyl group include monoisopropanolamine, diisopropanolamine, triisopropanolamine, N-ethylethanolamine, N,N-dibutylethanolamine, N-butylethanolamine, monoethanolamine, diethanolamine, and triethanolamine. Among these, monoethanolamine, diethanolamine, or triethanolamine is preferable, and monoethanolamine ($H_2NCH_2CH_2OH$) is more preferable. In addition, examples of the cyclic nitrogen-containing compound include isoquinoline, imidazole, N-ethylmorpholine, ε-caprolactam, quinoline, 1,3-dimethyl-2-imidazolidinone, α-picoline, β-picoline, γ-picoline, 2-picoline, 3-picoline, 4-picoline, piperazine, piperidine, pyrazine, pyridine, pyrrolidine, N-methyl-2-pyrrolidone, N-phenylmorpholine, 2,4-lutidine, and 2,6-lutidine. Among these, N-methyl-2-pyrrolidone or N-ethylmorpholine is preferable, and N-methyl-2-pyrrolidone (NMP) is more preferable.

It is preferable that the peeling solution includes an acyclic nitrogen-containing compound and a cyclic nitrogen-containing compound. It is more preferable that the peeling solution includes, as an acyclic nitrogen-containing compound, at least one selected from the group consisting of monoethanolamine, diethanolamine, and triethanolamine and includes, as a cyclic nitrogen-containing compound, at least one cyclic nitrogen-containing compound selected from N-methyl-2-pyrrolidone and N-ethylmorpholine. It is still more preferable that the peeling solution includes monoethanolamine and N-methyl-2-pyrrolidone.

When the peeling solution is removed, the resist pattern formed on the pattern only has to be removed. Even in a case where a deposit as an etching product is attached to a side wall of the pattern, it is not necessary to completely remove the deposit. The deposit refers to an etching product which is attached and deposited to a side wall of the cured composition layer.

In the peeling solution, the content of the acyclic nitrogen-containing compound is preferably 9 parts by mass to 11 parts by mass with respect to 100 parts by mass of the peeling solution, and the content of the cyclic nitrogen-containing compound is preferably 65 parts by mass to 70 parts by mass with respect to 100 parts by mass of the peeling solution. In addition, it is preferable that the peeling solution is obtained by diluting a mixture of the acyclic nitrogen-containing compound and the cyclic nitrogen-containing compound with pure water.

<Solid Image Pickup Element>

A solid image pickup element according to the present invention includes the film according to the present invention. The solid image pickup element according to the present invention is configured to include the film according to the present invention. The configuration of the solid image pickup element is not particularly limited as long as the solid image pickup element functions. For example, the following configuration can be adopted.

The solid image pickup element includes plural photodiodes and transfer electrodes on the support, the photodiodes constituting a light receiving area of the solid image pickup element (for example, a charge coupled device (CCD) image sensor or a complementary metal-oxide semiconductor (CMOS) image sensor), and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film according to the present invention such as an infrared cut filter or an infrared transmitting filter is formed on the device protective film.

Further, a configuration in which light collecting means (for example, a microlens; hereinafter, the same shall be applied) is provided above the device protective film and below the film according to the present invention (on a side thereof close the support), or a configuration in which light collecting means is provided on the film according to the present invention may be adopted.

In addition, the color filter may have a structure in which a cured film which form each color pixel is embedded in a space which is partitioned in, for example, a lattice shape by a partition wall In this case, it is preferable that the partition wall has a low refractive index with respect to each color pixel. Examples of an imaging device having such a structure include a device described in JP2012-227478A and JP2014-179577A.

<Infrared Sensor>

An infrared sensor according to the present invention includes the film according to the present invention. The configuration of the infrared sensor according to the present invention is not particularly limited as long as it includes the film according to the present invention and functions as an infrared sensor.

Hereinafter, an embodiment of the infrared sensor according to the present invention will be described using the drawings.

In FIG. 1, reference numeral 110 represents a solid image pickup element. In an imaging region provided on a solid image pickup element 110, infrared cut filters 111 and infrared transmitting filters 114 are provided. In addition, color filters 112 are laminated on the infrared cut filters 111. Microlenses 115 are disposed on an incidence ray hυ side of the color filters 112 and the infrared transmitting filters 114. A planarizing layer 116 is formed so as to cover the microlenses 115.

Characteristics of the infrared cut filters 111 can be selected depending on the emission wavelength of an infrared light emitting diode (infrared LED) described below. The infrared cut filter can be formed using a composition including an infrared absorber. Examples of the infrared absorber include the near infrared absorbing colorant polymer according to the present invention and the other infrared absorber described above regarding the composition according to the present invention.

The color filters 112 is not particularly limited as long as pixels which allow transmission of light having a specific wavelength in the visible range and absorbs the light are formed therein, and well-known color filters of the related art for forming an image can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected depending on the emission wavelength of the infrared LED described below.

For example, the following description will be made assuming that the emission wavelength of the infrared LED is 830 nm.

A maximum value of a light transmittance of the infrared transmitting filter 114 in the thickness direction of the film in a wavelength range of 400 to 650 nm is preferably 30% or lower, more preferably 20% or lower, still more preferably 10% or lower and even still more preferably 0.1% or lower. It is preferable that the transmittance satisfies the above-described conditions in the entire wavelength range of 400 to 650 nm.

A minimum value of a light transmittance of the infrared transmitting filter 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in at least a part of a wavelength range of 800 nm or longer, and it is more preferable that the transmittance satisfies the above-described conditions at a wavelength corresponding to the emission wavelength of the infrared LED. The minimum value of the light transmittance in a wavelength range of 900 to 1300 nm is typically 99.9% or lower.

The thickness of the infrared transmitting filter 114 is preferably 100 μm or less, more preferably 15 μm or less, still more preferably 5 μm or less, and even still more preferably 1 μm or less. The lower limit value is preferably 0.1 μm. In a case where the thickness is in the above-described range, the film can satisfy the above-described spectral characteristics.

A method of measuring the spectral characteristics, the thickness, and the like of the infrared transmitting filter 114 is as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 to 1300 nm using an ultraviolet-visible-near infrared spectrophotometer (U-4100, manufactured by Hitachi High-Technologies Corporation).

The infrared transmitting filter 114 having the above-described spectral characteristics can be formed using a composition including the coloring material that shields visible light. The details of the coloring material that shields visible light are the same as the range described above regarding the composition according to the present invention.

In addition, for example, in a case where the emission wavelength of the infrared LED is 940 nm, it is preferable that a maximum value of a light transmittance of the infrared transmitting filter 114 in a thickness direction in a wavelength range of 450 to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1000 to 1300 nm is 70% or higher.

The infrared transmitting filter 114 having the above-described spectral characteristics can be manufactured using a composition including the coloring material that shields visible light and an infrared absorber having a maximal absorption in a wavelength range of 750 to 950 nm. The details of the coloring material that shields visible light are the same as the range described above regarding the composition according to the present invention. Examples of the infrared absorber include the near infrared absorbing colorant polymer according to the present invention and the other infrared absorber described above regarding the composition according to the present invention.

The patterns of the infrared cut filters, the color filters, and the infrared transmitting filters used in the infrared sensor shown in FIG. 1 can be formed, for example, as follows.

Figure 2:
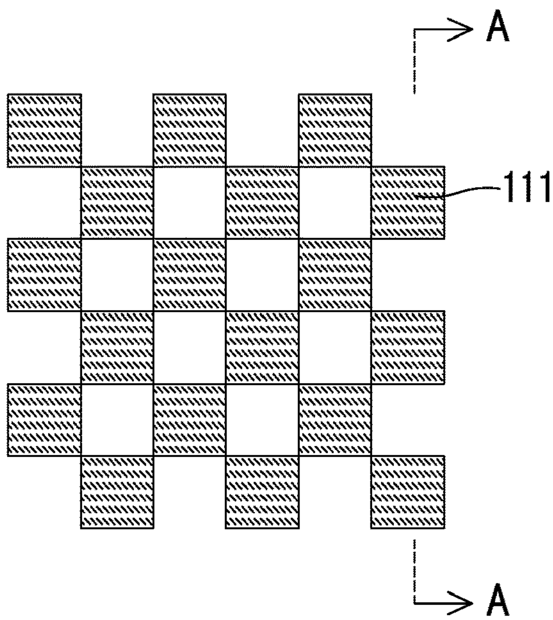
FIG. 2 is a diagram (plan view) showing a step of forming a pattern.
Figure 3:
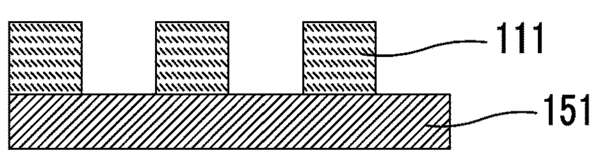
FIG. 3 is a cross-sectional view taken along line A-A of FIG. 2.

First, a composition for forming the infrared cut filter (infrared absorbing composition) is applied to the support 151 to form an infrared absorbing composition layer. Next, a pattern is formed on the infrared absorbing composition layer as shown in FIGS. 2 and 3. The pattern forming method may be any one of the photolithography method and the dry etching method. In FIGS. 2 and 3, a Bayer (lattice) pattern is formed on the infrared absorbing composition layer. However, a shape of the pattern can be appropriately selected according to the use.

Figure 4:
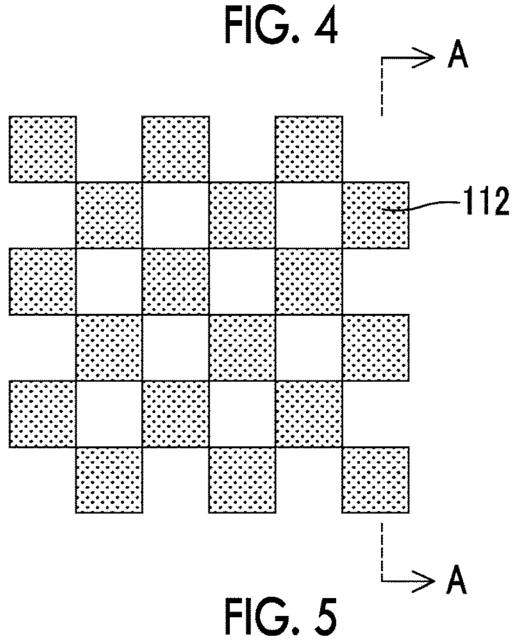
FIG. 4 is a diagram (plan view) showing a step of forming a pattern.
Figure 5:
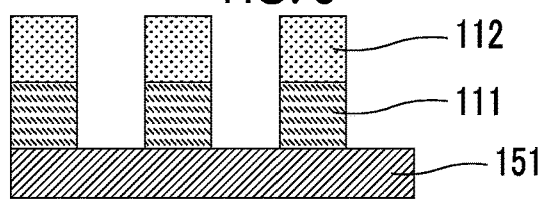
FIG. 5 is a cross-sectional view taken along line A-A of FIG. 4.

Next, a composition (coloring composition) for forming the color filter is applied to the Bayer pattern (the infrared cut filters 111) of the infrared absorbing composition layer to form a coloring composition layer thereon. Next, as shown in FIGS. 4 and 5, the coloring composition layer is patterned to form a Bayer pattern (the color filters 112) of the coloring composition layer on the Bayer pattern (the infrared cut filters 111) of the infrared absorbing composition layer. The pattern forming method may be any one of the photolithography method and the dry etching method and is preferably the photolithography method.

Figure 6:
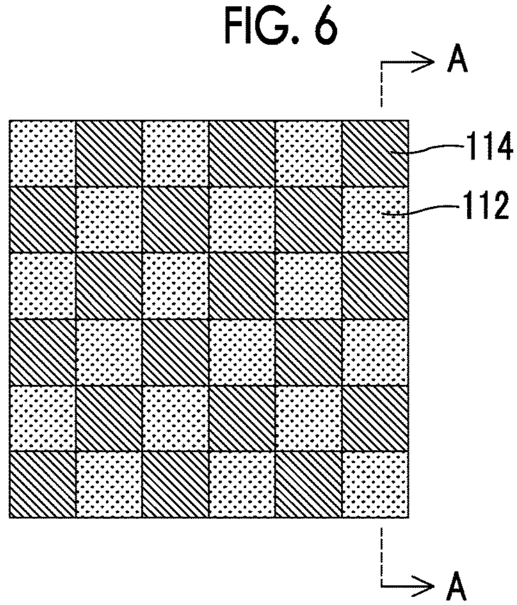
FIG. 6 is a diagram (plan view) showing a step of forming a pattern.
Figure 7:
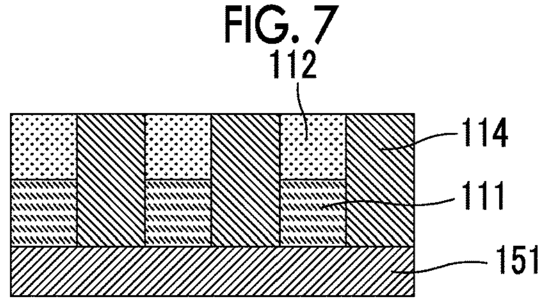
FIG. 7 is a cross-sectional view taken along line A-A of FIG. 6.

Next, a composition for forming the infrared transmitting filter is applied to the films on which the color filters 112 are formed to form a composition layer thereon. Next, as shown in FIGS. 6 and 7, the composition layer is patterned to form a pattern of the infrared transmitting filters 114 on a portion where the Bayer pattern of the infrared cut filters 111 is not formed.

In addition, in the embodiment shown in FIG. 1, the color filters 112 are provided on the incidence ray hυ side compared to the infrared cut filter 111. The lamination order of the infrared cut filter 111 and the color filters 112 may be reversed, and the infrared cut filter 111 may be provided on the incidence ray hυ side compared to the color filters 112.

In addition, in the embodiment shown in FIG. 1, the infrared cut filters 111 and the color filters 112 are laminated adjacent to each other. However, the infrared absorbing filters 111 and the color filters 112 are not necessarily provided adjacent to each other. The infrared cut filters 111 may be formed on another support other than the support on which the color filters 112 are formed. As the support, any transparent substrate can be preferably used. In addition, a transparent substrate including copper, a substrate which includes a transparent layer including copper, or a substrate on which a band pass filter is formed can also be used.

In addition, in a case where the infrared cut filter 111 further has a function as a color filter by including a chromatic colorant, the color filters 112 are not necessarily provided.

<Image Display Device>

The film (preferably the infrared cut filter) according to the present invention can also be used in an image display device such as a liquid crystal display device or an organic electroluminescence (organic EL) display device. For example, by using the film according to the present invention in combination with the respective colored pixels (for example, red, green, blue), the infrared cut filter can be used in order to shield infrared light included in light emitted from a backlight (for example, a white light emitting diode (white LED)) of an image display device to prevent a malfunction of a peripheral device. In addition, the film according to the present invention can also be used in order to form an infrared pixel in addition to the colored pixels.

The definition of the image display device and the details of each image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices descried in "Next-Generation Liquid Crystal Display Techniques".

The image display device may include a white organic EL element. It is preferable that the white organic EL element has a tandem structure. The tandem structure of the organic EL element is described in, for example, JP2003-45676A, or pp. 326-328 of "Forefront of Organic EL Technology Development—Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

<Measurement of Weight-Average Molecular Weight (Mw)>

The weight-average molecular weight (Mw) was measured using the following method.

Kind of column: Tsk gel Super HZM-M, TSK gel Super HZ4000, TSK gel Super HZ3000, and TSK gel Super HZ2000 (all of which are manufactured by Tosoh Corporation) connected in series Developing solvent: tetrahydrofuran Column temperature: 40° C.

Flow rate (sample injection volume): 0.35 ml/min (10 μl)

Device name: HLC-8220 GPC (manufactured by Tosoh Corporation)

Calibration curve base resin: polystyrene

Synthesis of Near Infrared Absorbing Colorant Polymer

Synthesis Example 1

A monomer (A-ppb-1-M) was synthesized according to the following scheme.

In the following synthesis scheme, THF represents tetrahydrofuran, DMAc represents dimethylacetamide, and V-601 represents dimethyl 2,2'-azobis(isobutyrate) (manufactured by Wako Pure Chemical Industries, Ltd.).

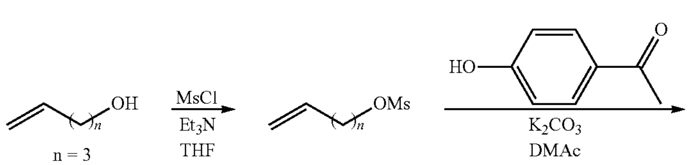

-continued
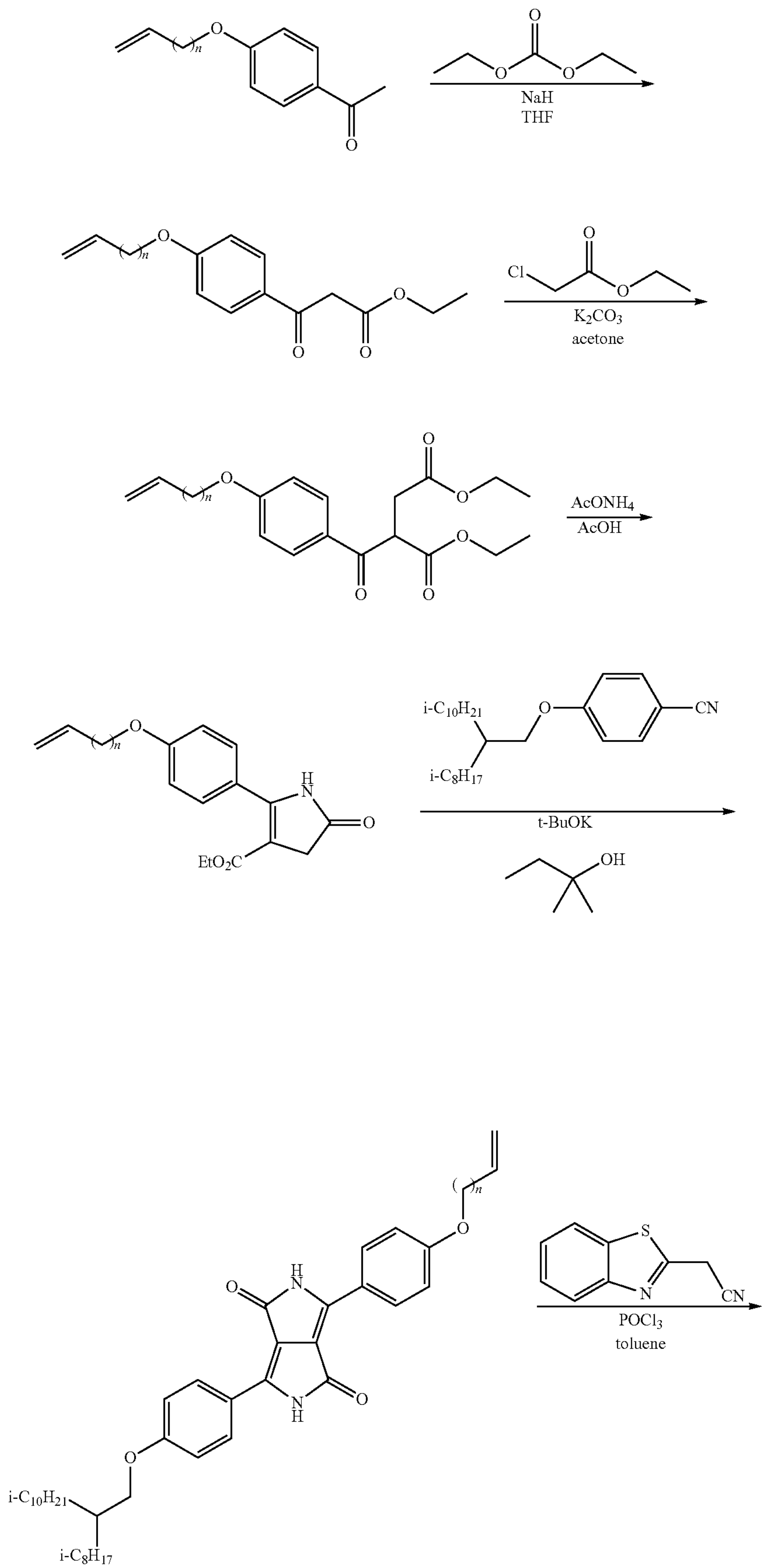

-continued
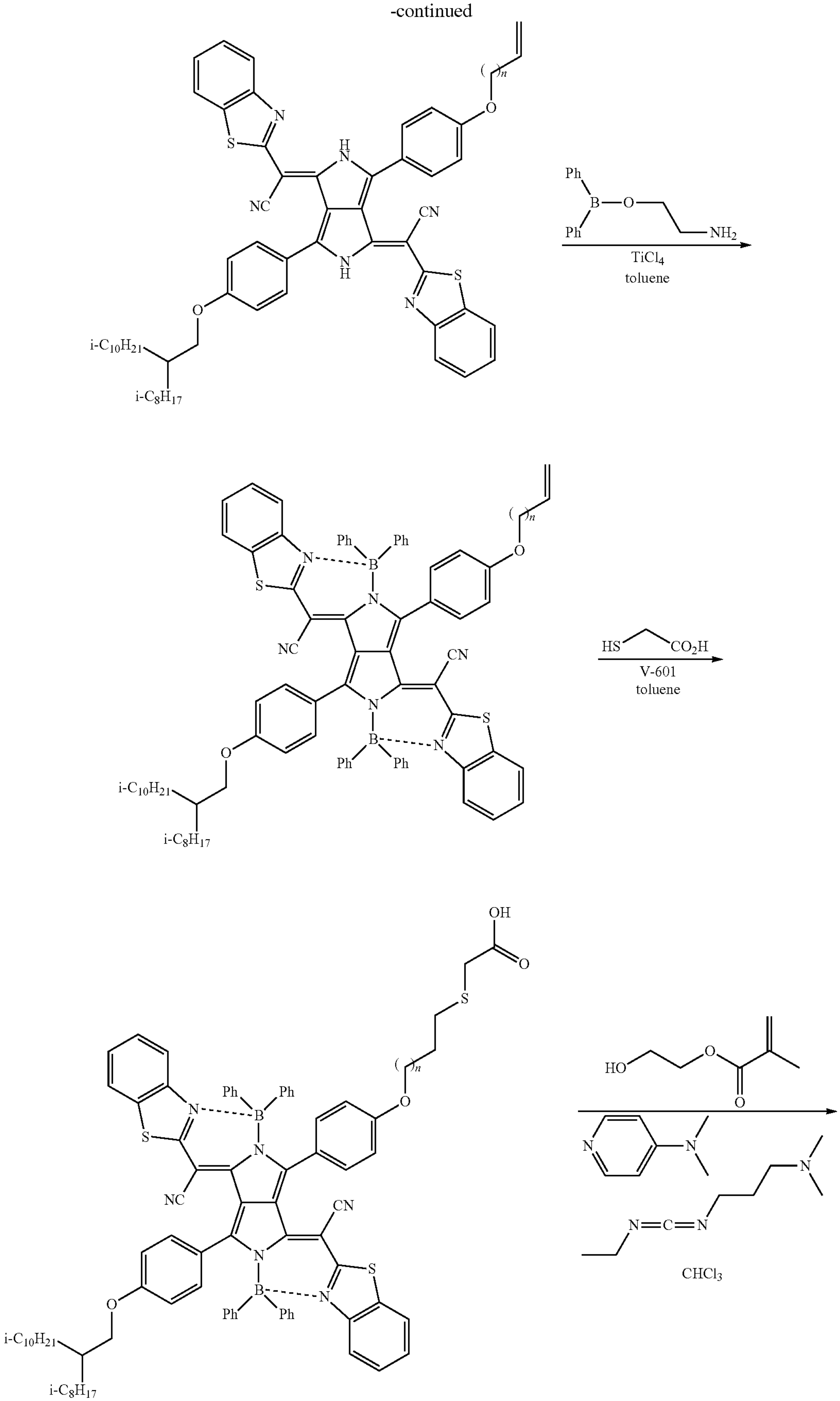

-continued
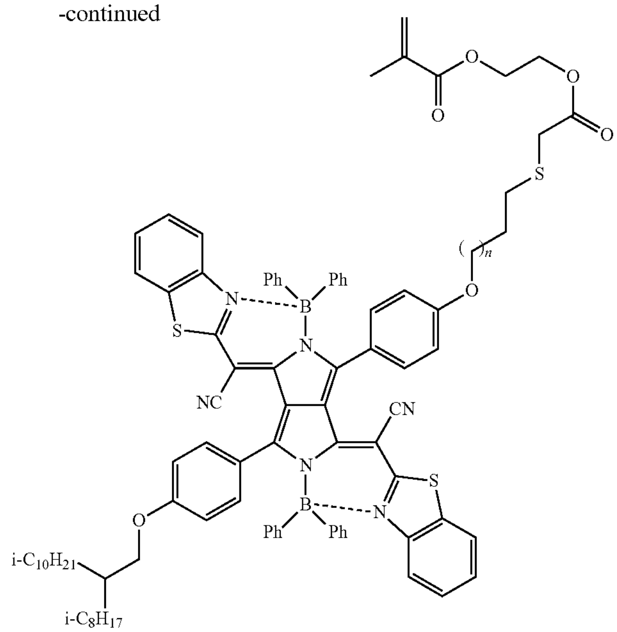
(A-ppb-1-M)
According to the following synthesis scheme, near infrared absorbing colorant polymers (A-ppb-1-P1) and (A-ppb-1-P2) were synthesized.
In the following synthesis scheme, V-601 represents dimethyl 2,2'-azobis(isobutyrate) (manufactured by Wako Pure Chemical Industries, Ltd.), and PGMEA represents propylene glycol methyl ether acetate.
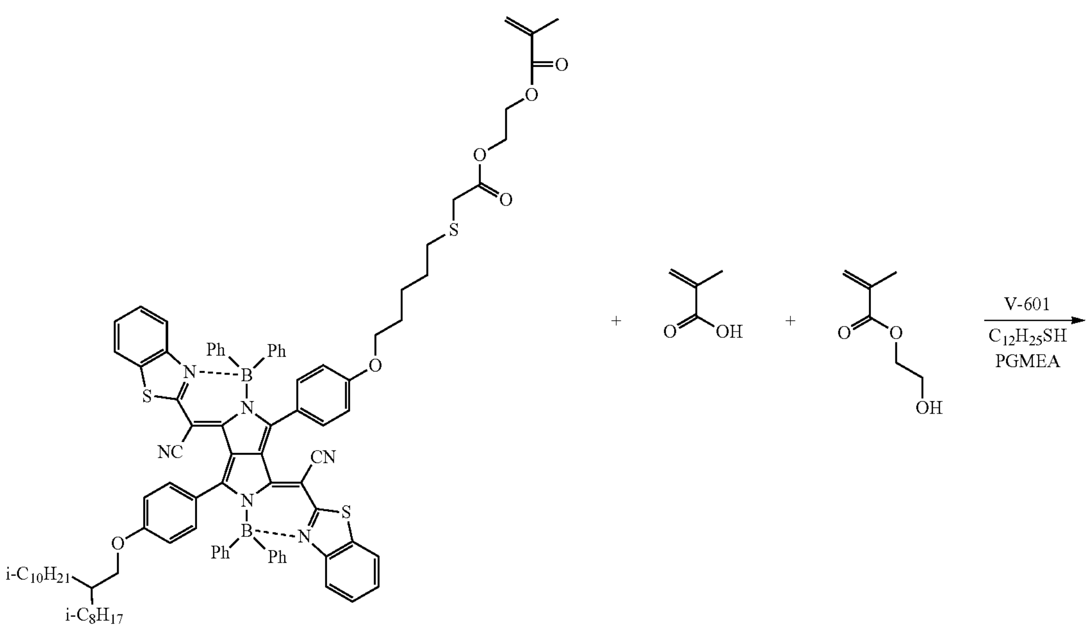
(A-ppb-1-$M_1$)

-continued
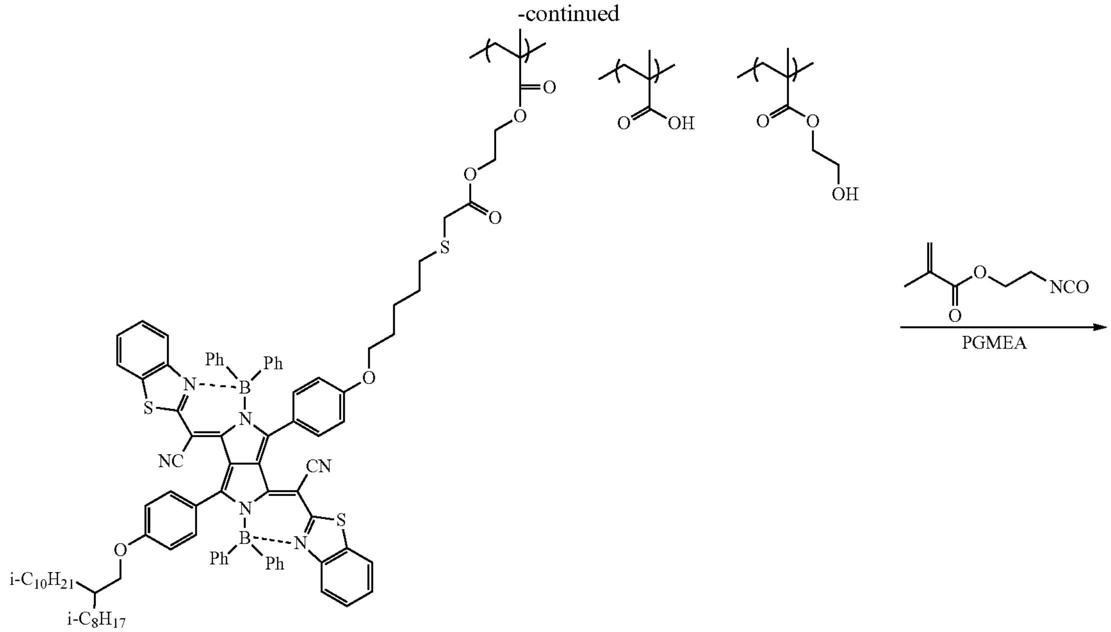
(A-ppb-1-P$_1$)
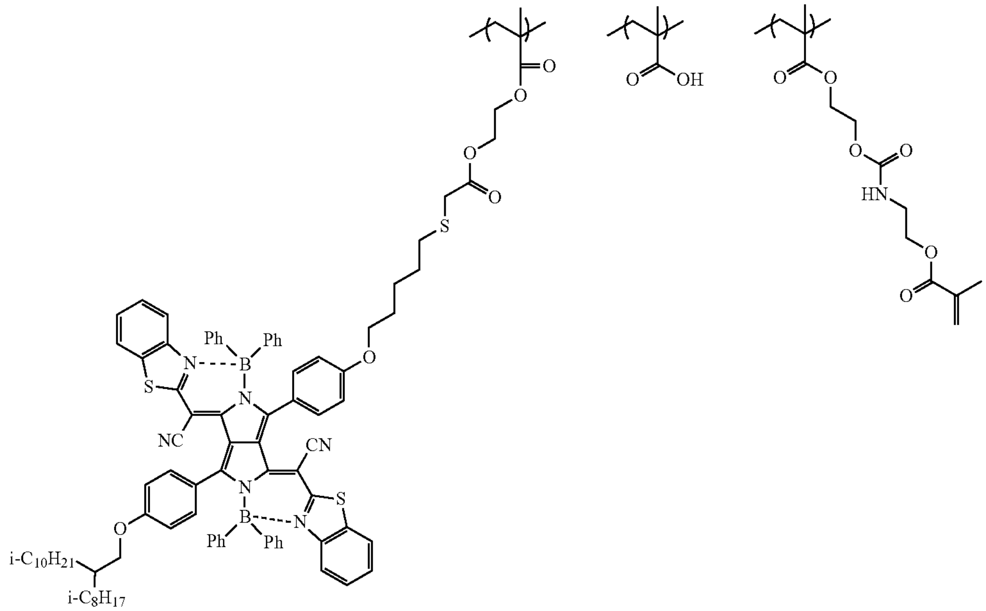
(A-ppb-1-P$_2$)

Synthesis Example 2
Near infrared absorbing colorant polymers (A-sq-6-P2), (A-cy-10-P2), (A-ox-1-P2), (A-ph-5-P2), (A-na-4-P2), (A-di-1-P2), and (A-ppb-1/sq-6-P2) were synthesized using the same method as in Synthesis Example 1, except that the following monomers were used instead of the monomer (A-ppb-1-M).
Monomers: the following structures
(A-sq-6-M)
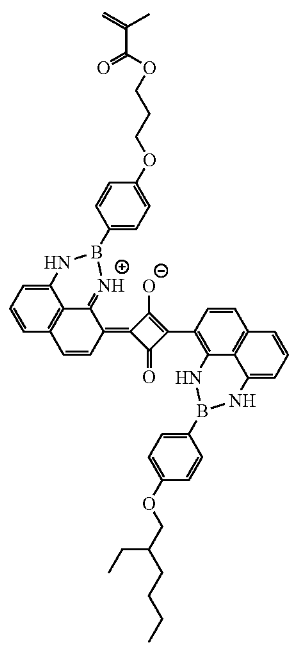
(A-cy-10-M)
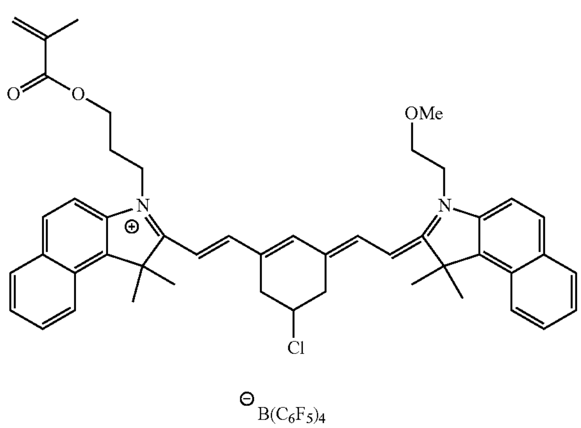
-continued
(A-ox-1-M)
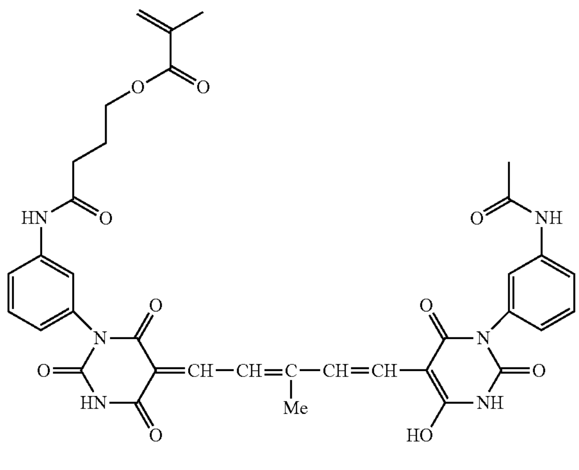
(A-ph-5-M)
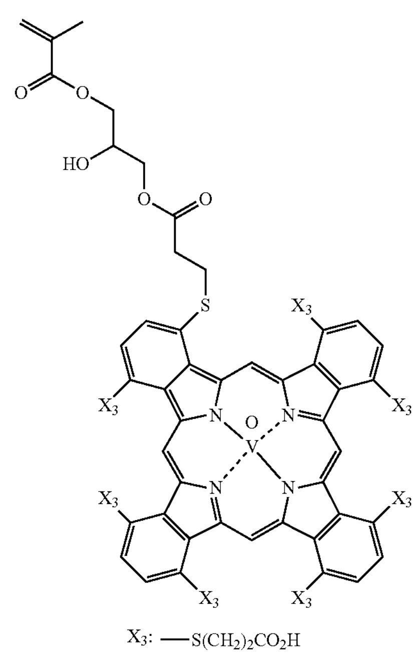

-continued
(A-na-4-M)
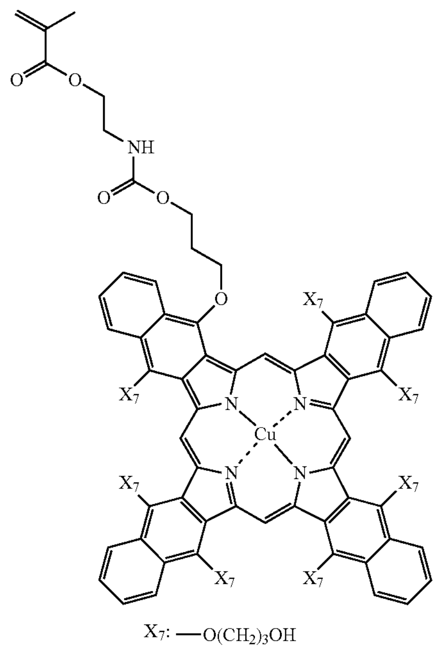
-continued
(A-di-1-M)
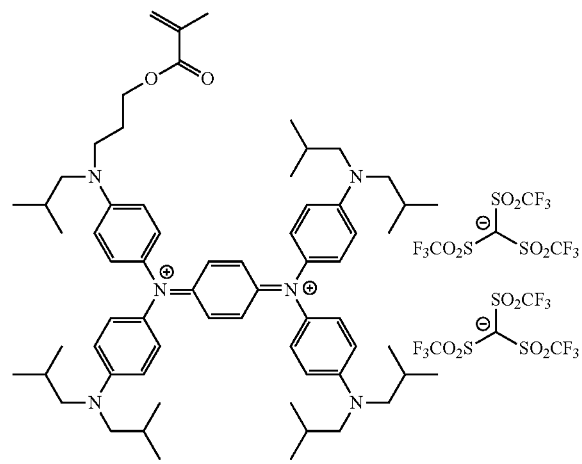
Near infrared absorbing colorant polymers (A-sq-6-P2), (A-cy-10-P2), (A-ox-1-P2), (A-ph-5-P2), (A-na-4-P2), (A-di-1-P2), and (A-ppb-1/sq-6-P2): the following structures
(A-sq-6-$P_2$)
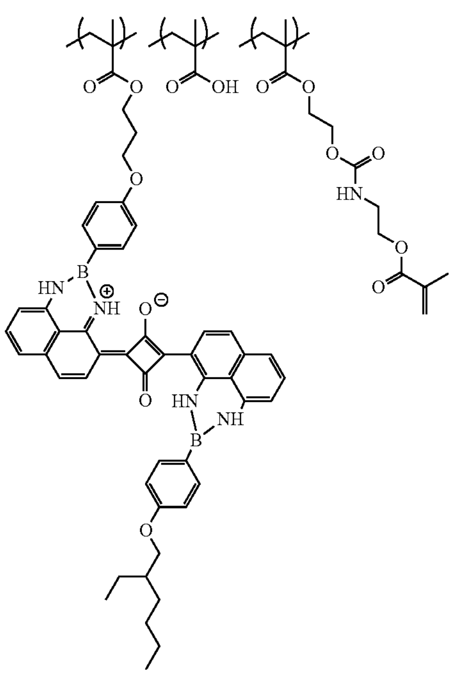

-continued
(A-cy-10-$P_2$)
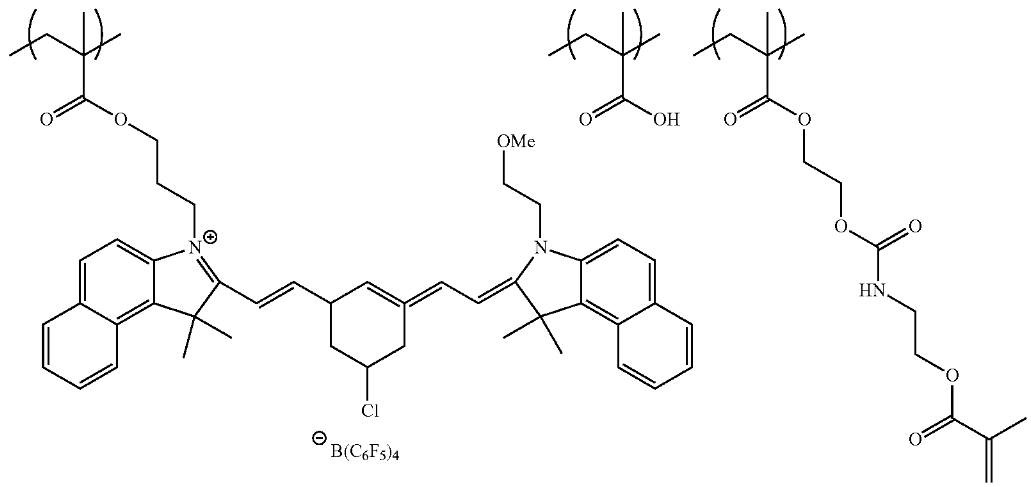
(A-ox-1-$P_2$)
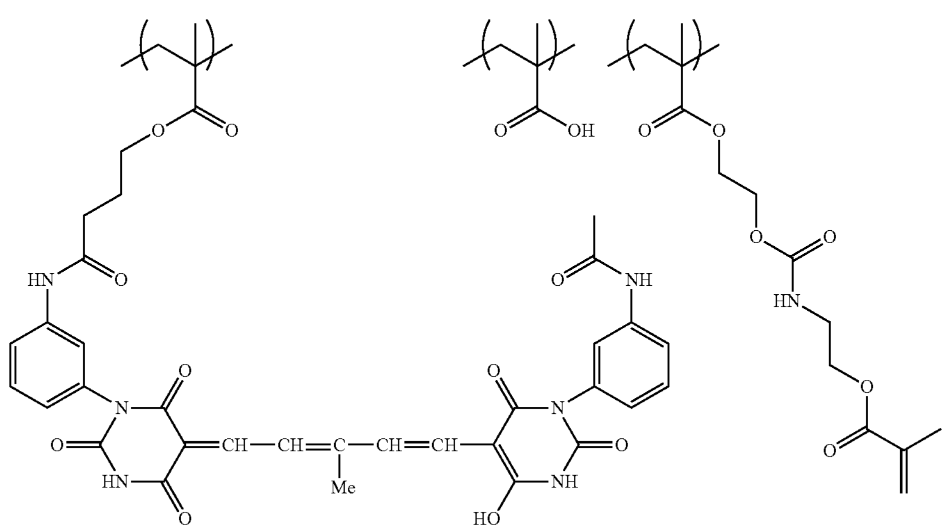

-continued
(A-ph-5-P$_2$)
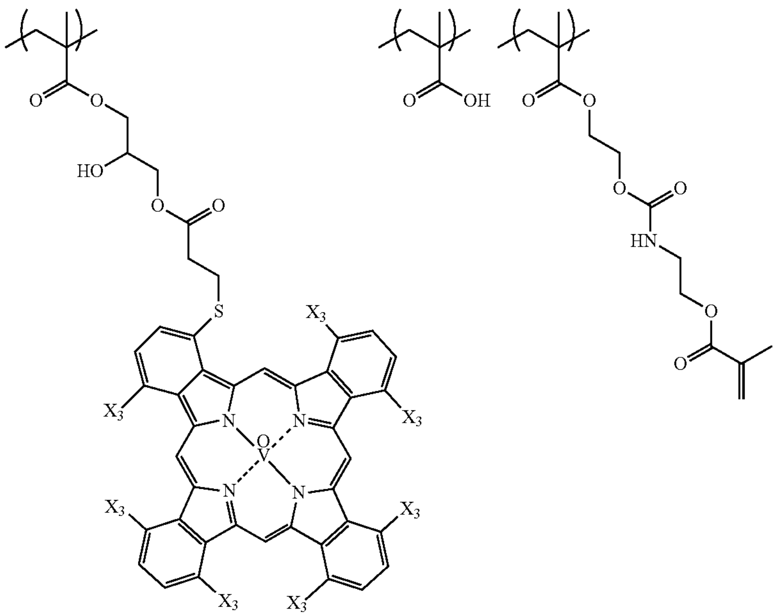
$X_3$: —$S(CH_2)_2CO_2H$
(A-na-4-P$_2$)
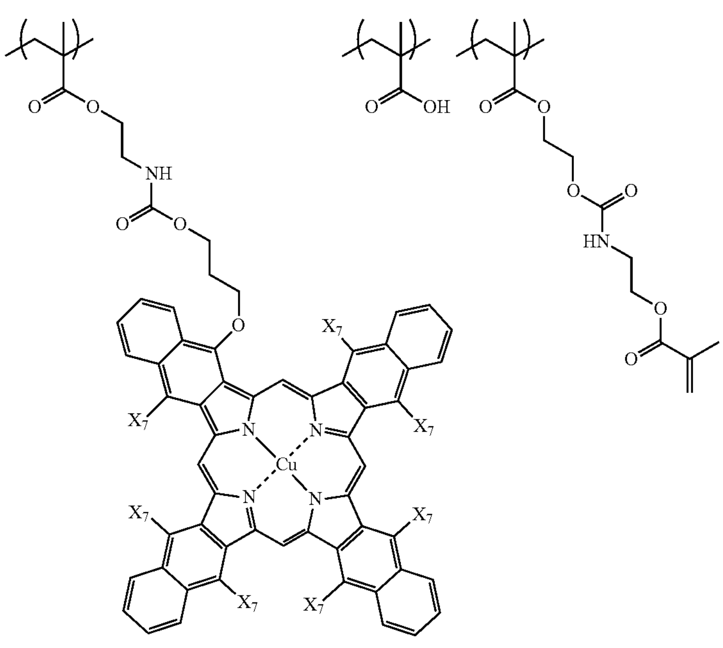
$X_7$:—$O(CH_2)_3OH$ -continued
(A-di-1-P$_2$)
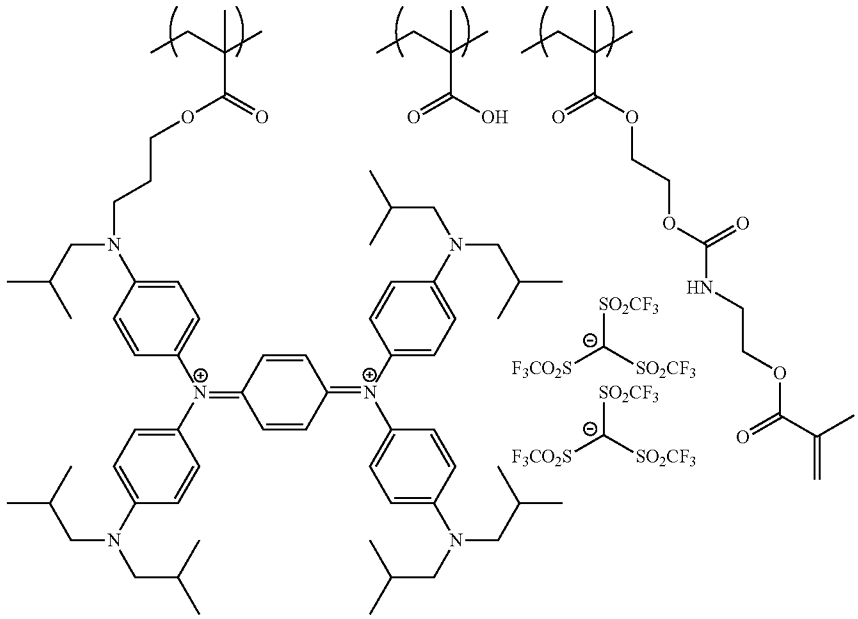
(A-ppd-1/sq-6-P$_2$)
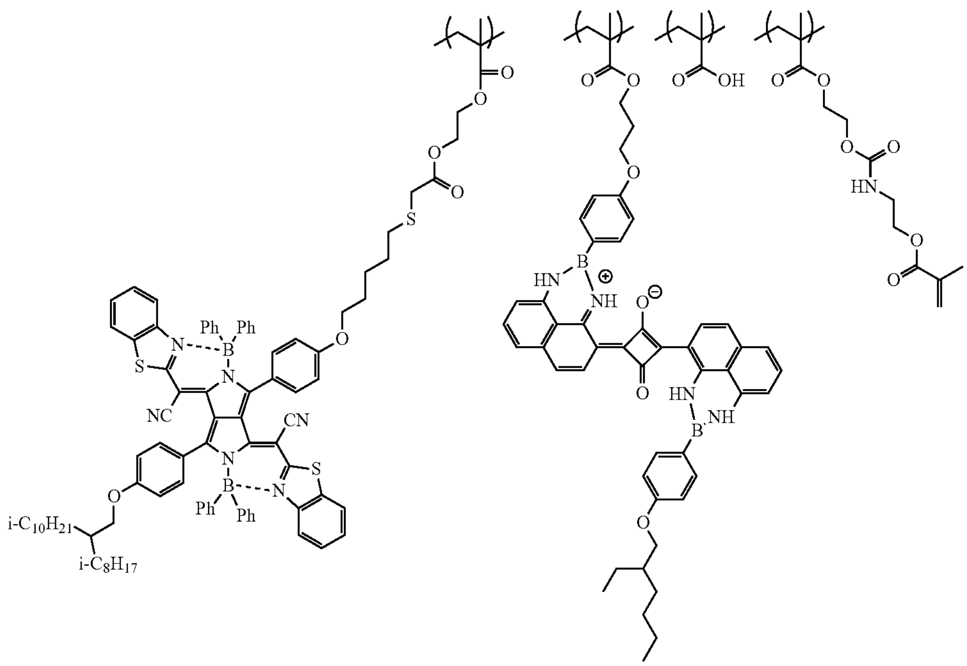

Synthesis Example 3
Near infrared absorbing colorant polymers (B-ppb-1-P2), (B-sq-5-P2), (B-cy-10-P2), (B-ox-1-P2), (B-ph-1-P2), (B-na-3-P2), and (B-di-1-P2) were synthesized using the same method as in Synthesis Example 1, except that the following monomers were used instead of the monomer (A-ppb-1-M).
Monomers: the following structures
(B-ppb-1-M)
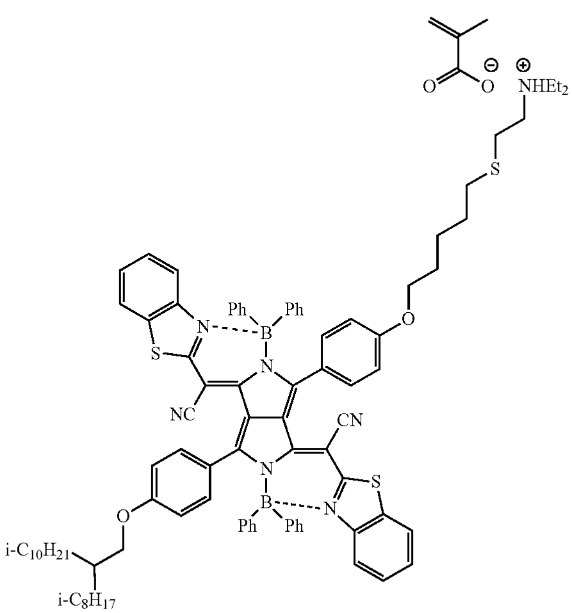
(B-sq-5-M)
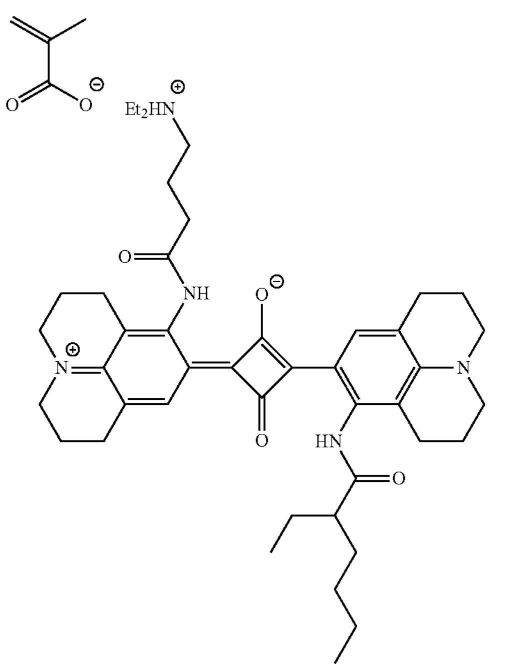
-continued
(B-cy-10-M)
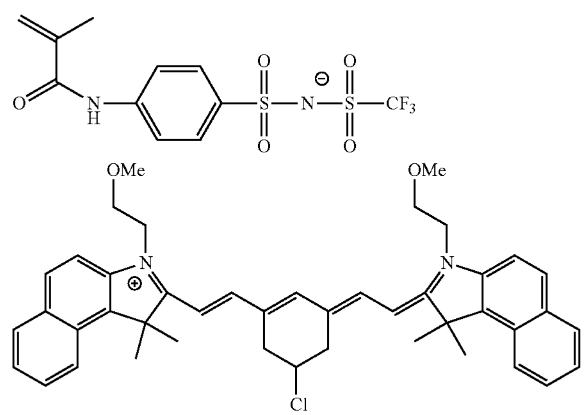
(B-ox-1-M)
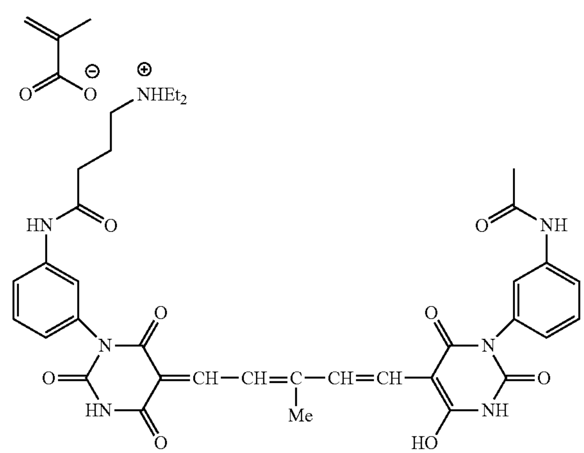
(B-ph-1-M)
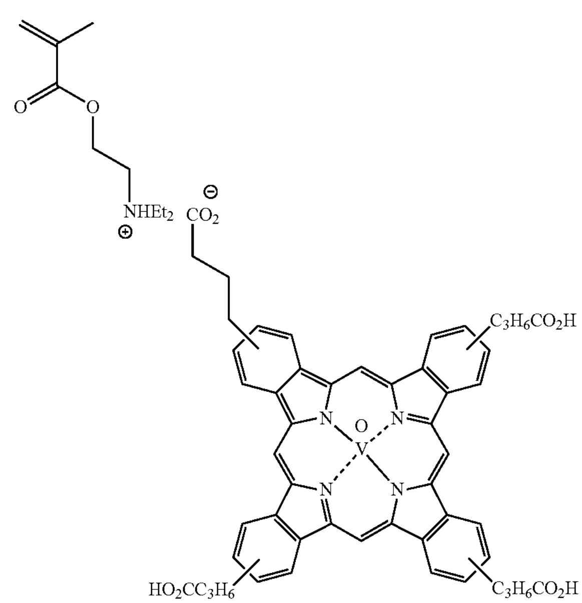

-continued
(B-na-3-M)
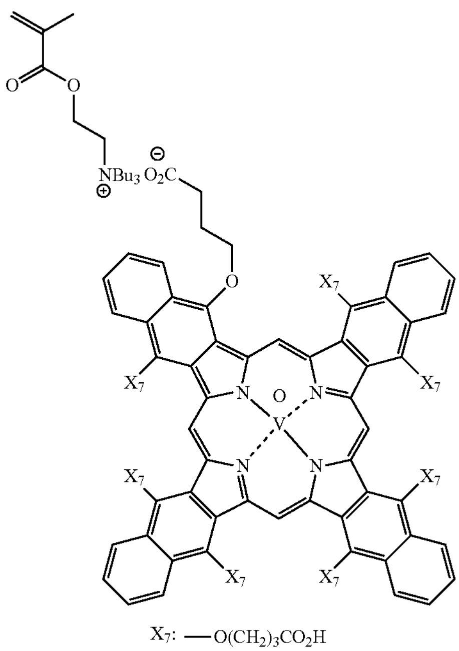
(B-di-1-M)
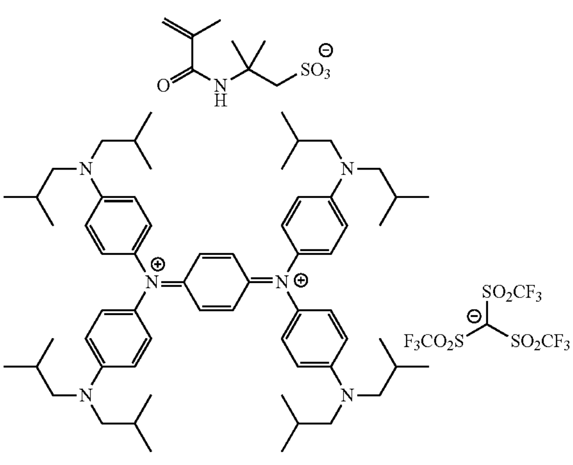
Near infrared absorbing colorant polymers (B-ppb-1-P2), (B-sq-5-P2), (B-cy-10-P2), (B-ox-1-P2), (B-ph-1-P2), (B-na-3-P2), and (B-di-1-P2): the following structures
(B-ppd-1-$P_2$)
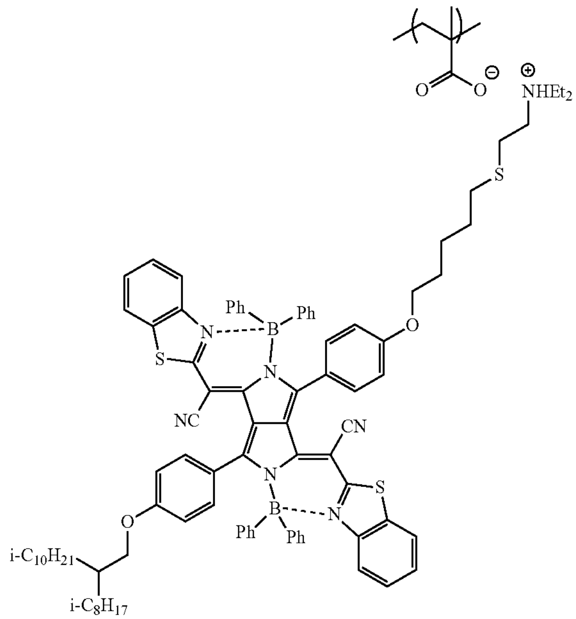
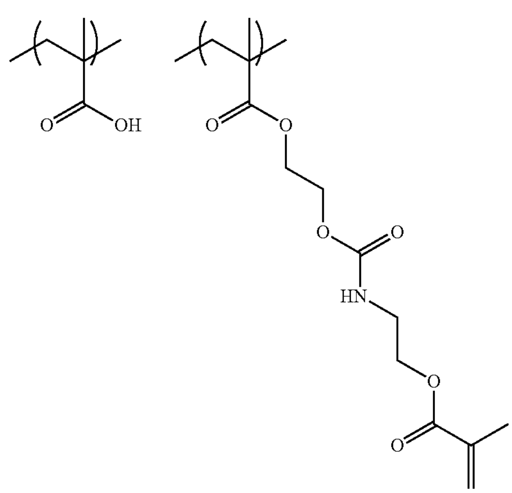

-continued
(B-sq-5-P$_2$)
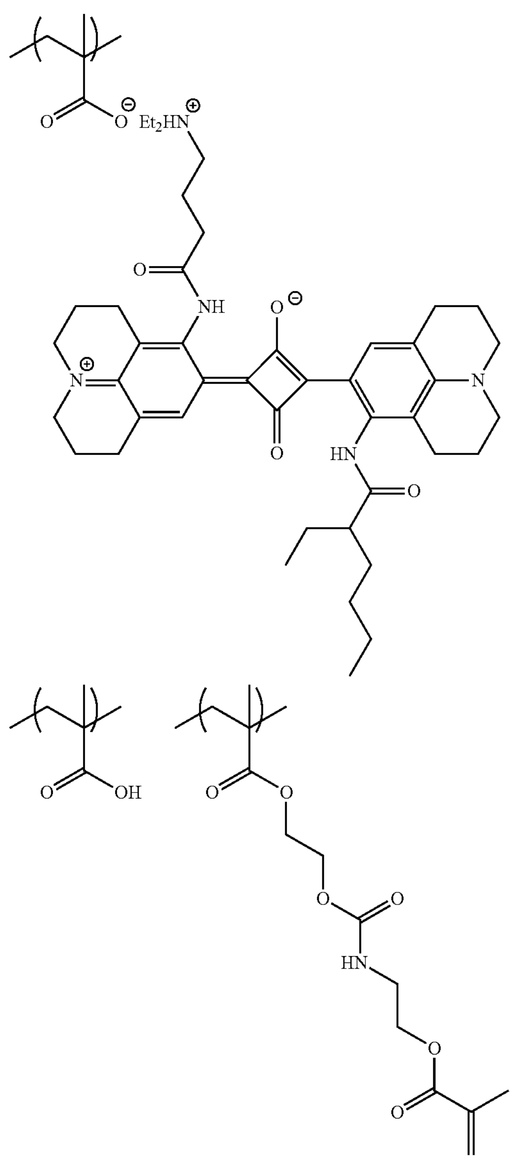
(B-cy-10-P$_2$)
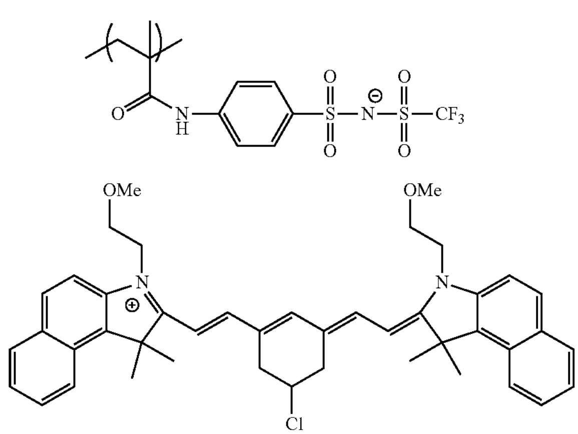
-continued
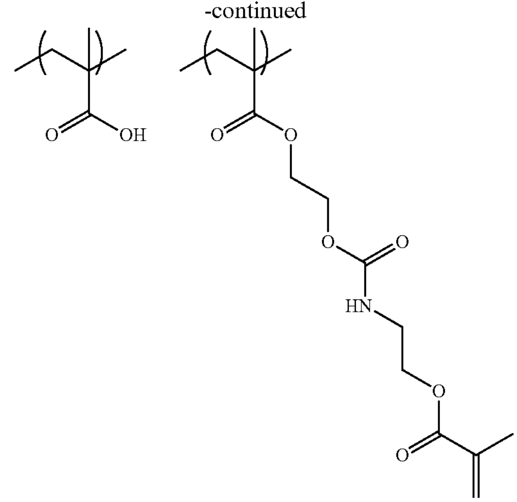
(B-ox-1-P$_2$)
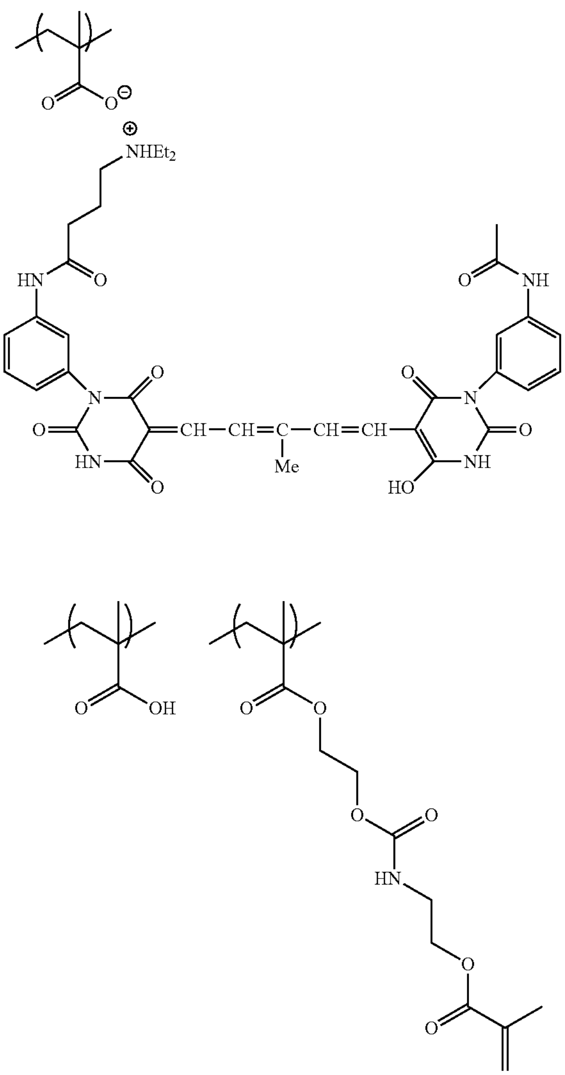

-continued
(B-ph-1-P2)
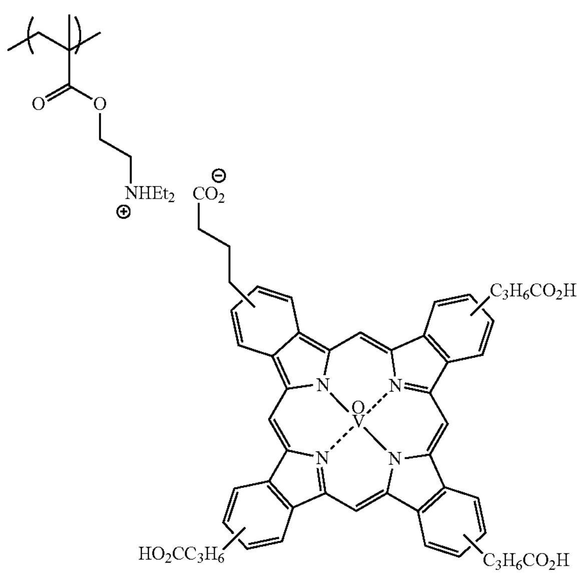
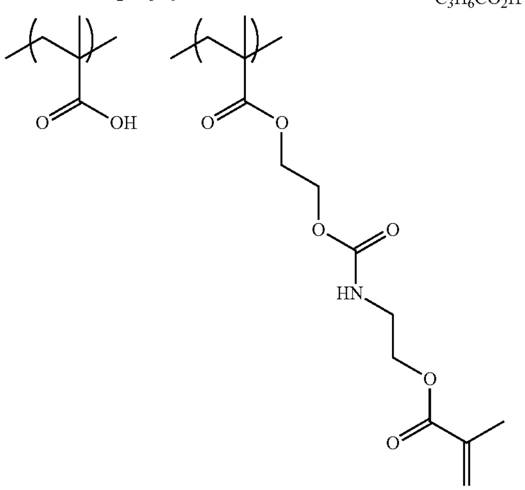
(B-na-3-P2)
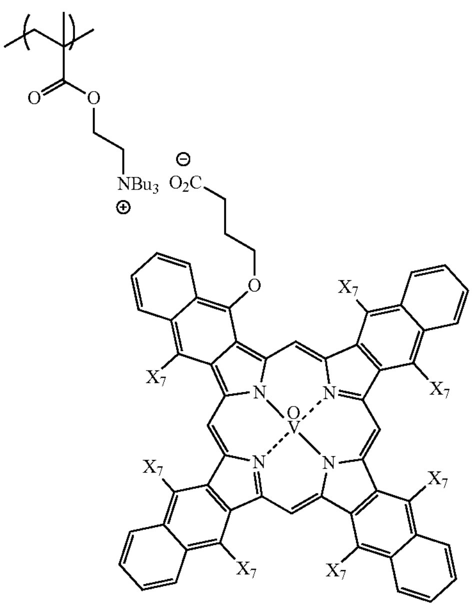
X7: —O(CH2)3CO2H
-continued
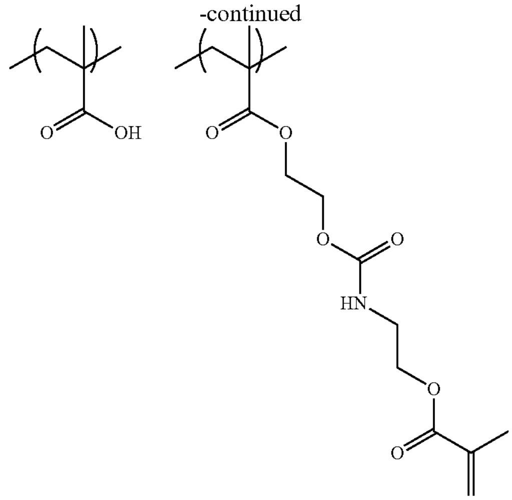
(B-di-1-P2)
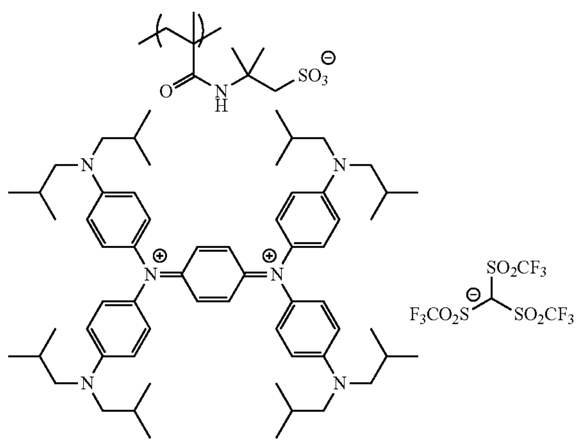
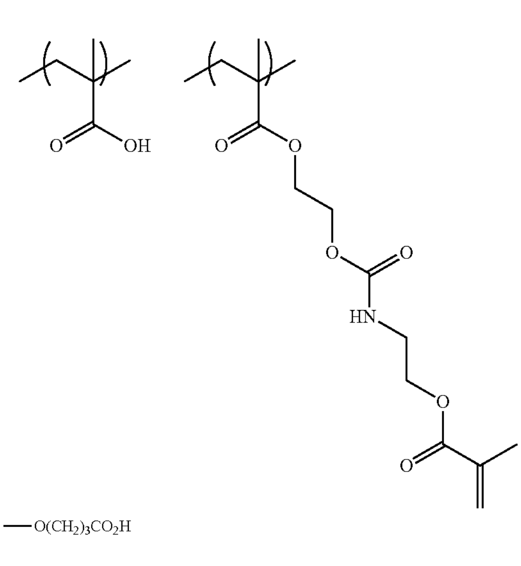

Synthesis Example 4
A monomer (C-ppb-1-M) was synthesized according to the following scheme.
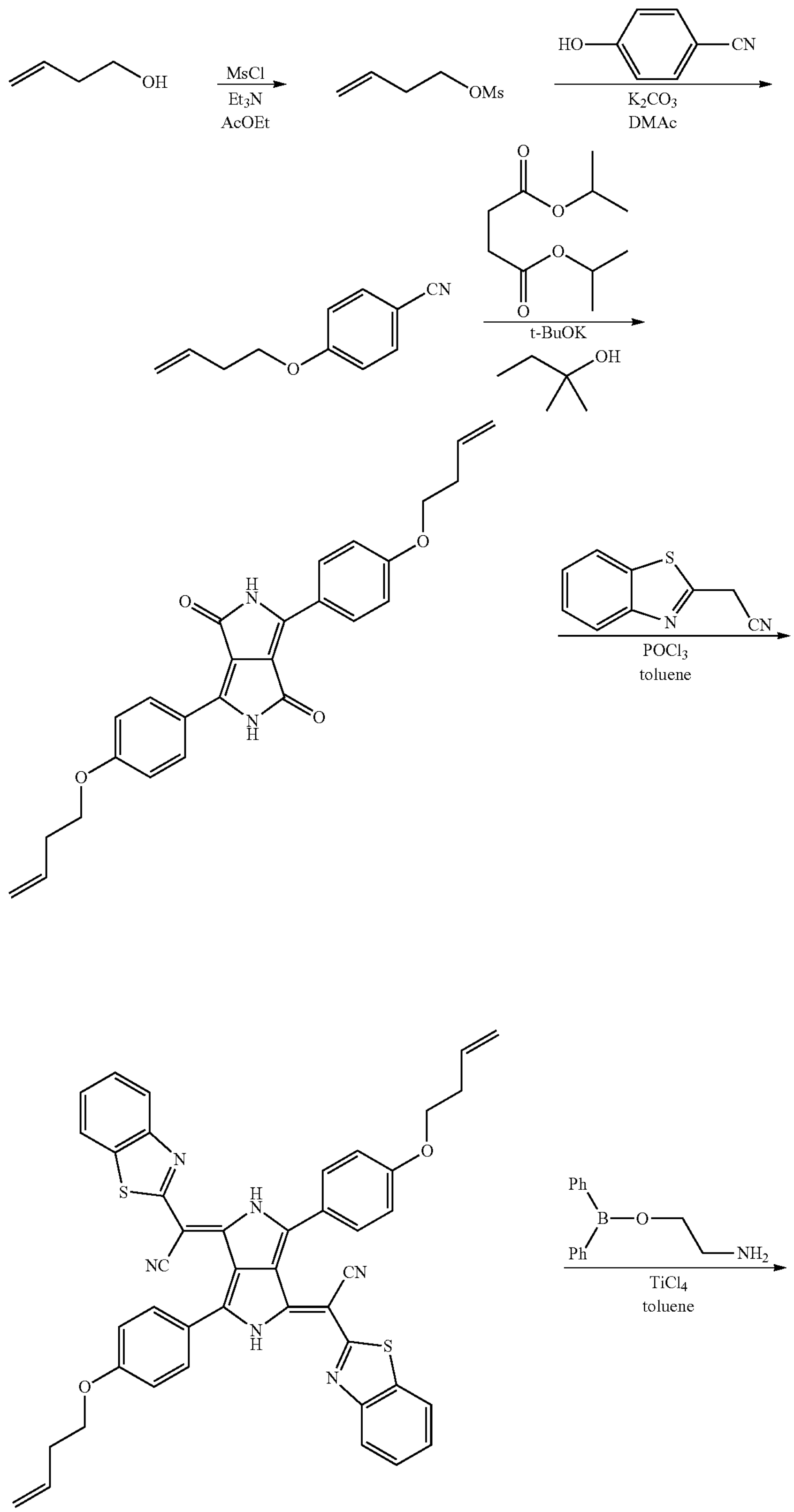

-continued
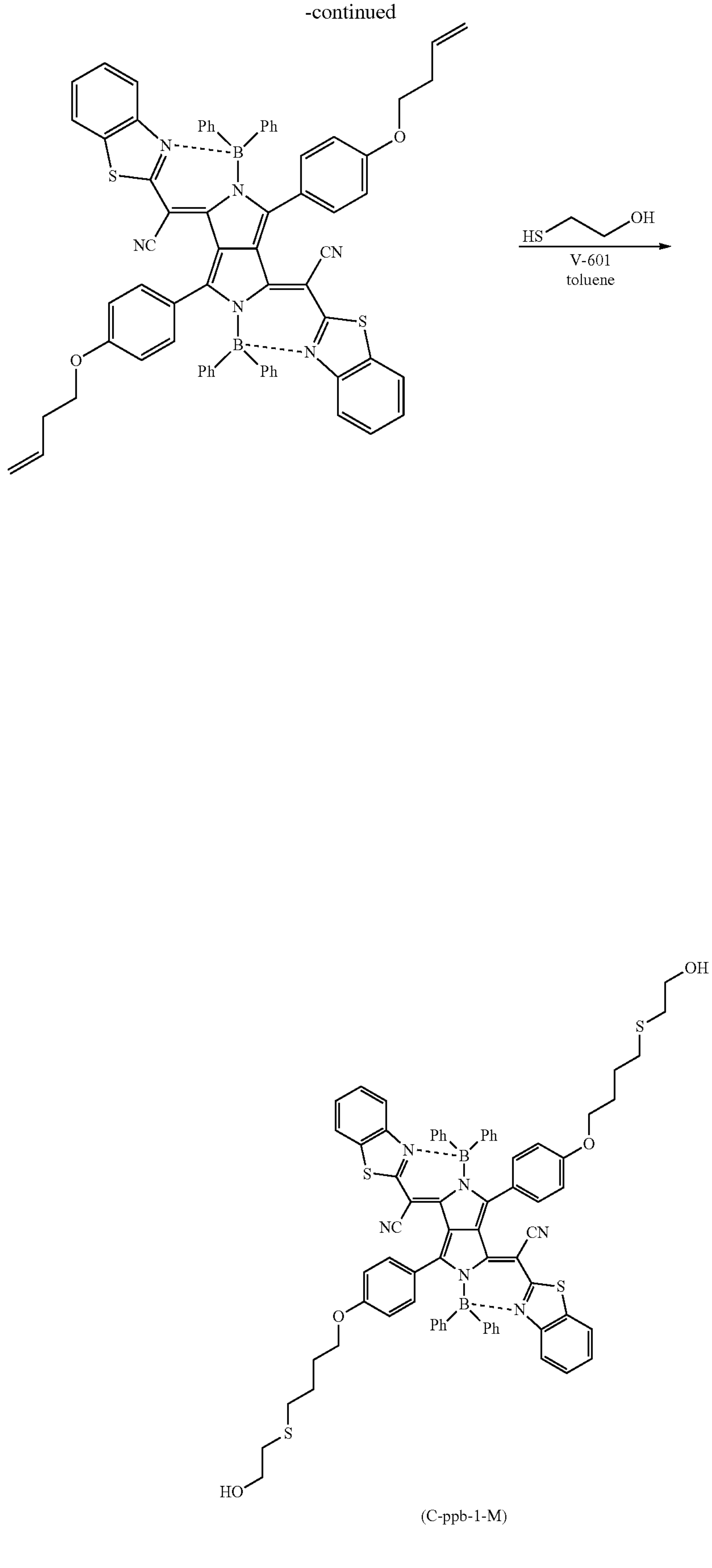
(C-ppb-1-M)

According to the following synthesis scheme, a near infrared absorbing colorant polymer (C-ppb-1-P) was synthesized.
In the formula, an arbitrary * site is linked to an arbitrary ** site.
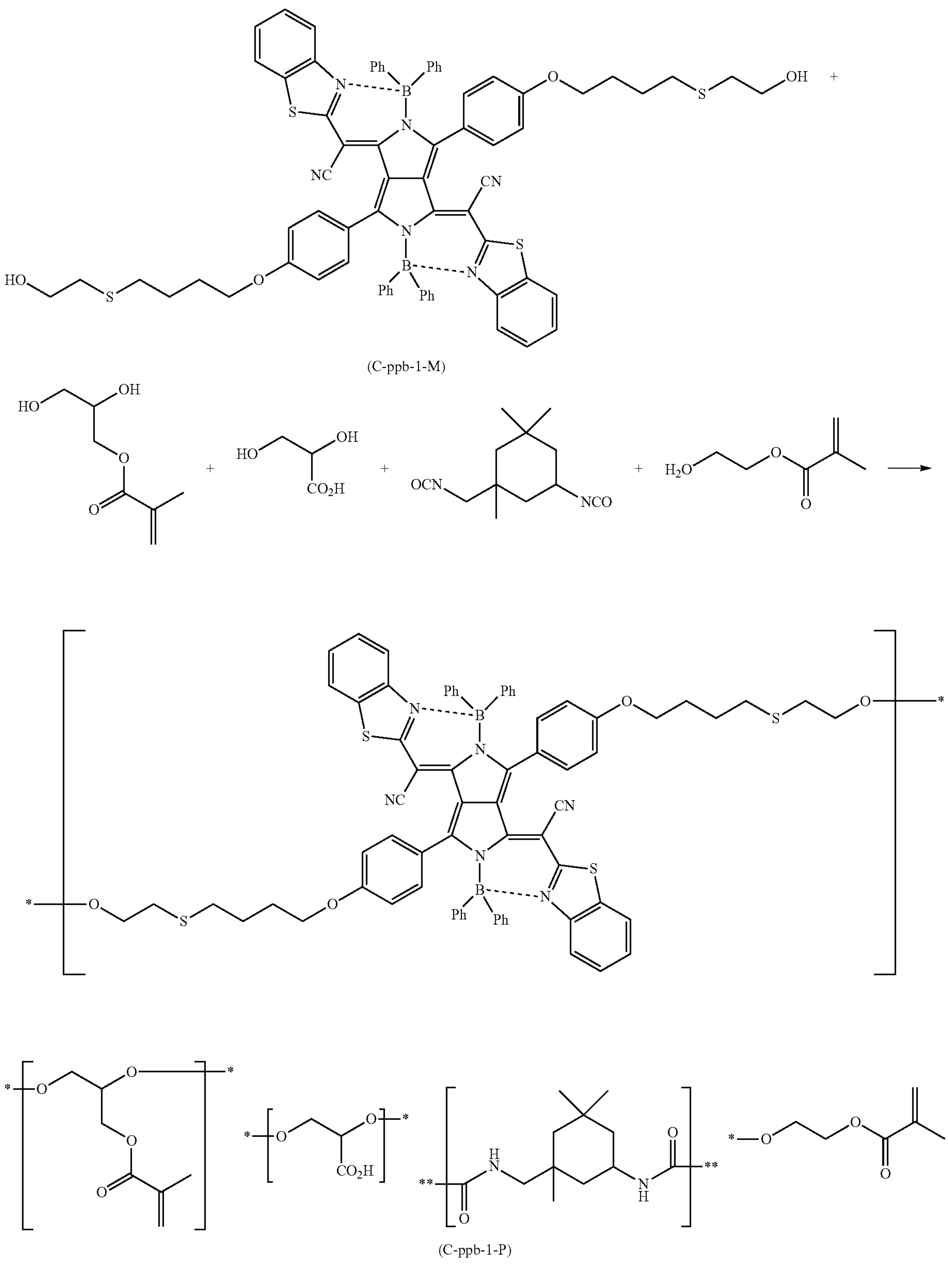
(C-ppb-1-M)
(C-ppb-1-P)

Synthesis Example 5
Near infrared absorbing colorant polymers (C-sq-6-P), (C-cy-8-P), (C-ox-3-P), (C-ph-1-P), (C-na-1-P), and (C-di-1-P) were synthesized using the same method as in Synthesis Example 4, except that the following monomers were used instead of the monomer (C-ppb-1-M).
Monomers: the following structures
(C-sq-6-M)
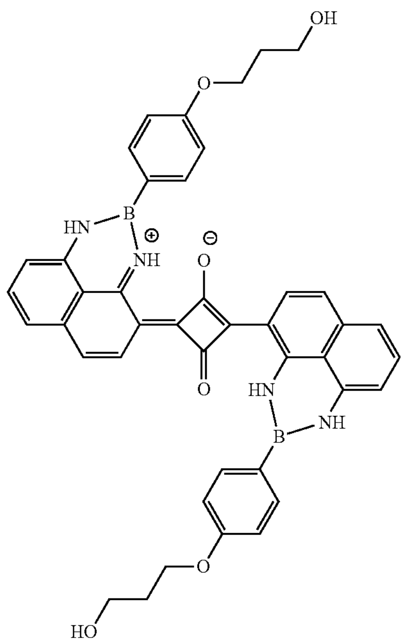
(C-cy-8-M)
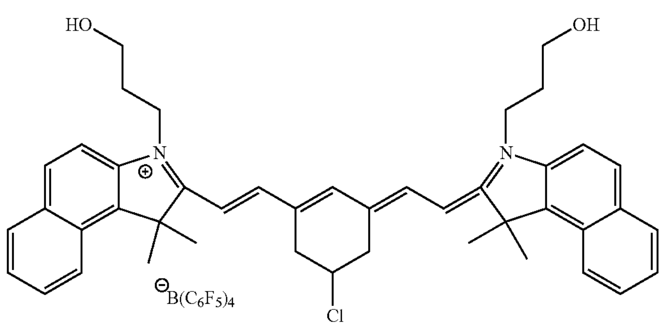
(C-ox-3-M)
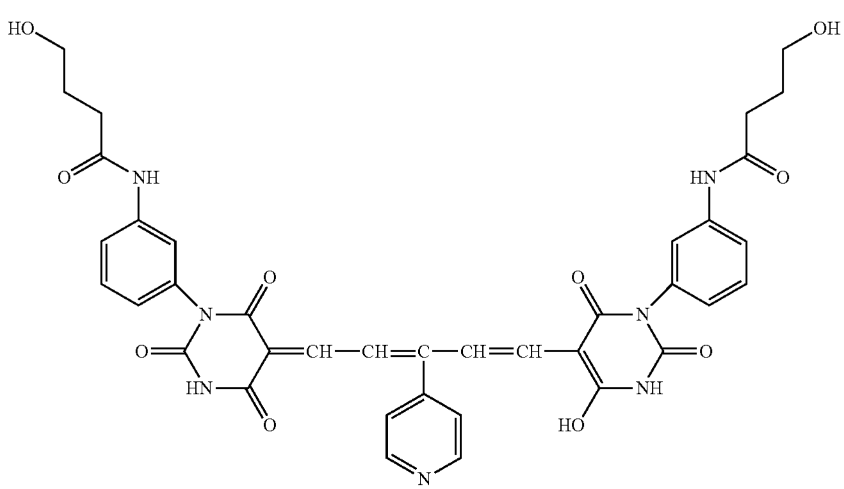

-continued
(C-ph-1-M)
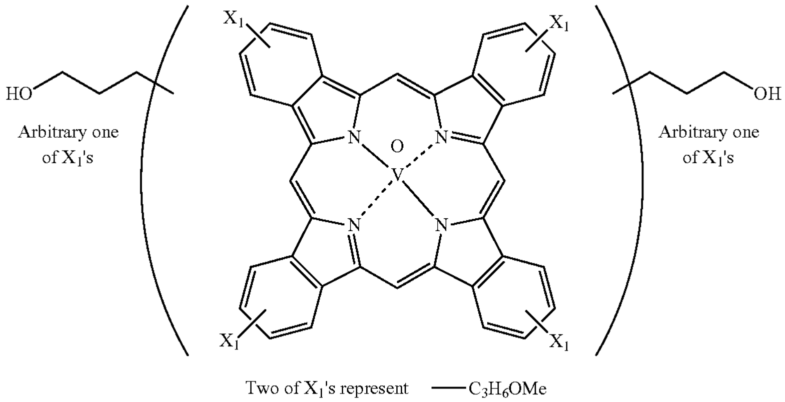
(C-na-1-M)
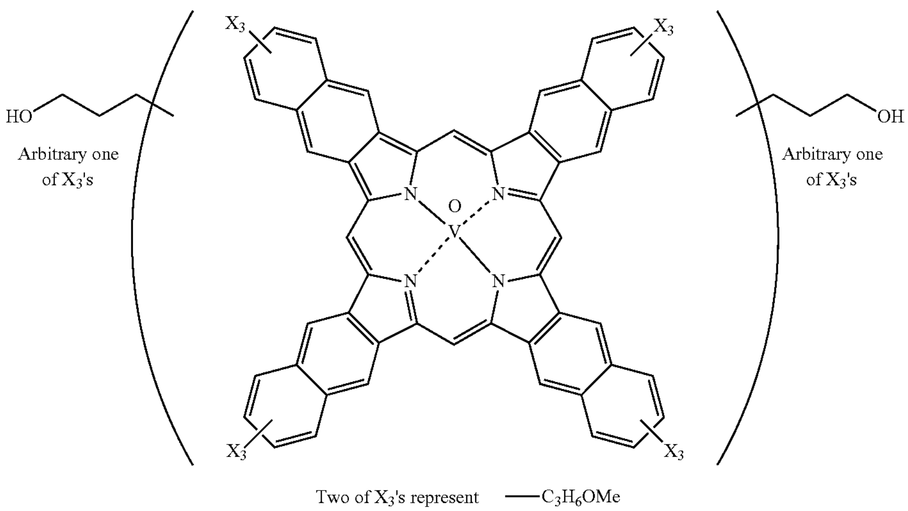
(C-di-1-M)
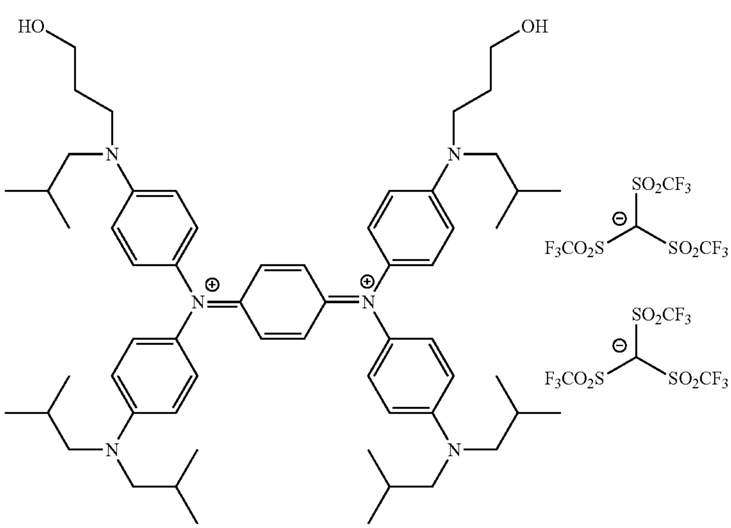

Near infrared absorbing colorant polymers (C-sq-6-P), (C-cy-8-P), (C-ox-3-P), (C-ph-1-P), (C-na-1-P), and (C-di-1-P): the following structures
(C-sq-6-P)
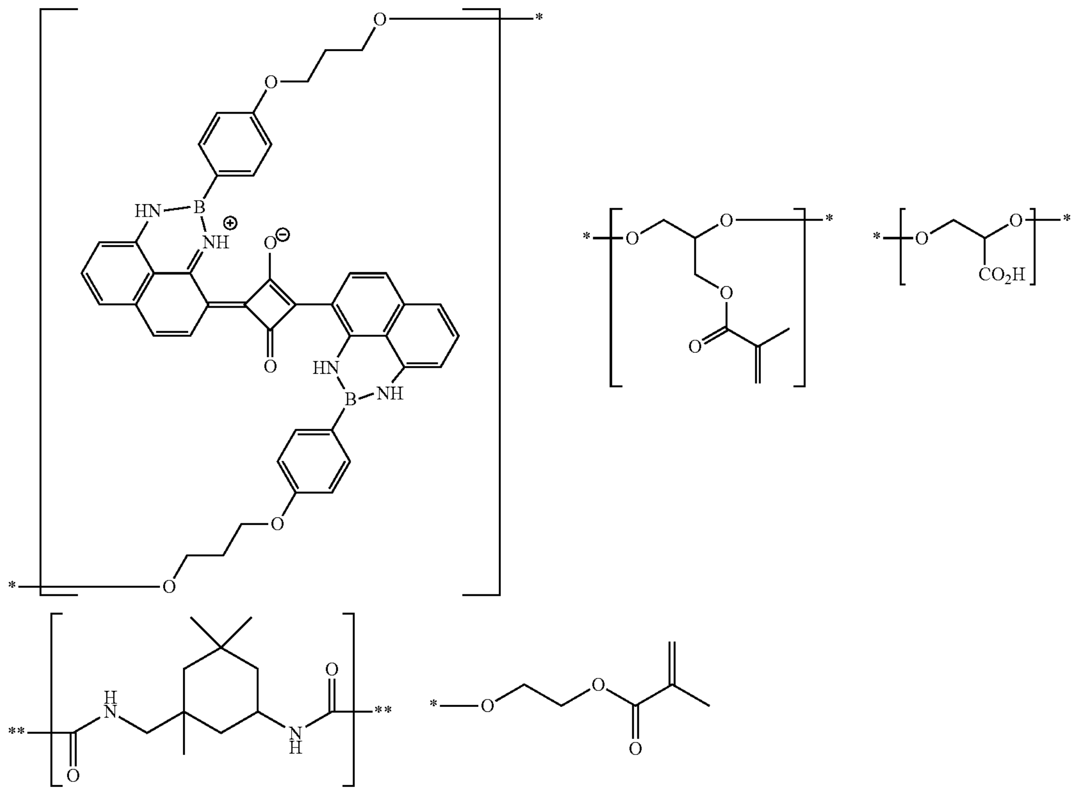
(C-cy-8-P)
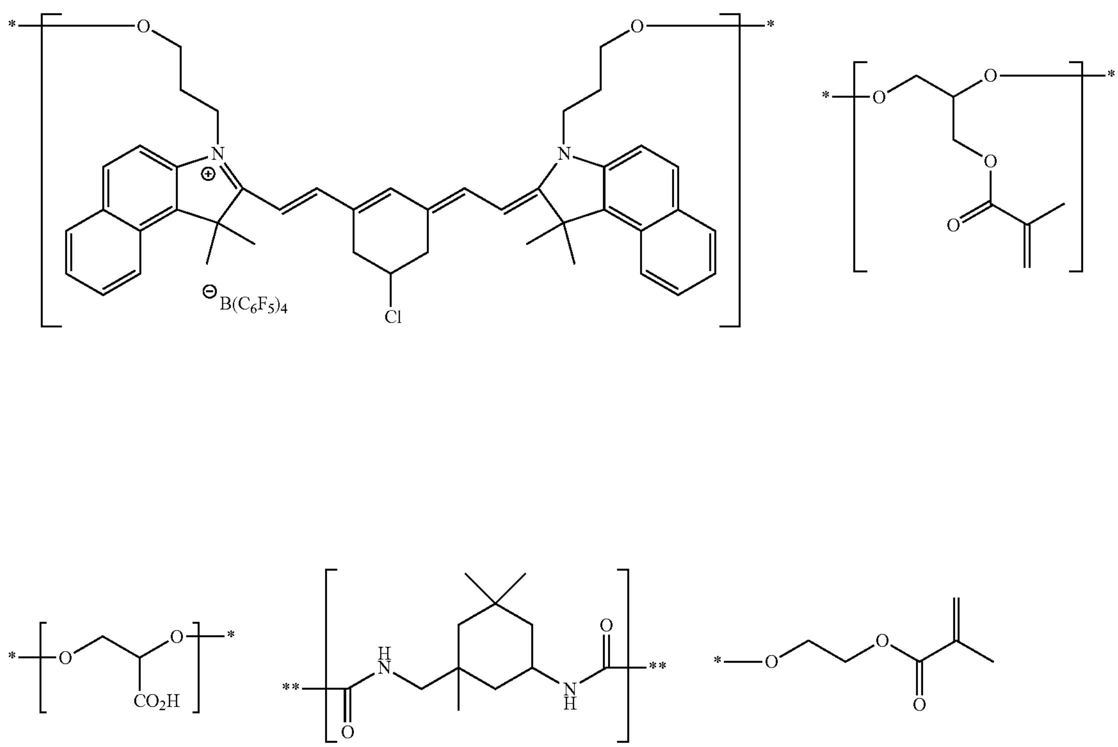

-continued
(C-ox-3-P)
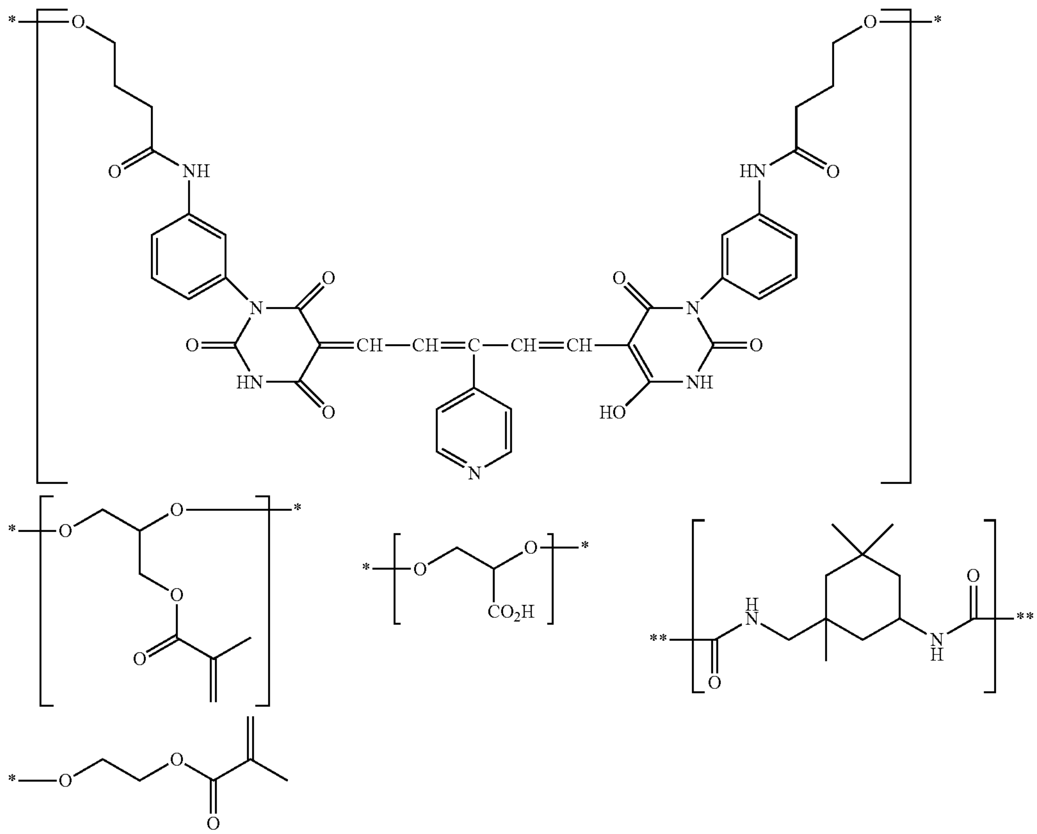
(C-ph-1-P)
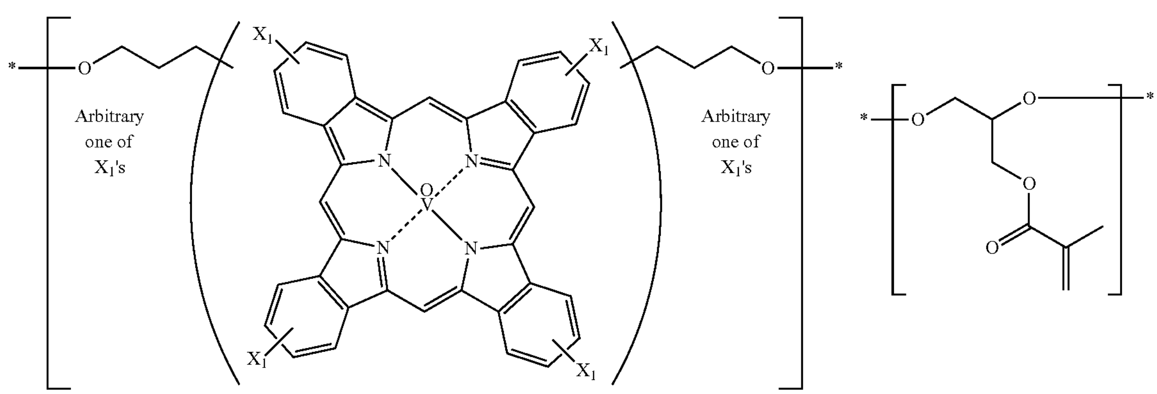
Two of $X_1$'s represent —$C_3H_6OMe$
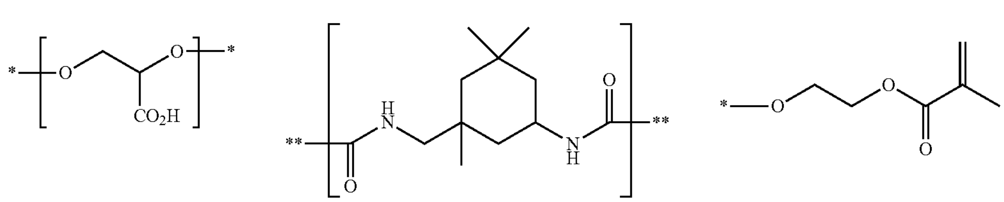

-continued
(C-na-1-P)
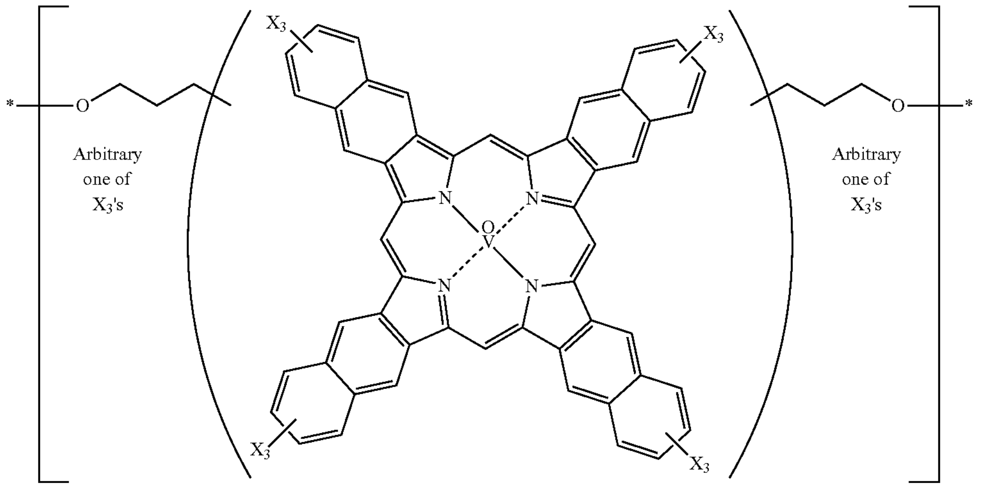
Two of $X_3$'s represent —$C_3H_6OMe$
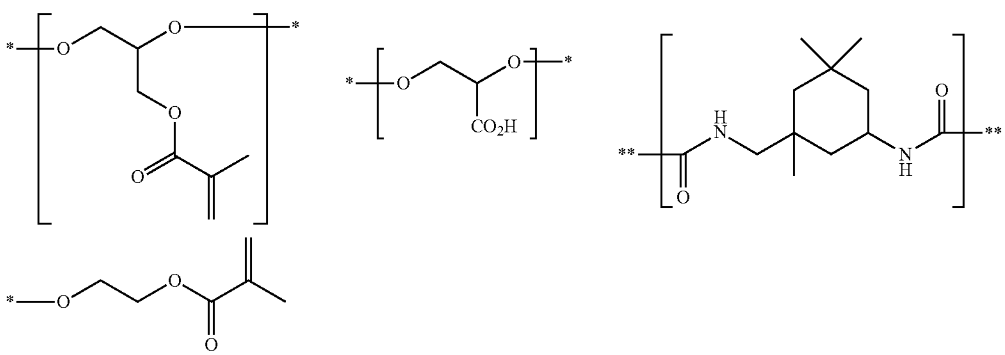
(C-di-1-P)
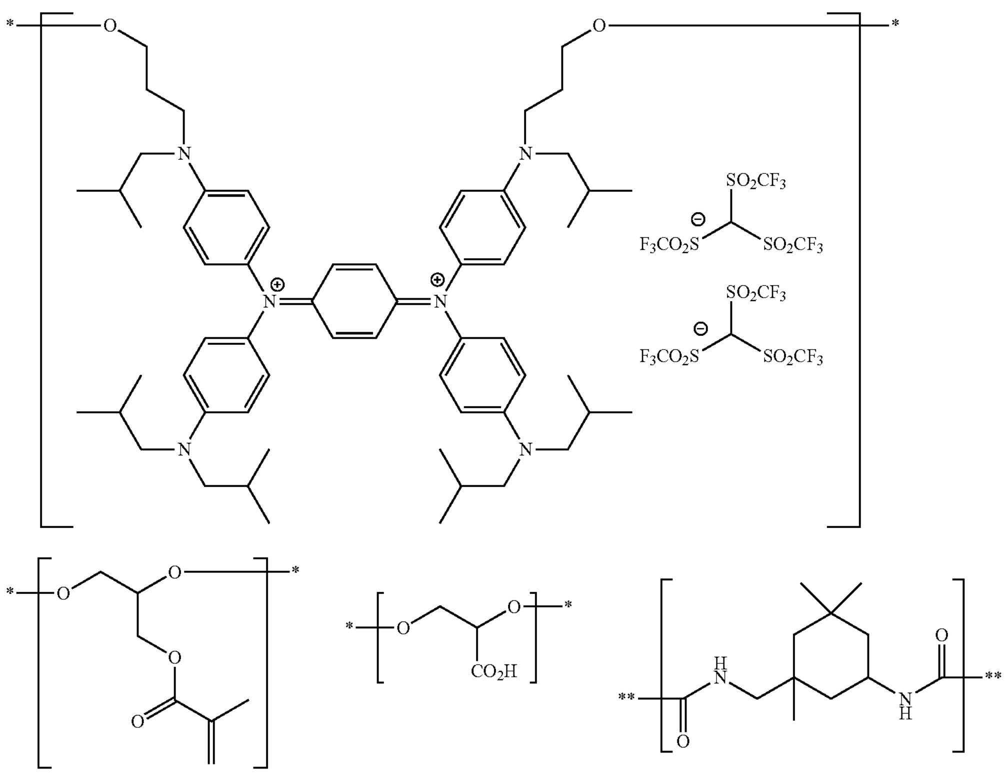

-continued
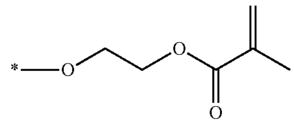
Synthesis Example 6
According to the following synthesis scheme, a near infrared absorbing colorant polymer (D-ppb-1-P) was synthesized.
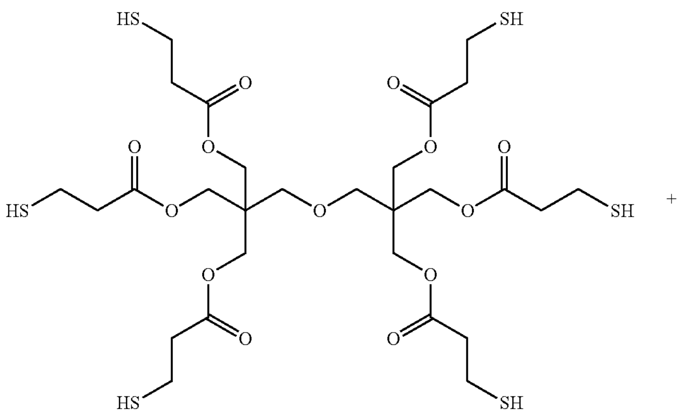
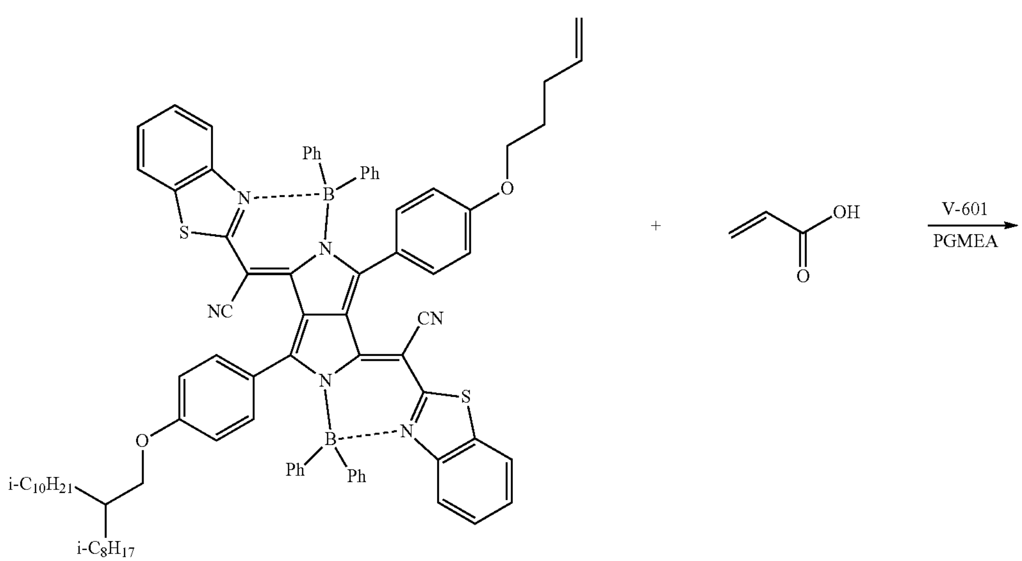
(D-ppb-1-M)

-continued
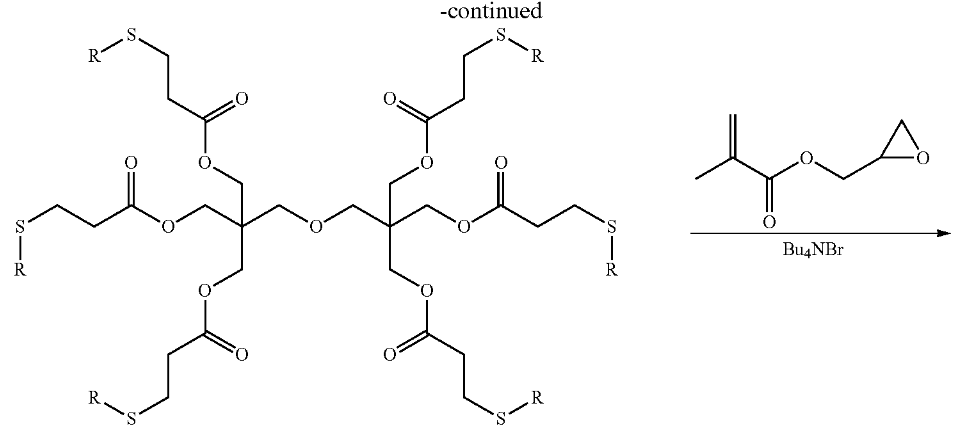
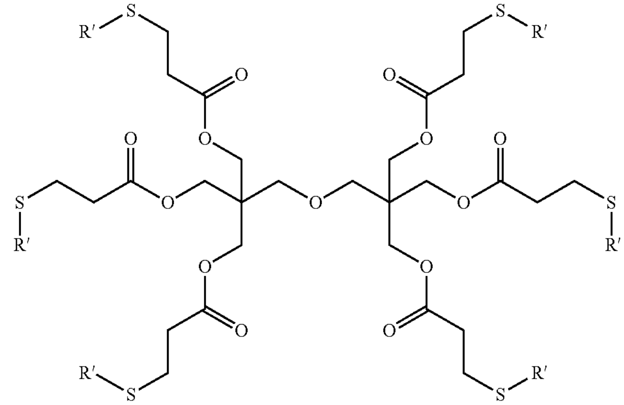
(D-ppb-1-P)

-continued
R = 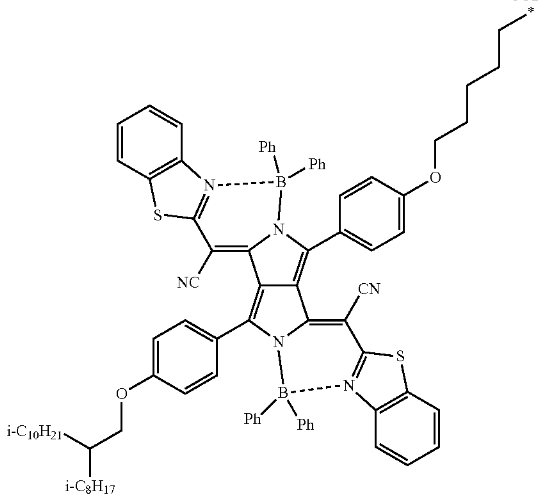 or 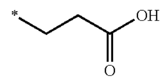
R′ = 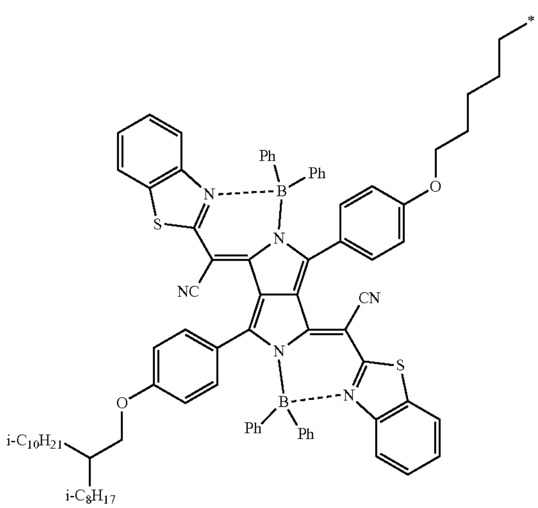 or 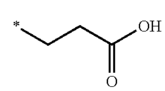 or 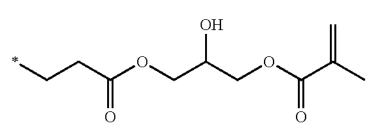

Synthesis Example 7
Near infrared absorbing colorant polymers (D-sq-6-P), (D-cy-6-P), (D-ox-1-P), (D-ph-8-P), (D-na-2-P), and (D-di-1-P) were synthesized using the same method as in Synthesis Example 6, except that the following monomers were used instead of the monomer (D-ppb-1-M).
Monomers: the following structures
(D-sq-6-M)
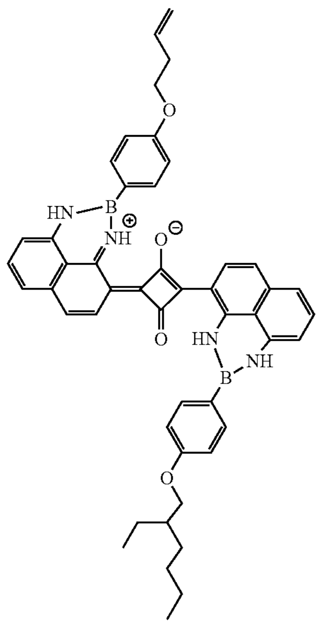
(D-cy-6-M)
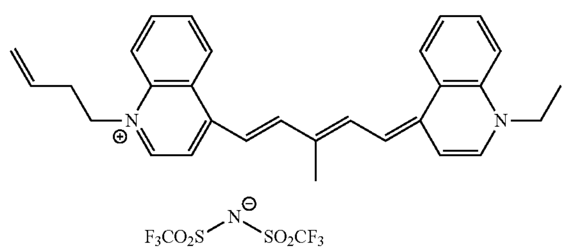
(D-ox-1-M)
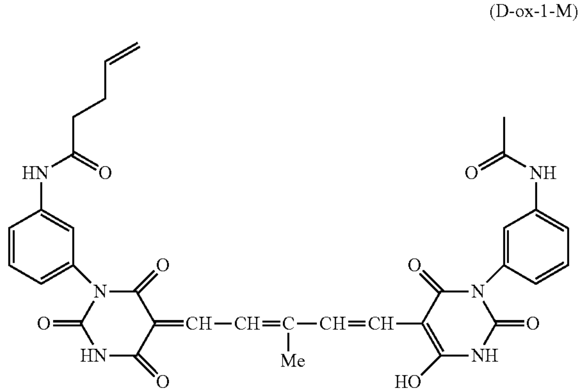
-continued
(D-ph-8-M)
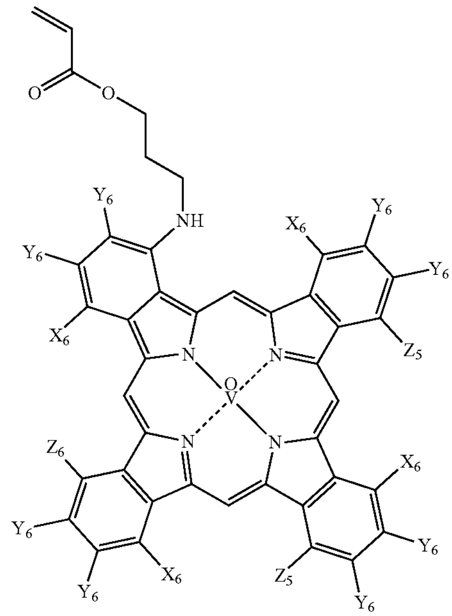
(D-na-2-M)
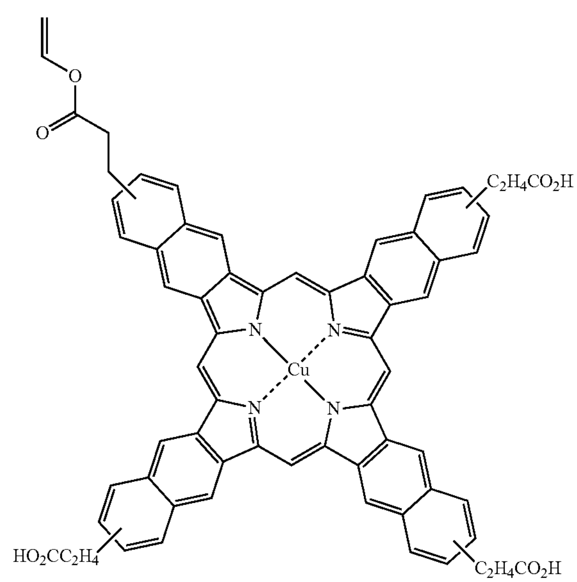

-continued
(D-di-1-M)
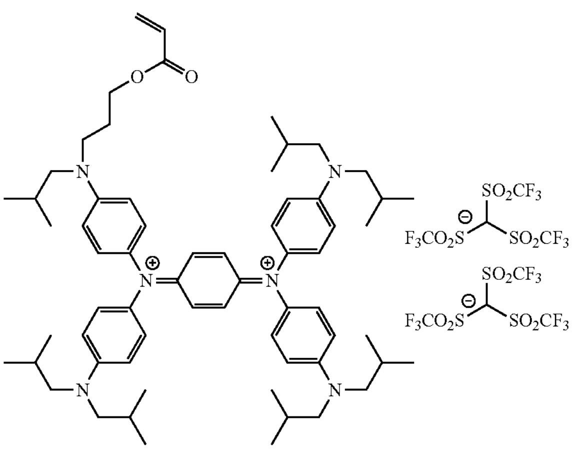
-continued
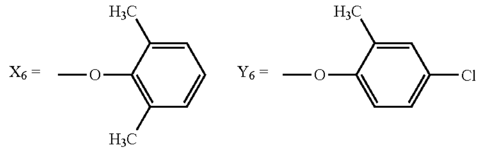
$Z_6$ = —$NH(CH_2)_3OH$
Near infrared absorbing colorant polymers (D-sq-6-P), (D-cy-6-P), (D-ox-1-P), (D-ph-8-P), (D-na-2-P), and (D-di-1-P): the following structures
(D-sq-6-P)
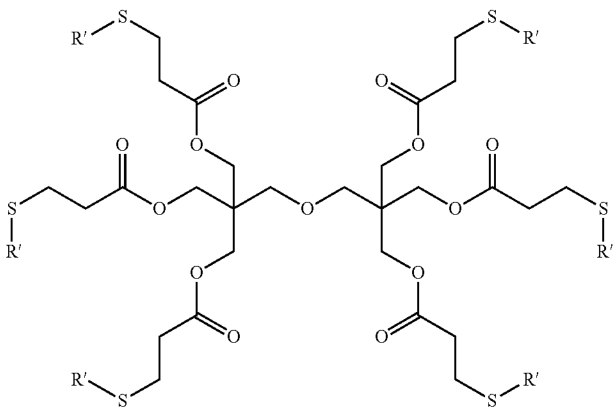
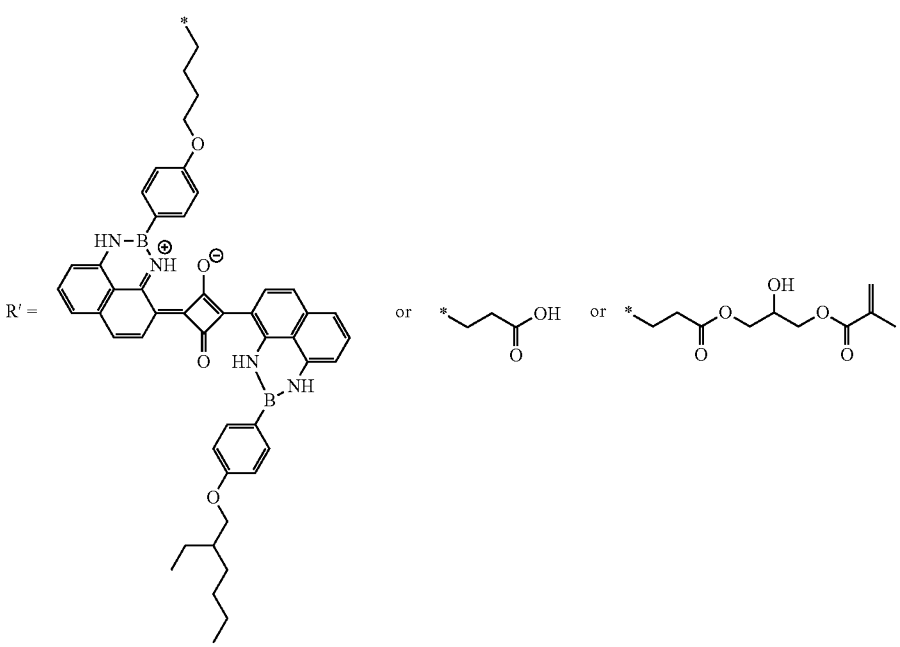

-continued
(D-cy-6-P)
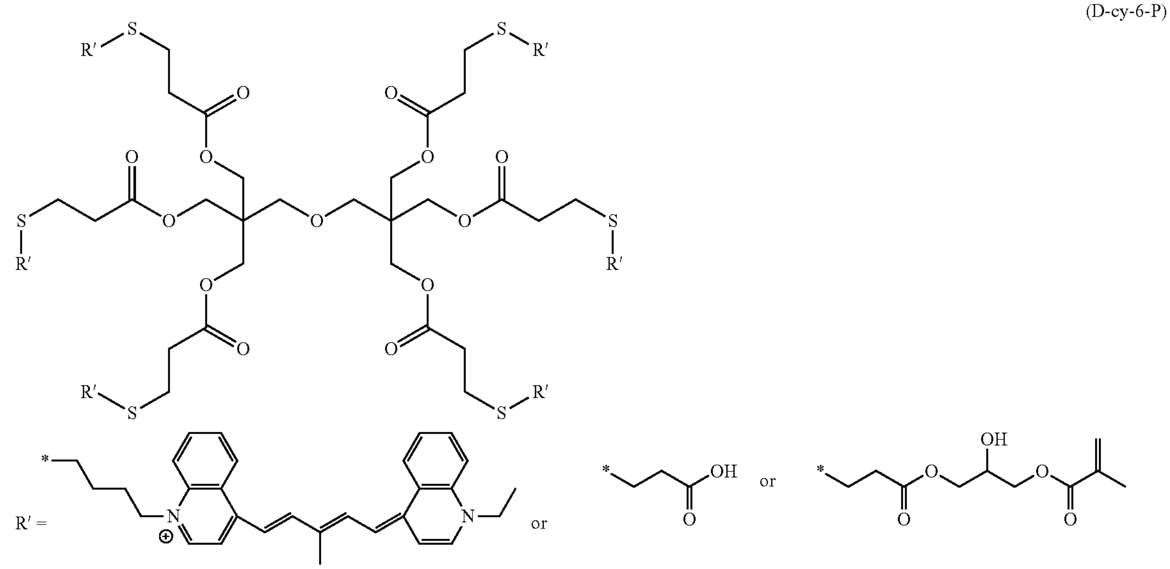
(D-ox-1-P)
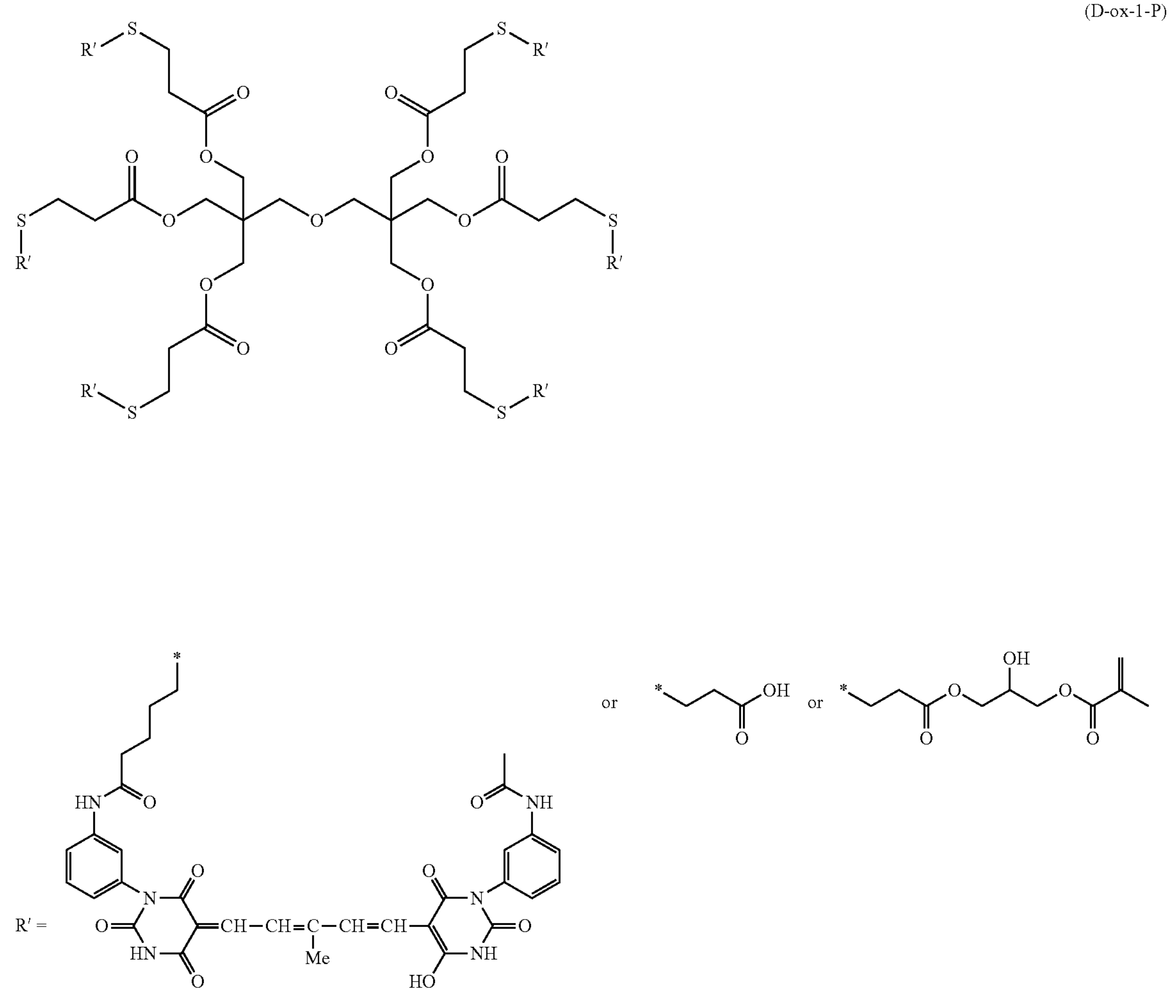

-continued
(D-ph-8-P)
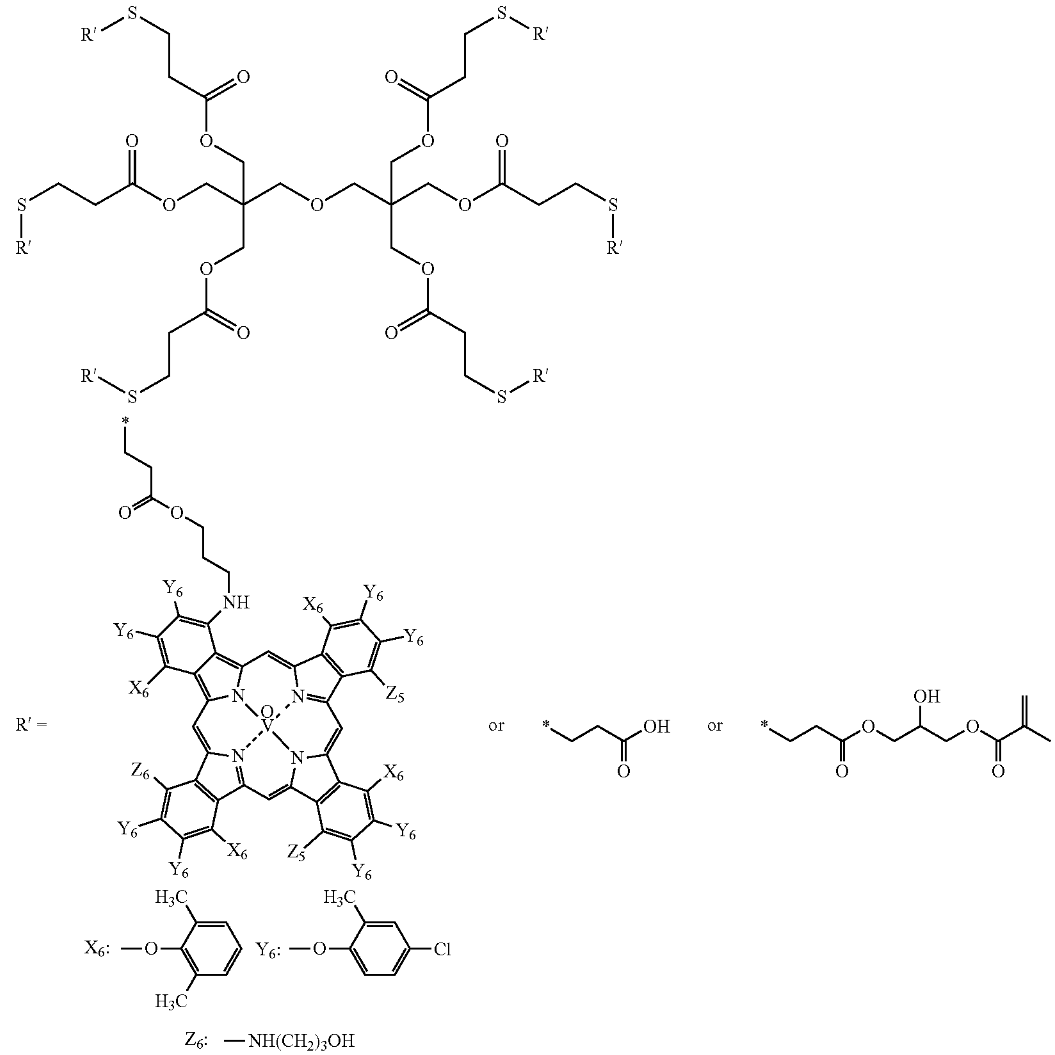
(D-ph-8-P)
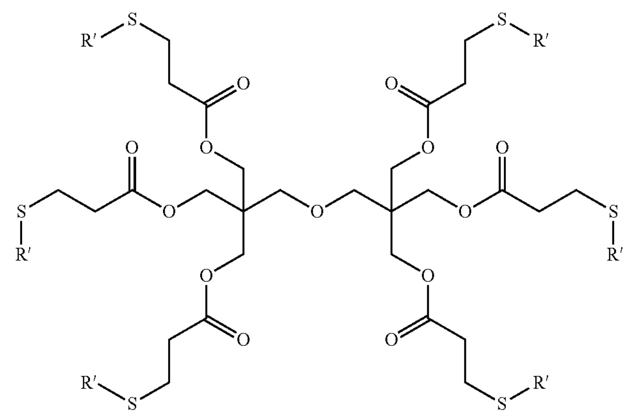

-continued

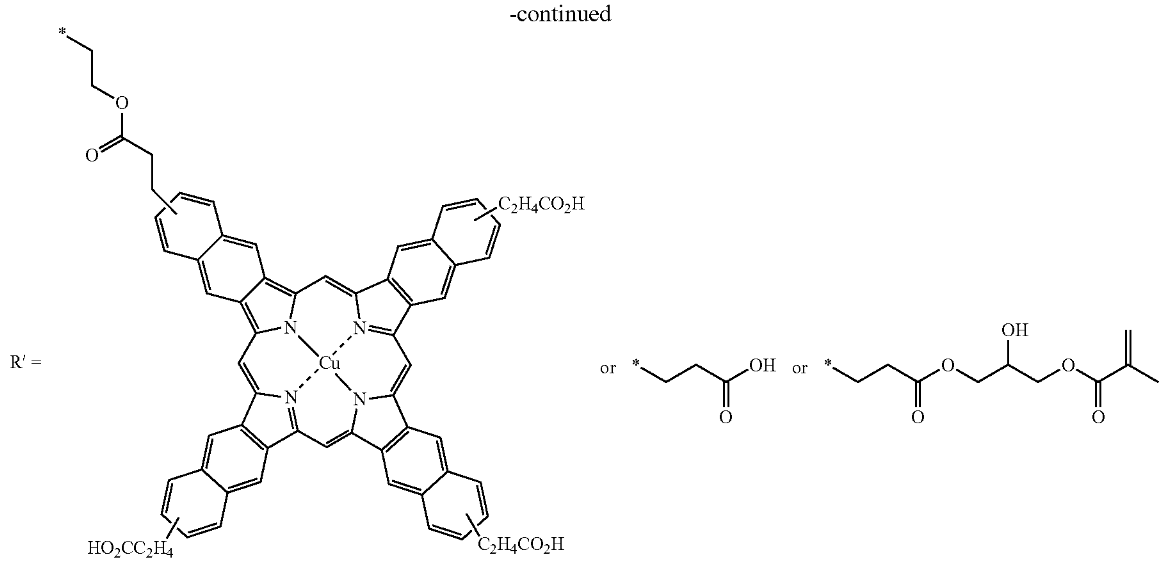

(D-di-1-P)

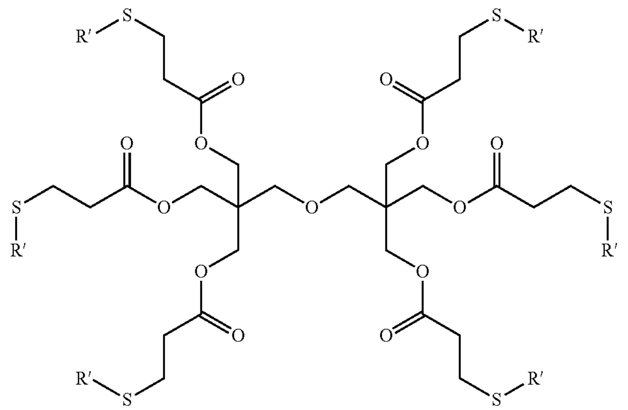

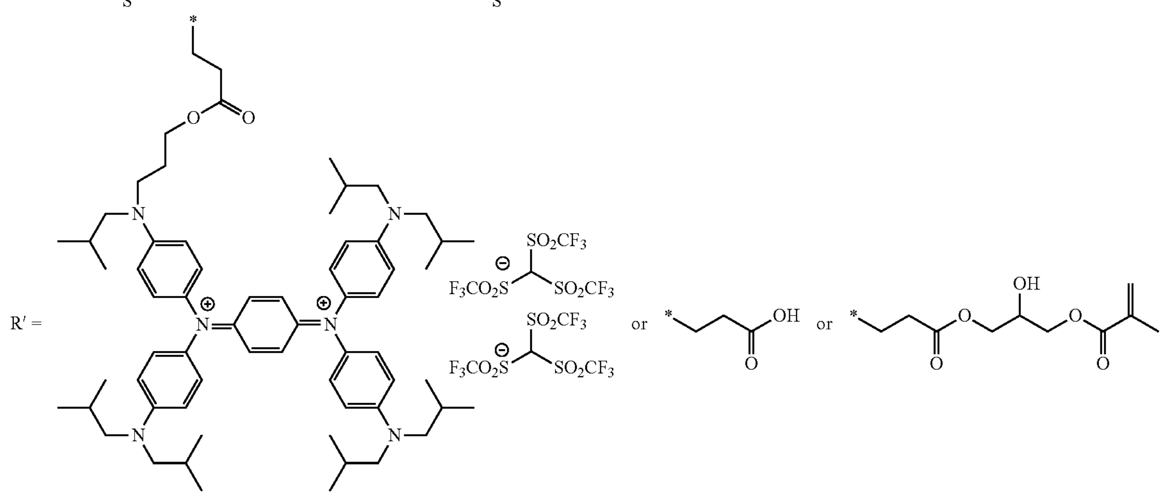

Test Example 1

Example 1

The components having the following composition 1 were mixed and stirred, and the obtained mixture was filtered through a nylon filter (manufactured by Pall Corporation) having a pore size of 0.45 μm to prepare a composition.

(Composition 1)

| | |
|---|---|
| Near Infrared Absorbing Colorant Polymer (A-ppb-1-P1) | 3.29 parts by mass |
| Curable Compound 1 | 2.38 parts by mass |
| Resin 1 | 12.5 parts by mass |
| Photopolymerization Initiator 1 | 2.61 parts by mass |
| Surfactant 1 | 9.09 parts by mass |

-continued

| | |
|---|---|
| Polymerization Inhibitor 1 | 0.001 parts by mass |
| Propylene Glycol Methyl Ether Acetate (PGMEA) | 70.14 parts by mass |

Near Infrared Absorbing Colorant Polymer (A-ppb-1-P1): the following structure (Mw=8000, acid value=50 mgKOH/g, polymerizable group equivalent=0 mmol/g)

(A-ppb-1-P1)

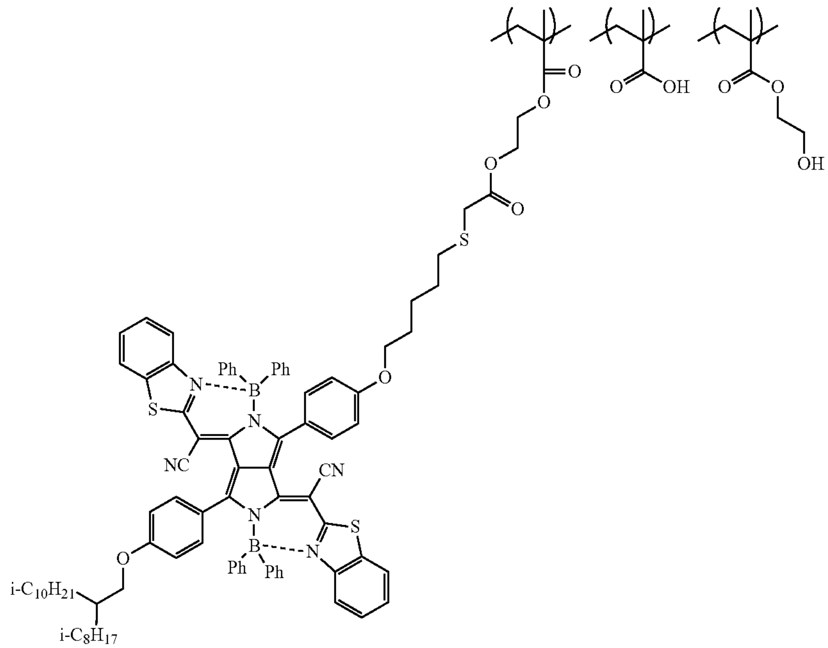

Curable Compound 1: KAYARAD DPHA (manufactured by Nippon Kayaku Co., Ltd.)

Resin 1: the following structure (Mw: 40000)

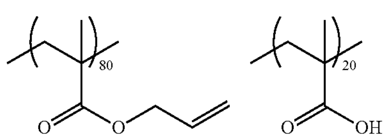

Photopolymerization Initiator 1: IRGACURE-OXE 01 (manufactured by BASF SE)

Surfactant 1: the following mixture (Mw: 14000, 1.0% PGMEA solution)

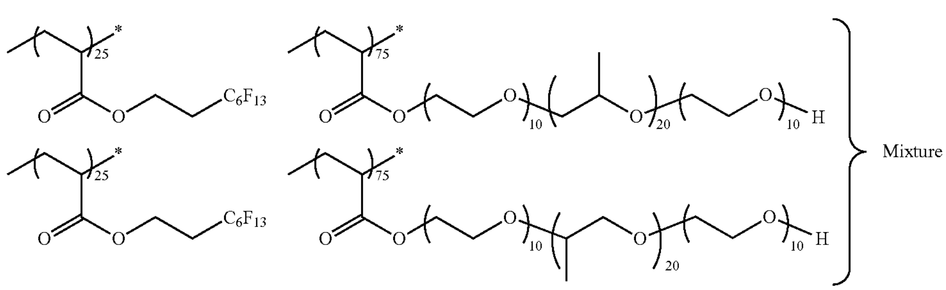

Polymerization Inhibitor 1: p-methoxyphenol

Example 2

A composition according to Example 2 was prepared using the same method as in Example 1, except that A-ppb-1-P2 (the following structure, Mw=8000, acid value=50 mgKOH/g, polymerizable group equivalent=0.5 mmol/g) was used instead of A-ppb-1-P1 as the near infrared absorbing colorant polymer.

(A-ppb-1-P2)

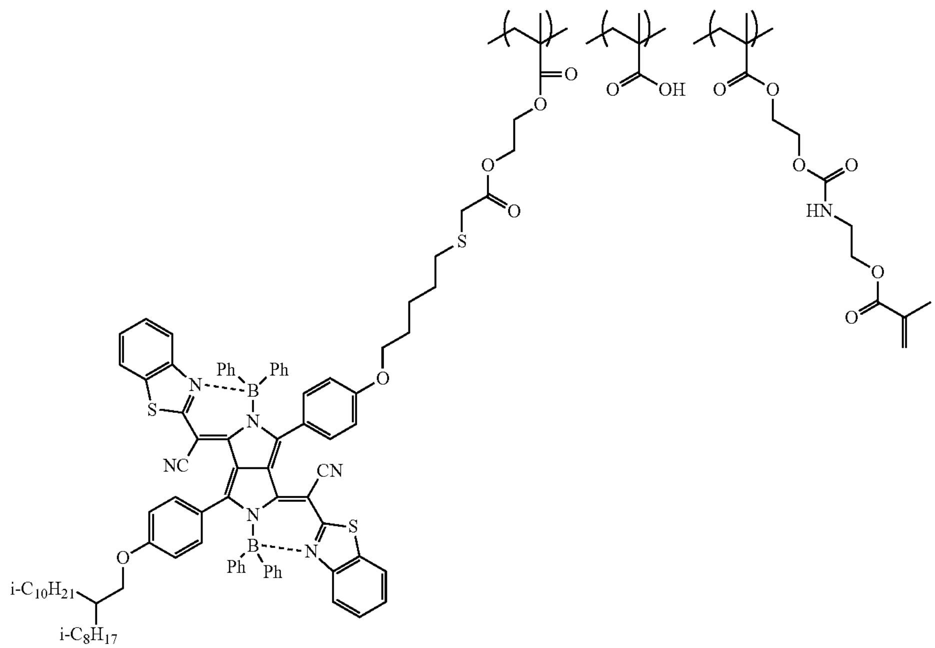

Examples 3 to 30

Compositions according to Example 3 to 30 were prepared using the same method as in Example 1, except that except that near infrared absorbing colorant polymers (the near infrared absorbing colorant polymers synthesized in the above-described Synthesis Examples) shown in the following table were used instead of A-ppb-1-P1 as the near infrared absorbing colorant polymer.

TABLE 15

| | Near Infrared Absorbing Colorant Polymer | Composition Ratio (Molar Ratio) First Component | Second Component | Third Component | Fourth Component | Weight-Average Molecular Weight | Acid Value (mgKOH/g). | Polymerizable group Equivalent (mmol/g) |
|---|---|---|---|---|---|---|---|---|
| Example 1 | A-ppb-1-P1 | 30 | 44 | 26 | — | 8000 | 50.0 | 0.00 |
| Example 2 | A-ppb-1-P2 | 30 | 44 | 26 | — | 8000 | 50.0 | 0.50 |
| Example 3 | A-sq-6-P2 | 35 | 45 | 20 | — | 8800 | 65.0 | 0.51 |
| Example 4 | A-cy-10-P2 | 25 | 45 | 30 | — | 7000 | 52.7 | 0.63 |
| Example 5 | A-ox-1-P2 | 35 | 40 | 25 | — | 8200 | 63.3 | 0.71 |
| Example 6 | A-ph-5-P2 | 20 | 55 | 25 | — | 9500 | 72.0 | 0.58 |
| Example 7 | A-na-4-P2 | 20 | 60 | 20 | — | 12500 | 81.6 | 0.48 |
| Example 8 | A-di-1-P2 | 15 | 40 | 45 | — | 6600 | 59.4 | 0.94 |
| Example 9 | A-ppb-1/sq-6-P2 | 15 | 15 | 45 | 25 | 7200 | 59.5 | 0.59 |
| Example 10 | B-ppb-1-P2 | 25 | 44 | 31 | — | 6900 | 55.5 | 0.70 |
| Example 11 | B-sq-5-P2 | 35 | 45 | 20 | — | 8100 | 66.7 | 0.53 |
| Example 12 | B-cy-10-P2 | 25 | 45 | 30 | — | 8200 | 65.5 | 0.78 |
| Example 13 | B-ox-1-P2 | 35 | 40 | 25 | — | 10500 | 59.0 | 0.66 |
| Example 14 | B-ph-1-P2 | 20 | 55 | 25 | — | 7200 | 90.8 | 0.74 |
| Example 15 | B-na-3-P2 | 20 | 55 | 25 | — | 8500 | 62.1 | 0.50 |
| Example 16 | B-di-1-P2 | 25 | 50 | 25 | — | 9000 | 55.8 | 0.50 |

TABLE 15-continued

| | Near Infrared Absorbing Colorant Polymer | Composition Ratio (Molar Ratio) First Component | Second Component | Third Component | Fourth Component | Weight-Average Molecular Weight | Acid Value (mgKOH/g). | Polymerizable group Equivalent (mmol/g) |
|---|---|---|---|---|---|---|---|---|
| Example 17 | C-ppb-1-P | 10 | 15 | 25 | 50 | 11000 | 49.3 | 0.53 |
| Example 18 | C-sq-6-P | 10 | 15 | 25 | 50 | 14200 | 60.2 | 0.64 |
| Example 19 | C-cy-8-P | 10 | 15 | 25 | 50 | 13700 | 47.3 | 0.51 |
| Example 20 | C-ox-3-P | 10 | 15 | 25 | 50 | 9700 | 59.3 | 0.63 |
| Example 21 | C-ph-1-P | 10 | 15 | 25 | 50 | 10200 | 57.2 | 0.61 |
| Example 22 | C-na-1-P | 10 | 15 | 25 | 50 | 13500 | 52.9 | 0.57 |
| Example 23 | C-di-1-P | 10 | 15 | 25 | 50 | 10700 | 41.7 | 0.45 |

Repeating units in each structural formula represent a first component, a second component, a third component, and a fourth component in order from left to right.

TABLE 16

| | Near Infrared Absorbing Colorant Polymer | Average Value of R's Colorant Portion | $CO_2H$ Portion | C═C Portion | — | Weight-Average Molecular Weight | Acid Value (mgKOH/g) | Polymerizable Group Equivalent (mmol/g) |
|---|---|---|---|---|---|---|---|---|
| Example 24 | D-ppb-1-P | 2.0 | 2.5 | 1.5 | — | 3400 | 41.3 | 0.44 |
| Example 25 | D-sq-6-P | 2.5 | 2.0 | 1.5 | — | 3200 | 35.5 | 0.47 |
| Example 26 | D-cy-6-P | 2.7 | 2.0 | 1.3 | — | 3100 | 36.3 | 0.42 |
| Example 27 | D-ox-1-P | 3.0 | 2.0 | 1.0 | — | 3100 | 36.7 | 0.33 |
| Example 28 | D-ph-8-P | 1.0 | 3.0 | 2.0 | — | 4000 | 42.6 | 0.51 |
| Example 29 | D-na-2-P | 2.0 | 2.0 | 2.0 | — | 3500 | 31.8 | 0.57 |
| Example 30 | D-di-1-P | 1.3 | 3.0 | 1.7 | — | 3700 | 45.4 | 0.46 |

Comparative Example 1

A composition according to Comparative Example 1 was prepared using the same method as in Example 1, except that a comparative colorant (the following structure) was used instead of A-ppb-1-P1 as the near infrared absorbing colorant polymer.

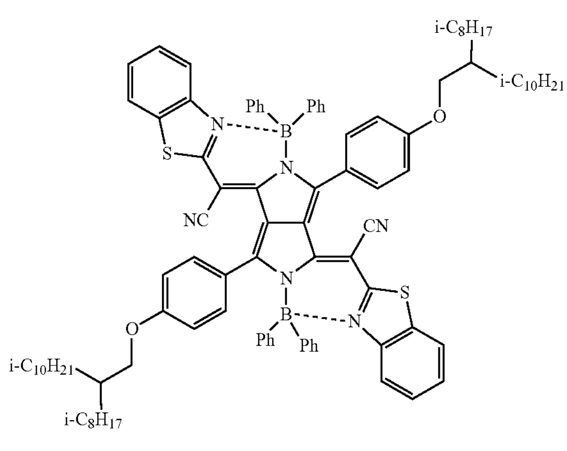

<Evaluation>

(1) Preparation of Composition for Forming Undercoat Layer

| | |
|---|---|
| PGMEA | 19.20 parts by mass |
| Ethyl Lactate | 36.67 parts by mass |
| Resin: (a 41% ethyl acetate solution of a copolymer including benzyl methacrylate, methacrylic acid, and 2-hydroxy ethyl methacrylate (molar ratio = 60:20:20)) | 30.51 parts by mass |

-continued

| | |
|---|---|
| Dipentaerythritol hexaacrylate | 12.20 parts by mass |
| Polymerization Inhibitor 1 | 0.006 parts by mass |
| Surfactant 1 | 0.83 parts by mass |
| Photopolymerization Initiator (TAZ-107, manufactured by Midori Kagaku Co., Ltd.) | 0.59 parts by mass |

(2) Preparation of Glass Wafer with Undercoat Layer

The composition for forming undercoat layer was applied to a 200 mm (8 inch) glass wafer using a spin coater to form a coating film, and the formed coating film was heated using a hot plate at 120° C. for 120 seconds. The rotation speed of the spin coater was adjusted such that the thickness of the heated coating film was about 0.5 μm. The heated coating film was further treated in an oven at 220° C. for 1 hour to cure the coating film. As a result, an undercoat layer was formed.

This way, the glass wafer with the undercoat layer in which the undercoat layer was formed on the glass wafer was obtained.

(Solvent Resistance)

Each composition was applied to the glass wafer with the undercoat layer using a spin coater such that the thickness of the dried coating film was 1.0 μm. Next, the glass wafer was heated using a hot plate at 100° C. for 2 minutes and at 200° C. for 5 minutes.

The film prepared as above was dipped in cyclohexanone for 5 minutes, and spectral characteristics before and after the dipping were compared to each other to evaluate solvent resistance based on the following Expression. An absorbance was measured using a spectrophotometer U4100 (manufactured by Hitachi High-Technologies Corporation) under conditions of an incidence angle of 00 at a maximal absorption.

(Absorbance after Dipping/Absorbance before Dipping)×100 Expression:

A: a value of the expression was 90% or higher

B: a value of the expression was 80% or higher and lower than 90%

C: a value of the expression was lower than 80%

(Development Residue)

Each composition was applied to the glass wafer with the undercoat layer using a spin coater such that the thickness of the dried coating film was 1.0 μm. Next, the glass wafer was heated using a hot plate at 100° C. for 2 minutes. As a result, a composition layer was obtained.

Next, using an i-ray stepper exposure device FPA-3000 i5+ (manufactured by Canon Corporation), a 2 μm Bayer pattern was formed by exposure on the obtained composition layer through a mask at 1000 mJ/cm$^2$. Next, puddle development was performed at 23° C. for 60 seconds using a tetramethylammonium hydroxide (TMAH) 0.3% aqueous solution. Next, the glass wafer was rinsed by spin showering and was washed with pure water. Next, the glass wafer was heated using a hot plate at 200° C. for 5 minutes.

At this time, a residue on the undercoat layer was observed with a scanning electron microscope (SEM). The evaluation standards are as follows.

A: a residue was not observed

B: a residue was observed on a part of the undercoat layer

C: a residue was observed on the entire surface of the undercoat layer (Color Transfer)

Each composition was applied to the glass wafer with the undercoat layer using a spin coater such that the thickness of the dried coating film was 1.0 μm. Next, the glass wafer was heated using a hot plate at 100° C. for 2 minutes. As a result, a composition layer was obtained.

Next, using an i-ray stepper exposure device FPA-3000 i5+ (manufactured by Canon Corporation) at 1000 mJ/cm$^2$, the obtained composition layer was exposed at 1000 mJ/cm$^2$ through a mask pattern in which a 7.0 μm square pixel was arranged in a 4 mm×3 mm region of a substrate. Next, puddle development was performed at 23° C. for 60 seconds using a tetramethylammonium hydroxide (TMAH) 0.3% aqueous solution. Next, the glass wafer was rinsed by spin showering, was washed with pure water, and was heated using a hot plate at 200° C. for 5 minutes.

A CT-2000L solution (transparent undercoating agent, manufactured by Fujifilm Electronic Materials Co., Ltd.) was applied to the pattern-formed surface prepared as described above such that the thickness of the dried coating film was 1 μm, was dried to form a transparent film, and was heated at 200° C. for 5 minutes. After completion of heating, the absorbance of the transparent film adjacent to the pattern formed using each composition was measured using a microspectrophotometer (LCF-1500M, manufactured by Otsuka Electronics Co., Ltd.). A ratio [%] of a value of the absorbance of the obtained transparent film to a value of the absorbance of the pattern measured before heating was calculated and set as an index for evaluating color transfer.

—Evaluation Standards—

Color Transfer (%) to Adjacent Pixel

A: color transfer to adjacent pixel<10%

B: 10%≤color transfer to adjacent pixel≤30%

C: color transfer to adjacent pixel>30%

TABLE 17

| | Colorant | Solvent Resistance | Color Transfer | Development Residue |
|---|---|---|---|---|
| Example 1 | A-ppb-1-P1 | B | A | A |
| Example 2 | A-ppb-1-P2 | A | A | A |
| Example 3 | A-sq-6-P2 | B | A | A |
| Example 4 | A-cy-10-P2 | B | B | A |
| Example 5 | A-ox-1-P2 | B | B | A |
| Example 6 | A-ph-5-P2 | A | B | B |
| Example 7 | A-na-4-P2 | A | B | B |
| Example 8 | A-di-1-P2 | B | B | B |
| Example 9 | A-ppb-1/sq-6-P2 | A | A | A |
| Example 10 | B-ppb-1-P2 | A | A | A |
| Example 11 | B-sq-5-P2 | B | B | A |
| Example 12 | B-cy-10-P2 | B | B | A |
| Example 13 | B-ox-1-P2 | B | B | A |
| Example 14 | B-ph-1-P2 | A | B | B |
| Example 15 | B-na-3-P2 | A | B | B |
| Example 16 | B-di-1-P2 | B | B | B |
| Example 17 | C-ppb-1-P | A | A | A |
| Example 18 | C-sq-6-P | B | B | A |
| Example 19 | C-cy-8-P | B | B | A |
| Example 20 | C-ox-3-P | B | B | A |
| Example 21 | C-ph-1-P | A | B | B |
| Example 22 | C-na-1-P | A | B | B |
| Example 23 | C-di-1-P | B | B | B |
| Example 24 | D-ppb-1-P | A | A | A |
| Example 25 | D-sq-6-P | B | A | A |
| Example 26 | D-cy-6-P | B | B | A |
| Example 27 | D-ox-1-P | B | B | A |
| Example 28 | D-ph-8-P | A | B | B |
| Example 29 | D-na-2-P | A | B | B |
| Example 30 | D-di-1-P | B | B | B |
| Comparative Example | Comparative Colorant | C | C | C |

In the above results, in Examples 1 to 30 in which the near infrared absorbing colorant polymer was used as the infrared absorber, the film having excellent solvent resistance and suppressed color transfer was able to be formed. Further, the development residue was small.

On the other hand, in Comparative Example, solvent resistance and color transfer properties were poorer than those in Examples.

Example 31

[Synthesis of Silicone Skeleton Epoxy Resin (X)]

394 parts of 2-(3,4-epoxycyclohexyl)ethyltrimethoxysilane, 475 parts of polydimethyl diphenylsiloxane having a silanol group having a molecular weight of 1700, 4 parts of 0.5% KOH methanol solution, and 36 parts of isopropyl alcohol were added to a reaction vessel and were heated to 75° C. After heating, the components were caused to react with each other under reflux for 10 hours. Next, the reaction vessel was cooled to room temperature, and 656 parts of methanol was added. Next, 172.8 parts of 50% distilled water methanol solution was added dropwise for 60 minutes, the reaction vessel was heated to a reflux temperature, and the components were caused to react with each other for 10 hours. After completion of the reaction, the reaction vessel was cooled to room temperature, the solution was neutralized with 5% aqueous sodium dihydrogen phosphate solution. Next, the reaction vessel was heated to 80° C., and methanol was recovered by distillation. Next, the reaction vessel was cooled to room temperature, 780 parts of methyl isobutyl ketone (MIBK) was added for washing, and the solution was washed with water three times. Next, the solvent was removed from the organic phase at 100° C. under reduced pressure. As a result, 731 parts of a silicone skeleton epoxy resin (X) was obtained. In the obtained silicone skeleton epoxy resin (X), the epoxy equivalent was 491 g/eq, the weight-average molecular weight was 2090, the viscosity was 3328 mPa·s, and the external appearance was colorless and transparent.

[Synthesis of Silicone Skeleton Epoxy Resin (Y)]

111 parts of 2-(3,4-epoxycyclohexyl)ethyltrimethoxysilane, 100 parts of polydimethyl diphenylsiloxane having a silanol group having a molecular weight of 1700, 1 parts of 0.5% KOH methanol solution, and 8 parts of isopropyl alcohol were added to a reaction vessel and were heated to 75° C. After heating, the components were caused to react with each other under reflux for 10 hours. Next, 120 parts of methanol was added to the solution after the reaction, and 48.6 parts of 50% distilled water methanol solution was added dropwise for 60 minutes. After the dropwise addition, the solution was further caused to react under reflux for 10 hours. After completion of the reaction, the solution was neutralized with 5% aqueous sodium dihydrogen phosphate solution. Next, the reaction vessel was heated to 80° C., and methanol was recovered by distillation. Next, the reaction vessel was cooled to room temperature, 174 parts of MIBK was added for washing, and the solution was washed with water three times. Next, the solvent was removed from the organic phase at 100° C. under reduced pressure. As a result, 174 parts of a silicone skeleton epoxy resin (Y) was obtained. In the obtained silicone skeleton epoxy resin (Y), the epoxy equivalent was 411 g/eq, the weight-average molecular weight was 3200, the viscosity was 15140 mPa·s, and the external appearance was colorless and transparent.

[Synthesis of Polycarboxylic Acid Resin (Z)]

243.5 parts of X22-160AS (manufactured by Shin-Etsu Chemical Co., Ltd.) as a both terminal carbinol-modified silicone oil, 60.9 parts of ADEKA S Y9-10 (manufactured by Adeka Corporation) as a polyester polyol, 83.5 parts of RIKACID MH (methylhexahydrophthalic anhydride, manufactured by New Japan Chemical Co., Ltd.) as a compound having one carboxylic anhydride group in a molecule, and 12.3 parts of RIKACID BT-100 (butanetetracarboxylic anhydride, manufactured by New Japan Chemical Co., Ltd.) as a compound having two or more carboxylic anhydride groups in a molecule were added a glass separable flask equipped with a stirring device, a Dimroth condenser, and a thermometer, were caused to react with each other at 70° C. for 3 hours, and were caused to react with each other at 140° C. for 16 hours. As a result, 400 parts of a polycarboxylic acid resin (Z) was obtained. In the obtained polycarboxylic acid resin (Z), the acid value was 76.7 mgKOH/g, the weight-average molecular weight was 3452, the viscosity was 5730 mPa·s, and the external appearance was colorless, transparent, and liquid.

Preparation of Composition According to Example 31 and Manufacturing of Film 72.4 parts of the obtained polycarboxylic acid resin (Z) as an epoxy resin curing agent and 0.50 parts of zinc stearate as a curing accelerator were added to a glass separable flask equipped with a stirring device and a thermometer, and were stirred at 60° C. for 1 hour to dissolve the polycarboxylic acid resin (Z) in zinc stearate. Next, the solution was allowed to cool to 28° C., and 40 parts of the obtained silicone skeleton epoxy resin (X), 60 parts of the obtained silicone skeleton epoxy resin (Y), and 5.0 parts of ERL-4221 (3,4-epoxycyclohexylmethyl-(3,4-epoxy)cyclohexylcarboxylate, manufactured by Dow Chemical Company) were added thereto and stirred at 28° C. to be made homogeneous. Next, 150 parts of chloroform and 1.0 part of a near infrared absorbing colorant polymer (A-cy-11-P2) having the following structure were added to the stirred solution and stirred at 28° C. to be made homogeneous. As a result, a composition according to Example 31 was obtained. The obtained composition was added dropwise to a glass substrate disposed on a spin coater, and the substrate was rotated at 1000 rpm for 30 seconds. As a result, the surface of the substrate was coated with the obtained composition. Next, the coating film was dried at 80° C. for 10 minutes and was thermally cured at 150° C. for 3 hours to obtain a film.

Near Infrared Absorbing Colorant Polymer (A-cy-11-P2): the following structure (a numerical value added to the repeating unit is a molar ratio; Mw=8600, acid value=69.7 mgKOH/g, polymerizable group equivalent=0.62 mmol/g)

(A-cy-11-P2)

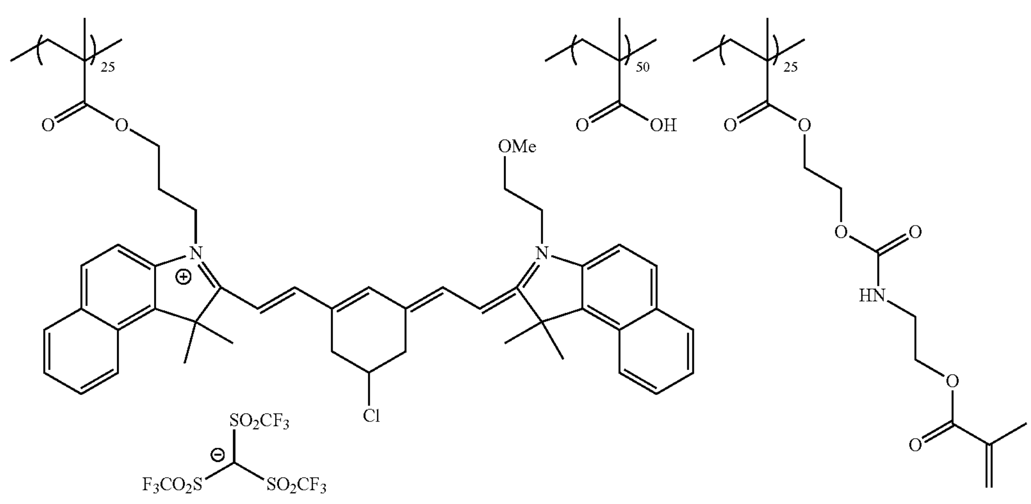

Preparation of Composition According to Example 32 and Manufacturing of Film 100 parts by mass of a cyclic olefin resin "ARTON G" (manufactured by JSR Corporation) and 0.04 parts by mass of a near infrared absorbing colorant polymer (A-sq-4-P2)

having the following structure were added to a vessel, and methylene chloride was added to adjust the concentration of the resin to 20 mass %. As a result, a composition was obtained.

The obtained composition was cast on a flat glass substrate, was dried at 20° C. for 8 hours, and was peeled off from the glass substrate. The peeled coating film was further dried at 100° C. for 8 hours under reduced pressure to obtain a film having a thickness of 0.1 mm, a length of 60 mm, and a width of 60 mm.

Near Infrared Absorbing Colorant Polymer (A-sq-4-P2): the following structure (a numerical value added to the repeating unit is a molar ratio; Mw=8900, acid value=47.7 mgKOH/g, polymerizable group equivalent=1.27 mmol/g)

(A-sq-4-P2)

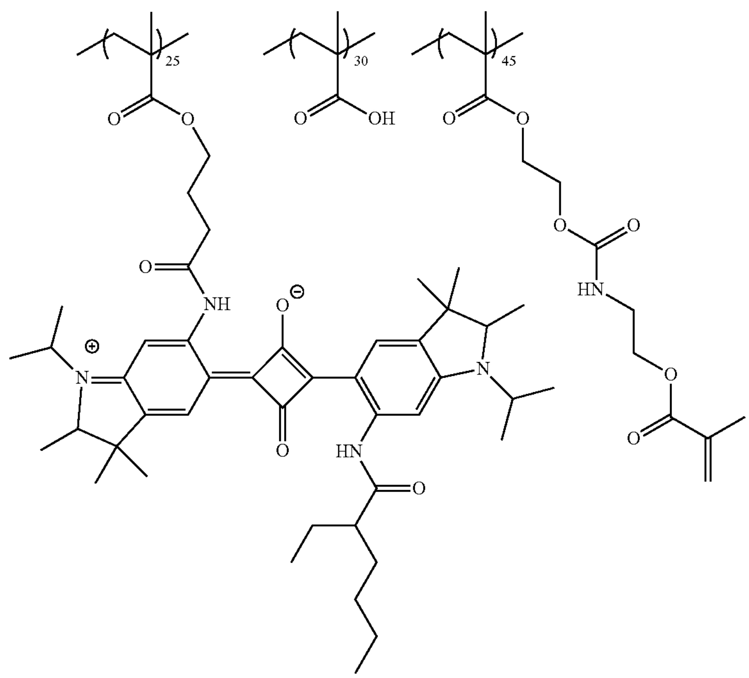

Regarding the films obtained in Examples 31 and 32, solvent resistance was evaluated using the same method as in Example 1.

TABLE 18

| | Colorant | Solvent Resistnace |
|---|---|---|
| Example 31 | A-cy-11-P2 | B |
| Example 32 | A-sq-4-P2 | B |

In the above results, the films obtained in Examples 31 and 32 had excellent solvent resistance.

Test Example 2

[Preparation of Composition for Forming Infrared Cut Filter]

The components having the following composition were mixed and stirred, and the obtained solution was filtered through a nylon filter (manufactured by Pall Corporation) having a pore size of 0.45 μm to prepare a composition for forming an infrared cut filter.

(Composition 101)

| | |
|---|---|
| Near Infrared Absorbing Colorant Polymer (A-ppb-1-P2) | 3.29 parts by mass |
| Curable Compound 1 | 2.38 parts by mass |
| Resin 1 | 12.5 parts by mass |
| Photopolymerization Initiator 1 | 2.61 parts by mass |
| Surfactant 1 | 9.09 parts by mass |
| Polymerization Inhibitor 1 | 0.001 parts by mass |
| Propylene Glycol Methyl Ether Acetate (PGMEA) | 70.14 parts by mass |

[Preparation of Red Composition]

The components having the following composition were mixed and stirred, and the obtained solution was filtered through a nylon filter (manufactured by Pall Corporation) having a pore size of 0.45 μm to prepare a Red composition.

| | |
|---|---|
| Red Pigment Dispersion | 51.7 parts by mass |
| Resin 2 (40% PGMEA solution) | 0.6 parts by mass |
| Curable Compound 3 | 0.6 parts by mass |
| Photopolymerization Initiator 1 | 0.3 parts by mass |
| Surfactant 1 | 4.2 parts by mass |
| PGMEA | 42.6 parts by mass |

[Preparation of Green Composition]

The components having the following composition were mixed and stirred, and the obtained solution was filtered through a nylon filter (manufactured by Pall Corporation) having a pore size of 0.45 μm to prepare a Green composition.

| | |
|---|---|
| Green Pigment Dispersion | 73.7 parts by mass |
| Resin 2 (40% PGMEA solution) | 0.3 parts by mass |
| Curable Compound 1 | 1.2 parts by mass |
| Photopolymerizati on Initiator 1 | 0.6 parts by mass |

-continued

| | |
|---|---|
| Surfactant 1 | 4.2 parts by mass |
| Ultraviolet Absorber 1 | 0.5 parts by mass |
| PGMEA | 19.5 parts by mass |

[Preparation of Blue Composition]

The following components were mixed and stirred, and the obtained mixture was filtered through a nylon filter (manufactured by Pall Corporation) having a pore size of 0.45 μm to prepare a Blue composition.

| | |
|---|---|
| Blue Pigment Dispersion | 44.9 parts by mass |
| Resin 2 (40% PGMEA solution) | 2.1 parts by mass |
| Curable Compound 1 | 1.5 parts by mass |
| Curable Compound 3 | 0.7 parts by mass |
| Photopolymerization Initiator 1 | 0.8 parts by mass |
| Surfactant 1 | 4.2 parts by mass |
| PGMEA | 45.8 parts by mass |

[Preparation of Composition for Forming Infrared Transmitting Filter]

The components having the following composition were mixed and stirred, and the obtained solution was filtered through a nylon filter (manufactured by Pall Corporation) having a pore size of 0.45 μm to prepare a composition for forming an infrared transmitting filter.

(Composition 201)

| | |
|---|---|
| Near Infrared Absorbing Colorant Polymer (A-ppb-1-P2) | 3.3 parts by mass |
| Red Pigment Dispersion | 32.1 parts by mass |
| Blue Pigment Dispersion | 25.7 parts by mass |
| Resin 2 (40% PGMEA solution) | 6.2 parts by mass |
| Curable Compound 1 | 0.6 parts by mass |
| Curable Compound 2 | 1.4 parts by mass |
| Photopolymerization Initiator 1 | 1.0 part by mass |
| Surfactant 1 | 4.2 parts by mass |
| Substrate Adhesive 1 | 0.53 parts by mass |
| Polymerization Inhibitor 1 | 0.001 parts by mass |
| PGMEA | 25.1 parts by mass |

(Composition 202)

| | |
|---|---|
| Pigment Dispersion 1-1 | 46.5 parts by mass |
| Pigment Dispersion 1-2 | 37.1 parts by mass |
| Curable Compound 4 | 1.8 parts by mass |
| Resin 2 | 1.1 parts by mass |
| Photopolymerization Initiator 2 | 0.9 parts by mass |
| Surfactant 1 | 4.2 parts by mass |
| Polymerization Inhibitor 1 | 0.001 parts by mass |
| Substrate Adhesive | 0.6 parts by mass |
| PGMEA | 7.8 parts by mass |

Materials used in each of the compositions are as follows.

| | |
|---|---|
| Near Infrared Absorbing Colorant Polymer (A-ppb-1-P2) | the above structure |
| Pyrrolopyrrole Dye: | the following structure |

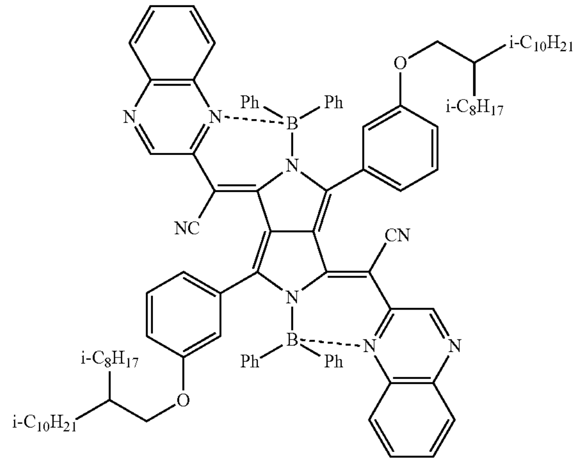

Red Pigment Dispersion 9.6 parts by mass of C.I. Pigment Red 254, 4.3 parts by mass of C.I. Pigment Yellow 139, 6.8 parts by mass of a dispersant (BYK-161 (manufactured by BYK)), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under conditions of a pressure of 2000 kg/cm$^3$ and a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (BYK-161 (manufactured by BYK)), 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared.

Next, using a high-pressure disperser NANO-3000-10 (manufactured by Nippon BEE Chemical Co., Ltd.) equipped with a pressure reducing mechanism, the pigment dispersion was further dispersed under conditions of a pressure of 2000 kg/cm$^3$ and a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (Disperbyk-161 (manufactured by BYK Chemie)), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under conditions of a pressure of 2000 kg/cm$^3$ and a flow rate of 500 g/min. This dispersing treatment was repeated 10 times. As a result, a Blue pigment dispersion was obtained.

Pigment Dispersion 1-1

A mixed solution having a composition shown below was mixed and dispersed for 3 hours using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. As a result, Pigment Dispersion 1-1 was prepared.

| | |
|---|---|
| Mixed pigment including a red pigment (C.I. Pigment Red 254) and a yellow pigment (C.I. Pigment Yellow 139) | 11.8 parts by mass |
| Resin (Disperbyk-111, manufactured by BYK Chemie) | 9.1 parts by mass |
| PGMEA | 79.1 parts by mass |

Pigment Dispersion 1-2

A mixed solution having a composition shown below was mixed and dispersed for 3 hours using a beads mill (a high-pressure dispersing machine with a pressure reducing mechanism, NANO-3000-10 (manufactured by Nippon BEE Chemical Co., Ltd.)) in which zirconia beads having a diameter of 0.3 mm were used. As a result, Pigment Dispersion 1-2 was prepared.

| | |
|---|---|
| Mixed pigment including a blue pigment (C.I. Pigment Blue 15:6) and a violet pigment (C.I. Pigment Violet 23) | 12.6 parts by mass |
| Resin (Disperbyk-111, manufactured by BYK Chemie) | 2.0 parts by mass |
| Resin 10 | 3.3 parts by mass |
| Cyclohexanone | 31.2 parts by mass |
| PGMEA | 50.9 parts |

Curable Compound 1: KAYARAD DPHA (manufactured by Nippon Kayaku Co., Ltd.)

Curable Compound 2: NK ESTER A-DPH-12E (manufactured by Shin-Nakamura Chemical Co., Ltd.)

Curable Compound 3: the following structure

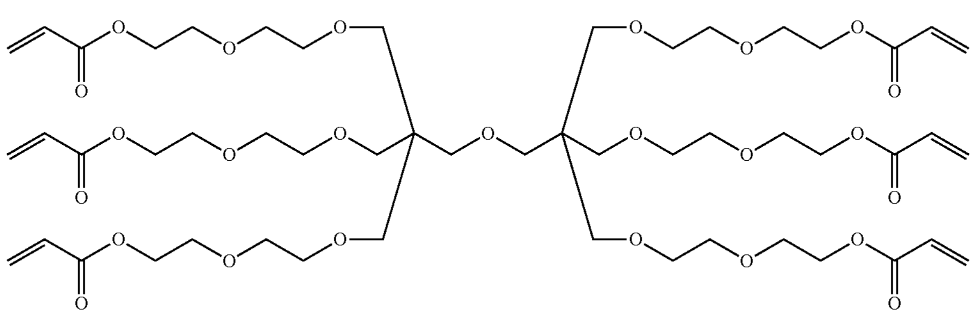 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Curable Compound 4: the following structures (a mixture in which a molar ratio between a left compound and a right compound is 7:3)

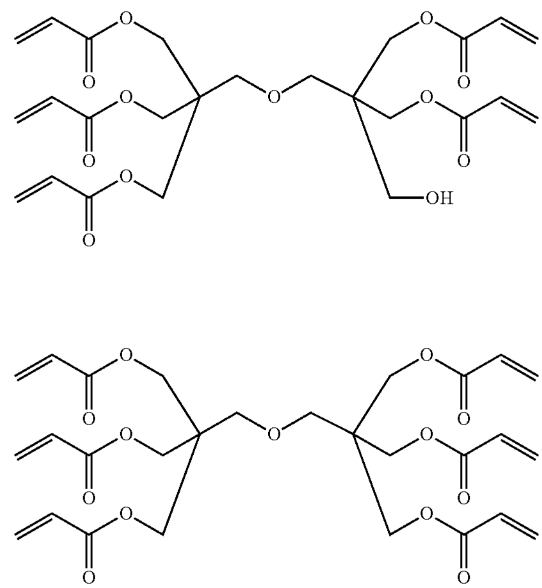

Resin 1: a resin having the following structure (a ratio in a repeating unit is a molar ratio; Mw=40000)

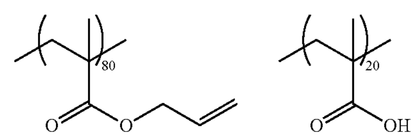

Resin 2: the following structure (a ratio in a repeating unit is a molar ratio; acid value:70 mg/KOHg, Mw=11000)

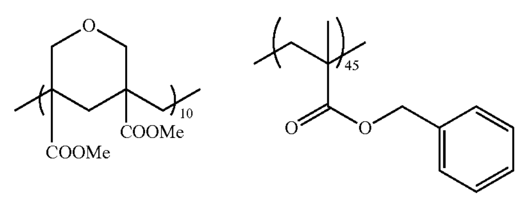

-continued

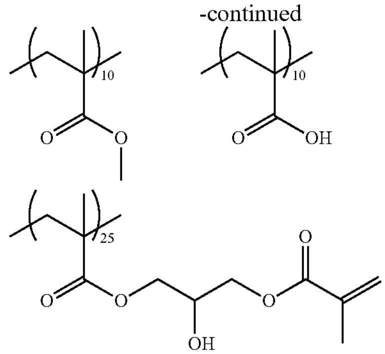

Resin 10: a resin having the following structure (a ratio in a repeating unit is a molar ratio; Mw=14000)

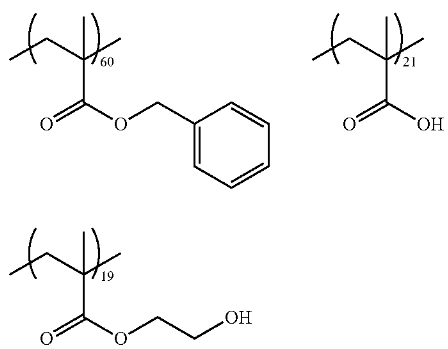

Photopolymerization Initiator 1: IRGACURE-OXE 01 (manufactured by BASF SE)

Photopolymerization initiator 2: the following structure

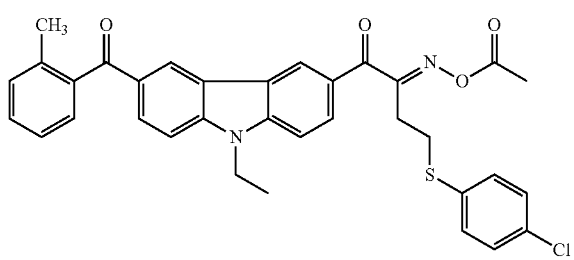 [SMILES: CCn1c2ccc(C(=O)/C(CCSc3ccc(Cl)cc3)=N/OC(C)=O)cc2c2cc(C(=O)c3ccccc3C)ccc21]

Surfactant 1: the following mixture (Mw: 14000, 1.0% PGMEA solution)

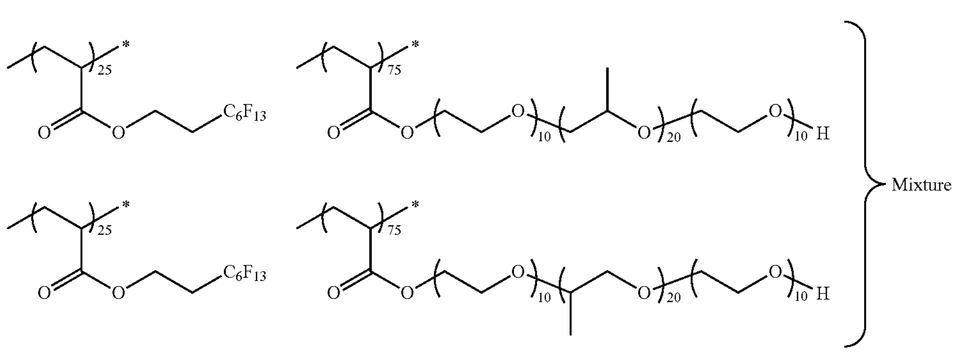

Substrate Adhesive: the following structure

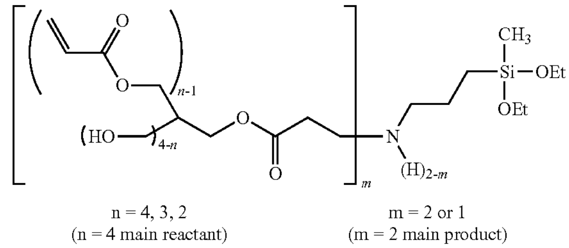

Polymerization Inhibitor 1: p-methoxyphenol

Ultraviolet Absorber: the following structure

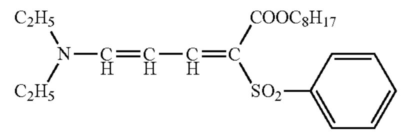

Example 101

The composition having the composition 101 was applied to a silicon wafer using a spin coating method such that the thickness of the formed film was 1.0 μm, and then was heated using a hot plate at 100° C. for 2 minutes. Next, using an i-ray stepper exposure device FPA-3000 i5+ (manufactured by Canon Corporation) at 1000 mJ/cm$^2$, the composition was exposed through a mask having a 2 μm Bayer pattern at 1000 mJ/cm$^2$. Next, puddle development was performed at 23° C. for 60 seconds using a tetramethylammonium hydroxide (TMAH) 0.3 mass % aqueous solution. Next, the glass wafer was rinsed by spin showering and was washed with pure water. Next, the silicon wafer was heated using a hot plate at 200° C. for 5 minutes. As a result, a 2 μm Bayer pattern (infrared cut filter) was formed.

The Red composition was applied to the Bayer pattern of the infrared cut filter using a spin coating method such that the thickness of the formed film was 1.0 μm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, the composition was exposed through a mask having a 2 μm dot pattern at 1000 mJ/cm$^2$. Next, puddle development was performed at 23° C. for 60 seconds using a tetramethylammonium hydroxide (TMAH) 0.3% aqueous solution. Next, the silicon wafer was rinsed by spin showering and was washed with pure water. Next, the infrared cut filter was heated using a hot plate at 200° C. for 5 minutes. As a result, a colored layer of the Red composition was patterned on the Bayer pattern of the infrared cut filter. Likewise, patterns were sequentially formed using the Green composition and the Blue composition.

Next, the composition having the composition 202 (the composition for forming an infrared transmitting filter) was applied to the pattern-formed film using a spin coating method such that the thickness of the formed film was 2.0 μm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, the composition was exposed through a mask having a 2 μm Bayer pattern at 1000 mJ/cm$^2$. Next, puddle development was performed at 23° C. for 60 seconds using a tetramethylammonium hydroxide (TMAH) 0.3% aqueous solution. Next, the silicon wafer was rinsed by spin showering, was washed with pure water, and was heated using a hot plate at 200° C. for 5 minutes. As a result, the infrared transmitting filter was patterned on a portion (pattern non-formed portion) where the Bayer pattern of the infrared cut filter was not formed. This filter was incorporated into a solid image pickup element using a well-known method Using the obtained solid image pickup element, an object was irradiated with a near infrared LED light source having an emission wavelength of 850 nm in a low-illuminance environment (0.001 Lux) to obtain an image. The object was able to be clearly recognized on the image, and imaging performance was excellent.

Example 201

The composition having the composition 102 was applied to a silicon wafer using a spin coating method such that the thickness of the formed film was 1.0 μm, and then was heated using a hot plate at 100° C. for 2 minutes. Next, the entire surface of the silicon wafer was exposed using an i-ray stepper exposure device FPA-3000 i5+ (manufactured by Canon Corporation) at 1000 mJ/cm$^2$. Next, the silicon wafer was heated using a hot plate at 200° C. for 5 minutes. Next, a 2 μm Bayer pattern (infrared cut filter) was formed using a dry etching method.

Next, the Red composition was applied to the Bayer pattern of the infrared cut filter using a spin coating method such that the thickness of the formed film was 1.0 μm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, the composition was exposed through a mask having a 2 μm dot pattern at 1000 mJ/cm$^2$. Next, puddle development was performed at 23° C. for 60 seconds using a tetramethylammonium hydroxide (TMAH) 0.3% aqueous solution. Next, the silicon wafer was rinsed by spin showering, was washed with pure water, and was heated using a hot plate at 200° C. for 5 minutes. As a result, a colored layer of the Red composition was patterned on the Bayer pattern of the infrared cut filter. Likewise, patterns were sequentially formed using the Green composition and the Blue composition.

Next, the composition having the composition 201 (the composition for forming an infrared transmitting filter) was applied to the pattern-formed film using a spin coating method such that the thickness of the formed film was 2.0 μm. Next, the silicon wafer was heated using a hot plate at 100° C. for 2 minutes. Next, using an i-ray stepper exposure device FPA-3000 i5+ (manufactured by Canon Corporation) at 1000 mJ/cm$^2$, the composition was exposed through a mask having a 2 μm Bayer pattern at 1000 mJ/cm$^2$. Next, puddle development was performed at 23° C. for 60 seconds using a tetramethylammonium hydroxide (TMAH) 0.3% aqueous solution. Next, the silicon wafer was rinsed by spin showering, was washed with pure water, and was heated using a hot plate at 200° C. for 5 minutes. As a result, the infrared transmitting filter was patterned on a portion where the Bayer pattern of the infrared absorbing filter was not formed. This filter was incorporated into a solid image pickup element using a well-known method Using the obtained solid image pickup element, an object was irradiated with a near infrared LED light source having an emission wavelength of 900 nm in a low-illuminance environment (0.001 Lux) to obtain an image. The object was able to be clearly recognized on the image, and imaging performance was excellent.

EXPLANATION OF REFERENCES

110: solid image pickup element
111: infrared cut filter
112: color filter
114: infrared transmitting filter
115: microlens
116: planarizing layer
151: support

What is claimed is:

1. A near infrared absorbing colorant polymer having a maximal absorption in a wavelength range of 700 to 1200 nm, comprising:

a curable group, and at least one near infrared absorbing colorant structure, wherein the at least one near infrared absorbing colorant structure comprises a compound derived from a compound represented by the following Formula (PP), (PP)

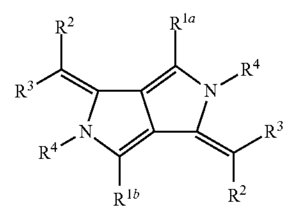

in Formula (PP), $R^{1a}$ and $R^{1b}$ each independently represent an alkyl group, an aryl group, or a heteroaryl group, $R^2$ and $R^3$ each independently represent a hydrogen atom or a substituent, $R^2$ and $R^3$ may be bonded to each other to form a ring, $R^4$'s each independently represent a hydrogen atom, an alkyl group, an aryl group, a heteroaryl group, —$BR^{4A}R^{4B}$, or a metal atom, $R^4$ may form a covalent bond or a coordinate bond with at least one selected from the group consisting of $R^{1a}$, $R^{1b}$, and $R^3$, and $R^{4A}$ and $R^{4B}$ each independently represent a hydrogen atom or a substituent.

2. The near infrared absorbing colorant polymer according to claim 1, wherein the near infrared absorbing colorant polymer has a structure in which two or more near infrared absorbing colorant structures are bonded to a divalent or higher linking group.

3. The near infrared absorbing colorant polymer according to claim 1, wherein the near infrared absorbing colorant polymer comprises at least one selected from the group consisting of a repeating unit having a near infrared absorbing colorant structure at a side chain and a repeating unit having a near infrared absorbing colorant structure at a main chain.

4. The near infrared absorbing colorant polymer according to claim 1, wherein the near infrared absorbing colorant polymer comprises at least one selected from the group consisting of a repeating unit represented by the following Formula (A), a repeating unit represented by the following Formula (B), and a repeating unit represented by the following Formula (C), or is represented by the following Formula (D):

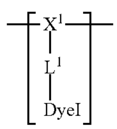

(A)

in Formula (A), $X^1$ represents a main chain of the repeating unit, $L^1$ represents a single bond or a divalent linking group, and DyeI represents a near infrared absorbing colorant structure;

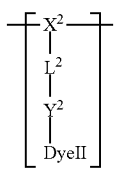

(B)

in Formula (B), $X^2$ represents a main chain of the repeating unit, $L^2$ represents a single bond or a divalent linking group, DyeII represents a near infrared absorbing colorant structure having a group capable of forming an ionic bond or a coordinate bond with $Y^2$, and $Y^2$ represents a group capable of forming an ionic bond or a coordinate bond with DyeII;

$$-\!\!\left[\text{DyeIII}-\!\!\left(L^3\right)_m\right]\!\!- \quad \text{(C)}$$

in Formula (C), $L^3$ represents a single bond or a divalent linking group,

DyeIII represents a near infrared absorbing colorant structure, and m represents 0 or 1; and $$(\text{DyeIV})_n\!-\!\!\left(L^4\right)\!-\!\!(\text{P})_k \quad \text{(D)}$$

in Formula (D), $L^4$ represents an (n+k)-valent linking group, n represents an integer of 2 to 20, k represents an integer of 0 to 20, DyeIV represents a near infrared absorbing colorant structure, P represents a substituent, in a case where n represents 2 or more, a plurality of DyeIV's may be different from each other, in a case where k represents 2 or more, a plurality of P's may be different from each other, and n+k represents an integer of 2 to 20.

5. The near infrared absorbing colorant polymer according to claim 1, wherein the curable group is a radically polymerizable group.

6. The near infrared absorbing colorant polymer according to claim 1, comprising an acid group.

7. A composition comprising:

the near infrared absorbing colorant polymer according to claim 1; and a solvent.

8. The composition according to claim 7, further comprising:

a curable compound and;

an alkali-soluble resin.

9. The composition according to claim 8, further comprising:

a photopolymerization initiator, wherein the curable compound is a radically polymerizable compound.

10. The composition according to claim 7, further comprising:

a coloring material that shields visible light.

11. A film which is formed using the composition according to claim 7.

12. A pattern forming method comprising:

forming a composition layer on a support using the composition according to claim 7; and forming a pattern on the composition layer using a photolithography method or a dry etching method.

13. An optical filter comprising:

a film which is formed using a composition including a near infrared absorbing colorant polymer and a solvent, wherein the near infrared absorbing colorant polymer includes a curable group and at least one near infrared absorbing colorant structure excluding a cyanine colorant and/or a dithiol colorant, and wherein the near infrared absorbing colorant polymer has a maximal absorption in a wavelength range of 700 to 1200 nm.

14. The optical filter according to claim 13, which is an infrared cut filter or an infrared transmitting filter.

15. The optical filter according to claim 13 comprising:

a pixel of the film; and at least one pixel selected from the group consisting of a red pixel, a green pixel, a blue pixel, a magenta pixel, a yellow pixel, a cyan pixel, a black pixel, and an achromatic pixel.

16. A device comprising:

a film which is formed using a composition including a near infrared absorbing colorant polymer and a solvent, wherein the near infrared absorbing colorant polymer includes a curable group and at least one near infrared absorbing colorant structure excluding a cyanine colorant and/or a dithiol colorant, wherein the near infrared absorbing colorant polymer has a maximal absorption in a wavelength range of 700 to 1200 nm, and wherein the device is a solid image pickup element, an infrared sensor, or an image display device.

* * * * *